US00RE46974E

(19) United States
(12) Reissued Patent
Nishimura et al.

(10) Patent Number: US RE46,974 E
(45) Date of Reissued Patent: Jul. 31, 2018

(54) ORGANIC ELECTROLUMINESCENCE DEVICE

(71) Applicant: IDEMITSU KOSAN CO., LTD., Chiyoda-ku (JP)

(72) Inventors: Kazuki Nishimura, Sodegaura (JP); Tetsuya Inoue, Sodegaura (JP); Yumiko Mizuki, Sodegaura (JP); Nobuhiro Yabunouchi, Sodegaura (JP); Mitsuru Eida, Sodegaura (JP)

(73) Assignee: IDEMITSU KOSAN CO., LTD., Chiyoda-ku (JP)

(21) Appl. No.: 15/381,955

(22) Filed: Dec. 16, 2016

Related U.S. Patent Documents

Reissue of:
(64) Patent No.: 9,203,043
Issued: Dec. 1, 2015
Appl. No.: 13/902,355
Filed: May 24, 2013

U.S. Applications:
(60) Provisional application No. 61/657,313, filed on Jun. 8, 2012.

(30) Foreign Application Priority Data

May 28, 2012 (JP) ..... 2012-121401

(51) Int. Cl.
*H01L 51/50* (2006.01)
*C09K 11/06* (2006.01)
*H01L 51/00* (2006.01)

(52) U.S. Cl.
CPC ..... *H01L 51/5012* (2013.01); *C09K 11/06* (2013.01); *H01L 51/0072* (2013.01); *H01L 51/5024* (2013.01); *C09K 2211/185* (2013.01); *H01L 51/0067* (2013.01); *H01L 51/0085* (2013.01); *H01L 51/504* (2013.01); *H01L 51/5016* (2013.01); *H01L 51/5044* (2013.01); *H01L 2251/308* (2013.01); *H01L 2251/5376* (2013.01); *H01L 2251/5384* (2013.01)

(58) Field of Classification Search
CPC ..... H01L 51/5012; H01L 51/0072; H01L 51/5024; C09K 11/06; C09K 2211/185
See application file for complete search history.

(56) References Cited

U.S. PATENT DOCUMENTS

| | | | | |
|---|---|---|---|---|
| 7,358,661 | B2 | 4/2008 | Kuma | |
| 7,737,627 | B2 * | 6/2010 | Hwang | C07F 9/5728 257/40 |
| 2010/0194270 | A1 * | 8/2010 | Kawamura | C07C 13/567 313/504 |
| 2010/0244676 | A1 | 9/2010 | Kinoshita | |
| 2012/0138915 | A1 | 6/2012 | Nishimura et al. | |
| 2012/0153272 | A1 * | 6/2012 | Fukuzaki | C07D 487/04 257/40 |
| 2013/0046094 | A1 * | 2/2013 | Stoessel et al. | 544/214 |
| 2013/0313536 | A1 | 11/2013 | Nishimura et al. | |
| 2016/0104845 | A1 | 4/2016 | Mizuki et al. | |

FOREIGN PATENT DOCUMENTS

| | | | | |
|---|---|---|---|---|
| EP | 2508585 | A1 | * | 10/2012 |
| JP | 9-3448 | | | 7/1997 |
| JP | 2000-173774 | | | 6/2000 |
| JP | 3695714 | | | 7/2005 |
| JP | 2009-73803 | A | | 4/2009 |
| JP | 2010-245063 | A | | 10/2010 |
| JP | 2011-153276 | A | | 8/2011 |
| JP | 2012-28634 | A | | 2/2012 |
| JP | 2012-33663 | A | * | 2/2012 |
| KR | 10-2012-0052499 | A | * | 5/2012 |
| WO | 2010/134352 | A1 | | 11/2010 |
| WO | WO 2010/134352 | A1 | | 11/2010 |
| WO | 2011/010840 | A1 | | 1/2011 |
| WO | WO 2011/025018 | | * | 3/2011 |
| WO | 2011/132683 | A1 | | 10/2011 |
| WO | 2011/132684 | A1 | | 10/2011 |
| WO | 2011/155507 | A1 | | 12/2011 |
| WO | WO 2012/014696 | | * | 2/2012 |
| WO | WO 2012/091225 | | * | 7/2012 |

OTHER PUBLICATIONS

English translation of JP 2012-33663 A, Feb. 2012.*
English translation of KR 10-2012-0052499 A, May 2012.*
International Search Report dated Aug. 27, 2013, in PCT/JP2013/064714 w/English Translation of Category of Cited Documents.
U.S. Appl. No. 14/039,539, filed Sep. 27, 2013, Mizuki, et al.

* cited by examiner

*Primary Examiner* — Alan Diamond
(74) *Attorney, Agent, or Firm* — Oblon, McClelland, Maier & Neustadt, L.L.P.

(57) ABSTRACT

An organic electroluminescence device 1 includes: an anode 3, a cathode 4 opposed to the anode 3 and an emitting layer 5 provided between the anode 3 and the cathode 4. The emitting layer 5 contains first and second host materials and a luminescent material. The first host material has a partial structure represented by at least one of the following formulae (1) and (2) while the second host material has a partial structure represented by the following formula (3). Az represents a substituted or unsubstituted aromatic heterocyclic group containing a nitrogen-containing six-membered ring. $W_{CN}$ is an aromatic hydrocarbon group substituted by at least one cyano group (CN) or an aromatic heterocyclic group substituted by at least one cyano group (CN). $Ar^1$ is a substituted or unsubstituted aromatic hydrocarbon group or a substituted or unsubstituted aromatic heterocyclic group, but is not an aromatic heterocyclic group containing a nitrogen-containing six-membered ring.

$$—Az—(W_{CN})_p \quad (1)$$

$$—Az—(CN)_q \quad (2)$$

$$—Ar^1—(CN)_r \quad (3)$$

24 Claims, 3 Drawing Sheets

ORGANIC ELECTROLUMINESCENCE DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*This application is a reissue application of U.S. Pat. No. 9,203,043 issued Dec. 1, 2015 from U.S. application Ser. No. 13/902,355, and claims priority to Japanese Patent Application No. 2012-121401, filed May 28, 2012, and U.S. Provisional Application No. 61/657,313, filed Jun. 8, 2012.* The entire disclosure of Japanese Patent Application No. 2012-121401, filed May 28, 2012, and U.S. Provisional Application No. 61/657,313, filed Jun. 8, 2012, are expressly incorporated by reference herein.

FIELD

Embodiments(s) described herein relate to an organic electroluminescence device.

BACKGROUND

When voltage is applied on an organic electroluminescence device (hereinafter, occasionally referred to as an organic EL device), holes and electrons are respectively injected into an emitting layer from an anode and a cathode. The injected electrons and holes are recombined in an emitting layer to form excitons. Here, according to the electron spin statistics theory, singlet excitons and triplet excitons are generated at a ratio of 25%:75%. In the classification according to the emission principle, in a fluorescent EL device which uses emission caused by singlet excitons, the limited value of an internal quantum efficiency of the organic EL device is believed to be 25%. On the other hand, in a phosphorescent EL device which uses emission caused by triplet excitons, it has been known that the internal quantum efficiency can be improved up to 100% when intersystem crossing efficiently occurs from the singlet excitons.

In a typical organic EL device, the most suitable device design has been made depending on fluorescent emission mechanism or phosphorescent emission mechanism. Particularly for designing a phosphorescent organic EL device, it has been known that simple application of a fluorescent device technique to a phosphorescent organic EL device does not provide a highly efficient phosphorescent organic EL device in consideration of a luminescence property of the phosphorescent organic EL device. The reasons are generally considered as follows.

First of all, since the phosphorescent emission is generated using triplet excitons, an energy gap of a compound for the emitting layer must be large. This is because a value of singlet energy (which means an energy gap between energy in the lowest singlet state and energy in the ground state) of a compound is typically larger than a value of triplet energy (which means an energy gap between energy in the lowest triplet state and energy in the ground state) of the compound.

Accordingly, in order to efficiently trap triplet energy of a phosphorescent dopant material in the device, first of all, a host material having larger triplet energy than that of the phosphorescent dopant material needs to be used in the emitting layer. Moreover, when providing an electron transporting layer and a hole transporting layer adjacently to the emitting layer, a compound having larger triplet energy than that of the phosphorescent dopant material needs to be used also in the electron transporting layer and the hole transporting layer. Thus, according to the typical designing idea of the organic EL device, a compound having a larger energy gap than that of a compound used in a fluorescent organic EL device is used in a phosphorescent organic EL device, thereby increasing drive voltage of the overall organic EL device.

Although a hydrocarbon compound exhibiting a high oxidation resistance and a high reduction resistance is useful for the fluorescent device, the hydrocarbon compound has a broad δ-electron cloud to render the energy gap small. For this reason, such a hydrocarbon compound is unlikely to be selected for the phosphorescent organic EL device, but an organic compound including a hetero atom (e.g., oxygen and nitrogen) is selected. Consequently, a lifetime of the phosphorescent organic EL device is shorter than that of the fluorescent organic EL device.

Moreover, device performance of the phosphorescent organic EL device is greatly affected by an exciton relaxation rate of triplet excitons much longer than that of singlet excitons in the phosphorescent dopant material. In other words, with respect to emission from the singlet excitons, since a relaxation rate leading to emission is so fast that the singlet excitons are unlikely to diffuse to the neighboring layers of the emitting layer (e.g., the hole transporting layer and the electron transporting layer), efficient emission is expected. On the other hand, with respect to emission from the triplet excitons, since spin is forbidden and a relaxation rate is slow, the triplet excitons are likely to diffuse to the neighboring layers, so that the triplet excitons are thermally energy-deactivated unless the phosphorescent dopant material is a specific phosphorescent compound. In short, in the phosphorescent organic EL device, control of the recombination region of the electrons and the holes is more important as compared with the control of that in the fluorescent organic EL device.

For the above reasons, enhancement of performance of the phosphorescent organic EL device requires material selection and device design different from those of the fluorescent organic EL device.

As a material of such a phosphorescent organic EL device, a carbazole derivative that exhibits a high triplet energy and is typically known as a hole transporting material has been used as a useful phosphorescent host material.

Patent Literature 1 (International Publication No. WO2011/132683) and Patent Literature 2 (International Publication No. WO2011/132684) each disclose that a compound provided by introducing a nitrogen-containing heterocyclic group to a biscarbazole skeleton in which two carbazoles are bonded is used as a host material in an emitting layer of a phosphorescent organic EL device. The compounds disclosed in Patent Literatures 1 and 2 are in a molecular design of well-balanced charge transportation achieved by introducing an electron-deficient nitrogen-containing heterocyclic group to a hole-transporting carbazole skeleton.

Moreover, Patent Literature 3 (International Publication No. WO2011/155507) discloses an organic EL device including an emitting layer in which a plurality of host materials are mixed in an attempt to prolong a lifetime of the organic EL device. In Patent Literature 3, combinations of various host materials to be mixed are studied.

However, in the organic EL devices using the compounds disclosed in Patent Literatures 1 and 2, prolonging a lifetime of each of the organic EL devices is a technical problem.

Moreover, a lifetime of the organic EL device disclosed in Patent Literature 3 is also desired to be prolonged.

BRIEF SUMMARY OF THE INVENTION

An object of the invention is to provide an organic electroluminescence device having a long lifetime.

After conducting concentrated studies in order to achieve the above object, the inventors have found that a lifetime of an organic EL device is prolonged by using, as a first host material of an emitting layer, a compound having a partial structure of an aromatic heterocyclic ring including a nitrogen-containing six-membered ring to which a cyano group is bonded directly or through a linking group and by using, as a second host material of the emitting layer, a compound having a partial structure of an aromatic hydrocarbon ring bonded with a cyano group or a partial structure of an aromatic heterocyclic ring bonded with a cyano group, and reached the invention.

An organic electroluminescence device according to an aspect of the invention includes: an anode; a cathode opposed to the anode; and an emitting layer provided between the anode and the cathode, in which the emitting layer includes a first host material, a second host material and a luminescent material, the first host material includes a partial structure represented by at least one of the following formulae (1) and (2), and the second host material includes a partial structure represented by the following formula (3) and does not comprise a partial structure represented by the formula (1) or the formula (2).

$$\text{-Az-}(W_{CN})_p \quad (1)$$

$$\text{-Az-}(CN)_q \quad (2)$$

$$\text{-}Ar^1\text{-}(CN)_r \quad (3)$$

In the formula (1), Az represents a substituted or unsubstituted aromatic heterocyclic group comprising a nitrogen-containing six-membered ring. $W_{CN}$ is an aromatic hydrocarbon group substituted by at least one cyano group (CN) or an aromatic heterocyclic group substituted by at least one cyano group (CN). p is an integer of 1 or more. $W_{CN}$ optionally has a substituent other than the cyano group and, when a plurality of $W_{CN}$ are present, the plurality of $W_{CN}$ are mutually the same or different.

In the formula (2), Az represents the same as Az of the formula (1), and q is an integer of 1 or more.

In the formula (3), $Ar^1$ is a substituted or unsubstituted aromatic hydrocarbon group or a substituted or unsubstituted aromatic heterocyclic group, but is not an aromatic heterocyclic group comprising a nitrogen-containing six-membered ring, and r is an integer of 1 or more.

According to the above aspects of the invention, an organic electroluminescence device having a long lifetime can be provided.

DETAILED DESCRIPTION OF THE INVENTION

First Exemplary Embodiment

Organic EL Device

Figure 1:
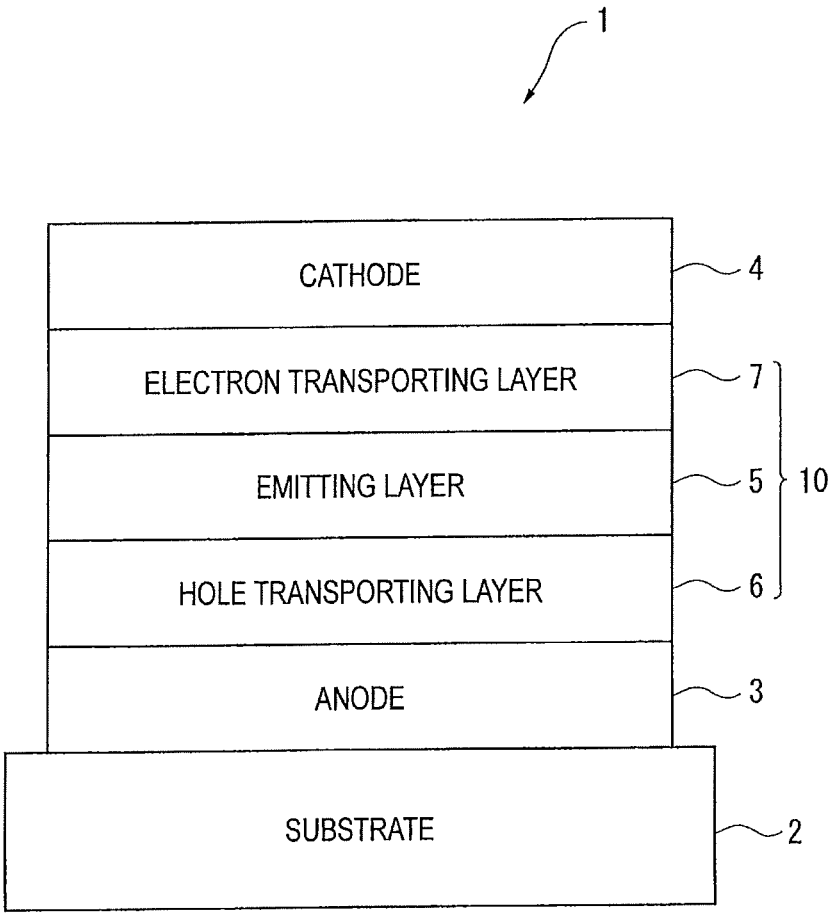
FIG. 1 schematically shows an exemplary arrangement of an organic EL device according to a first exemplary embodiment of the invention.

In a first exemplary embodiment of the invention, an organic EL device includes: a cathode; an anode; and an organic thin-film layer provided between the cathode and the anode. The organic thin-film layer is configured to have a single layer or a plurality of layers.

In the organic EL device according to the exemplary embodiment, at least one layer of the organic thin-film layer is an emitting layer. Accordingly, the organic thin-film layer may be provided by a single emitting layer. Alternatively, the organic compound layer may be provided by layers applied in a known organic EL device such as a hole injecting layer, a hole transporting layer, an electron injecting layer, an electron transporting layer, a hole blocking layer, an electron blocking layer. The organic thin-film layer may include an inorganic compound.

A compound according to the exemplary embodiment is contained in the organic thin-film layer. When the organic thin-film layer is provided by a plurality of layers, the compound according to the exemplary embodiment is contained singularly or as a component of a mixture in at least one of the plurality of organic thin-film layers. Preferably, the emitting layer contains the compound according to the exemplary embodiment. In this arrangement, it is preferable that the emitting layer contains the compound according to the exemplary embodiment as a host material and further contains a dopant material.

Typical device arrangements of an organic EL device include the following arrangements (a) to (e) and the like:

(a) anode/emitting layer/cathode;

(b) anode/hole injecting•transporting layer/emitting layer/cathode;

(c) anode/emitting layer/electron injecting•transporting layer/cathode;

(d) anode/hole injecting•transporting layer/emitting layer/electron injecting•transporting layer/cathode; and (e) anode/hole injecting•transporting layer/emitting layer/blocking layer/electron injecting•transporting layer/cathode.

While the arrangement (d) is preferably used among the above arrangements, the arrangement of the invention is not limited to the above arrangements.

It should be noted that the aforementioned "emitting layer" is an organic layer having an emission function and, when a doping system is applied, including a host material and a dopant material. Herein, the host material has a function of mainly promoting recombination of electrons and holes and trapping excitons in the emitting layer while the dopant material has a function of making the excitons obtained in the recombination efficiently emit. In a phosphorescent device, the host material has a function of trapping the excitons, which are generated mainly in the dopant, within the emitting layer.

The "hole injecting/transporting layer" (or hole injecting•transporting layer) means "at least one of a hole injecting layer and a hole transporting layer" while the "electron injecting/transporting layer" (or electron injecting-transporting layer) means "at least one of an electron injecting layer and an electron transporting layer." Herein, when the hole injecting layer and the hole transporting layer are provided, the hole injecting layer is preferably adjacent to the anode. When the electron injecting layer and the electron transporting layer are provided, the electron injecting layer is preferably adjacent to the cathode.

In the exemplary embodiment, the electron transporting layer means an organic layer having the highest electron mobility among organic layer(s) providing an electron transporting zone existing between the emitting layer and the cathode. When the electron transporting zone is provided by a single layer, the single layer is the electron transporting layer. Moreover, in the phosphorescent organic EL device, a blocking layer having an electron mobility that is not always high may be provided as shown in the arrangement (e) between the emitting layer and the electron transporting layer in order to prevent diffusion of exciton energy generated in the emitting layer. Thus, the organic layer adjacent to the emitting layer does not always correspond to the electron transporting layer.

The emitting layer may be of a double-dopant system in which at least two kinds of dopant materials having a high quantum efficiency are introduced and each of the dopants emits. Specifically, a host, a red dopant and a green dopant are co-evaporated on the emitting layer, whereby the emitting layer is commonly used to emit yellow light.

When the emitting layer is a laminate in which a plurality of emitting layers are laminated, electrons and holes are accumulated at the interface of the emitting layers, whereby a recombination region concentrates on the interface of the emitting layers to improve the quantum efficiency.

Injectability into the emitting layer of the holes may differ from that of the electrons and transporting capabilities of the hole and the electrons (represented by mobilities of the holes and the electrons in the emitting layer) may differ from each other.

FIG. 1 schematically shows an exemplary arrangement of an organic EL device according to an exemplary embodiment of the invention.

An organic EL device 1 shown in FIG. 1 includes a substrate 2, an anode 3, a cathode 4 and an organic thin-film layer 10 disposed between the anode 3 and the cathode 4.

The organic thin-film layer 10 includes a hole transporting layer 6, an emitting layer 5 and an electron transporting layer 7 which are sequentially laminated from the anode 3.

Figure 2:
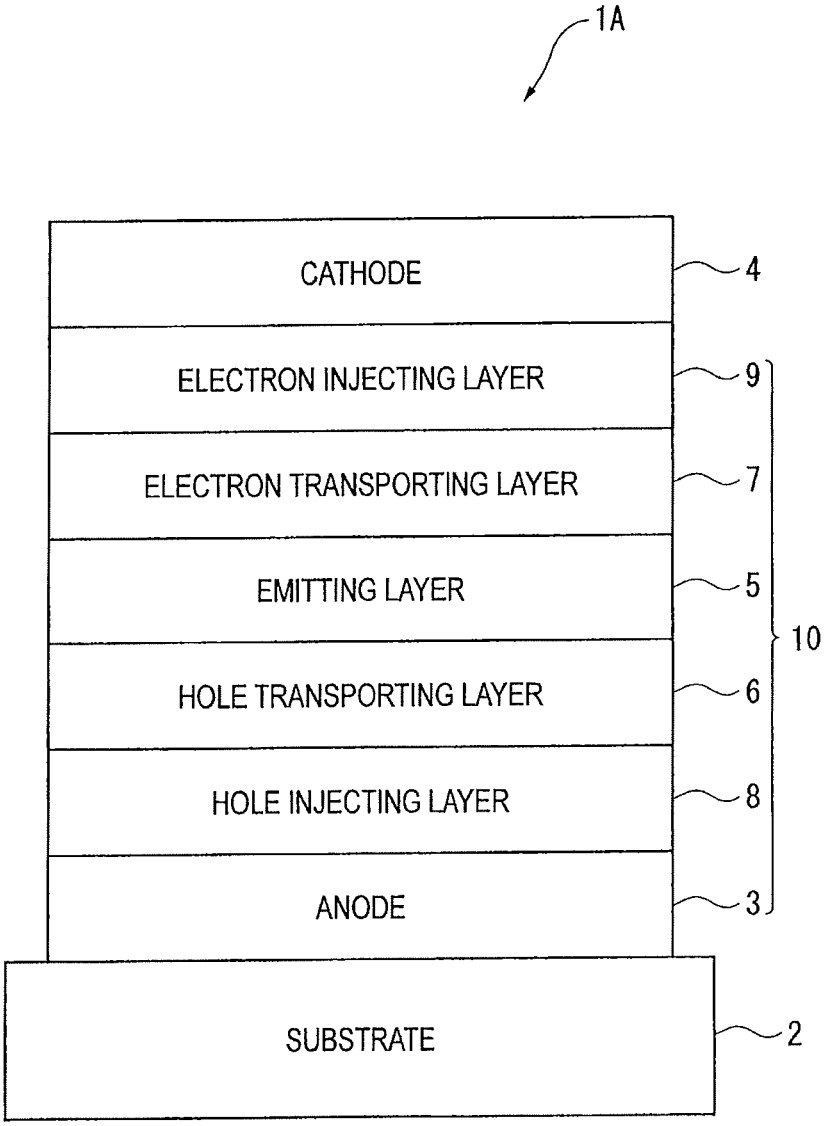
FIG. 2 schematically shows another exemplary arrangement of the organic EL device according to the first exemplary embodiment of the invention.

As another exemplary arrangement of the arrangement (d), as shown in FIG. 2, the organic thin-film layer 10 further includes a hole injecting layer 8 and an electron injecting layer 9 to provide an organic EL device 1A.

Emitting Layer

The emitting layer 5 contains a first host material, a second host material and a phosphorescent dopant material as a luminescent material.

A content ratio of the first host material and the second host material in the emitting layer is not particularly limited but adjustable as needed. The ratio by mass is preferably in a range of 1:99 to 99:1 (the host material: the second host material), more preferably of 10:90 to 90:10.

The organic EL device according to the exemplary embodiment can exhibit a prolonged lifetime by combining the first host material having at least one of a partial structure represented by the following formula (1) and a partial structure represented by the following formula (2) with the second host material having a partial structure represented by the following formula (3) to be used in the emitting layer. It is believed that mixture of the first and second host materials each having a specific partial structure promotes probability of recombination of holes and electrons to improve a luminous efficiency and a carrier balance, thereby further prolonging the lifetime of the organic EL device.

First Host Material

The first host material used in the organic EL device according to the exemplary embodiment may be a compound having a partial structure represented by at least one of the following formulae (1) and (2).

$$\text{-Az-}(W_{CN})_p \quad (1)$$

$$\text{-Az-}(CN)_q \quad (2)$$

The first host material may include a plurality of partial structures represented by the formula (1) or may include a plurality of partial structures represented by the formula (2).

Alternatively, the first host material may be a single compound including the partial structure represented by the formula (1) and the partial structure represented by the formula (2).

Further alternatively, the first host material may a mixture including a compound having the partial structure represented by the formula (1) and a compound having the partial structure represented by the formula (2).

The first host material is preferably a compound having the partial structure represented by the formula (1).

In the formulae (1) and (2), Az is a substituted or unsubstituted aromatic heterocyclic group that contains a nitrogen-containing six-membered ring. Examples of the aromatic heterocyclic group represented by Az include: a monocyclic aromatic heterocyclic group structured by a monocyclic hetero ring (occasionally referred to as a non-fused aromatic heterocyclic group); and a fused aromatic heterocyclic group in which a hetero ring is fused to an aromatic hydrocarbon ring or a hetero ring is fused to another hetero ring. The aromatic heterocyclic group represented by Az preferably has 5 to 30 ring atoms, more preferably 5 to 14 ring atoms.

Examples of the aromatic heterocyclic group represented by Az in the formulae (1) and (2) include a quinoline ring, isoquinoline ring, quinoxaline ring, phenanthridine ring, phenanthroline ring, pyridine ring, pyrazine ring, pyrimidine ring, pyridazine ring, triazine ring, acridine ring, piperidine ring, morpholine ring, piperazine ring and a group formed from derivatives thereof.

In the formula (1), $W_{CN}$ is an aromatic hydrocarbon group substituted by at least one cyano group (CN) or an aromatic heterocyclic group substituted by at least one cyano group (CN).

In the formula (1), p represents an integer of 1 or more and is defined as the number of $W_{CN}$ bondable to Az, the number depending on a structure of Az.

It should be noted that $W_{CN}$ may have a substituent other than a cyano group. This substituent will be described later.

When a plurality of $W_{CN}$ are present, the plurality of $W_{CN}$ may be mutually the same or different.

In the formula (2), q represents an integer of 1 or more and is defined as the number of the cyano group (—CN) bondable to Az, the number depending on a structure of Az. p and q are preferably 1 or 2, more preferably 1.

The aromatic hydrocarbon group for $W_{CN}$ in the formula (1) preferably has 6 to 30 ring carbon atoms, more preferably 6 to 14 ring carbon atoms.

Examples of the aromatic hydrocarbon group for $W_{CN}$ include a phenyl group, naphthyl group, phenanthryl group, biphenyl group, terphenyl group, quaterphenyl group, fluoranthenyl group, triphenylenyl group, phenanthrenyl group, fluorenyl group, spirofluorenyl group, 9,9-diphenylfluorenyl group, 9,9'-spirobi[9H-fluorene]-2-yl group, 9,9-dimethylfluorenyl group, benzo[c]phenanthrenyl group, benzo[a]triphenylenyl group, naphtho[1,2-c]phenanthrenyl group, naphtho[1,2-a]triphenylenyl group, dibenzo[a,c]triphenylenyl group and benzo[b]fluoranthenyl group.

Preferable examples of the aromatic hydrocarbon group for $W_{CN}$ include a phenyl group, naphthyl group, biphenyl group, terphenyl group, phenanthryl group, triphenylenyl group, fluorenyl group, spirobifluorenyl group and fluoranthenyl group.

The aromatic heterocyclic group for $W_{CN}$ in the formula (1) preferably has 5 to 30 ring atoms, more preferably 5 to 14 ring carbon atoms.

Specific examples of the aromatic heterocyclic group for $W_{CN}$ include, in addition to the same group as those of the specific examples of the aromatic heterocyclic group represented by Az, a pyrrole ring, isoindole ring, benzofuran ring, isobenzofuran ring, dibenzothiophen ring, indole ring, pyrrolidine ring, dioxane ring, carbazole ring, furan ring, thiophen ring, oxazole ring, oxadiazole ring, benzooxazole ring, thiazole ring, thiadiazole ring, benzothiazole ring, triazole ring, imidazole ring, benzoimidazole ring, pyrane ring, dibenzofuran ring, benzo[c]dibenzofuran ring and a group formed from derivatives thereof.

Examples of a cyano-substituted aromatic hydrocarbon group having 6 to 30 ring carbon atoms and a cyano-substituted heterocyclic group having 5 to 30 ring atoms include a cyano-substituted phenyl group, a cyano-substituted biphenyl group, a cyano-substituted naphthyl group, a cyano-substituted phenanthryl group, a cyano-substituted 9,9-diphenylfluorenyl group, a cyano-substituted 9,9'-spirobi[9H-fluorene]-2-yl group, a cyano-substituted 9,9-dimethylfluorenyl group, a cyano-substituted dibenzothiophenyl group, a cyano-substituted triphenyl group, and a cyano-substituted dibenzofuranyl group.

$W_{CN}$ is more preferably a cyano-substituted phenyl group, a cyano-substituted biphenyl group, a cyano-substituted 9,9-diphenylfluorenyl group, a cyano-substituted 9,9'-spirobi[9H-fluorene]-2-yl group, a cyano-substituted 9,9-dimethylfluorenyl group, a cyano-substituted dibenzofuranyl group, and a cyano-substituted dibenzothiophenyl group.

$W_{CN}$ is more preferably a cyano-substituted phenyl group, a cyano-substituted biphenyl group such as 4-cyanobiphenyl group, 3-cyanobiphenyl group and 2-cyanobiphenyl group, a cyano-substituted 9,9-diphenylfluorenyl group, a cyano-substituted 9,9'-spirobi[9H-fluorene]-2-yl group, a cyano-substituted 9,9-dimethylfluorenyl group, a cyano-substituted dibenzofuranyl group, and a cyano-substituted dibenzothiophenyl group.

Since $W_{CN}$ of the partial structure in the formula (1) is a cyano-substituted phenyl group, a cyano-substituted biphenyl group or a cyano-substituted fluorenyl, triplet energy level of $W_{CN}$ tends to be larger than that of the cyano group of the partial structure in the formula (2). Accordingly, the compound having $W_{CN}$ of the partial structure in the formula (1) is further preferable since exhibiting an increased luminous efficiency when contained in the emitting layer of the organic EL device.

Az in the formulae (1) and (2) is preferably a divalent to pentavalent group of a ring represented by the following formula (4-6).

(4-6)

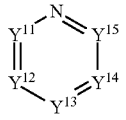

The partial structures represented by the formulae (1) and (2) are preferably structures represented by the following formulae (1-a) and (2-b).

(1-a)

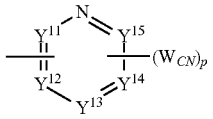

(2-b)

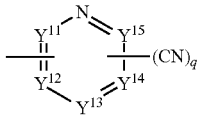

In the formula (4-6), $Y^{11}$ to $Y^{15}$ each independently represent a nitrogen atom (N) or $CR^c$. $CR^c$ is provided by $R^c$ bonded to a carbon atom (C).

In $CR^c$, $R^c$ each independently represents a hydrogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted silyl group, or a halogen atom.

When adjacent two of $Y^{11}$ to $Y^{15}$ are $CR^c$, a part of $R^c$ of the adjacent $CR^c$ may be bonded to a part of the other $R^c$ to form a cyclic structure.

When a plurality of $R^c$ are present, the plurality of $R^c$ are mutually the same or different.

Examples of the aromatic hydrocarbon group for $R^c$ in $CR^c$ are the same as those of the aromatic hydrocarbon group for $W_{CN}$.

Examples of the aromatic heterocyclic group for $R^c$ in $CR^c$ are the same as those of the aromatic heterocyclic group for $W_{CN}$.

The alkyl group for $R^c$ in $CR^c$ preferably has 1 to 6 carbon atoms. Examples of the alkyl group for $R^c$ in $CR^c$ include a methyl group, ethyl group, n-propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neo-pentyl group, 1-methylpentyl group, cyclopropyl group, cyclobutyl group, cyclopentyl group, cyclohexyl group, cyclooctyl group, and adamantyl group.

Preferable examples of the alkyl group for $R^c$ in $CR^c$ include a methyl group, ethyl group, n-propyl group, isopropyl group, n-butyl group, s-butyl group, isobutyl group, t-butyl group, cyclopentyl group and cyclohexyl group. Further, the alkyl group also may be alternatively a haloalkyl group, examples of which include ones provided by substituting at least one hydrogen atom of the above alkyl group with a halogen atom. The halogen atom is preferably fluorine. The haloalkyl group is exemplified by a trifluoromethyl group and a 2,2-trifluoroethyl group.

Examples of the silyl group for $R^c$ in $CR^c$ include a trimethylsilyl group, triethylsilyl group, tributylsilyl group, dimethylethylsilyl group, t-butyldimethylsilyl group, vinyldimethylsilyl group, propyldimethylsilyl group, dimethylisopropylsilyl group, dimethylpropylsilyl group, dimethylbutylsilyl group, dimethyl-tertiary-butylsilyl group, diethylisopropylsilyl group, phenyldimethylsilyl group, diphenylmethylsilyl group, diphenyl-tertiary-butylsilyl group and triphenylsilyl group.

Preferable examples of the silyl group for $R^c$ in $CR^c$ include a trimethylsilyl group, triethylsilyl group, t-butyldimethylsilyl group, vinyldimethylsilyl group and propyldimethylsilyl group.

Examples of the halogen atom for $R^c$ in $CR^c$ include fluorine, chlorine, bromine and iodine, among which fluorine is preferable.

As the monocyclic aromatic heterocyclic group for Az, a substituted or unsubstituted pyrimidine ring, a substituted or unsubstituted triazine ring or a substituted or unsubstituted pyridine ring is preferable.

The partial structure represented by the formula (1) is exemplified in the following list of groups. The partial structure represented by the formula (2) is exemplified by the following list of groups in which $W_{CN}$ is replaced by a cyano group (—CN).

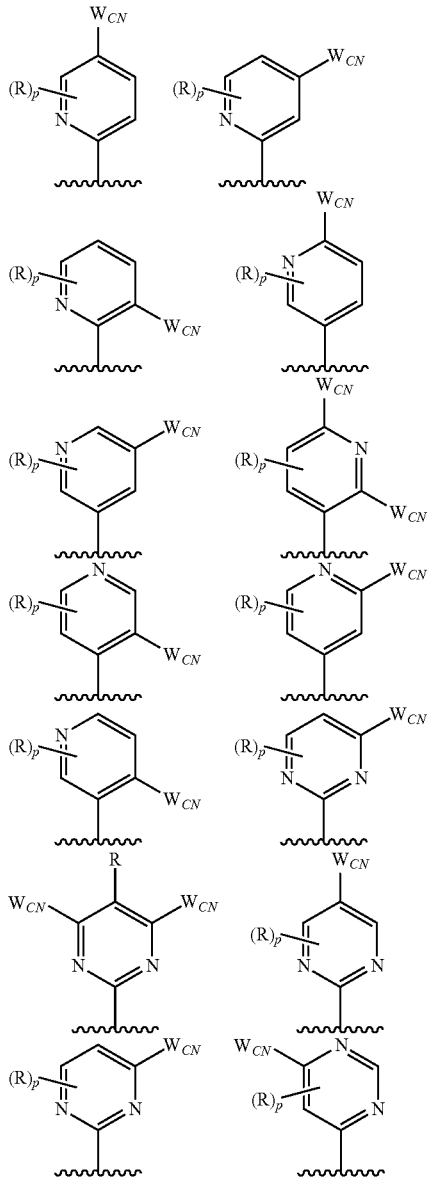

-continued

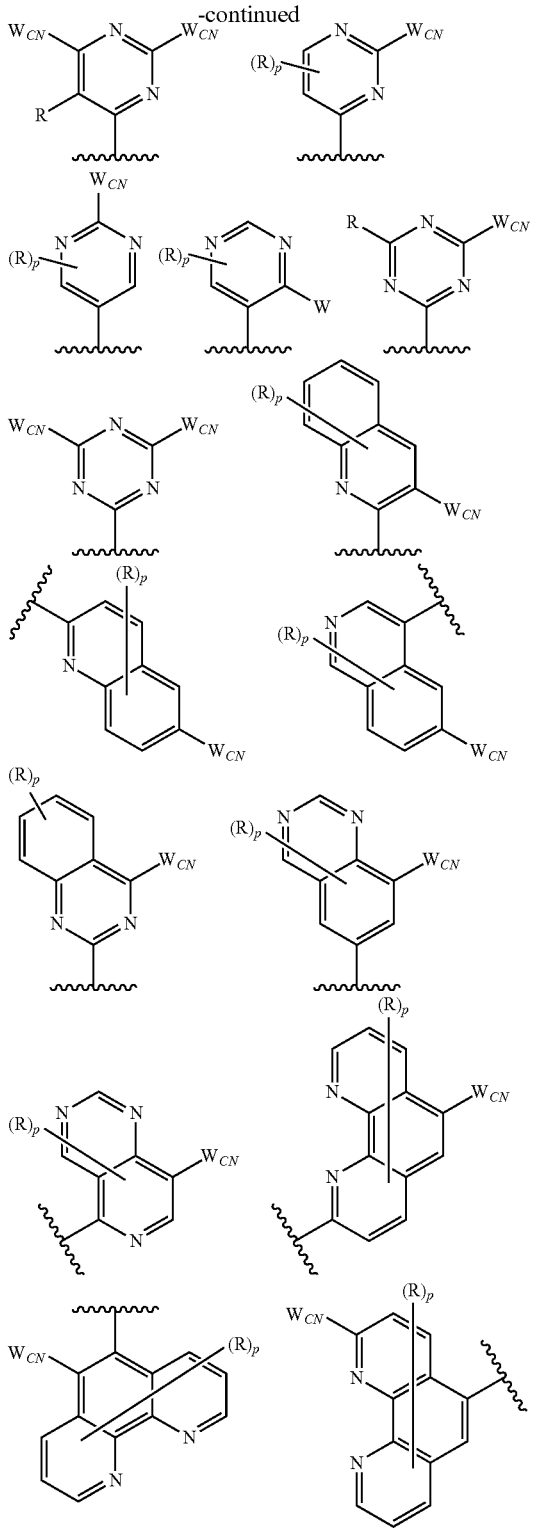

In the above formulae representing the above partial structures, R represents a substituent, which is the same as those for $R^c$ in $CR^c$ of the formula (4-6). R is preferably a substituted or unsubstituted phenyl group, a substituted or unsubstituted biphenyl group, a substituted or unsubstituted fluorenyl group, a substituted or unsubstituted naphthyl group, a substituted or unsubstituted dibenzofuranyl group, and a substituted or unsubstituted thiophenyl group.

In the above formulae representing the above partial structures, $W_{CN}$ represents the same as those for $W_{CN}$ in the above. p is an integer of 1 to 5.

The first host material is preferably represented by at least one of the formulae (1-1) and (2-1).

$$A^2\text{-Az-}(W_{CN})_p \quad (1\text{-}1)$$

$$Ar^2\text{-Az-}(CN)_q \quad (2\text{-}1)$$

In the formulae (1-1) and (2-1), $Ar^2$ represents a substituted or unsubstituted aromatic hydrocarbon group having 6 to 30 ring carbon atoms, or substituted or unsubstituted aromatic heterocyclic group having 5 to 30 ring atoms.

The same description of the aromatic hydrocarbon group for $W_{CN}$ and the same description of the aromatic heterocyclic group for $W_{CN}$ apply to $Ar^2$.

Az, $W_{CN}$ and p in the formula (1-1) are the same as Az, $W_{CN}$ and p in the formula (1).

Az and q in the formula (2-1) are the same as Az and q in the formula (2).

The first host material is preferably represented by the following formula (4).

(4)

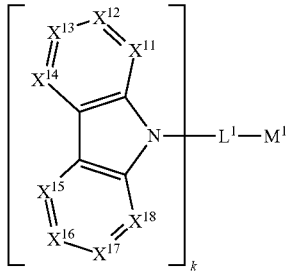

In the formula (4), $M^1$ is a group represented by one of the formulae (1) and (2).

In the formula (4), $L^1$ represents a single bond, a substituted or unsubstituted polyvalent aromatic hydrocarbon group having 6 to 30 ring carbon atoms, a substituted or unsubstituted polyvalent aromatic heterocyclic group having 5 to 30 ring atoms, or a group in which the above groups are linked. "Polyvalent" means having valence of 2 or more.

In the formula (4), k is 1 or 2.

Examples of $L^1$ representing the polyvalent aromatic hydrocarbon group having 6 to 30 ring carbon atoms are the same as those of the polyvalent aromatic hydrocarbon group described for $W_{CN}$, among which a phenylene group, biphenylene group and naphthylene group are preferable.

Examples of $L^1$ representing the polyvalent aromatic heterocyclic group having 6 to 30 ring carbon atoms are the same as those of the polyvalent aromatic heterocyclic group described for $W_{CN}$, among which a dibenzofuranylene group and dibenzothiophenylene group are preferable.

In the formula (4), $X^{11}$ to $X^{18}$ each independently represent a nitrogen atom or $CR^b$.

$R^b$ each independently represents a hydrogen atom, a halogen atom, a cyano group, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted alkoxy group having 1 to 30 carbon atoms, a substituted or unsubstituted aralkyl group having 6 to 30 ring carbon atoms, and a substituted or unsubstituted aryloxy group having 6 to 30 ring carbon atoms.

A part of one of adjacent two $R^b$ in $X^{11}$ to $X^{18}$ is optionally bonded to a part of the other $R^b$ to form a cyclic structure.

The same description of the aromatic hydrocarbon group for $W_{CN}$ applies to the aromatic hydrocarbon group for $R^b$.

The same description of the aromatic heterocyclic group for $W_{CN}$ applies to the aromatic heterocyclic group for $R^b$.

The same description of the alkyl group for $R^c$ applies to the alkyl group for $R^b$.

The same description of the silyl group for $R^c$ applies to the alkylsilyl group and arylsilyl group for $R^b$.

The alkenyl group for $R^b$ may be linear, branched or cyclic. Examples of the alkenyl group are vinyl, propenyl, butenyl, oleyl, eicosapentaenyl, docosahexaenyl, styryl, 2,2-diphenylvinyl, 1,2,2-triphenylvinyl and 2-phenyl-2-propenyl, among which a vinyl group is preferable.

The alkynyl group for $R^b$ may be linear, branched or cyclic. Examples of the alkynyl group are ethynyl, propynyl and 2-phenylethynyl, among which an ethynyl group is preferable.

The alkoxy group for $R^b$ is represented by —$OR^W$. $R^W$ is exemplified by the alkyl group having 1 to 30 carbon atoms. Examples of the alkoxy group are a methoxy group, ethoxy group, propoxy group, butoxy group, pentyloxy group and hexyloxy group. The alkoxy group also includes a haloalkoxy group, examples of which include ones provided by substituting at least one hydrogen atom of the above alkoxy group with a halogen atom. The halogen atom is preferably fluorine.

The aralkyl group for $R^b$ is represented by —$R^X$—$R^Y$. $R^X$ is exemplified by an alkylene group corresponding to the alkyl group having 1 to 30 carbon atoms. $R^Y$ is exemplified by the examples of the aromatic hydrocarbon group having 6 to 30 ring carbon atoms. In the aralkyl group, an aromatic hydrocarbon group moiety has 6 to 30 carbon atoms, preferably 6 to 20 carbon atoms, more preferably 6 to 12 carbon atoms. In the aralkyl group, an alkyl group moiety has 1 to 30 carbon atoms, preferably 1 to 20 carbon atoms, more preferably 1 to 10 carbon atoms, further preferably 1 to 6 carbon atoms. Examples of the aralkyl group are a benzyl group, 2-phenylpropane-2-yl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylethyl group, 1-β-naphthylisopropyl group, 2-β-naphthylisopropyl group, 1-pyrorylmethyl group, 2-(1-pyroryl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

The aryloxy group having 6 to 30 ring carbon atoms for $R^b$ is represented by —$OR^Z$. $R^Z$ is exemplified by the aromatic hydrocarbon group having 6 to 30 ring carbon atoms or the following monocyclic group and fused cyclic group. The aryloxy group is exemplified by a phenoxy group.

The first host material is preferably represented by at least one of the formulae (4-3) and (4-4).

(4-3)

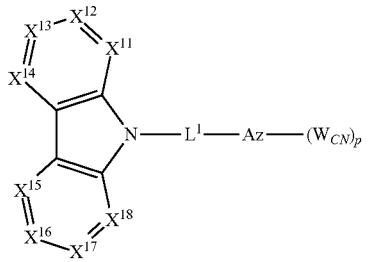

(4-4)

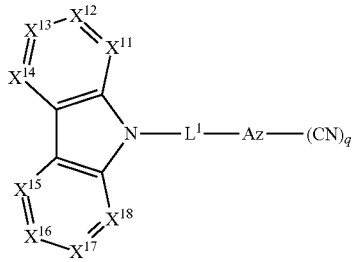

In the formulae (4-3) and (4-4), $L^1$ and $X^{11}$ to $X^{18}$ are the same as $L^1$ and $X^{11}$ to $X^{18}$ in the formula (4).

Az, $W_{CN}$ and p in the formula (4-3) are the same as Az, $W_{CN}$ and p in the formula (1).

Az and q in the formula (4-4) are the same as Az and q in the formula (1).

In the formulae (4), (4-3) and (4-4), preferably, $X^{11}$ to $X^{18}$ each independently represent $CR^b$.

Moreover, the first host material is preferably represented by the following formula (4-5).

(4-5)

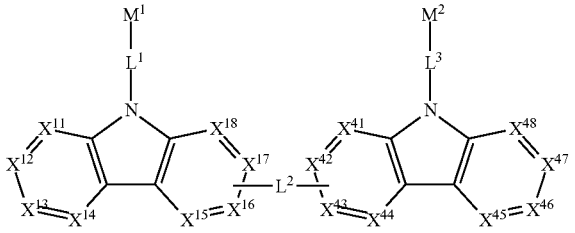

In the formula (4-5), $L^1$ is the same as $L^1$ in the formula (4-5).

In the formula (4-5), $X^{11}$ to $X^{14}$ and $X^{45}$ to $X^{48}$ each independently represent a nitrogen atom or $CR^b$.

In the formula (4-5), $X^{15}$ to $X^{18}$ and $X^{41}$ to $X^{44}$ each independently represent a nitrogen atom, $CR^b$ or a carbon atom to be bonded to $L^2$.

$R^b$ of $CR^b$ in $X^{11}$ to $X^{18}$ and $X^{41}$ to $X^{48}$ is the same as $R^b$ of $CR^b$ in $X^{11}$ to $X^{18}$ in the formula (4).

In the formula (4-5), $L^2$ and $L^3$ each independently represents a single bond, $A^3$ represents a substituted or unsubstituted divalent aromatic hydrocarbon group having 6 to 30 ring carbon atoms, a substituted or unsubstituted divalent aromatic heterocyclic group having 5 to 30 ring atoms, a cycloalkylene group having 5 to 30 ring carbon atoms, or a group in which the above groups are linked.

Examples of $L^2$ and $L^3$ representing the divalent aromatic hydrocarbon group having 6 to 30 ring carbon atoms are the same as those of the divalent aromatic hydrocarbon group described for $W_{CN}$, among which a phenylene group, biphenylene group and naphthylene group are preferable.

Examples of $L^2$ and $L^3$ representing the divalent aromatic heterocyclic group having 5 to 30 ring atoms are the same as those of the divalent aromatic heterocyclic group described for $W_{CN}$, among which a dibenzofuranylene group and dibenzothiophenylene group are preferable.

$L^2$ is preferably a single bond, a substituted or unsubstituted divalent monocyclic hydrocarbon group having 6 ring carbon atoms, or a substituted or unsubstituted divalent monocyclic aromatic heterocyclic group having at most 6 ring atoms. Among the above, $L^2$ is preferably a phenylene group, a group provided by bonding two or three phenylene groups, or single bond.

In the formula (4-5), $R^b$ represents the same as those for $R^b$ in the formulae (4-1) and (4-2).

In the formula (4-5), a part of one of at least adjacent two $R^b$ in $X^{11}$ to $X^{18}$ and $X^{41}$ to $X^{48}$ may be bonded to a part of the other $R^b$ to form a cyclic structure.

In the formula (4), $M^1$ is a group represented by one of the formulae (1) and (2).

In the formula (4-5), $M^2$ represents a substituted or unsubstituted aromatic hydrocarbon group having 6 to 30 ring carbon atoms, a substituted or unsubstituted aromatic heterocyclic group having 5 to 30 ring atoms, or a group represented by one of the formulae (1) and (2), and $M^1$ and $M^2$ are the same or different.

The same description of the aromatic hydrocarbon group for $W_{CN}$ applies to the aromatic hydrocarbon group for $M^2$.

The same description of the aromatic heterocyclic group for $W_{CN}$ applies to the aromatic heterocyclic group for $M^2$.

In the formula (4-5), preferably, $X^{15}$ to $X^{18}$ each independently represent $CR^b$ unless being a carbon atom to be bonded to $L^2$ while $X^{11}$ to $X^{14}$ each independently represent $CR^b$.

In the formula (4-5), preferably, $X^{41}$ to $X^{44}$ each independently represent $CR^b$ unless being a carbon atom to be bonded to $L^2$ while $X^{45}$ to $X^{48}$ each independently represent $CR^b$.

In the formula (4-5), preferably, $X^{15}$ to $X^{18}$ each independently represent $CR^b$ unless being a carbon atom to be bonded to $L^2$, and $X^{41}$ to $X^{44}$ each independently represent $CR^b$ unless being a carbon atom to be bonded to $L^2$ while $X^{11}$ to $X^{14}$ and $X^{45}$ to $X^{48}$ each independently represent $CR^b$.

In the first host material, the partial structures represented by the formulae (1) and (2) (i.e., an electron-transporting unit) are preferably introduced at ends of a biscarbazole skeleton. In this arrangement, the first host material has a favorable carrier balance in a molecule without counteraction between characteristics of a hole-injecting•transporting carbazolyl skeleton and characteristics of a group having an electron-injecting•transporting cyano group.

The first host material represented by the formula (4-5) is preferably one of a compound represented by the following formula (4-5-1), a compound represented by the following formula (4-5-2), and a compound represented by the following formula (4-5-3).

(4-5-1)

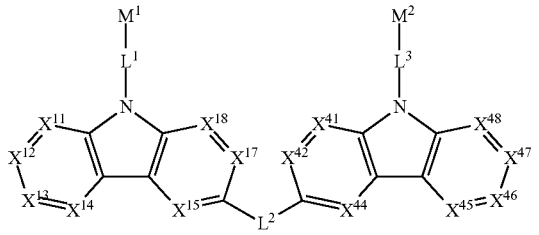

(4-5-2)

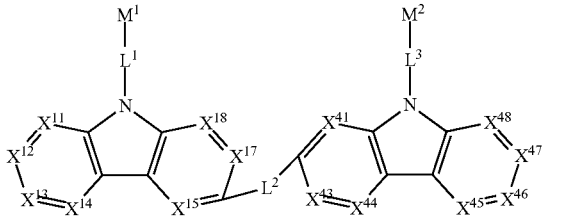

(4-5-3)

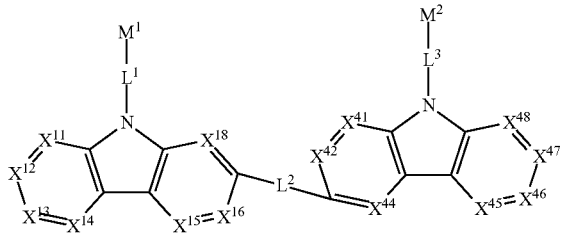

In the formulae (4-5-1), (4-5-2) and (4-5-3), $M^1$, $M^2$, $L^1$, $L^2$, $L^3$, $X^{11}$ to $X^{18}$, and $X^{41}$ to $X^{48}$ represent the same as $M^1$, $M^2$, $L^1$, $L^2$, $L^3$, $X^{11}$ to $X^{18}$, and $X^{41}$ to $X^{48}$ in the formula (4-5).

In the formula (4-5-1), preferably, $X^{11}$ to $X^{15}$, $X^{17}$, $X^{18}$, $X^{41}$, $X^{42}$, and $X^{45}$ to $X^{48}$ each independently represent $CR^b$.

In the formula (4-5-2), preferably, $X^{11}$ to $X^{15}$, $X^{17}$, $X^{18}$, $X^{41}$, and $X^{43}$ to $X^{48}$ each independently represent $CR^b$.

In the formula (4-5-3), preferably, $X^{11}$ to $X^{16}$, $X^{18}$, $X^{41}$, and $X^{44}$ to $X^{48}$ each independently represent $CR^b$.

In the invention, "carbon atoms forming a ring (ring carbon atoms)" mean carbon atoms forming a saturated ring, unsaturated ring, or aromatic ring. "Atoms forming a ring (ring atoms)" mean carbon atoms and hetero atoms forming a hetero ring including a saturated ring, unsaturated ring, or aromatic ring.

In the invention, a "hydrogen atom" means isotopes having different neutron numbers and specifically encompasses protium, deuterium and tritium.

Examples of the substituent meant by "substituted or unsubstituted" are the above-described aromatic hydrocarbon group, aromatic heterocyclic group, alkyl group (linear or branched alkyl group, cycloalkyl group and haloalkyl group), alkoxy group, aryloxy group, aralkyl group, haloalkoxy group, alkylsilyl group, dialkylarylsilyl group, alkyldiarylsilyl group, triarylsilyl group, halogen atom, cyano group, hydroxyl group, nitro group and carboxy group. In addition, the alkenyl group and alkynyl group are also usable. Examples of the substituents other than CN for $W_{CN}$ as described above are the substituents described herein.

In the above-described substituents, the aromatic hydrocarbon group, aromatic heterocyclic group, alkyl group, halogen atom, alkylsilyl group, arylsilyl group and cyano group are preferable. Preferable ones of the specific examples of each substituent are further preferable.

"Unsubstituted" in "substituted or unsubstituted" means that a group is not substituted by the above-described substituents but bonded with a hydrogen atom.

Herein, "a to b carbon atoms" in the description of "substituted or unsubstituted XX group having a to b carbon atoms" represent carbon atoms of an unsubstituted XX group and does not include carbon atoms of a substituted XX group.

In a later-described compound or a partial structure thereof, the same applies to the description of "substituted or unsubstituted."

A manufacturing method of the first host material is not particularly limited, but known methods are usable. For instance, the first host material may be manufactured by a coupling reaction using a copper catalyst described in "Tetrahedron, 40th volume (1984), p. 1435-1456" or a palladium catalyst described in "Journal of the American Chemical Society, 123 (2001), p. 7727-7729."

Examples of specific structures of the compounds usable as the first host material are shown below. However, the invention is not limited to the compounds having these structures. It should be noted that a bond at an end of the following structural formulae, of which chemical formula (e.g., CN or a benzene ring) is not described, represents a methyl group.

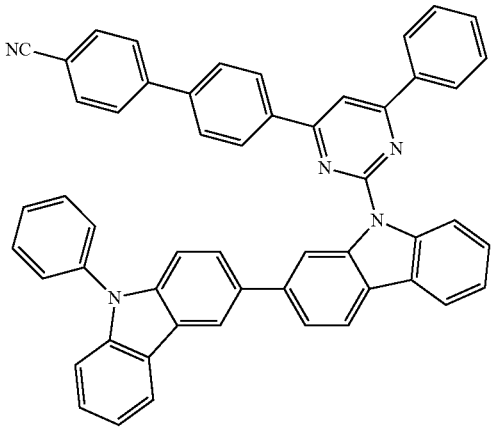

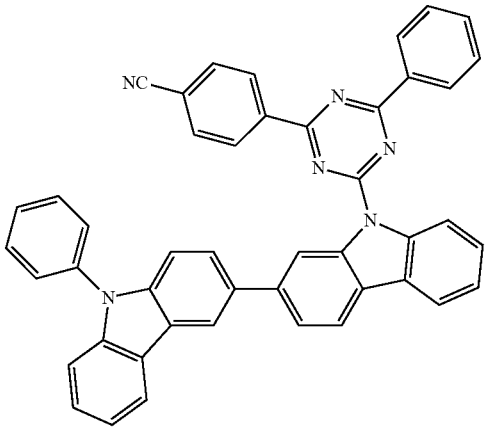

-continued
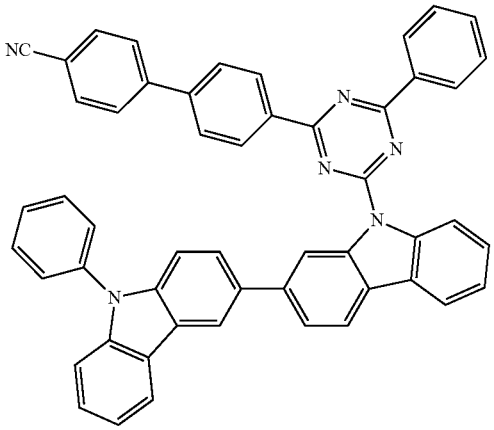
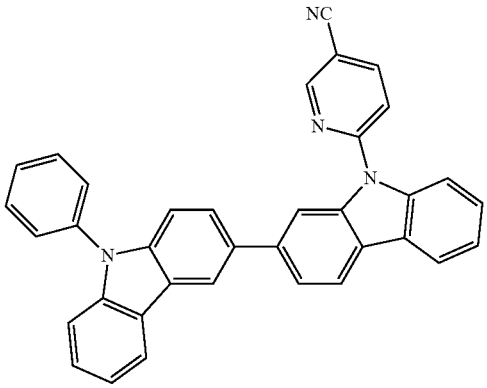
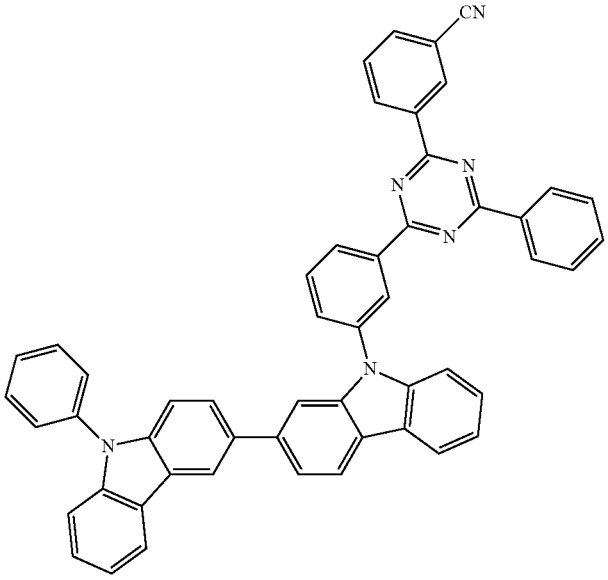
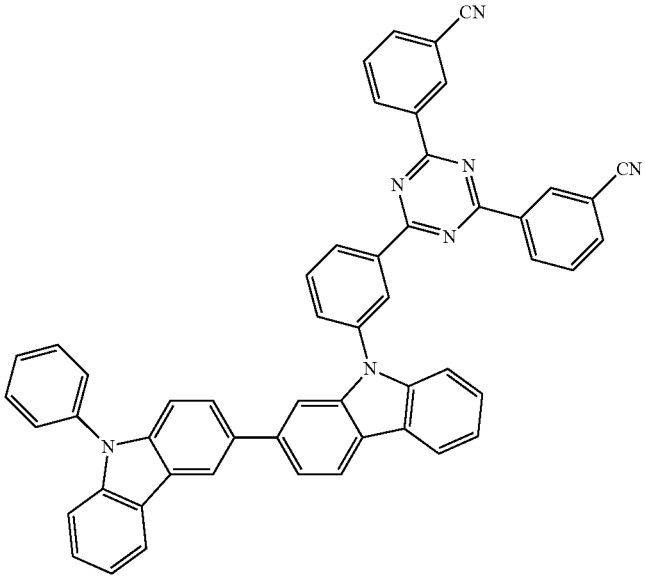

-continued
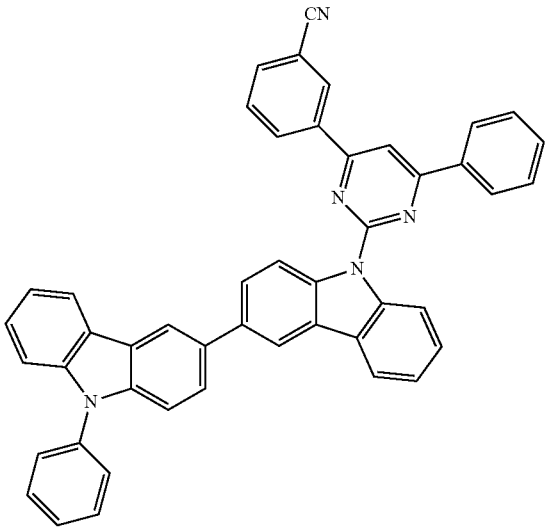
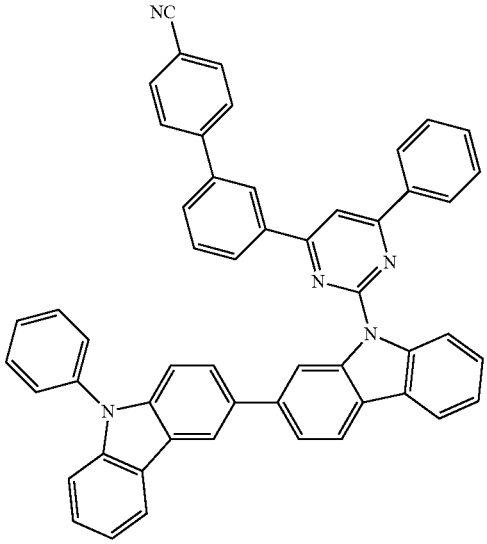
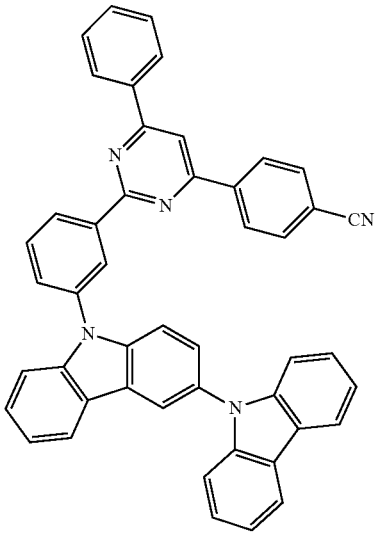
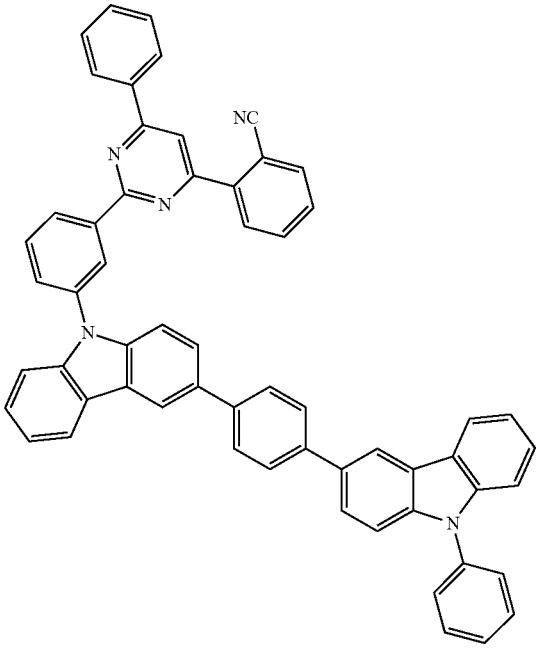

-continued
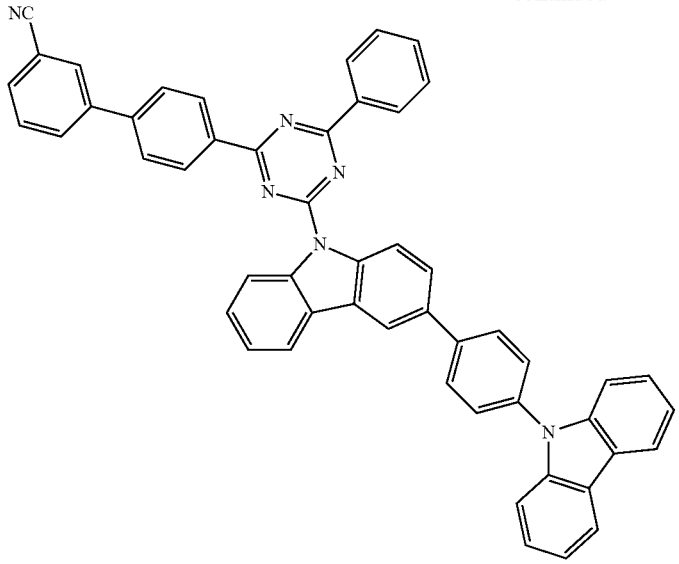
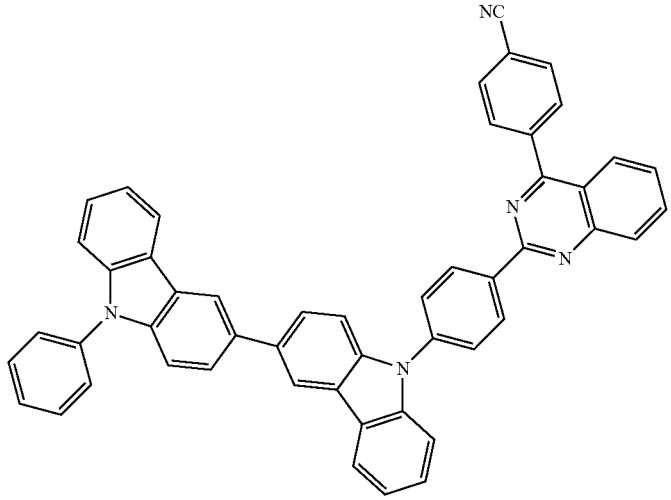
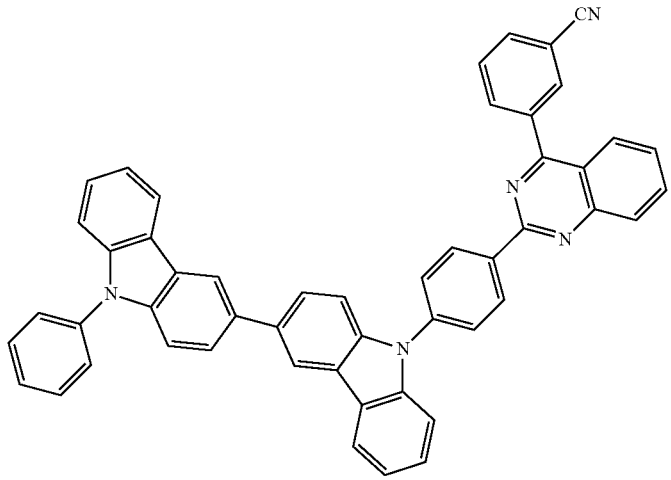

-continued
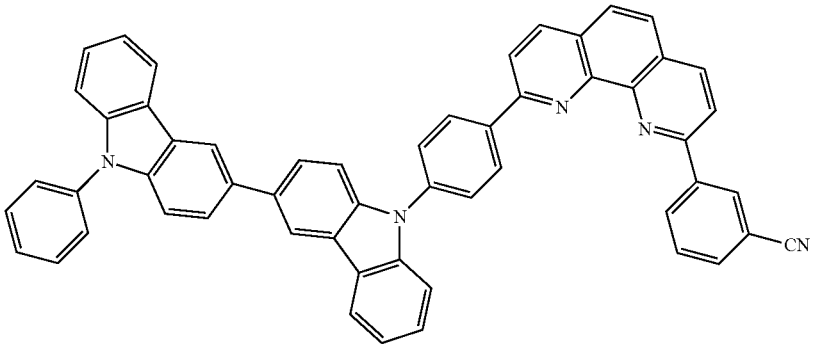
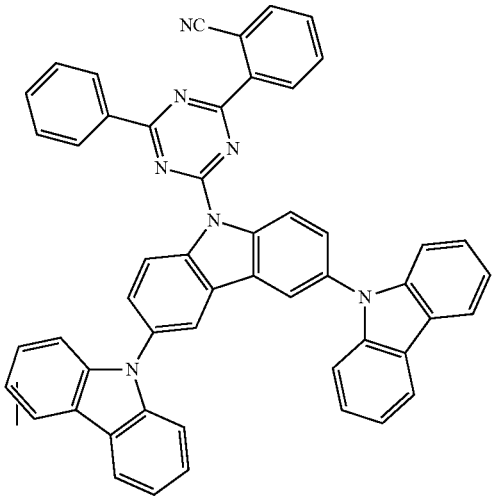
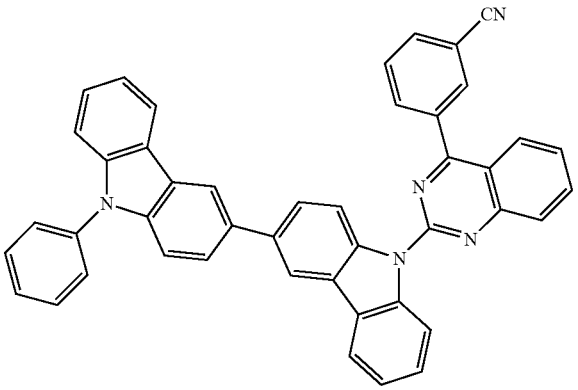
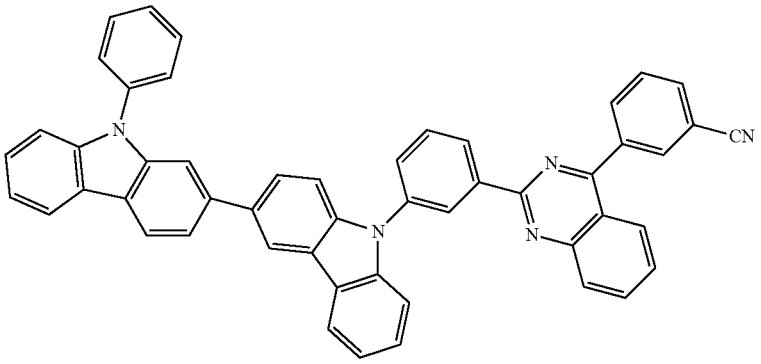
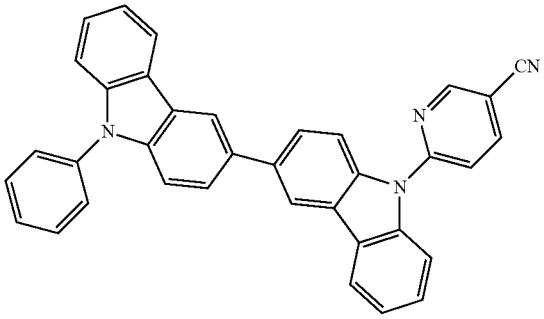

-continued
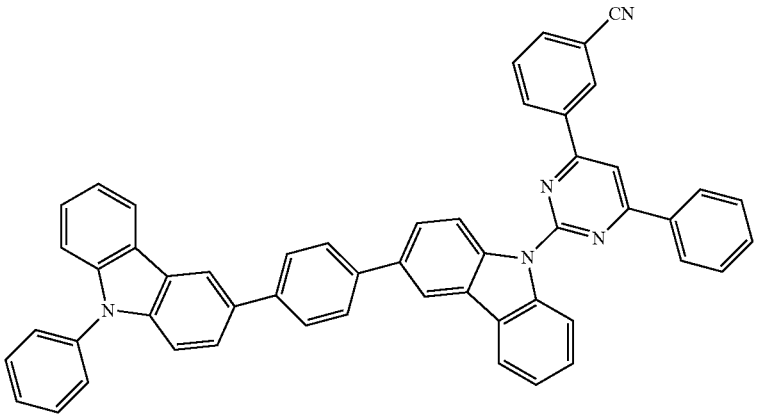
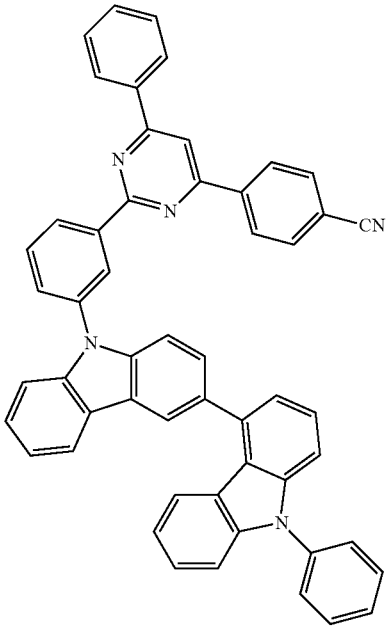
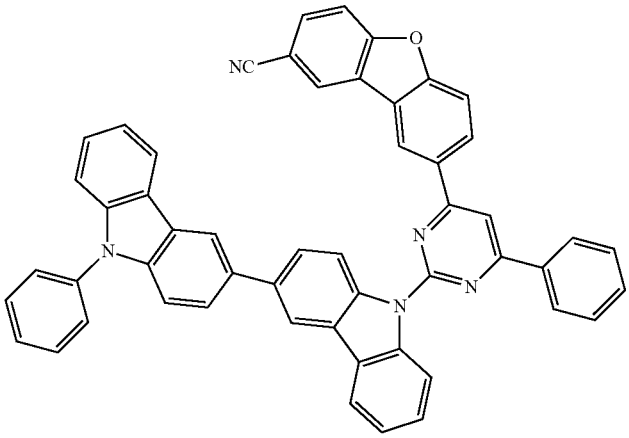
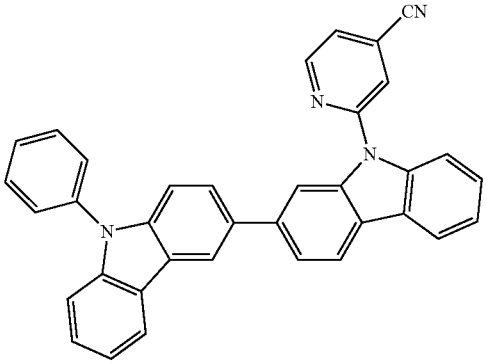
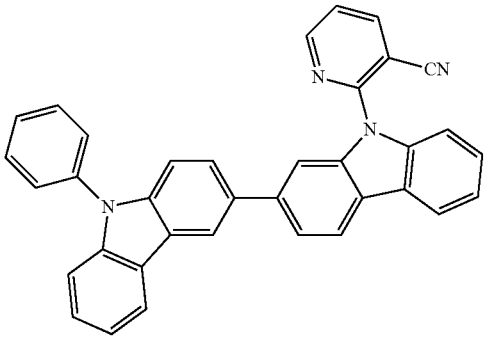
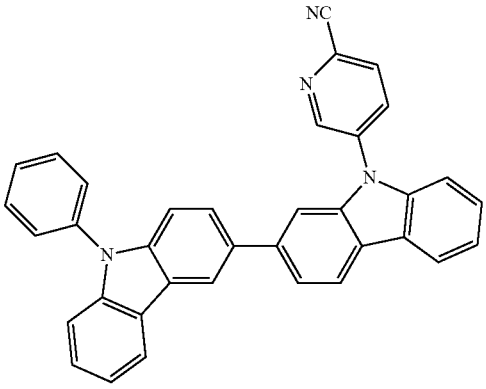

-continued
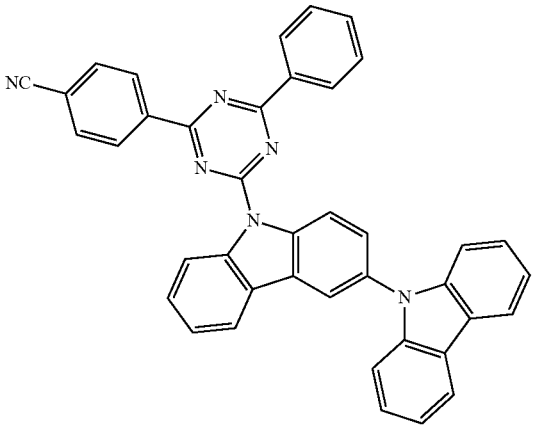
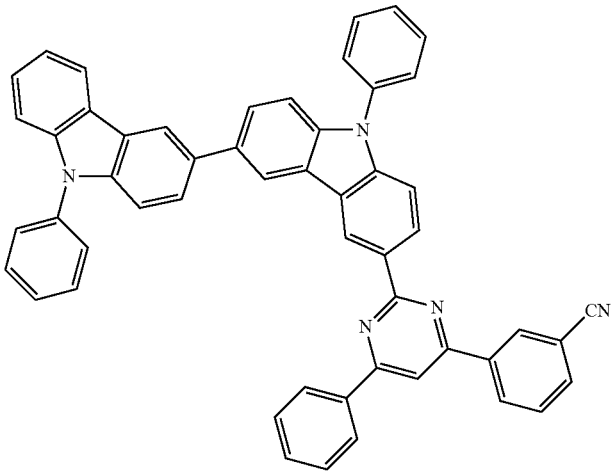
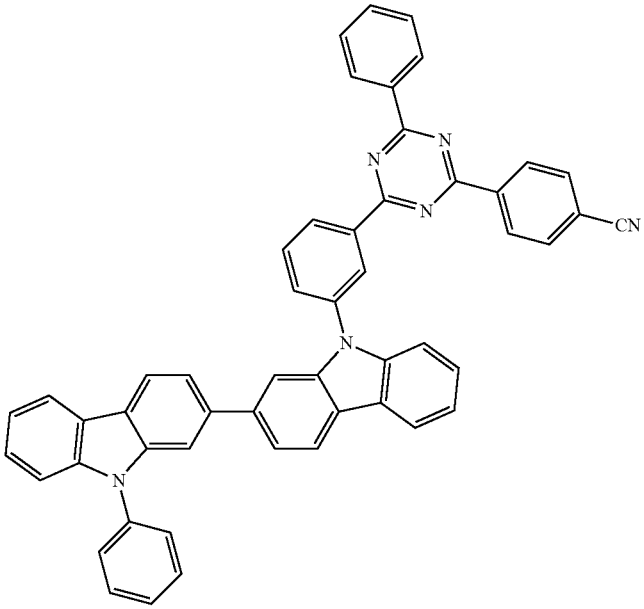
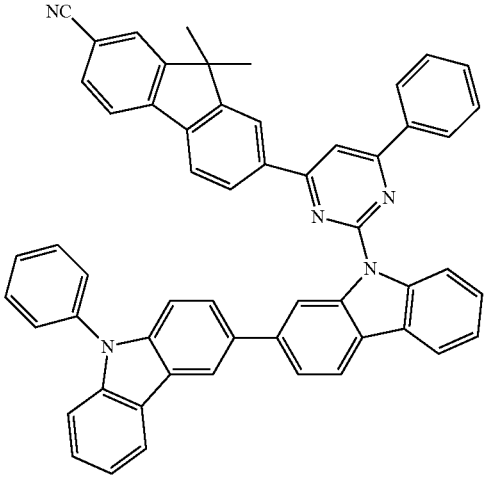
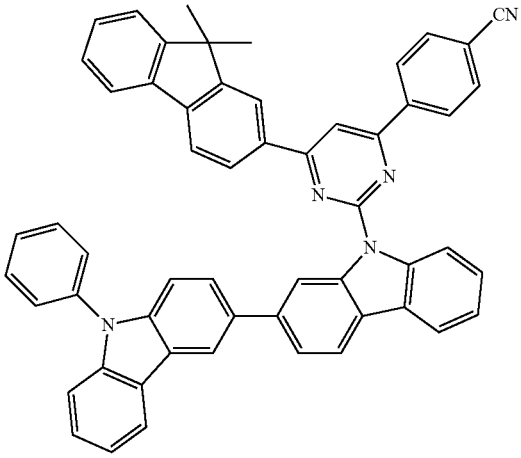
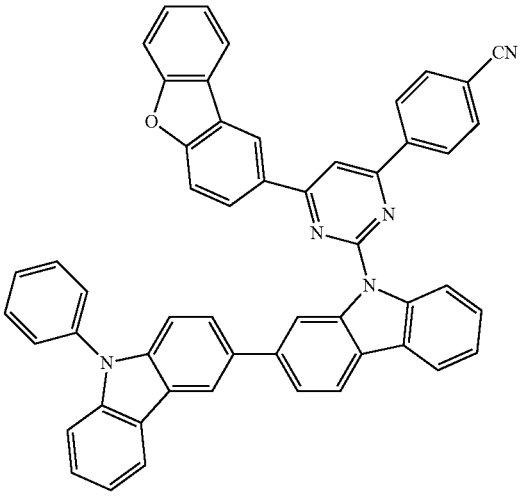

-continued
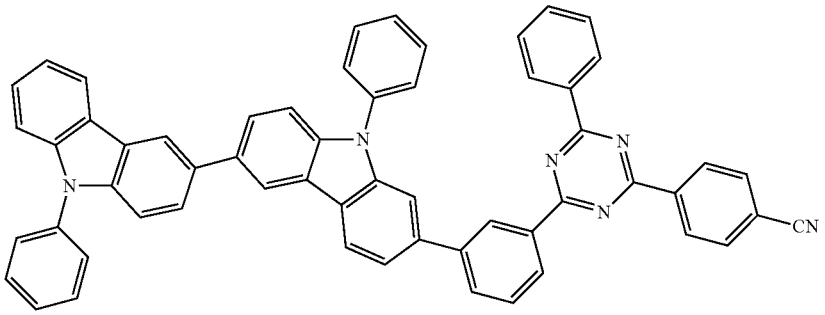
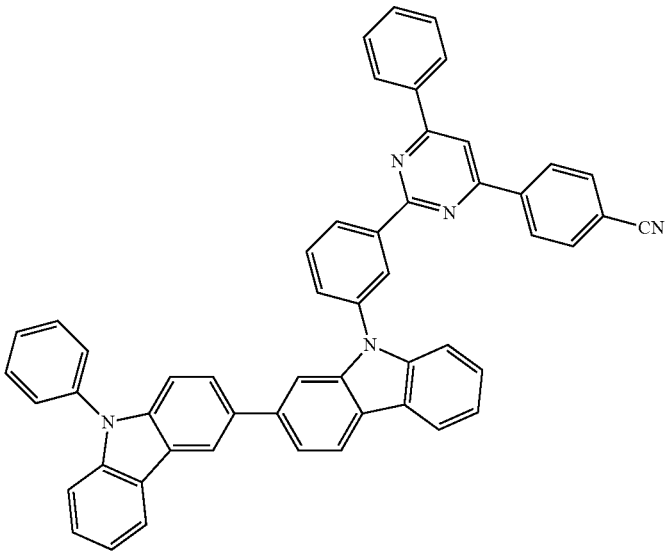
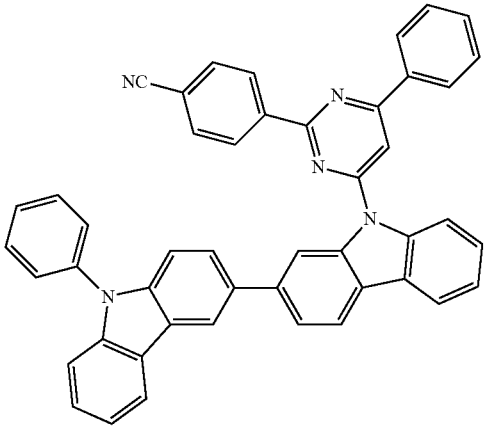
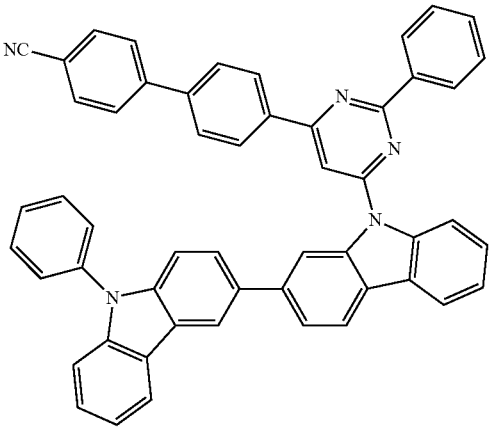

-continued
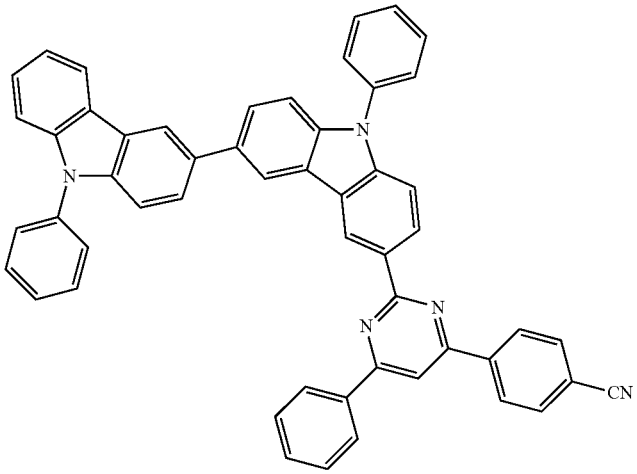
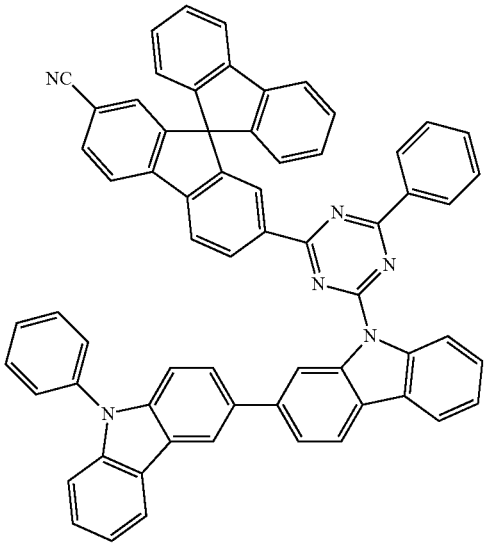
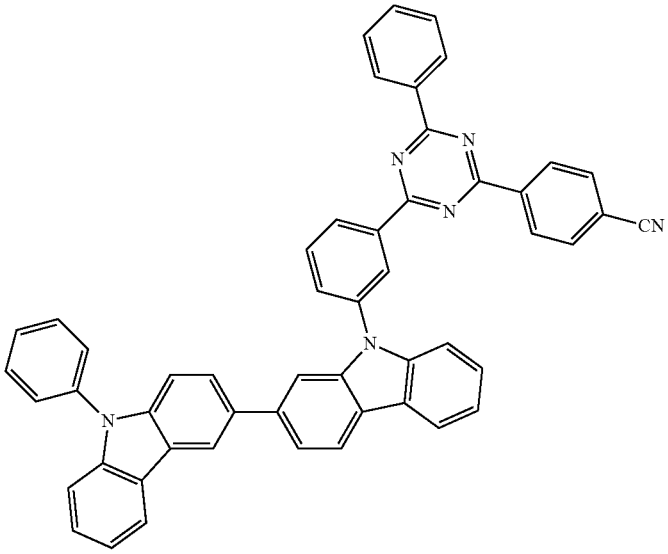
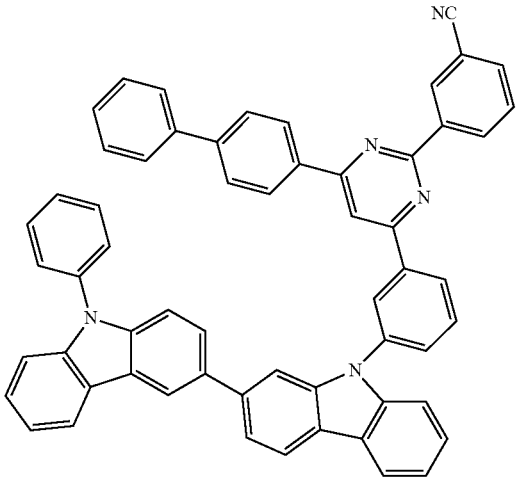

-continued
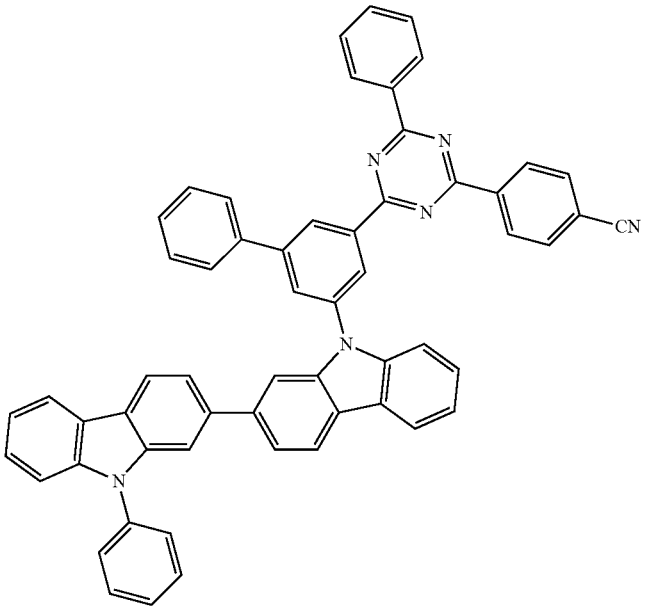
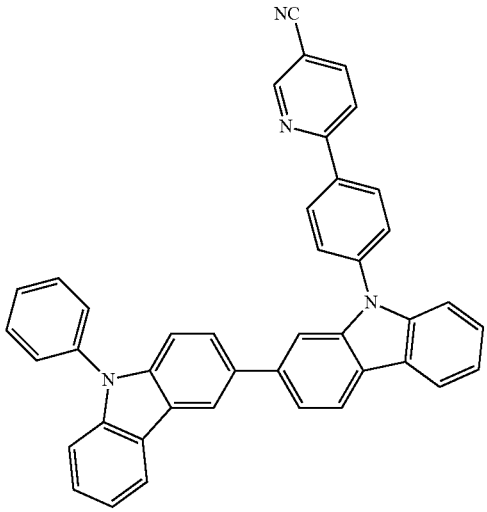
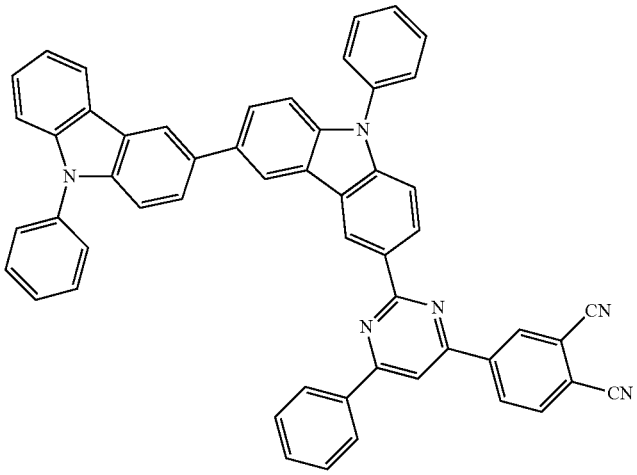
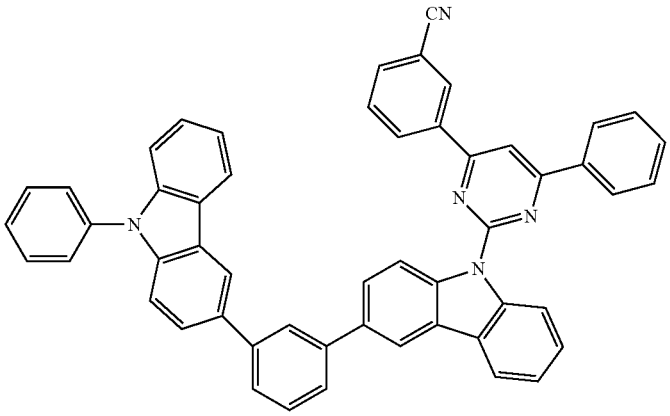

-continued
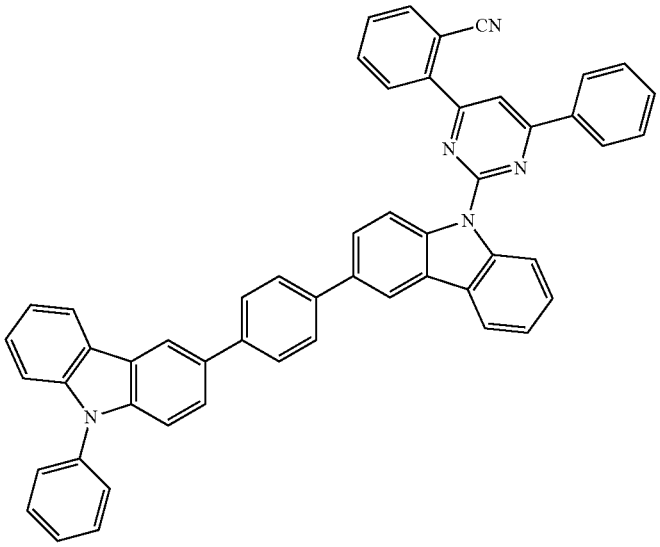
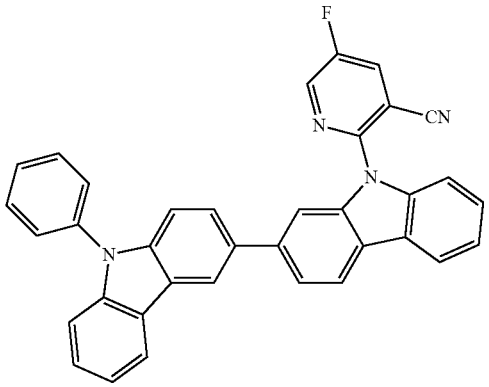
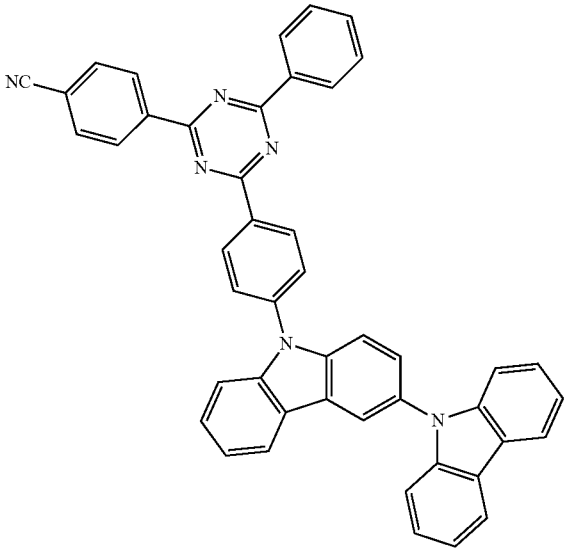
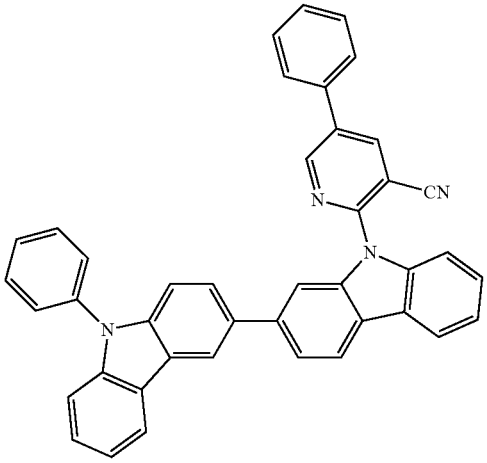
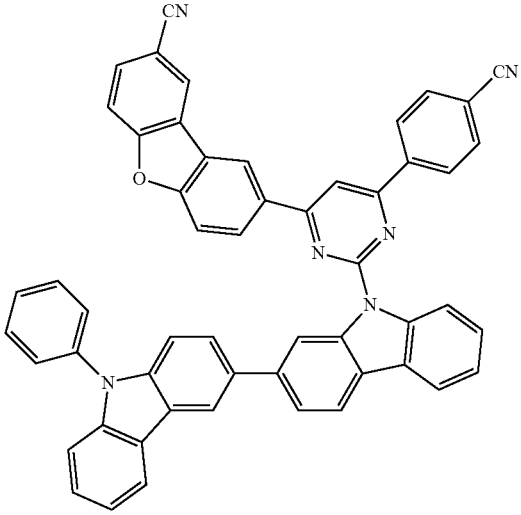
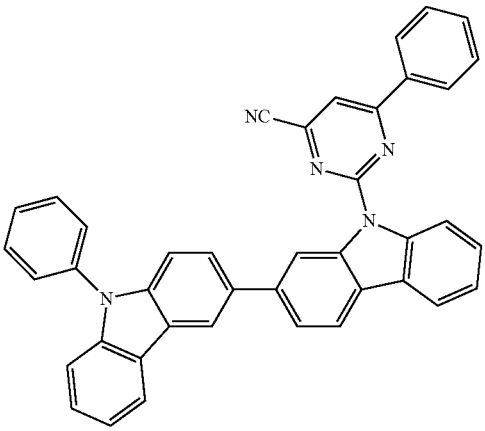

-continued
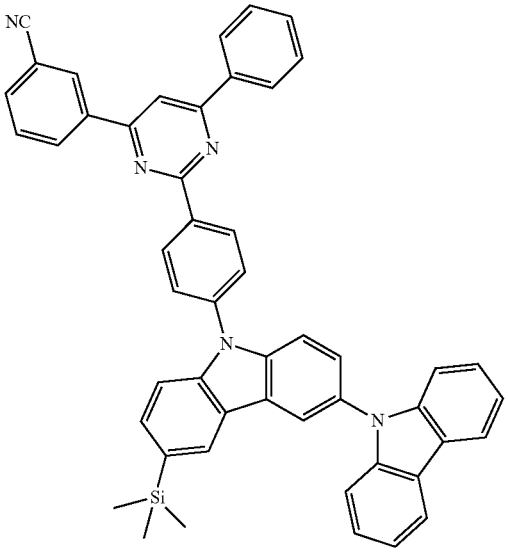
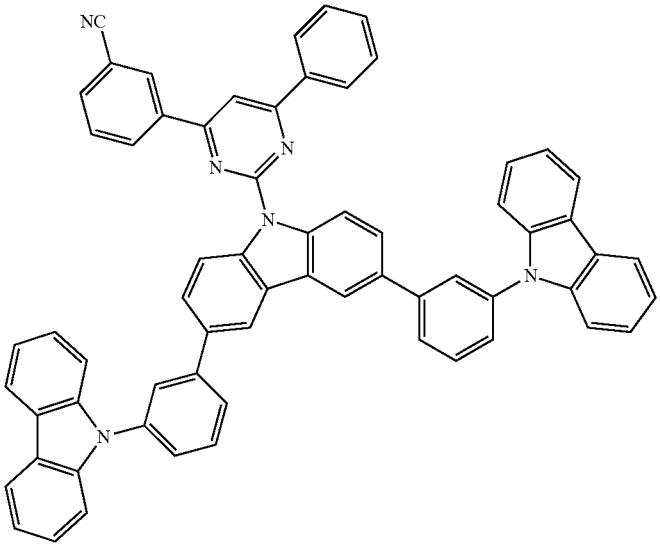
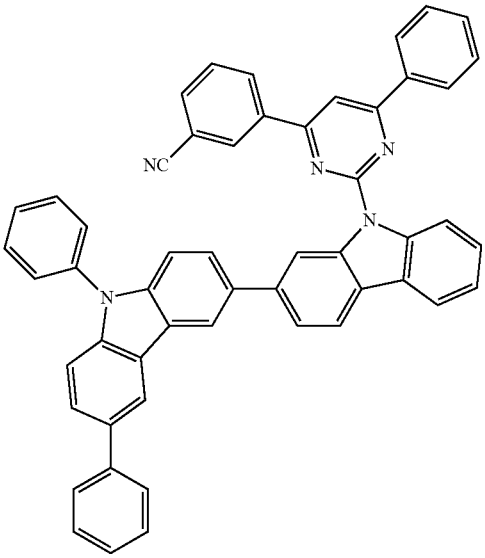
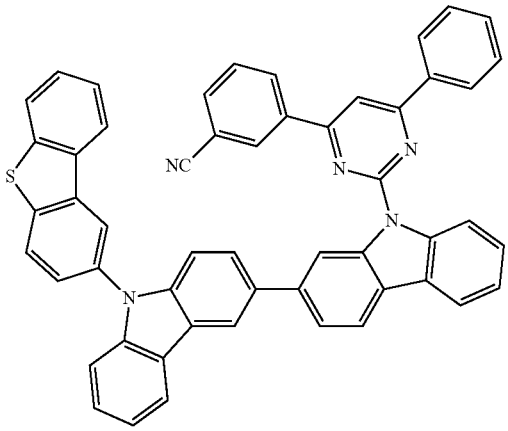
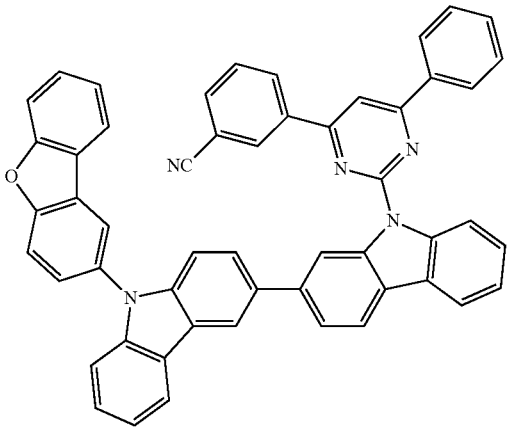

-continued
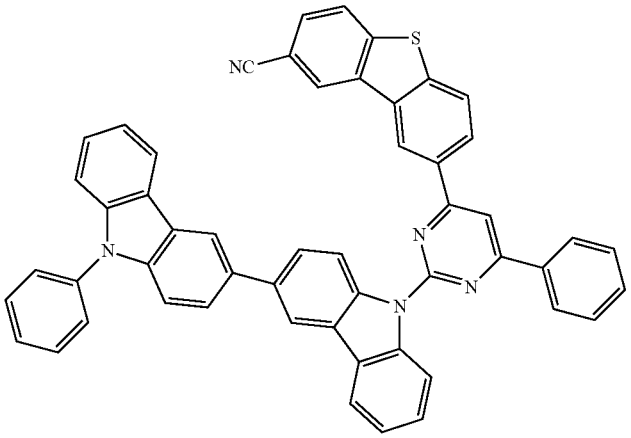
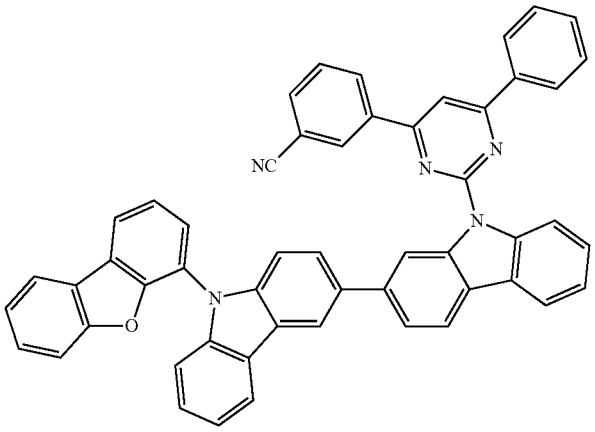
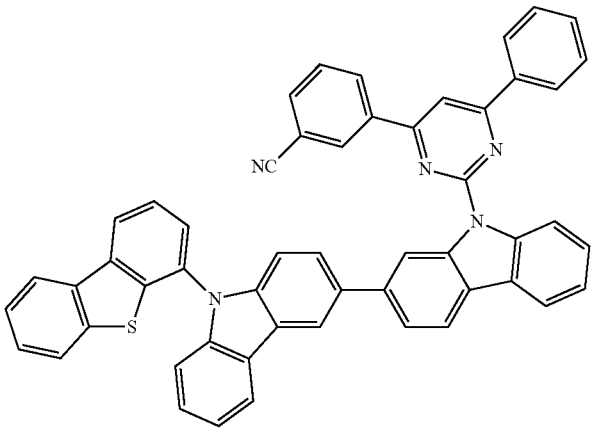

-continued
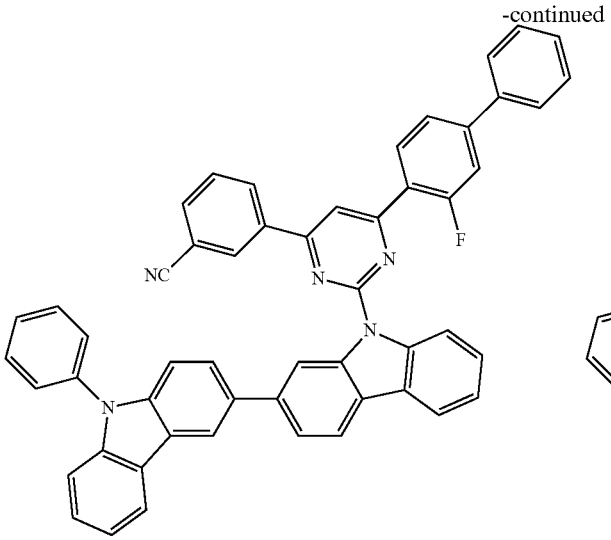
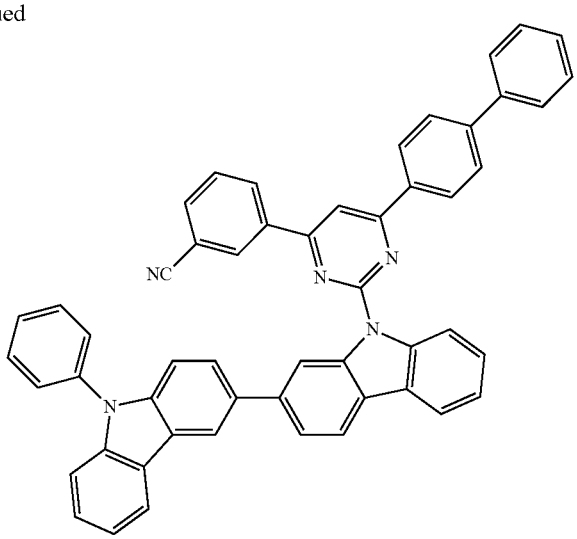
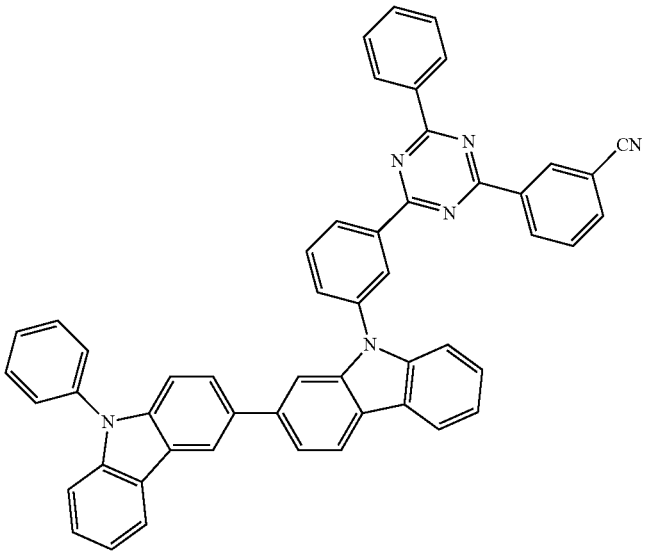
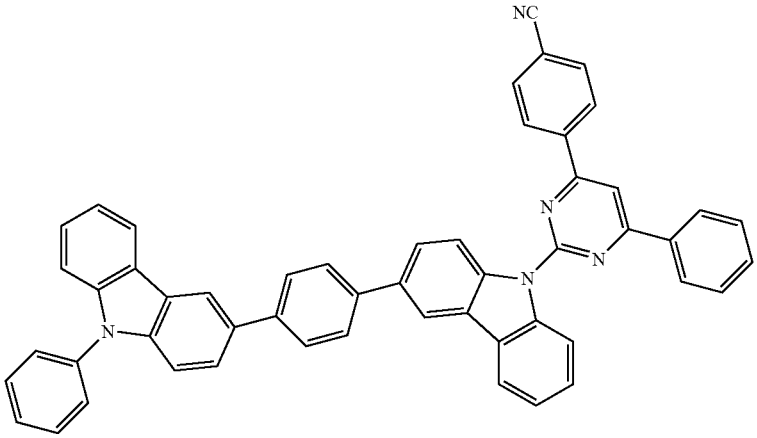

-continued
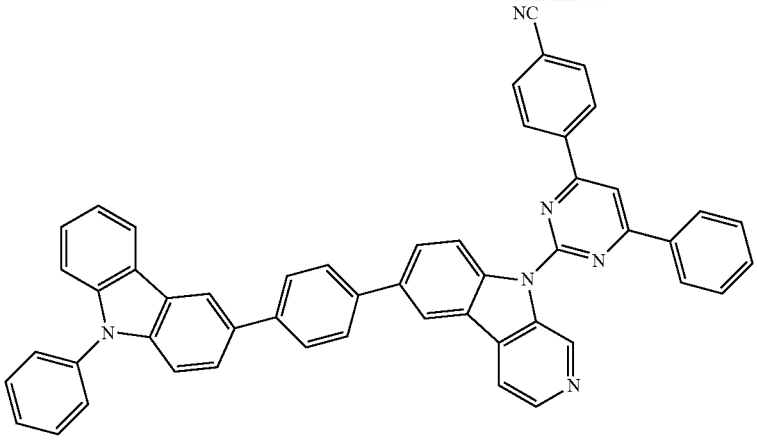
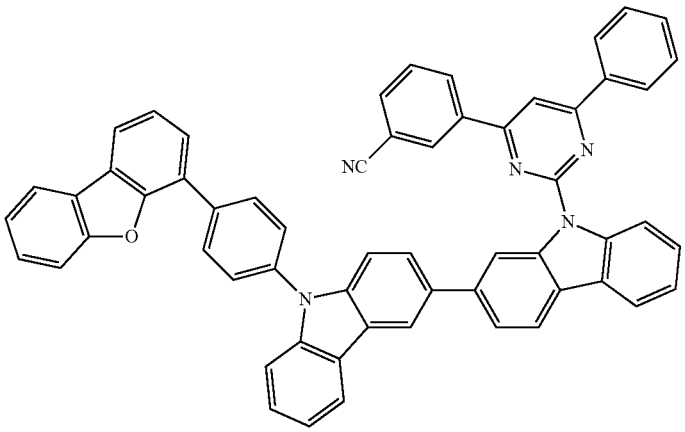
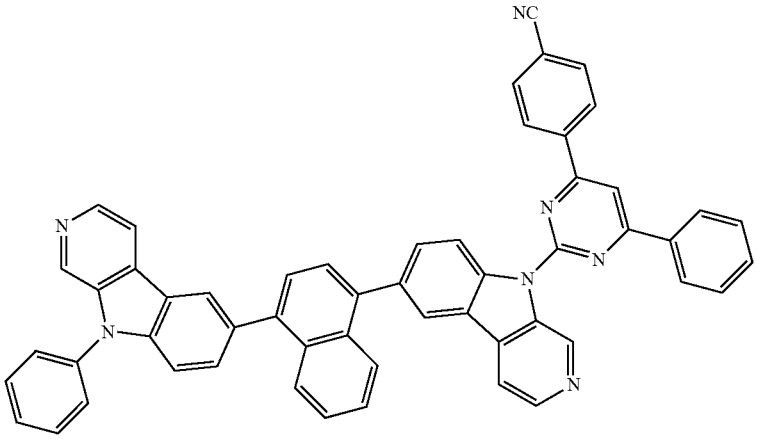
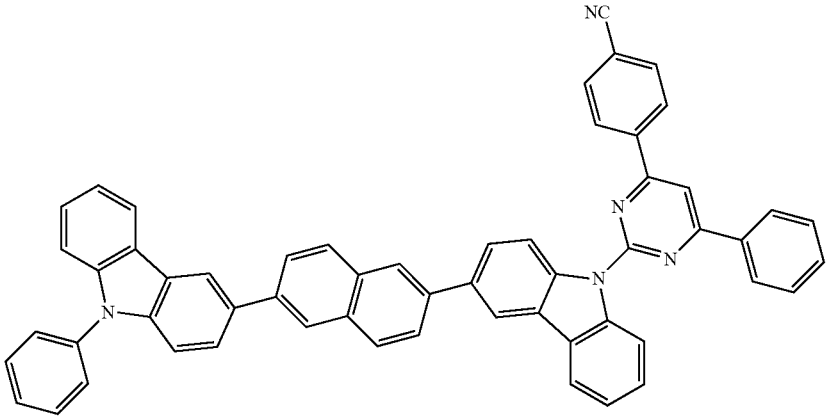

-continued
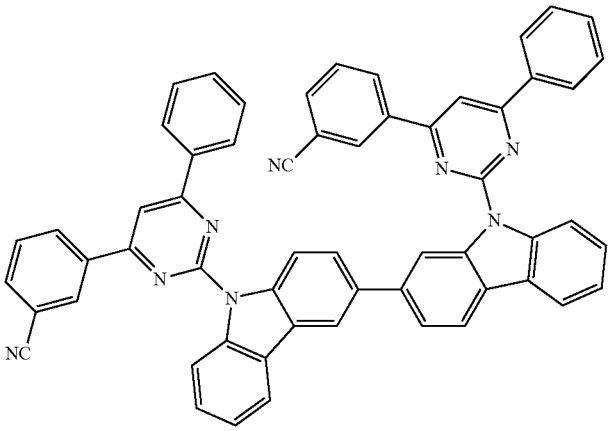
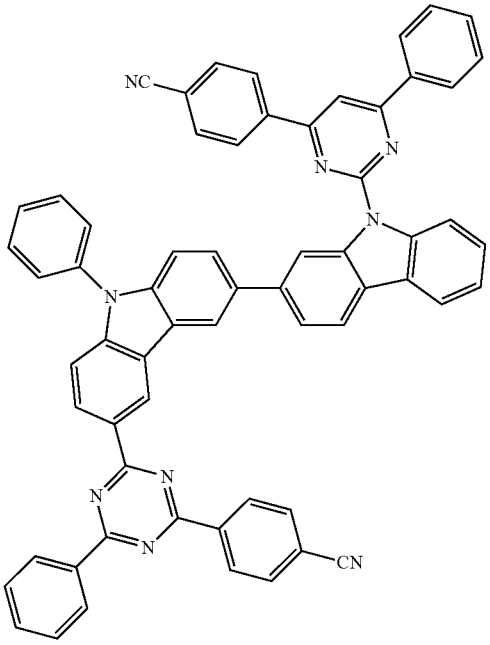
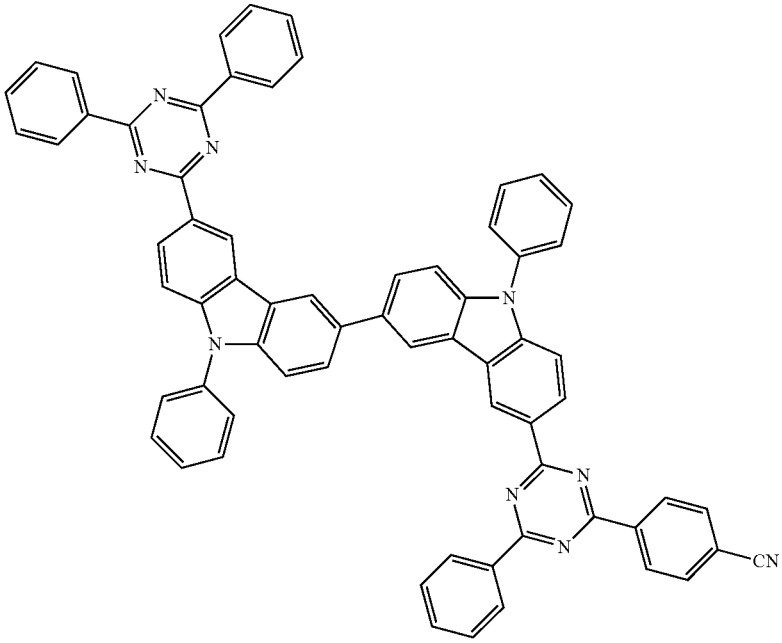
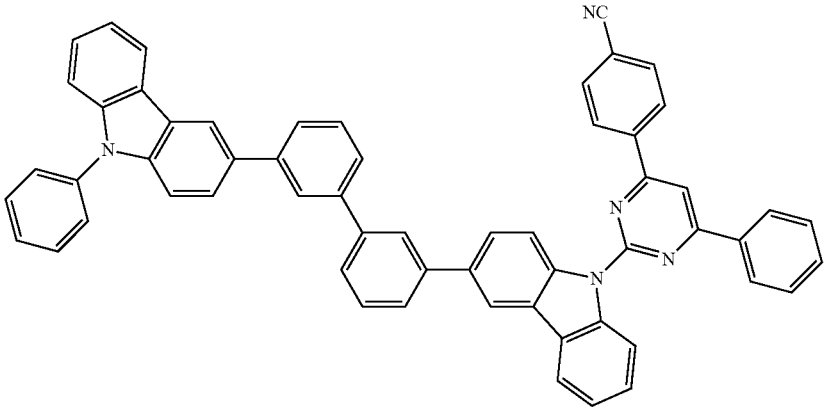

-continued
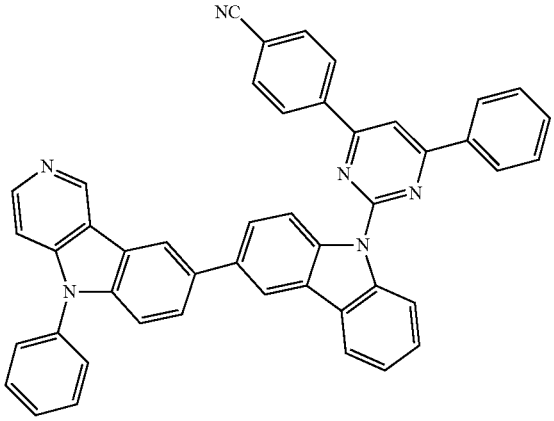
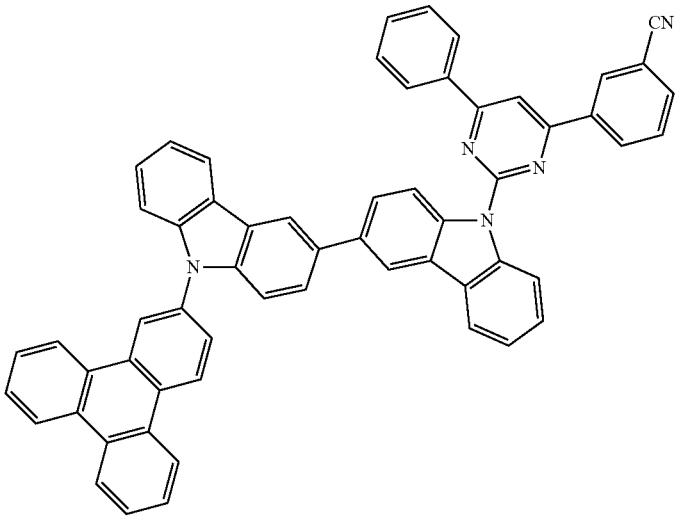
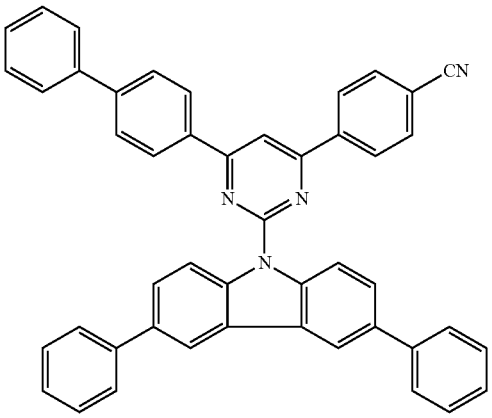
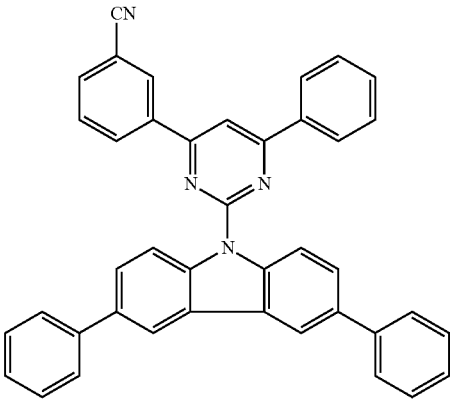

-continued
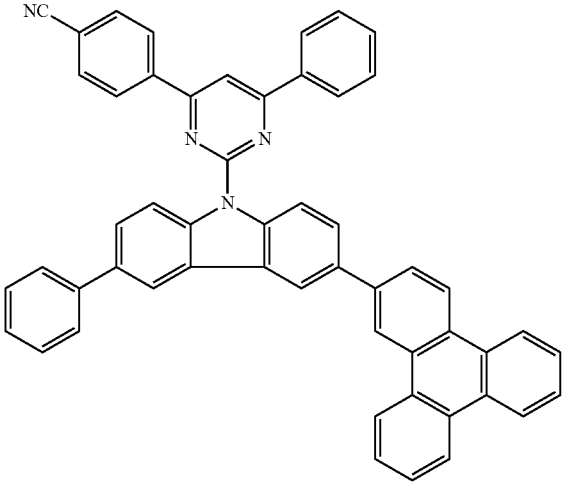
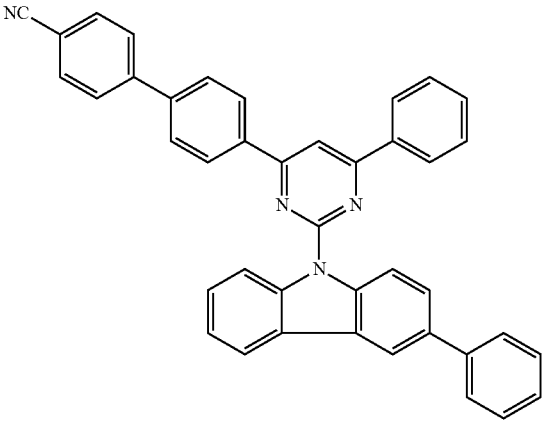
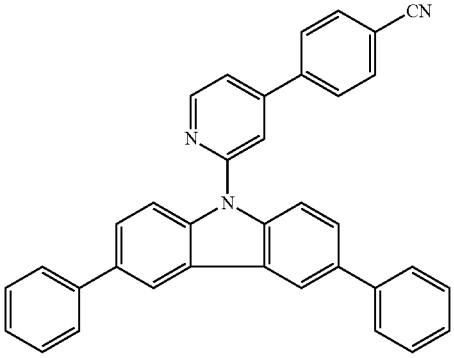
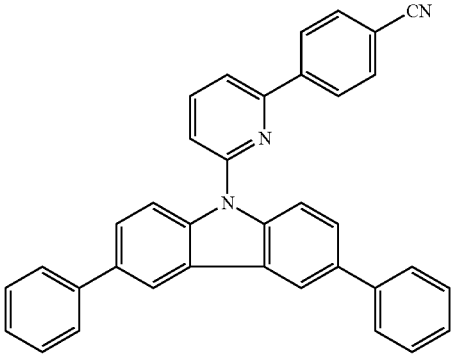
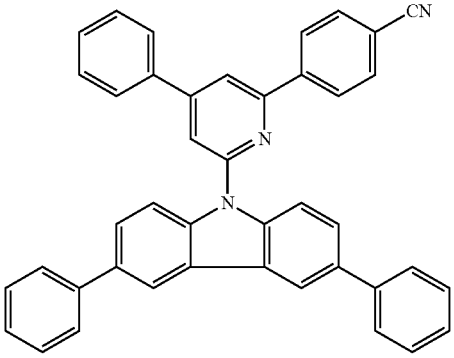
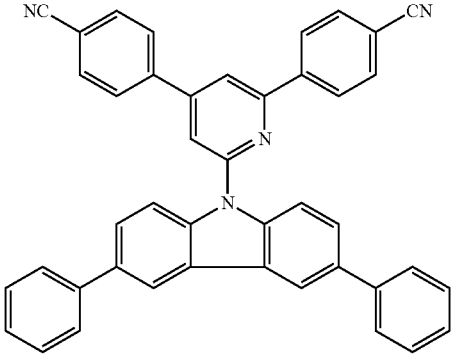
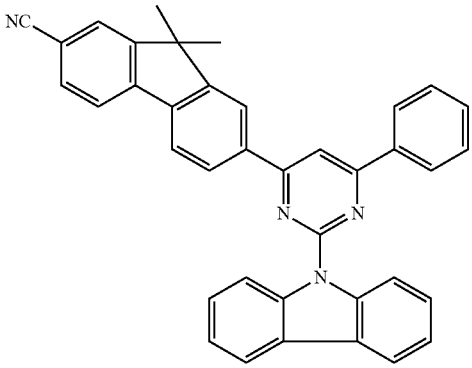
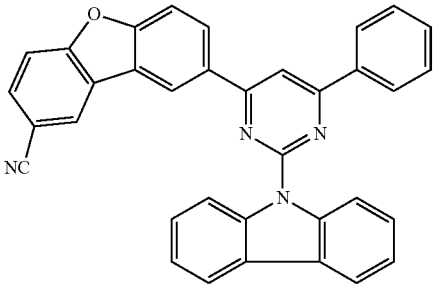

-continued
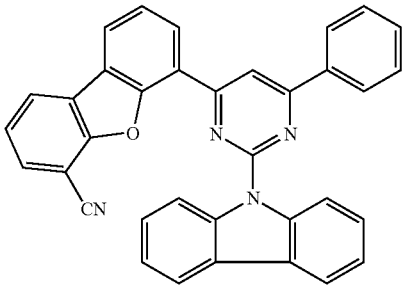
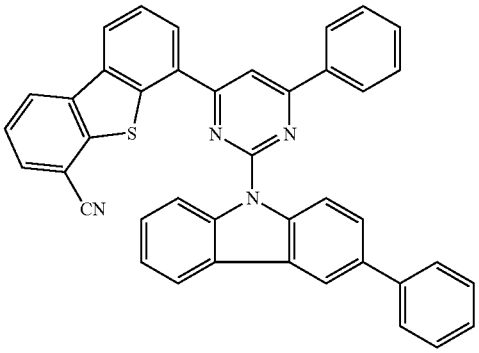
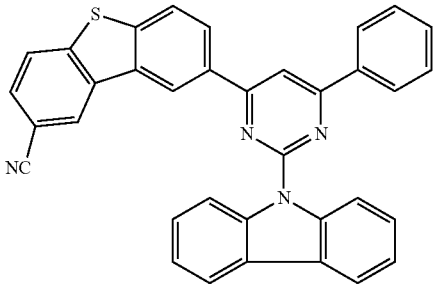
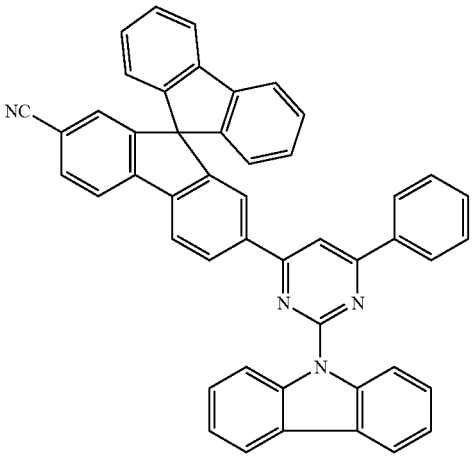
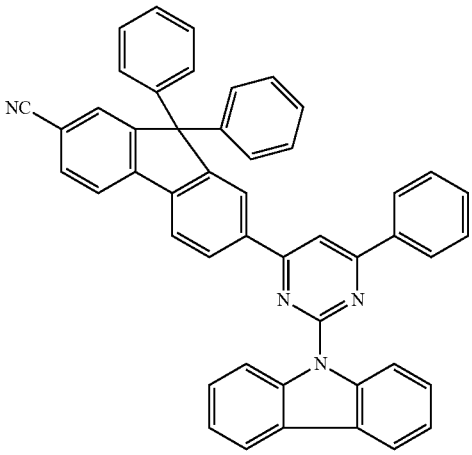
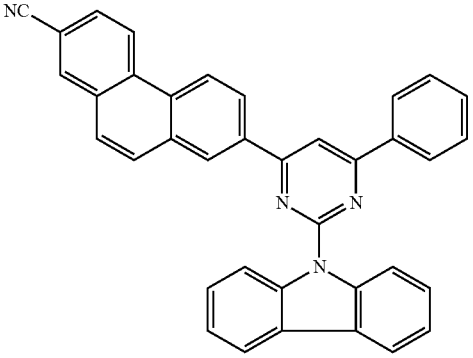
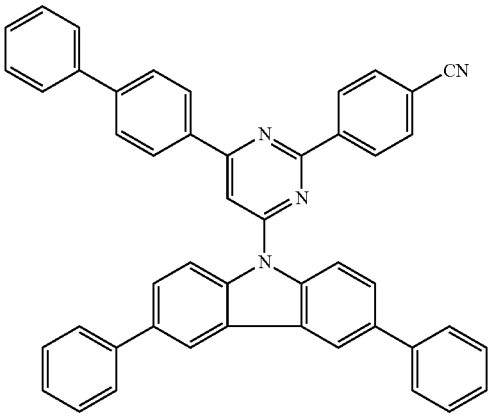
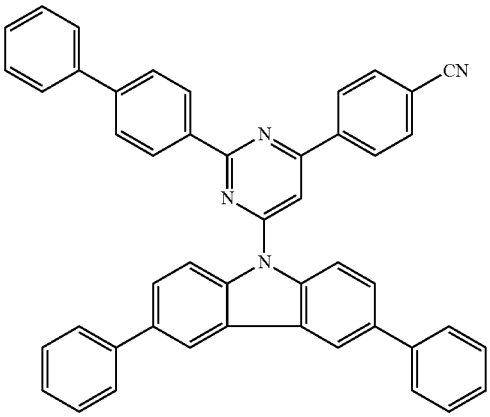

-continued
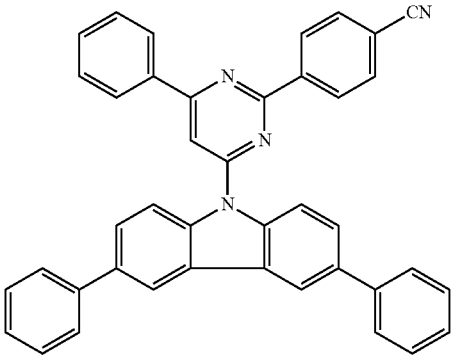
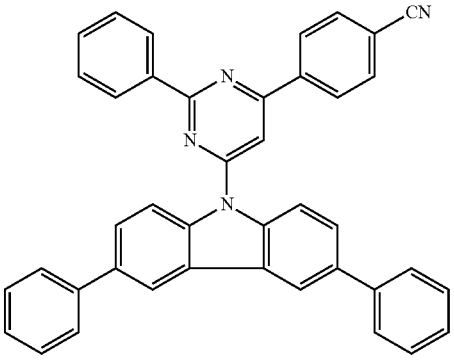
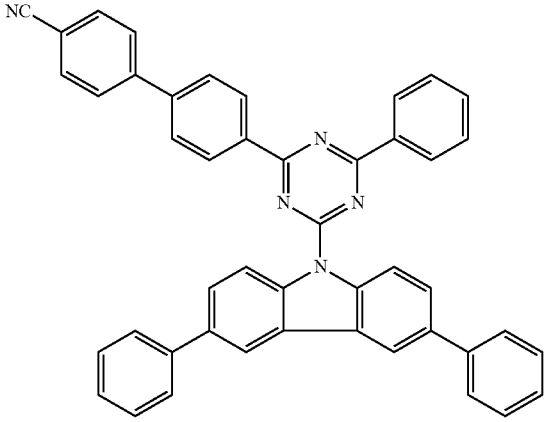
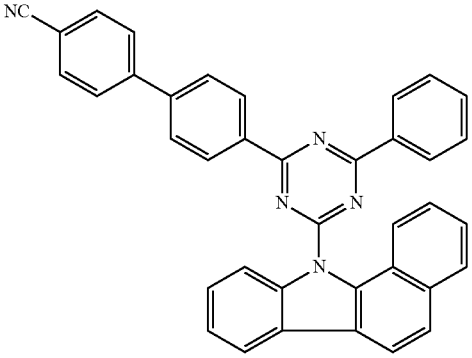
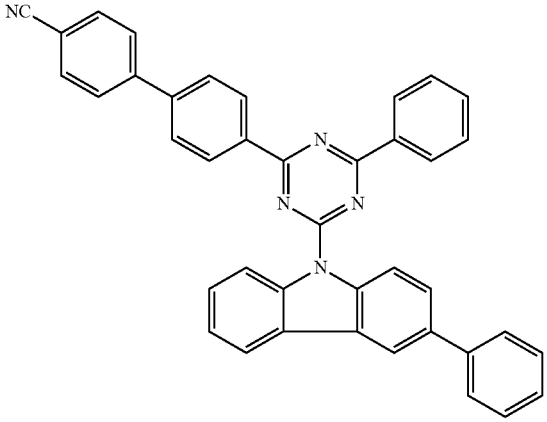
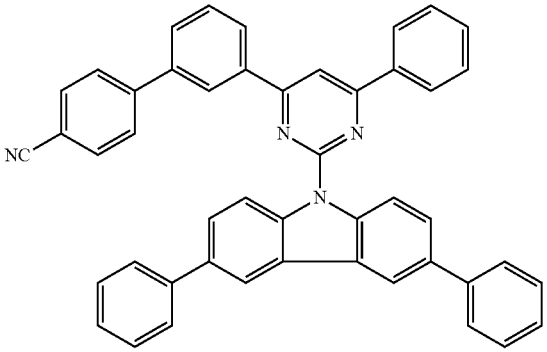
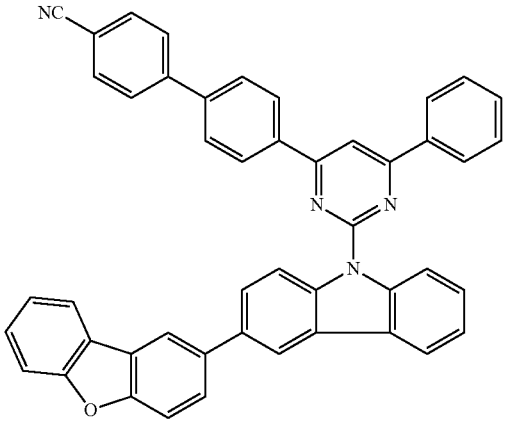
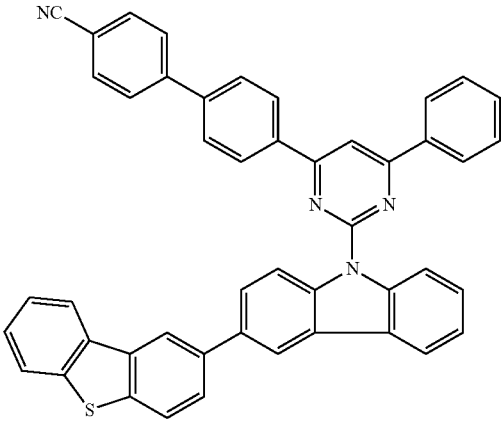

-continued
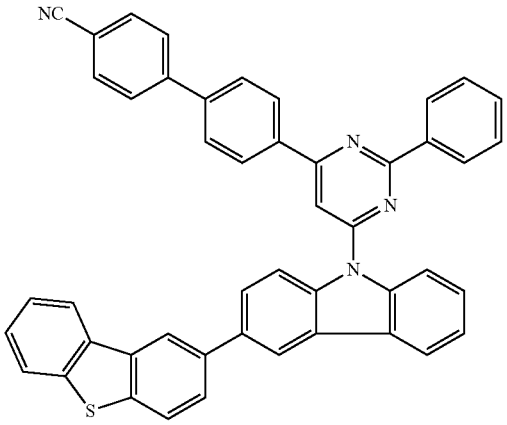
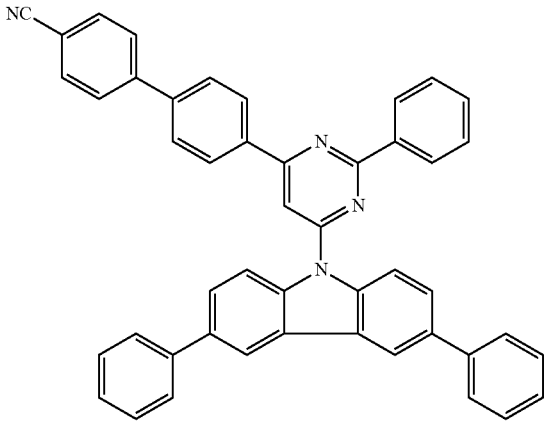
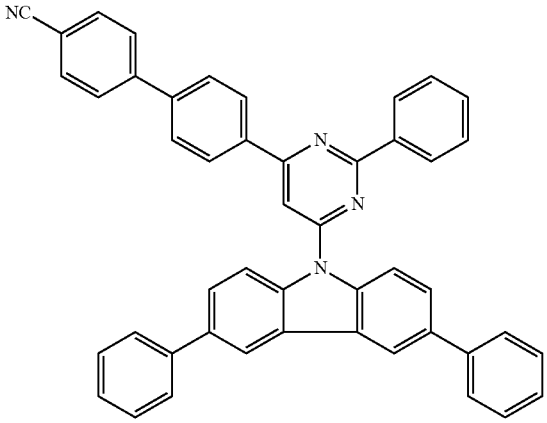
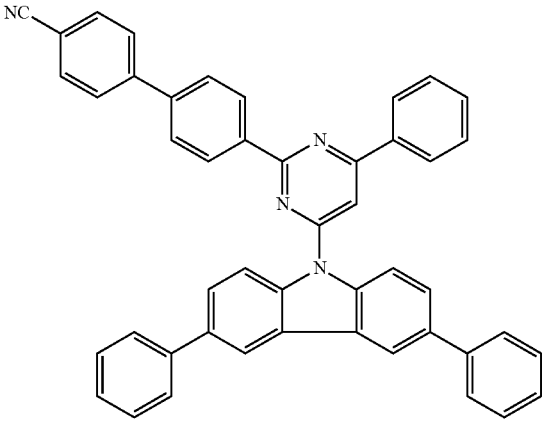
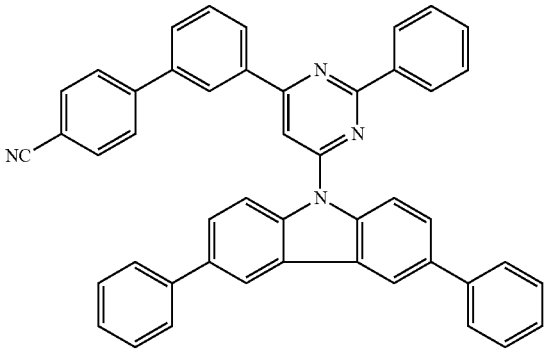
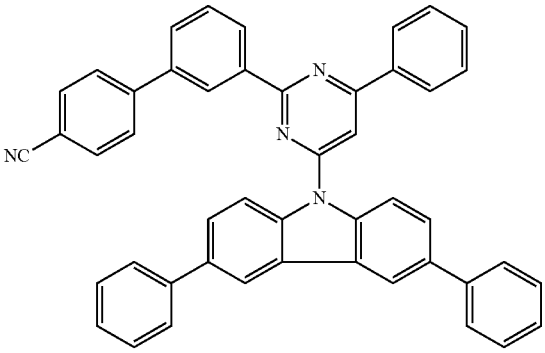
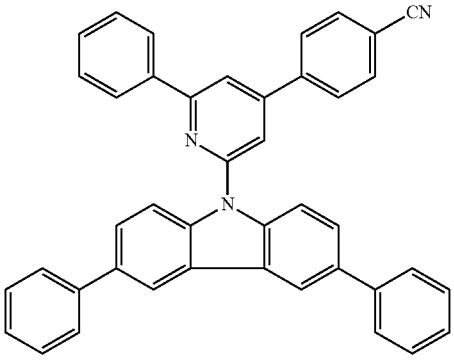
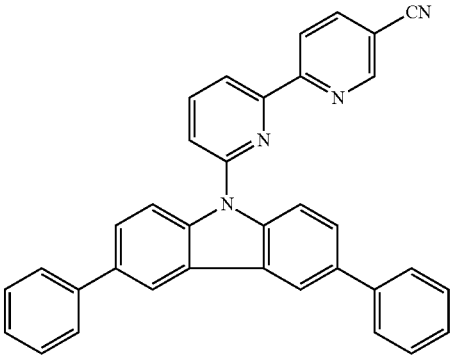

-continued
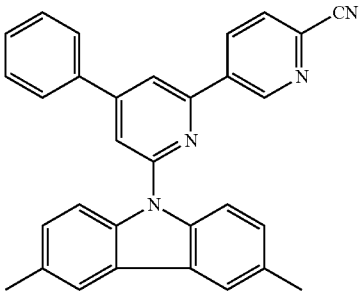
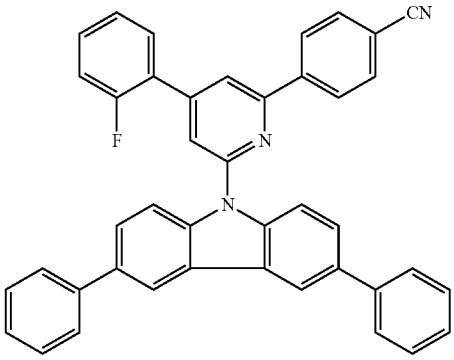
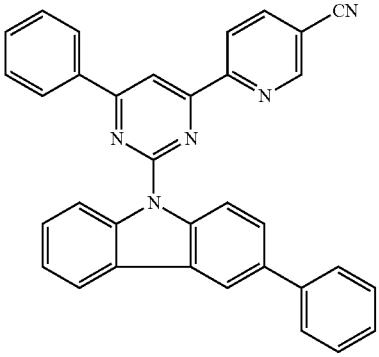
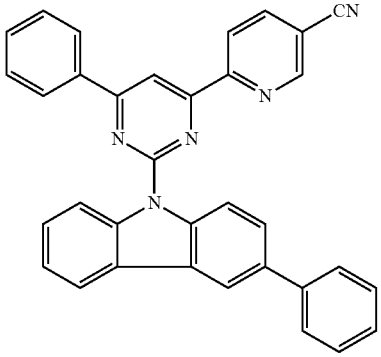
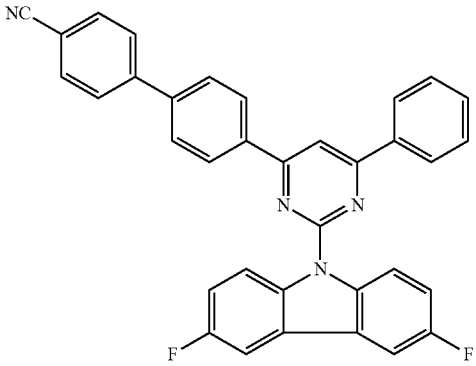
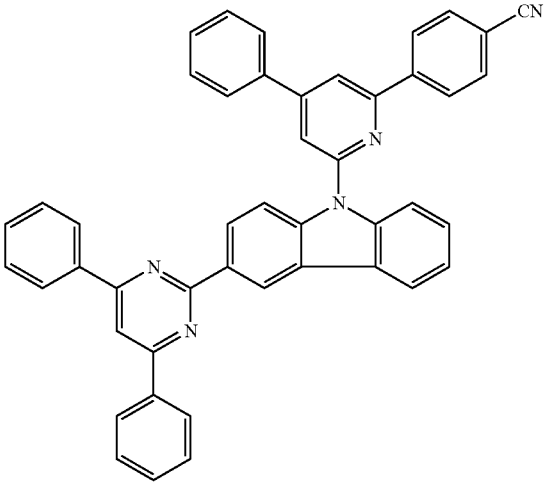
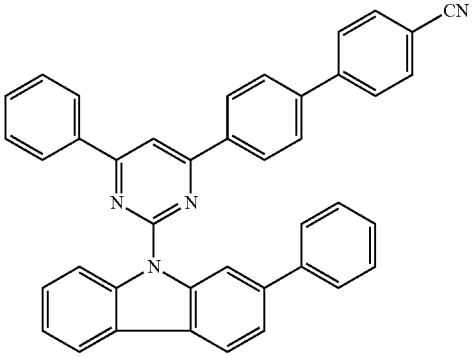
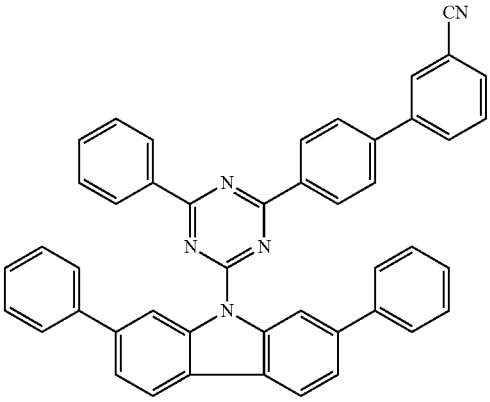

-continued
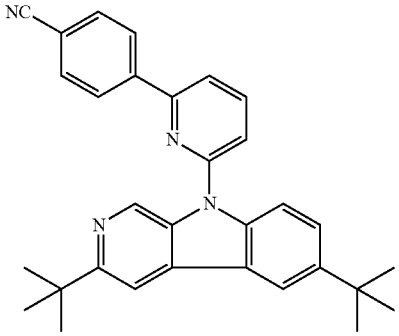
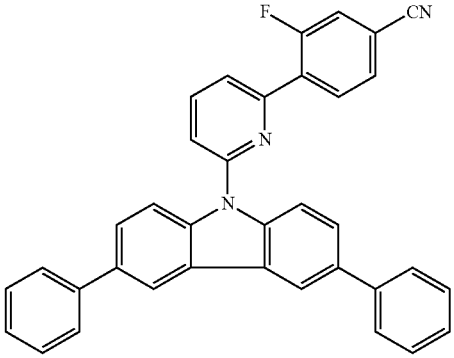
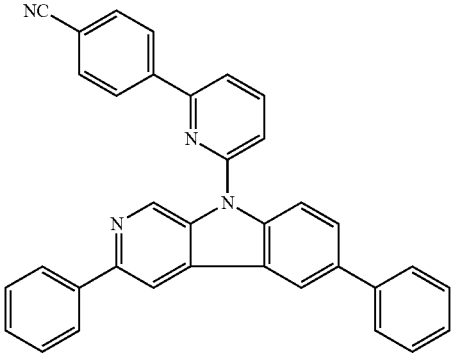
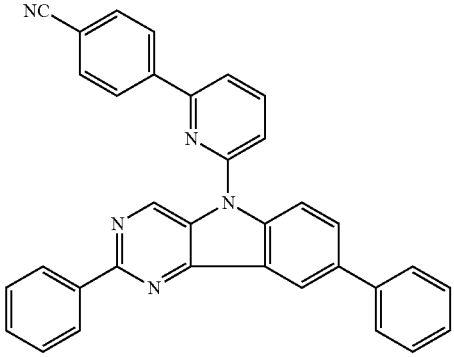
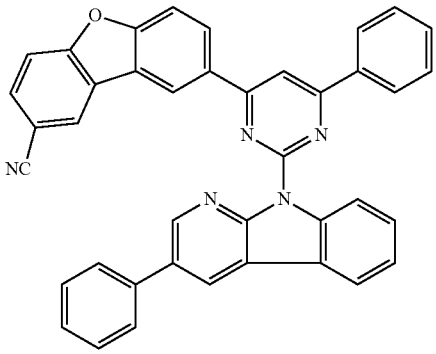
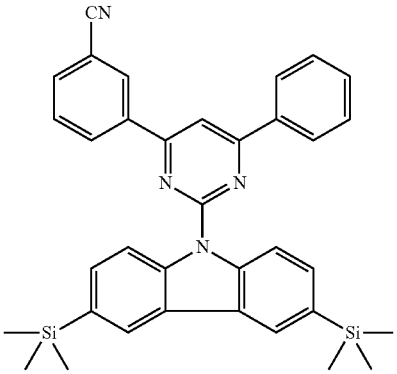
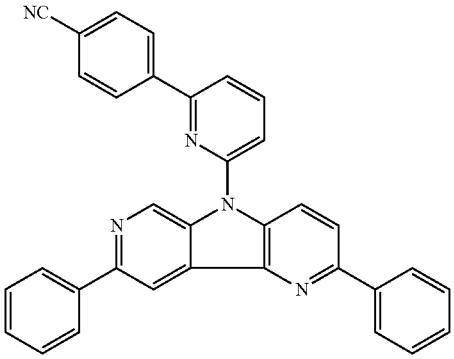
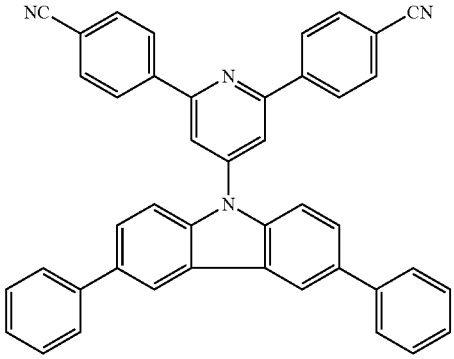

-continued
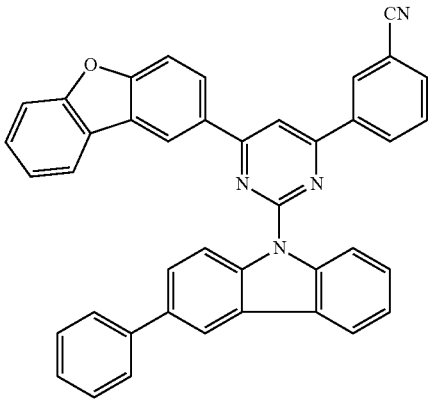
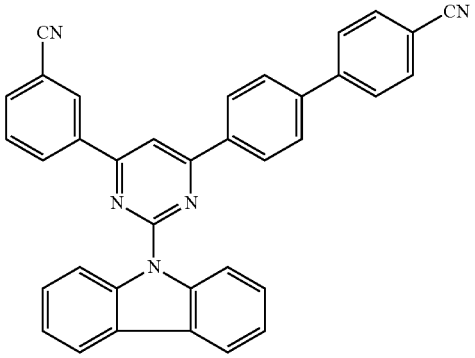
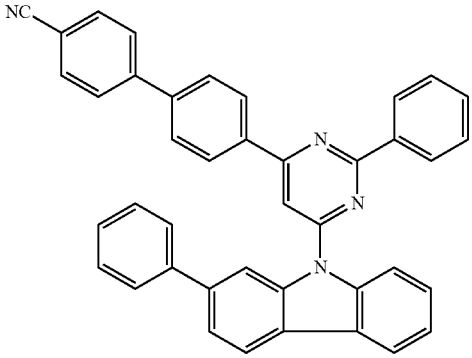
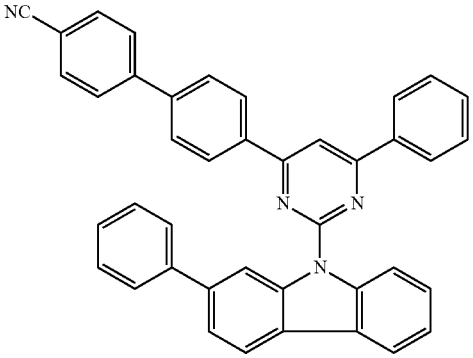
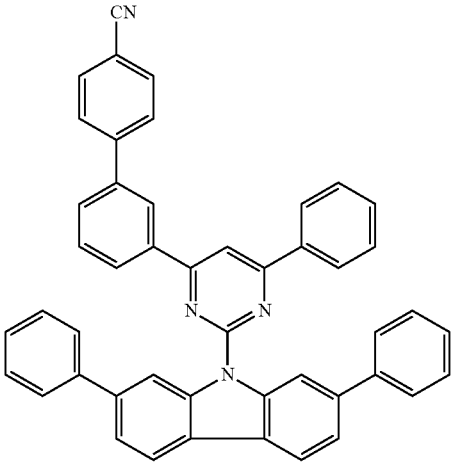
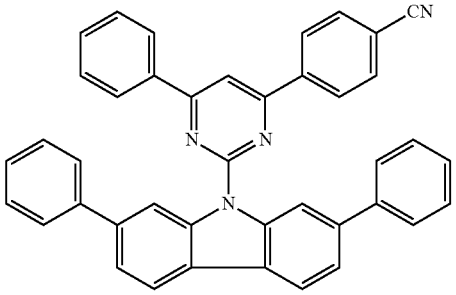
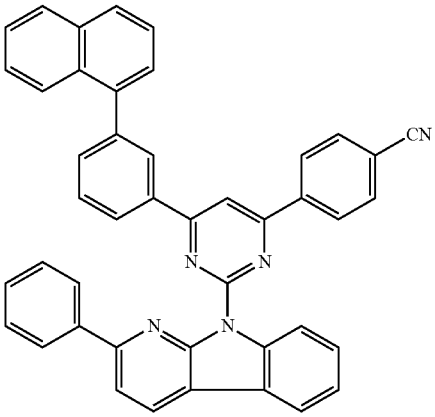
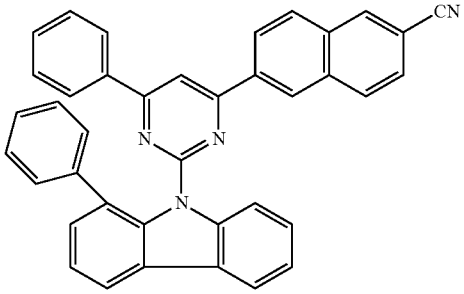

-continued
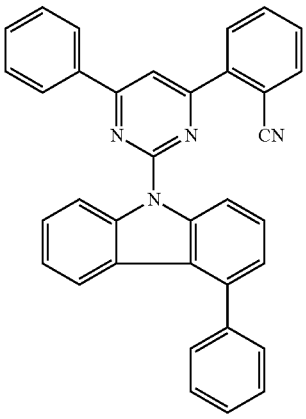
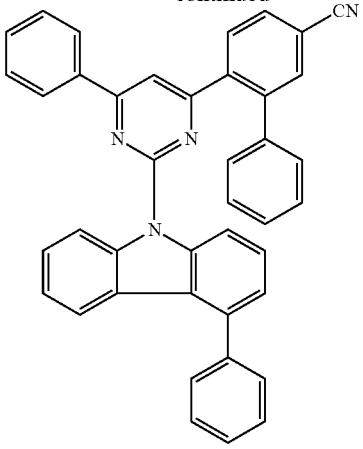
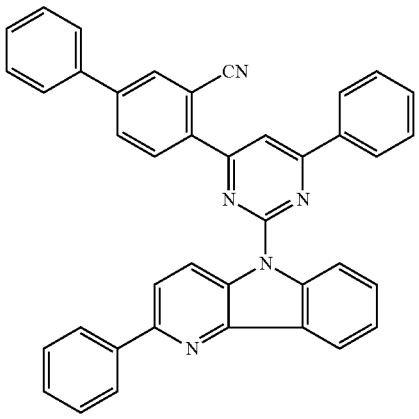
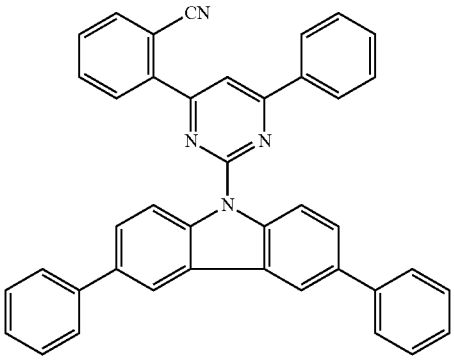
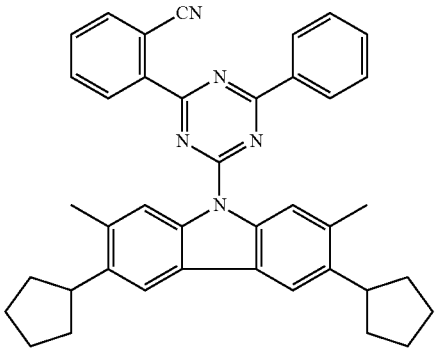
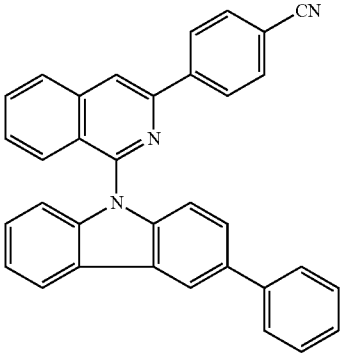
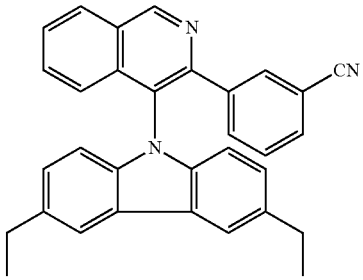
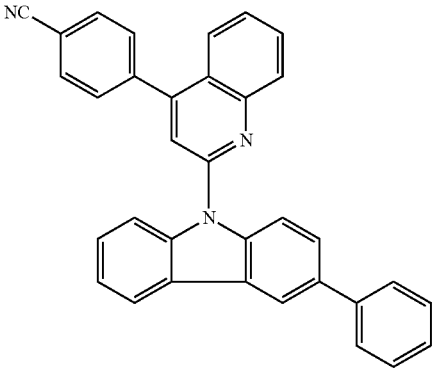
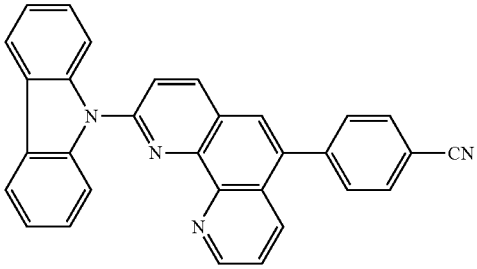
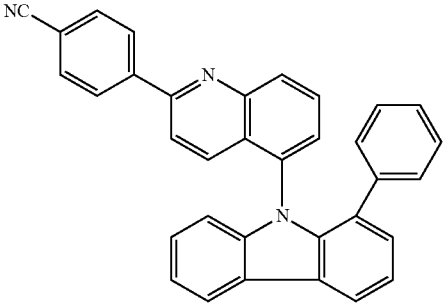

-continued

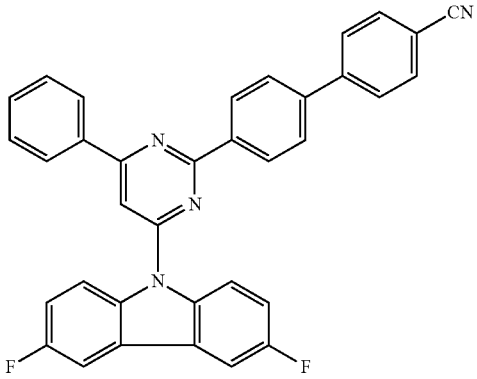

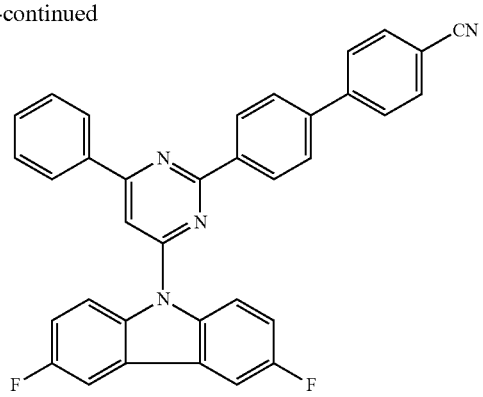

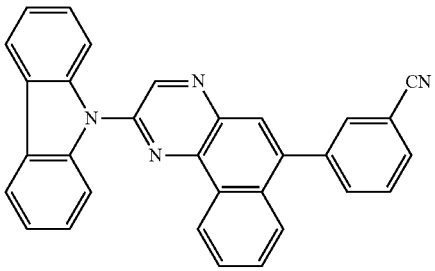

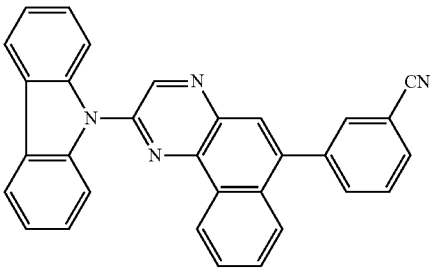

Second Host Material

The second host material used in the organic EL device according to the exemplary embodiment may be a compound having a partial structure represented by the following formula (3) and having no partial structure represented by the formula (1) or (2).

$$—Ar^1—(CN)_r \quad (3)$$

In the formula (3), $Ar^1$ is a substituted or unsubstituted aromatic hydrocarbon group or a substituted or unsubstituted aromatic heterocyclic group. The same description of the aromatic hydrocarbon group and the aromatic heterocyclic group for $W_{CN}$ applies to the aromatic hydrocarbon group and the aromatic heterocyclic group for $Ar^1$. It should be noted that $Ar^1$ is not an aromatic heterocyclic group including a nitrogen-containing six-membered ring.

In the formula (3), r represents the number of the cyano group (—CN) substituting for $Ar^1$ and is an integer of 1 or more. r is determined as the number of the cyano group bondable to r depending on a structure of $Ar^1$.

In the formula (3), the cyano-substituted aromatic hydrocarbon group having 6 to 30 ring carbon atoms and the cyano-substituted aromatic heterocyclic group having 5 to 30 ring atoms may be further substituted by a substituent other than a cyano group. The substituent herein is the same as those for the first host material.

The second host material may have a plurality of partial structures represented by the formula (3). In this arrangement, the partial structures represented by the formula (3) are mutually the same or different.

In addition, a mixture of plural kinds of compounds may be used as the second host material.

The second host material is preferably represented by the following formula (3-1).

$$Ar^3—Ar^1—(CN)_r \quad (3\text{-}1)$$

In the formula (3-1), $Ar^3$ represents a substituted or unsubstituted aromatic hydrocarbon group having 6 to 30 ring carbon atoms, or substituted or unsubstituted aromatic heterocyclic group having 5 to 30 ring atoms. The same description of the aromatic hydrocarbon group for $W_{CN}$ and the same description of the aromatic heterocyclic group for $W_{CN}$ apply to $Ar^3$.

$Ar^1$ and r in the formula (3-1) are the same as $Ar^1$ and r in the formula (3).

The second host material is preferably represented by the following formula (5).

(5)

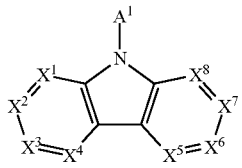

In the formula (5), $A^1$ is a group represented by the formula (3).

In the formula (5), $X^1$ to $X^8$ each independently represent N (nitrogen atom) or $CR^a$.

In the formula (5), $R^a$ each independently represents a hydrogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted silyl group, a halogen atom, or a cyano group. When a plurality of $R^a$ are present, the plurality of $R^a$ are the same or different. $R^a$ represents the same as those for $R^c$ in the first host material.

In the formula (5), when adjacent two of $X^1$ to $X^8$ are $CR^a$, a part of $R^a$ in the adjacent $CR^a$ may be bonded to a part of the other $R^a$ to form a cyclic structure.

When a plurality of $R^a$ are present, the plurality of $R^a$ may be mutually the same or different.

In the formula (5), preferably, $X^1$ to $X^8$ each independently represent $CR^a$.

The second host material is preferably represented by the following formula (5-1).

(5-1)

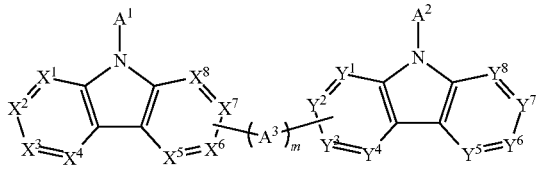

In the formula (5-1), $A^1$ represents a group having a partial structure represented by the formula (3).

In the formula (5-1), $A^2$ each independently represents the group having the partial structure represented by the formula (3), a substituted or unsubstituted aromatic hydrocarbon group having 6 to 30 ring carbon atoms, or a substituted or unsubstituted aromatic heterocyclic group having 5 to 30 ring atoms.

The same description of the aromatic hydrocarbon group for $W_{CN}$ in the first host material applies to the aromatic hydrocarbon group for $A^2$.

The same description of the aromatic heterocyclic group for $W_{CN}$ in the first host material applies to the aromatic heterocyclic group for $A^2$.

When $A^2$ is the group having the partial structure represented by the formula (3), $A^1$ and $A^2$ may be the same group or different groups.

In the formula (5-1), $A^3$ represents $A^3$ represents a substituted or unsubstituted divalent aromatic hydrocarbon group having 6 to 30 ring carbon atoms, a substituted or unsubstituted divalent aromatic heterocyclic group having 5 to 30 ring atoms, a substituted or unsubstituted cycloalkylene group having 5 to 30 ring carbon atoms, or a group in which the above groups are linked.

Examples of $A^3$ representing the divalent aromatic hydrocarbon group having 6 to 30 ring carbon atoms are the same as those of the divalent aromatic hydrocarbon group described for $W_{CN}$, among which a phenylene group, biphenylene group and naphthylene group are preferable.

Examples of $A^3$ representing the divalent aromatic heterocyclic group having 6 to 30 ring carbon atoms are the same as those of the divalent aromatic heterocyclic group described for $W_{CN}$, among which a dibenzofuranylene group and a dibenzothiophenylene group are preferable.

In the formula (5-1), m is an integer of 0 to 3. m is preferably an integer of 0 to 2, more preferably 0 or 1. When m is 0, one of $X^5$ to $X^8$ is bonded to one of $Y^1$ to $Y^4$ through a single bond.

Moreover, $A^3$ is preferably a single bond, a substituted or unsubstituted divalent monocyclic hydrocarbon group having at most 6 ring carbon atoms, or a substituted or unsubstituted divalent monocyclic aromatic heterocyclic group having at most 6 ring atoms.

Examples of $A^3$ representing the monocyclic hydrocarbon group having at most 6 ring carbon atoms include a phenylene group, cyclopentenylene group, cyclopentadienylene group, cyclohexylene group and cyclopentylene group, among which a phenylene group is preferable.

Examples of $A^3$ representing the monocyclic heterocyclic group having at most 6 ring atoms include a pyrrolylene group, pyrazinylene group, pyridinylene group, furylene group and thiophenylene group.

In the formula (5-1), it is preferable that m is 0 and one of $X^5$ to $X^8$ is bonded to one of $Y^1$ to $Y^4$ through a single bond, or alternatively, $A^3$ is a substituted or unsubstituted monocyclic hydrocarbon group having at most 6 ring carbon atoms, or a substituted or unsubstituted monocyclic aromatic heterocyclic group having at most 6 ring atoms. In the above, it is preferable that m is 0 and one of $X^5$ to $X^8$ is bonded to one of $Y^1$ to $Y^4$ through a single bond, or alternatively, $A^3$ is a substituted or unsubstituted phenylene group.

In the formula (5-1), $X^1$ to $X^4$ and $Y^5$ to $Y^8$ each independently represent N (nitrogen atom) or $CR^a$.

In the formula (5-1), $X^5$ to $X^8$ and $Y^1$ to $Y^8$ each independently represent N (nitrogen atom), $CR^a$ or a carbon atom to be bonded to $A^3$.

$R^a$ for $CR^a$ in $X^1$ to $X^8$ and $Y^1$ to $Y^8$ each independently represents the same as $R^a$ in the formula (5). When a plurality of $R^a$ are present, the plurality of $R^a$ are the same or different.

When at least adjacent two of $X^1$ to $X^8$ and $Y^1$ to $Y^8$ are $CR^a$, a part of $R^a$ in the adjacent $CR^a$ is optionally bonded to a part of the other $R^a$ to form a cyclic structure.

One of $X^5$ to $X^8$ is a carbon atom and one of $Y^1$ to $Y^4$ is a carbon atom. These carbon atoms are bonded to each other through $A^3$.

In the formula (5-1), $X^1$ to $X^8$ and $Y^1$ to $Y^8$ each independently represent $CR^a$. It is preferable that one of $X^5$ to $X^8$ is a carbon atom and one of $Y^1$ to $Y^4$ is a carbon atom, in which these carbon atoms are bonded to each other through $A^3$.

In the formula (5-1), preferably, $X^5$ to $X^8$ each independently represent $CR^a$ unless being a carbon atom to be bonded $A^3$, and $Y^1$ to $Y^4$ each independently represent $CR^a$ unless being a carbon atom to be bonded to $A^3$ while $X^1$ to $X^4$ and $Y^5$ to $Y^8$ each independently represent $CR^a$.

The formula (5-1) may satisfy at least one of the following (ii) to (v).

(ii) At least one of $X^1$ to $X^4$ and $Y^5$ to $Y^8$ is $CR^a$ and at least one of $R^a$ in $X^1$ to $X^4$ and $Y^5$ to $Y^8$ is a cyano-substituted aromatic hydrocarbon group having 6 to 30 ring carbon atoms or a cyano-substituted heterocyclic group having 5 to 30 ring atoms.

(iii) m is an integer of 1 to 3 and at least one of $A^3$ is a cyano-substituted divalent aromatic hydrocarbon group having 6 to 30 ring carbon atoms or a cyano-substituted divalent heterocyclic group having 5 to 30 ring atoms.

(iv) At least one of $X^5$ to $X^8$ and $Y^1$ to $Y^4$ is $CR^a$ and at least one of $R^a$ in $X^5$ to $X^8$ and $Y^1$ to $Y^8$ is a cyano-substituted aromatic hydrocarbon group having 6 to 30 ring carbon atoms or a cyano-substituted heterocyclic group having 5 to 30 ring atoms.

(v) At least one of $X^1$ to $X^8$ and $Y^1$ to $Y^8$ is C—CN.

The second host material represented by the formula (5-1) having the partial structure represented by the formula (3) has a structure in which an aromatic hydrocarbon group having a cyano group is introduced to an end of each of two rings (e.g., carbazole rings) which form a central skeleton by being linked through $A^3$.

The central skeleton serves as a hole-injecting•transporting unit. The aromatic hydrocarbon group having a cyano group serves as an electron-injecting•transporting unit. Since the aromatic hydrocarbon group having a cyano group serving as an electron-injecting•transporting unit is introduced to the outer side of the central skeleton, the second host material keeps a spread of electron clouds of HOMO (highest occupied molecular orbital) of the central skeleton to keep a favorable hole-injecting•transporting capability while exhibiting an electron-injecting•transporting function provided by a group having a cyano group. With this arrangement, carrier balance in a molecule becomes favorable in the second host material. Accordingly, when the second host material is used in an organic EL device, the organic EL device can achieve an excellent luminous efficiency.

Consequently, in addition to the advantage to prolong the lifetime of the organic EL device according to the exemplary embodiment which includes the emitting layer including the second host material and the first host material, the luminous efficiency of the organic EL device becomes favorable.

The second host material represented by the formula (5-1) is preferably represented by one of the following formulae (5-1-1), (5-1-2) and (5-1-3), (5-1-1)

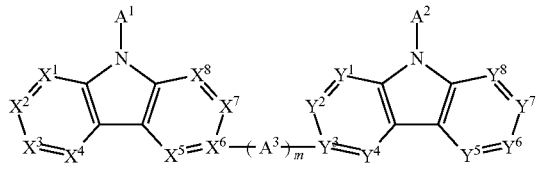

(5-1-2)

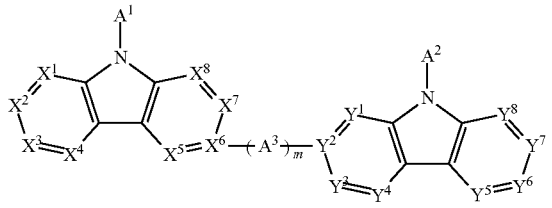

(5-1-3)

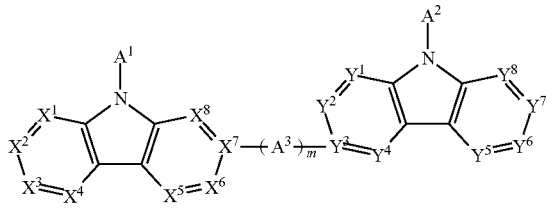

In the formula (5-1-1), $A^1$, $A^2$, $A^3$, $X^1$ to $X^5$, $X^7$, $X^8$, $Y^1$, $Y^2$, $Y^4$ to $Y^8$ and m represent the same as $A^1$, $A^2$, $A^3$, $X^1$ to $X^5$, $X^7$, $X^8$, $Y^1$, $Y^2$, $Y^4$ to $Y^8$ and m in the formula (5-1). $X^6$ and $Y^3$ are carbon atoms.

In the formula (5-1-1), preferably, $X^1$ to $X^5$, $X^7$, $X^8$, $Y^1$, $Y^2$ and $Y^4$ to $Y^8$ each independently represent $CR^a$.

In the formula (5-1-2), $A^1$, $A^2$, $A^3$, $X^1$ to $X^5$, $X^7$, $X^8$, $Y^1$, $Y^3$ to $Y^8$ and m represent the same as $A^1$, $A^2$, $A^3$, $X^1$ to $X^5$, $X^7$, $X^8$, $Y^1$, $Y^3$ to $Y^8$ and m in the formula (5-1). $X^6$ and $Y^2$ are carbon atoms.

In the formula (5-1-2), preferably, $X^1$ to $X^5$, $X^7$, $X^8$, $Y^1$ and $Y^3$ to $Y^8$ each independently represent $CR^a$.

In the formula (5-1-3), $A^1$, $A^2$, $A^3$, $X^1$ to $X^6$, $X^8$, $Y^1$, $Y^2$, $Y^4$ to $Y^8$ and m represent the same as $A^1$, $A^2$, $A^3$, $X^1$ to $X^6$, $X^8$, $Y^1$, $Y^2$, $Y^4$ to $Y^8$ and m in the formula (5-1). $X^7$ and $Y^3$ are carbon atoms.

In the formula (5-1-3), preferably, $X^1$ to $X^6$, $X^8$, $Y^1$, $Y^2$ and $Y^4$ to $Y^8$ each independently represent $CR^a$.

At least one of the partial structures represented by the formula (3) of the second host material is preferably a cyano-substituted phenyl group, a cyano-substituted naphthyl group, a cyano-substituted phenanthryl group, a cyano-substituted dibenzofuranyl group, a cyano-substituted biphenylyl group, a cyano-substituted terphenylyl group, or a cyano-substituted triphenylenyl group.

More preferably, $A^2$ of the second host material is not substituted by a cyano group.

In the formula (5-1), $A^1$ and $A^2$ are preferably different from each other. Specifically, the second host material preferably has an asymmetric structure. With such a structure, the second host material exhibits favorable crystallinity and non-crystallinity. Accordingly, since the organic EL device using the second host material has an excellent film quality, the organic EL device can achieve a high performance in characteristics (e.g., current efficiency) of the organic EL.

A manufacturing method of the second host material is not particularly limited, but known methods are usable. For instance, the second host material may be manufactured by a coupling reaction to a carbazole derivative and an aromatic halogenated compound using a copper catalyst described in "Tetrahedron, 40th volume (1984), p. 1435-1456" or a palladium catalyst described in "Journal of the American Chemical Society, 123 (2001), p. 7727-7729" to manufacture the biscarbazole derivative.

Specific examples of the second host material are described below, but the compound of the exemplary embodiment is not limited thereto.

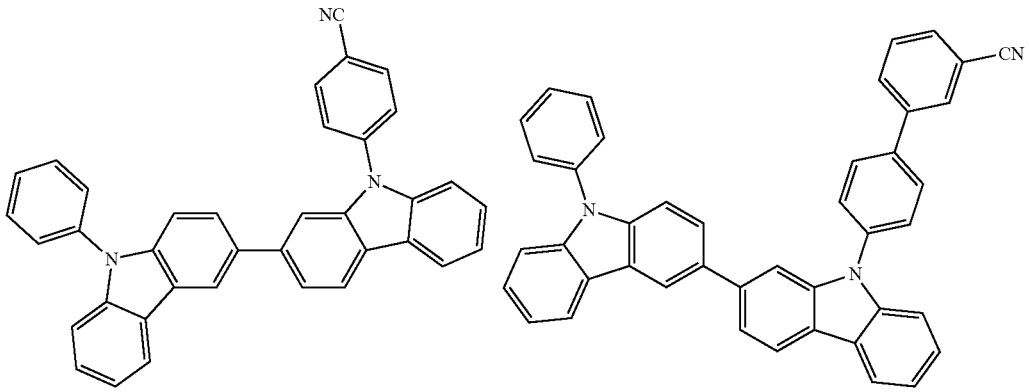

-continued
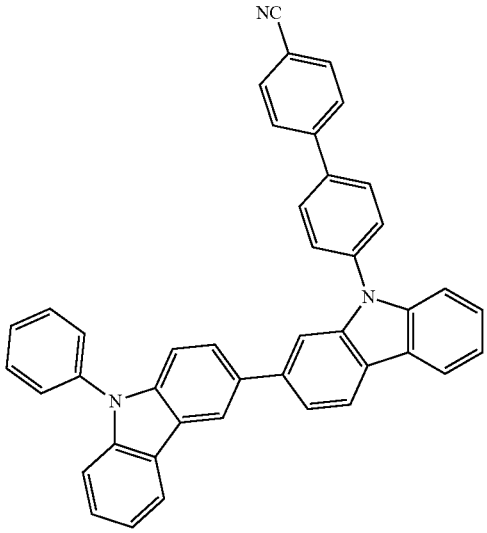
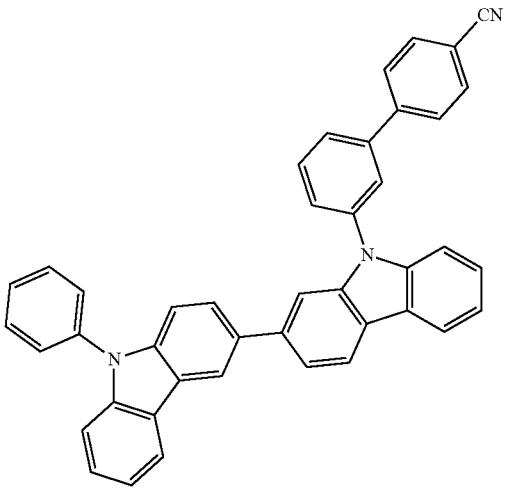
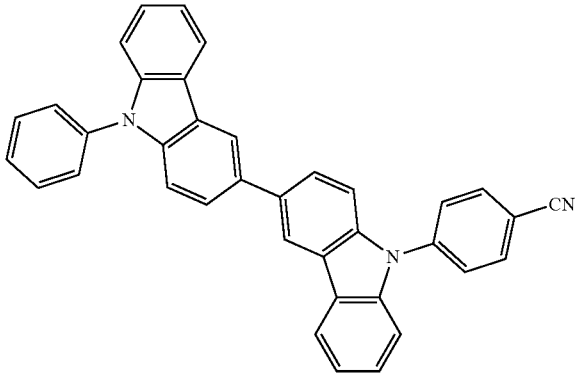
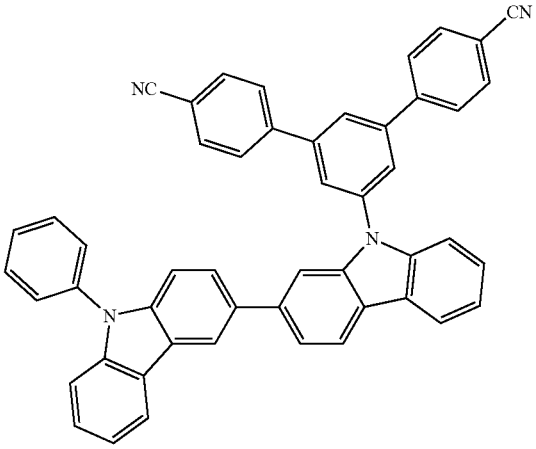
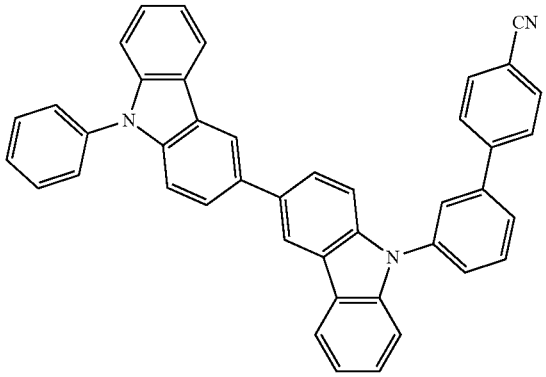

-continued
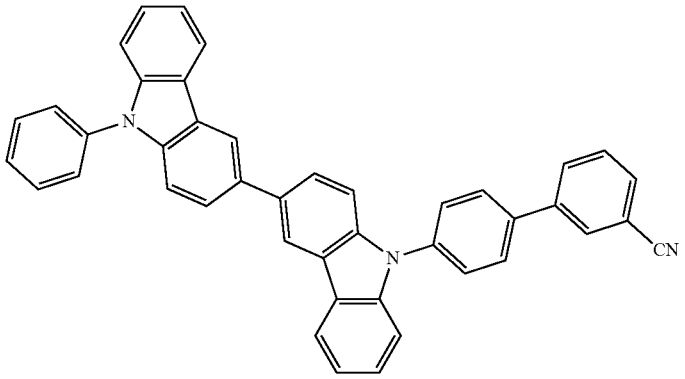
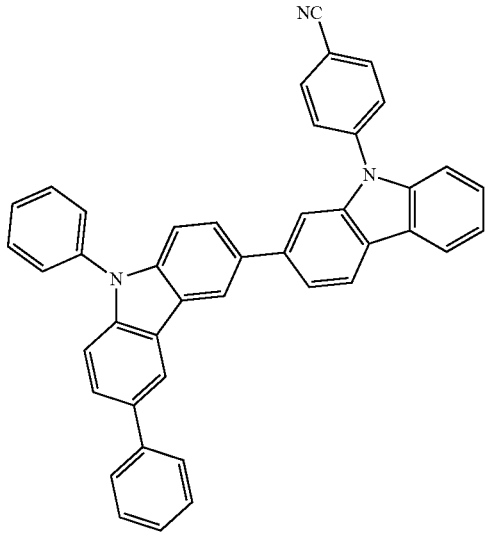
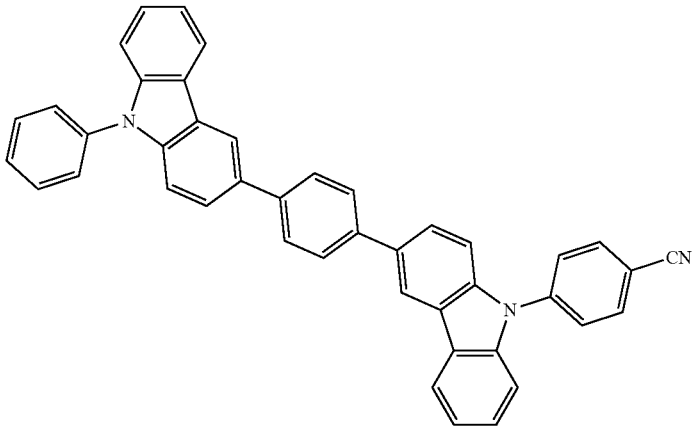
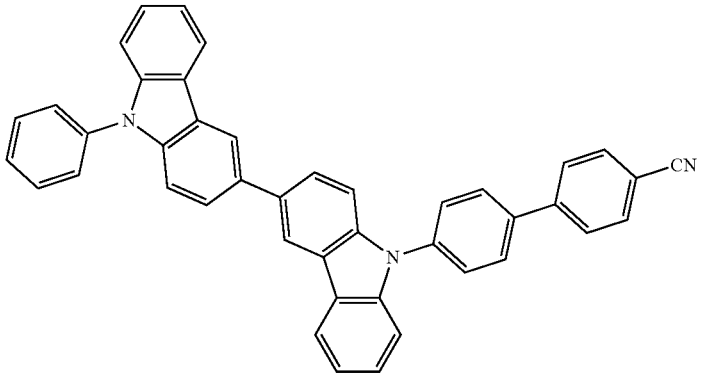
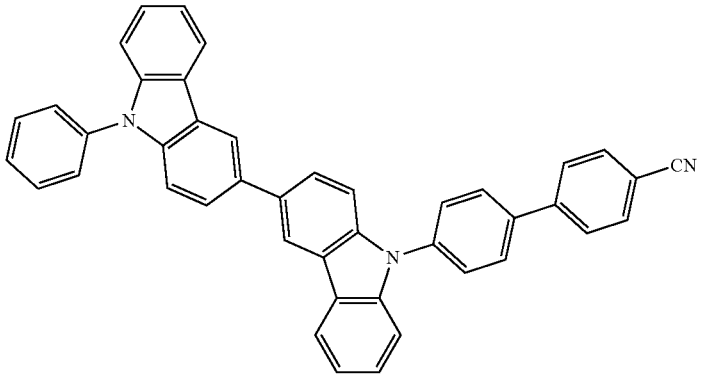

-continued
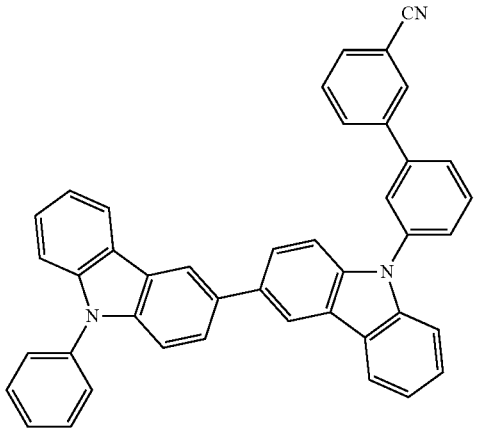
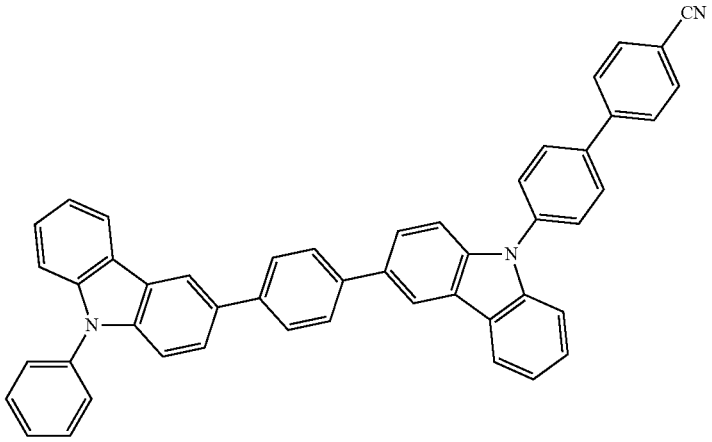
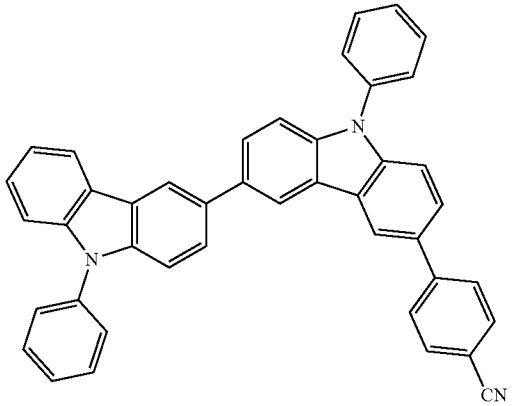
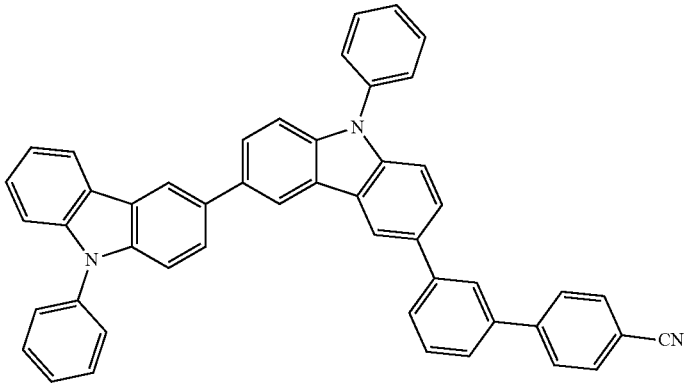
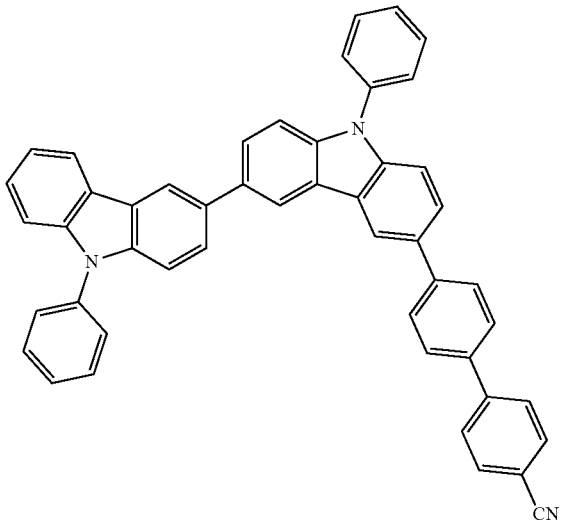
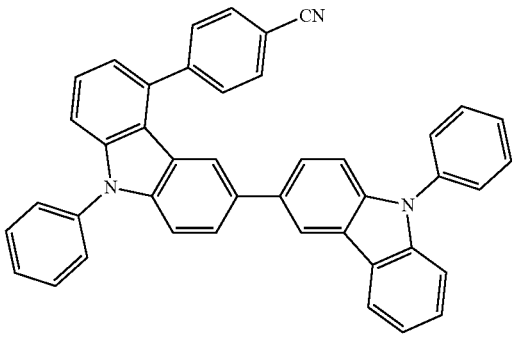

-continued
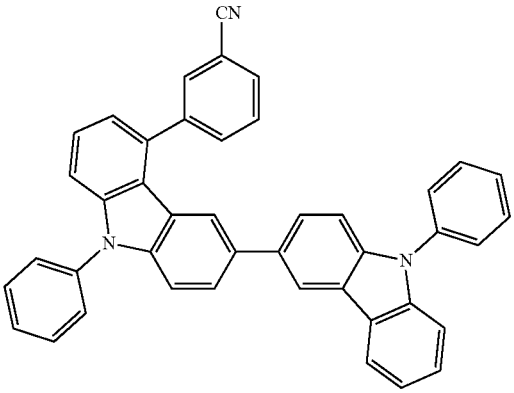
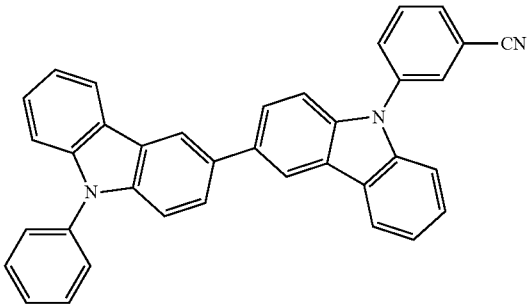
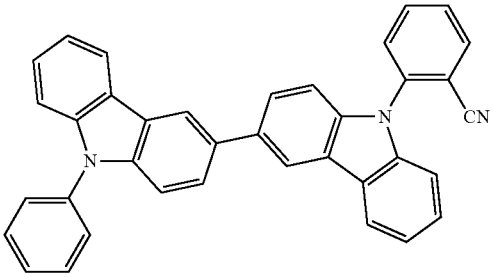
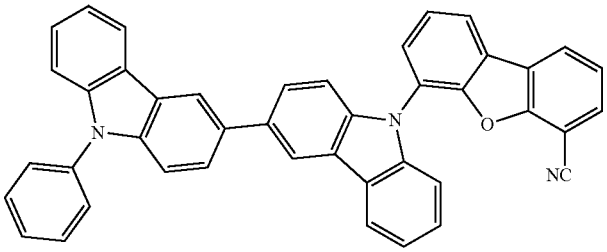
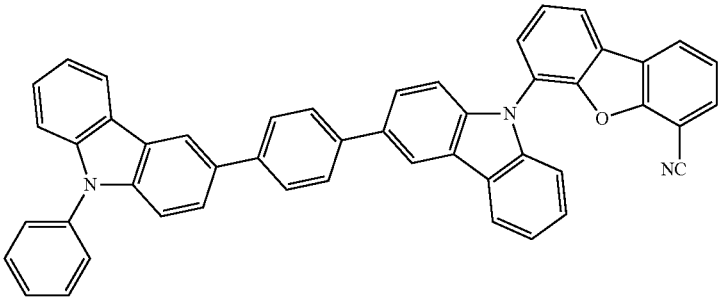
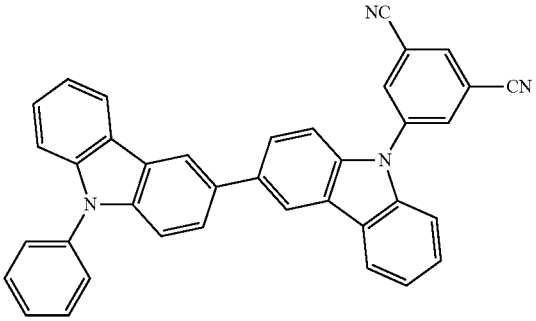
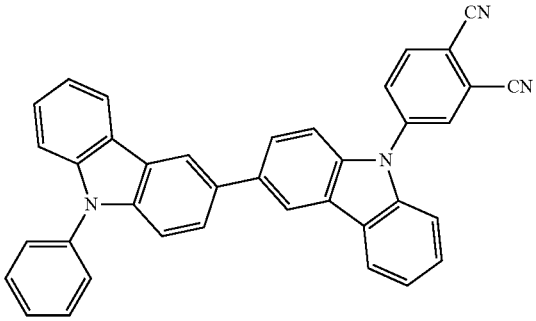
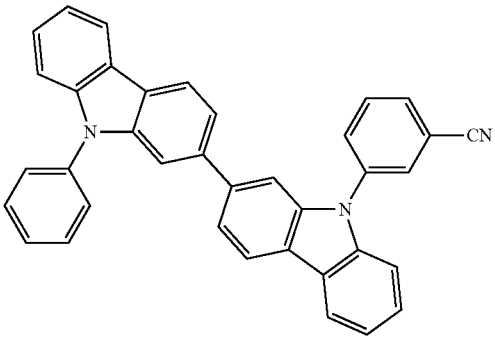
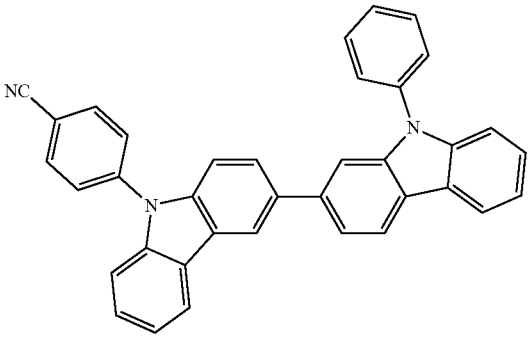

-continued
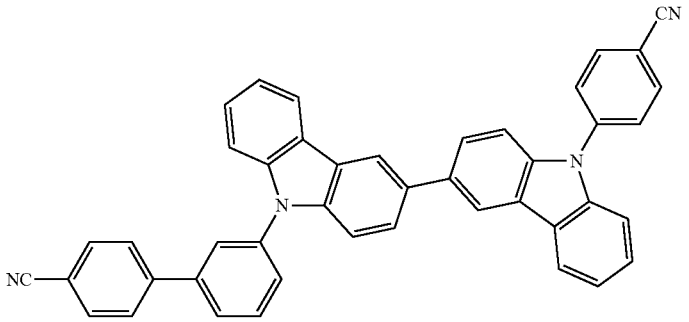
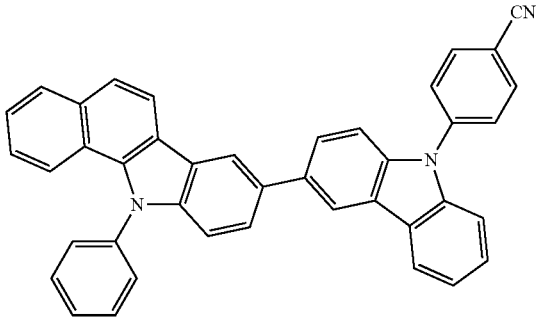
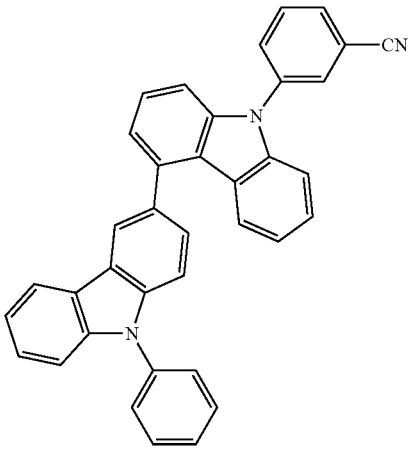
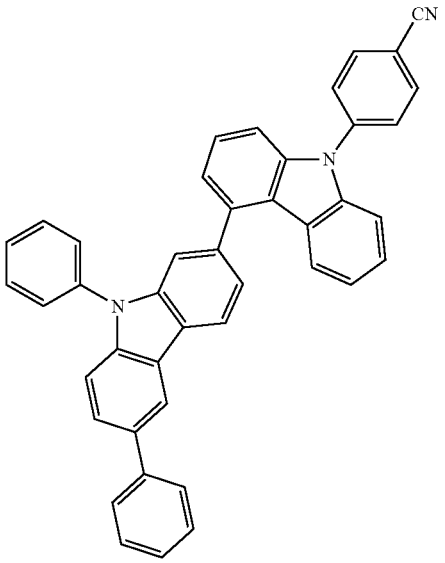
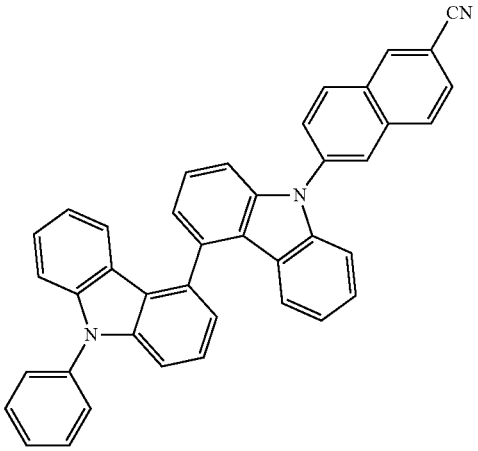

-continued
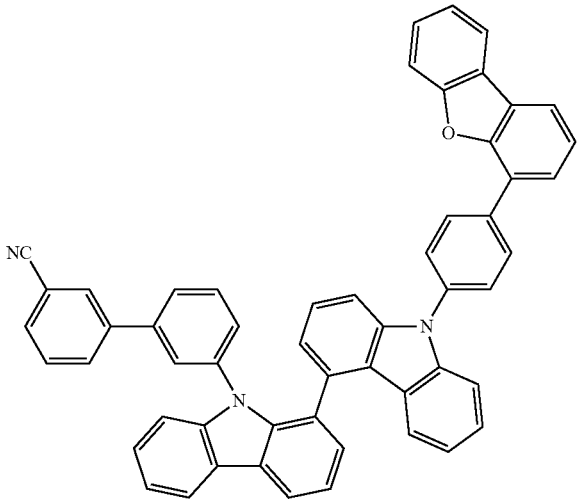
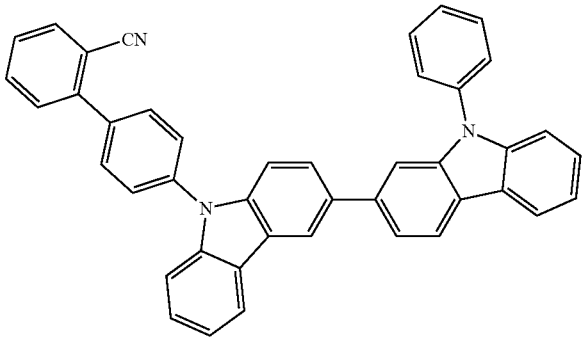
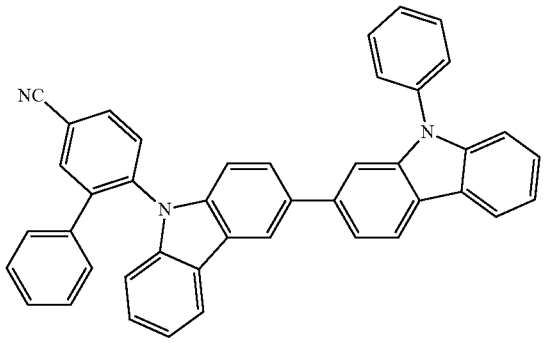
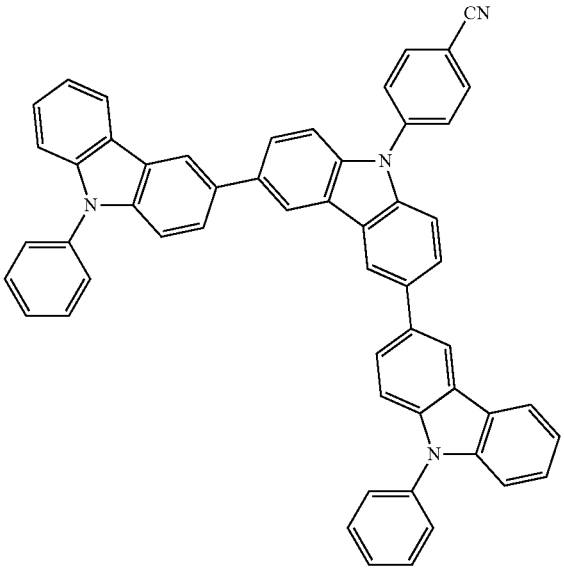
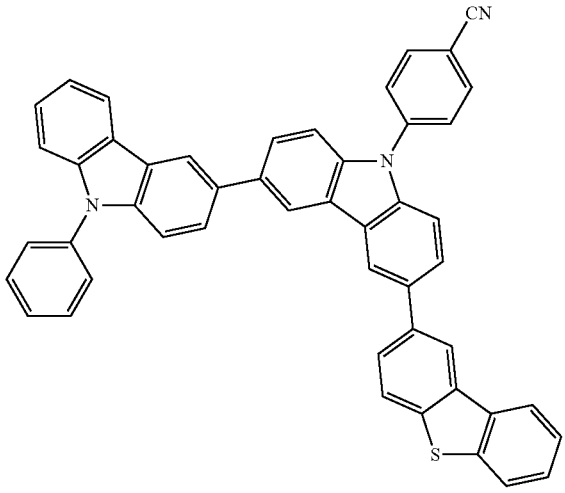
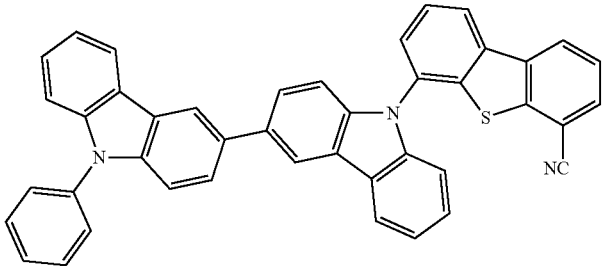

-continued
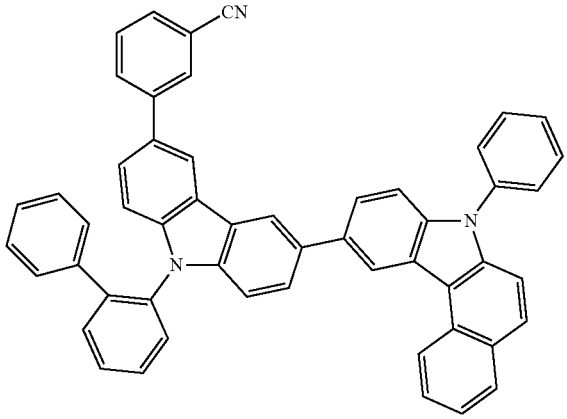
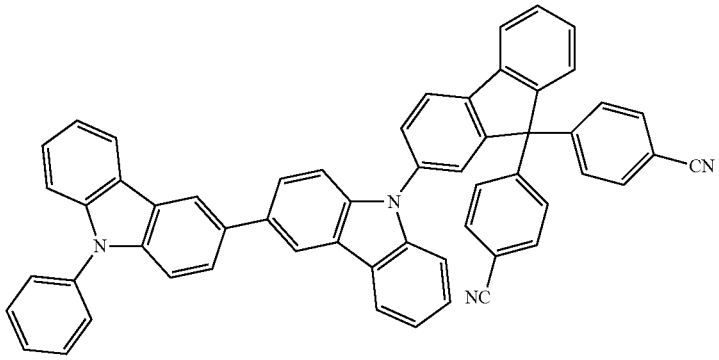
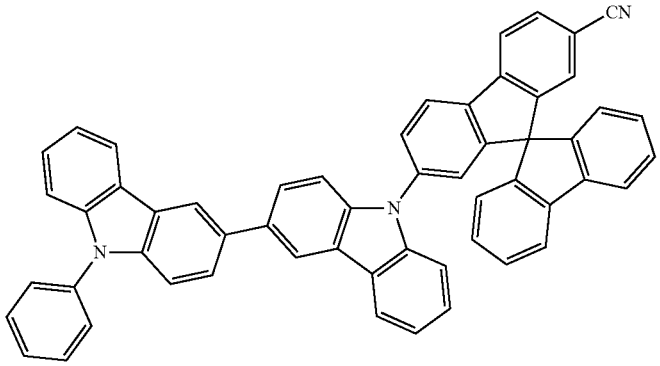
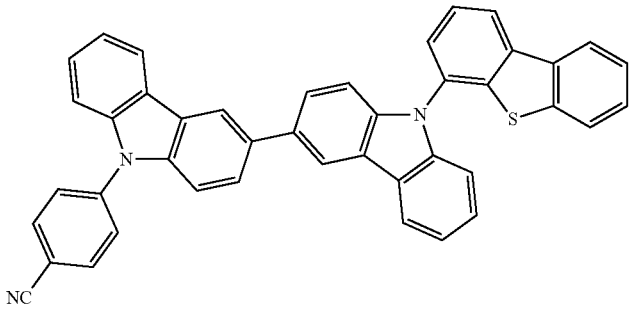

-continued
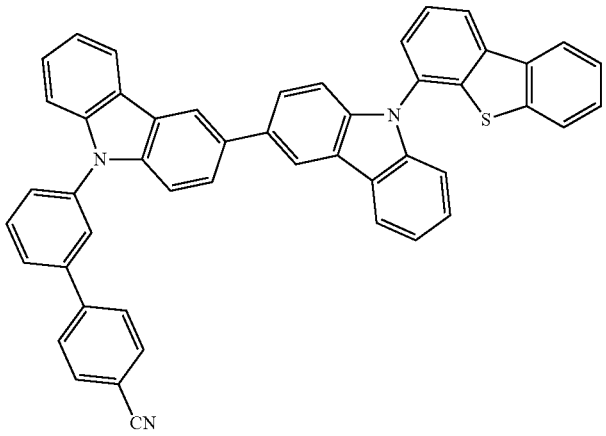
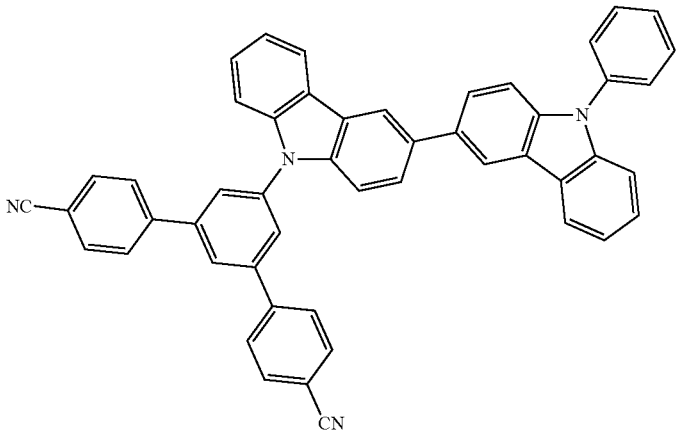
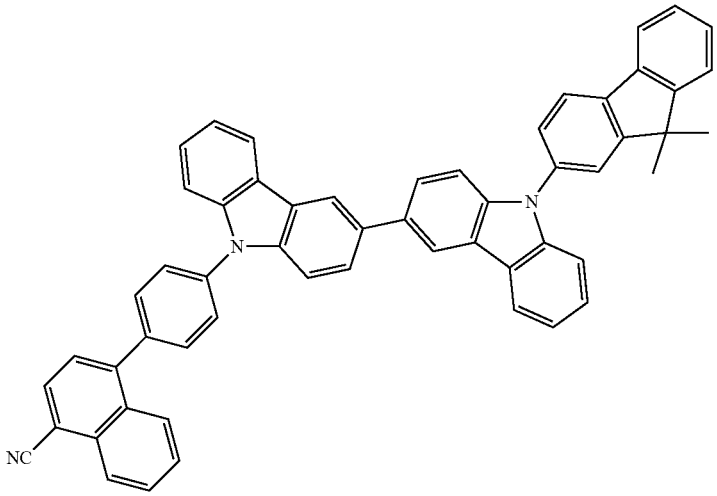

-continued
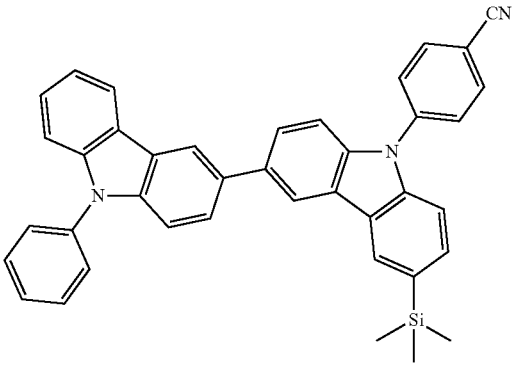
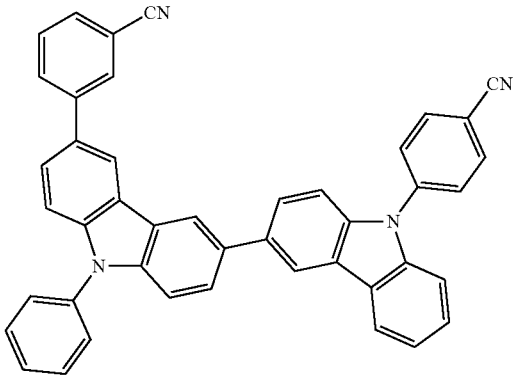
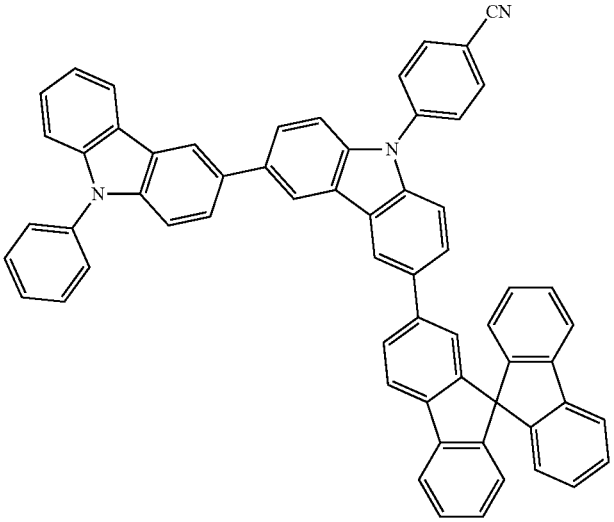
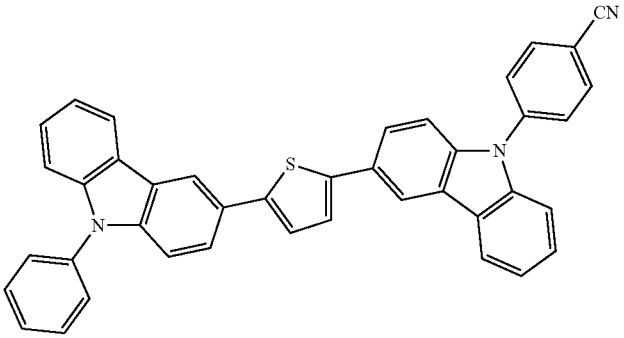
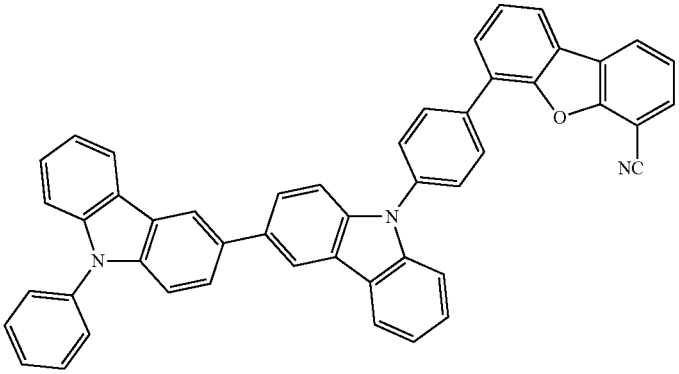
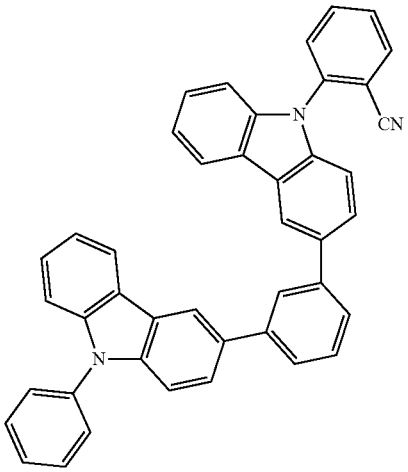

-continued
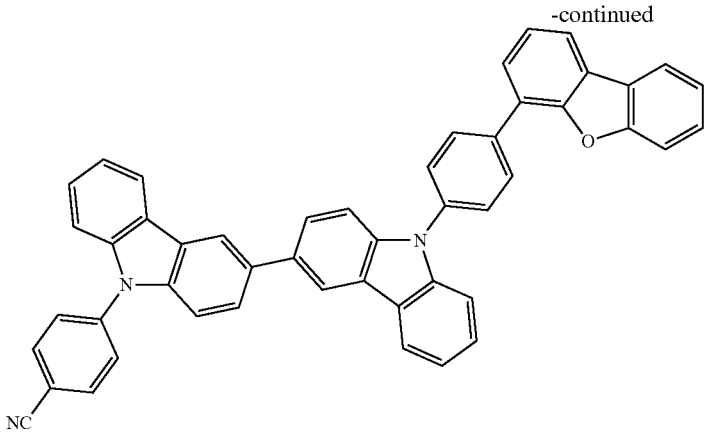
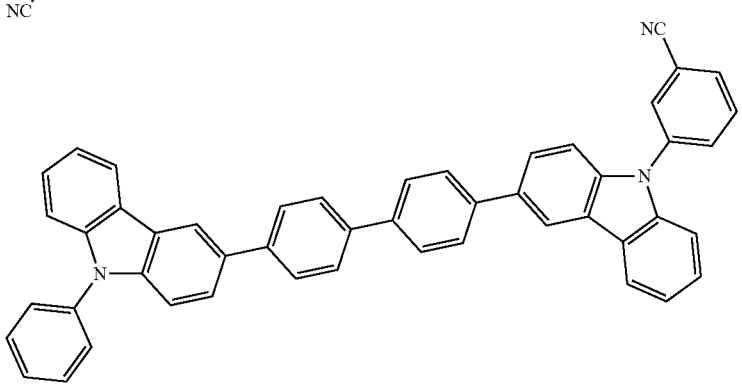
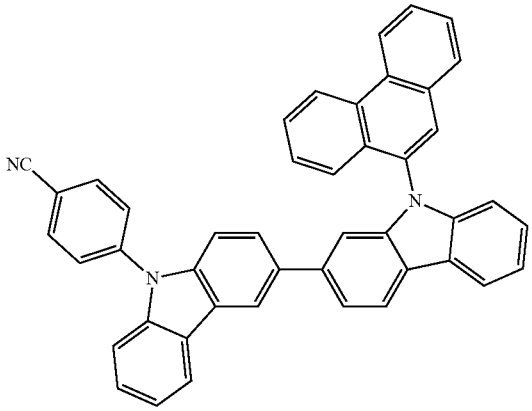
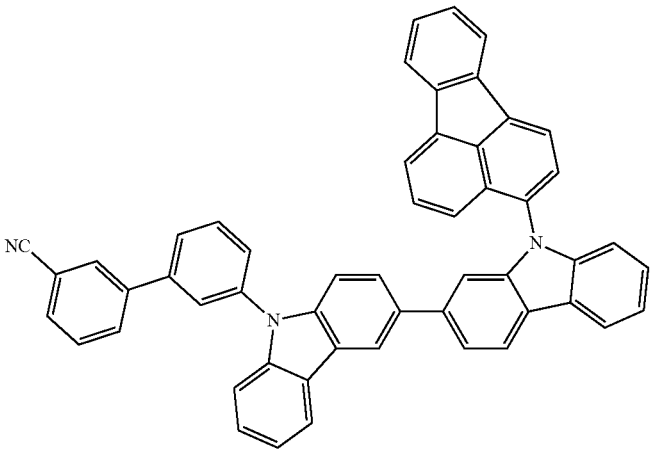
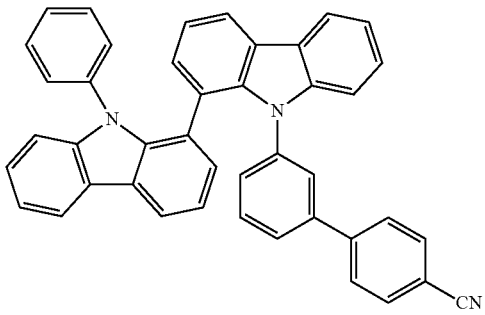

-continued
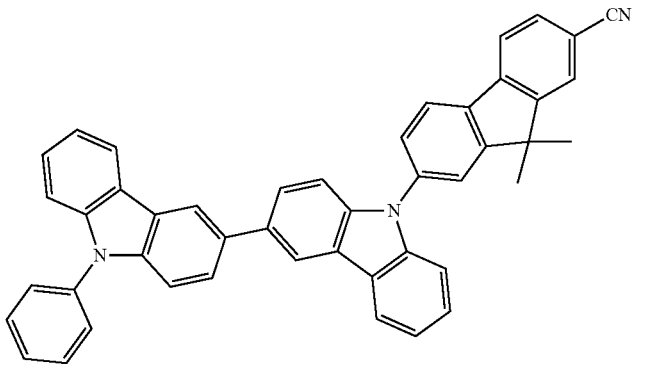
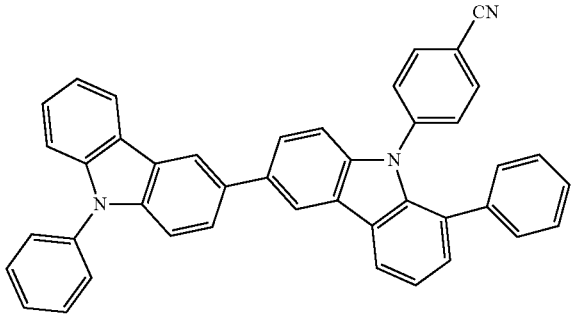
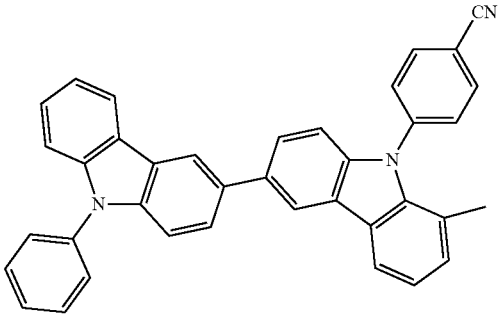
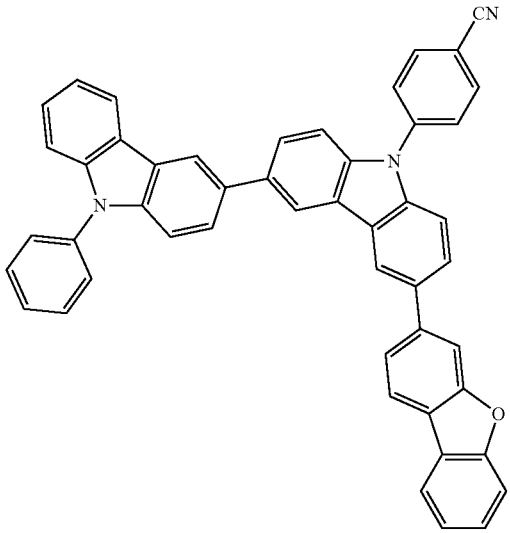
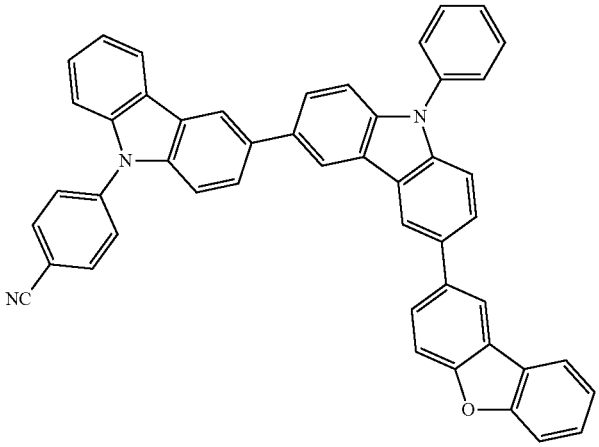
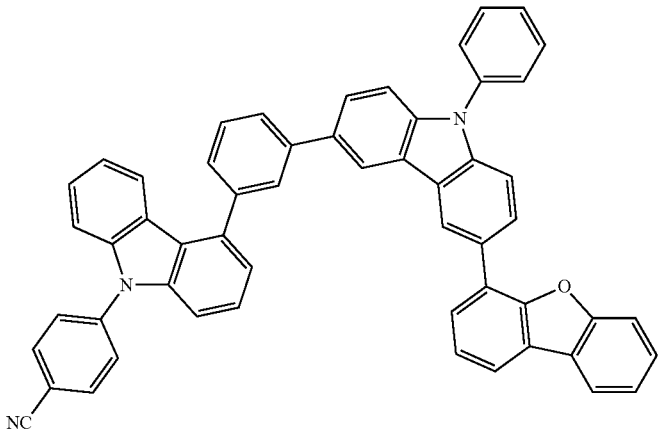
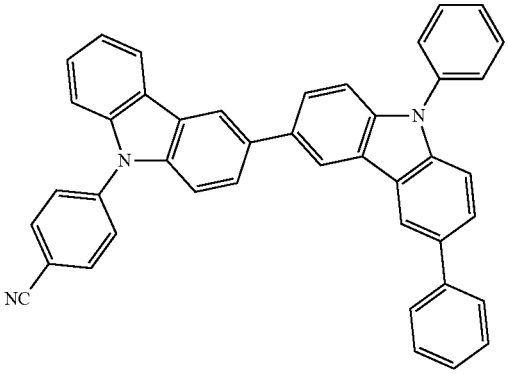

-continued
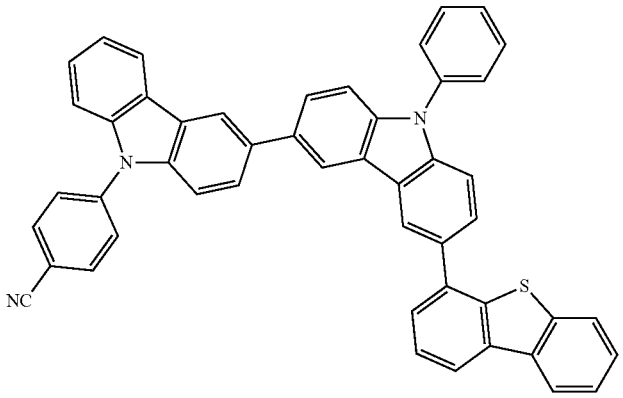
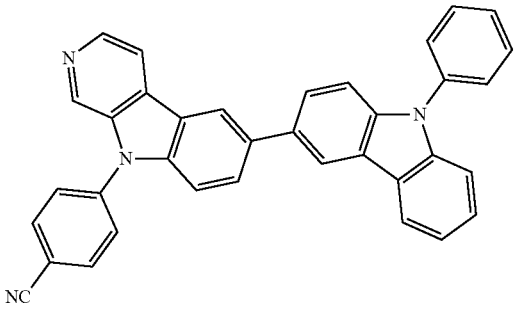
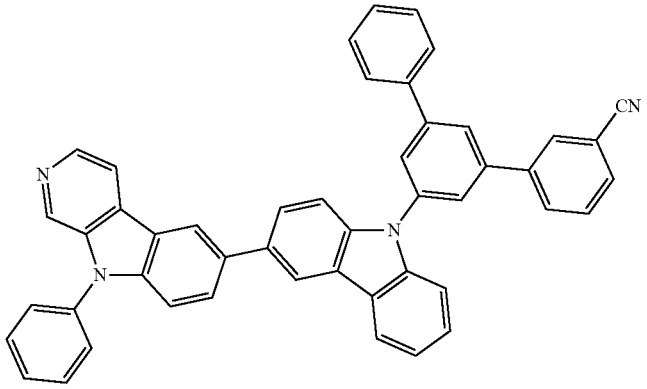
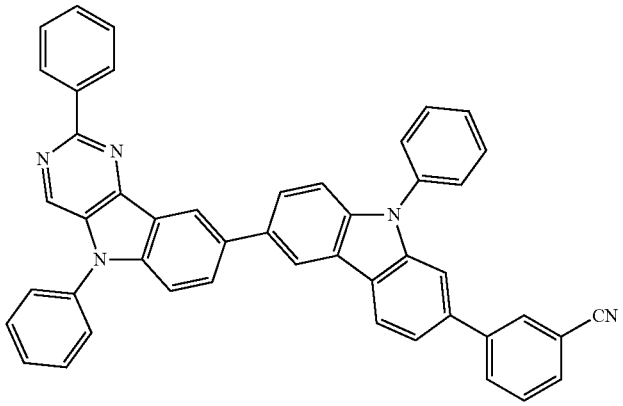
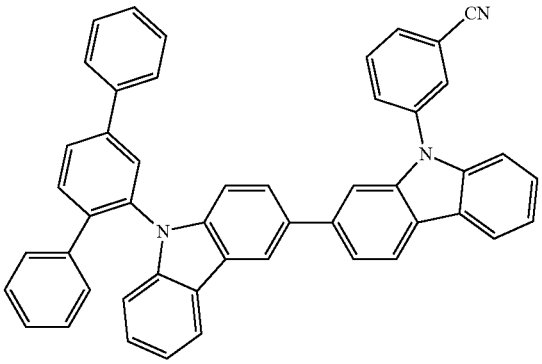
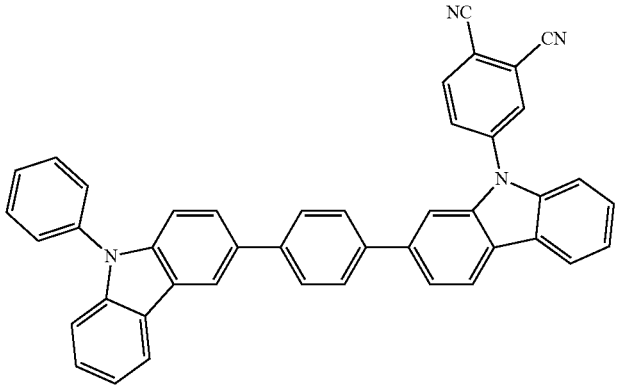
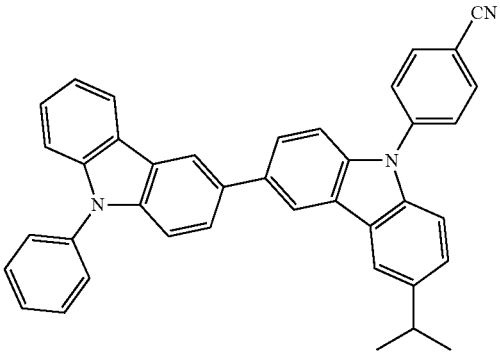

-continued
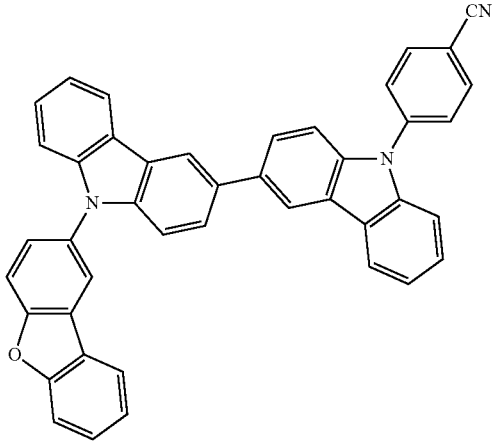
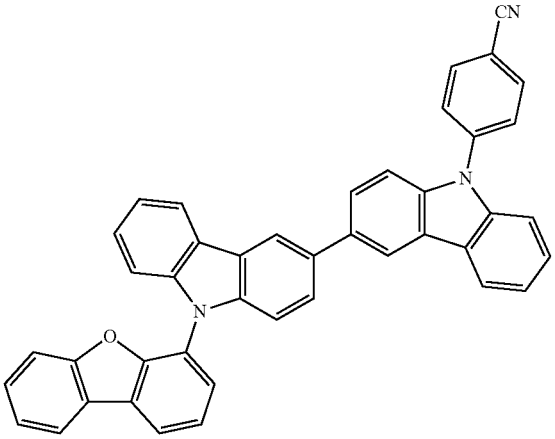
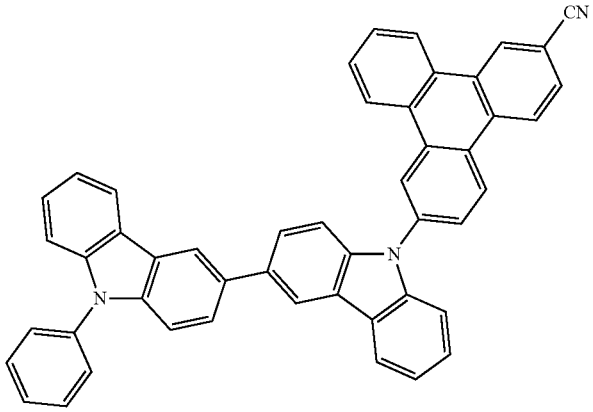
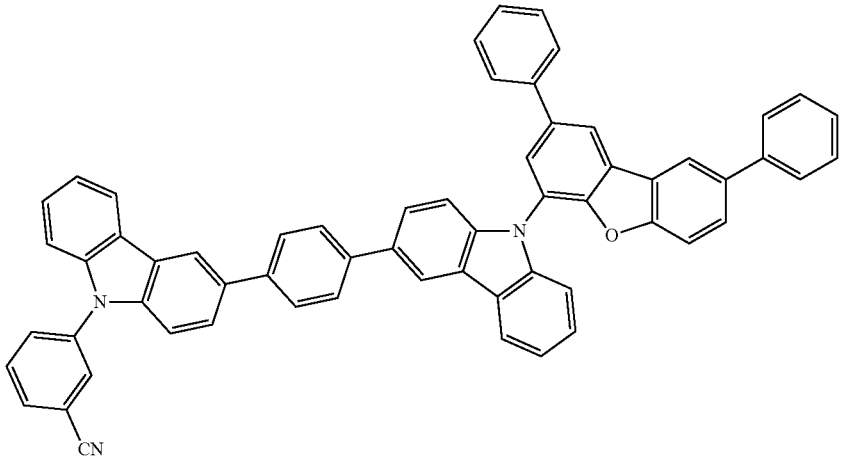

-continued
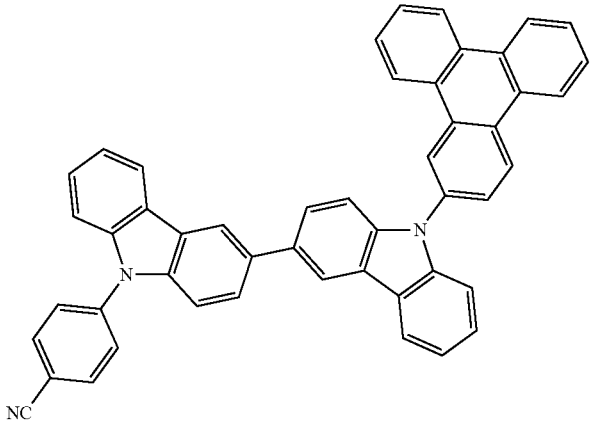
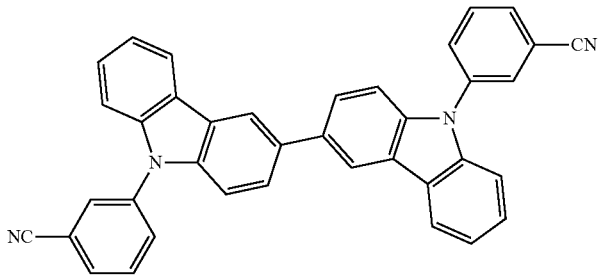
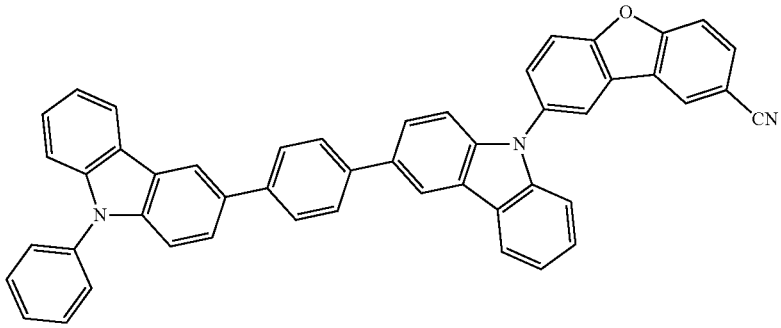
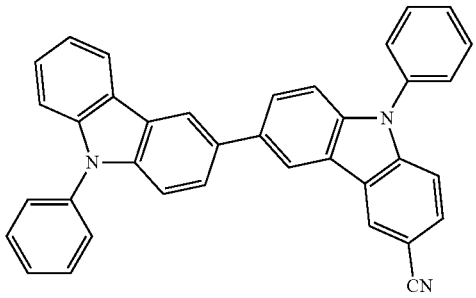
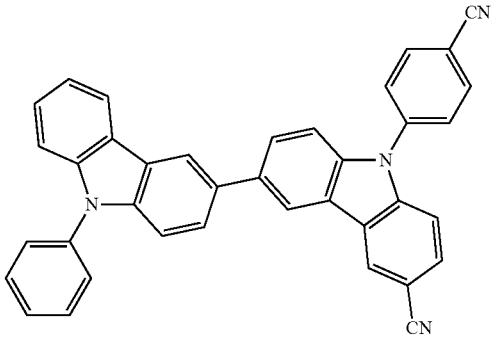
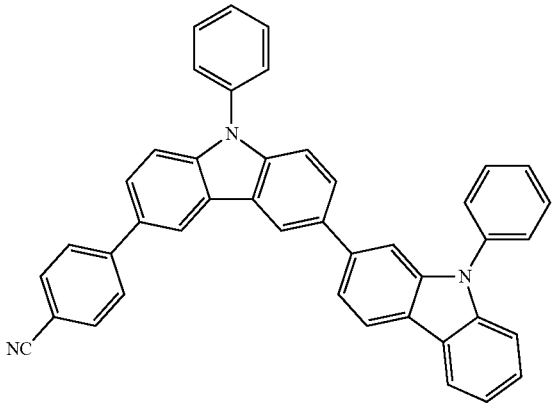
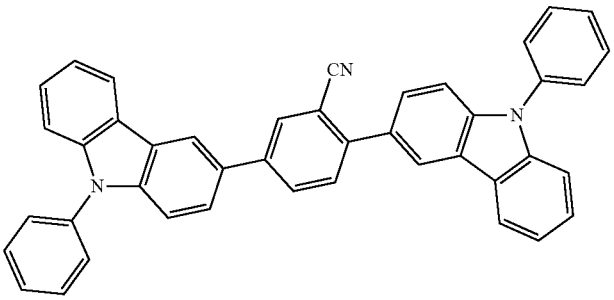

-continued
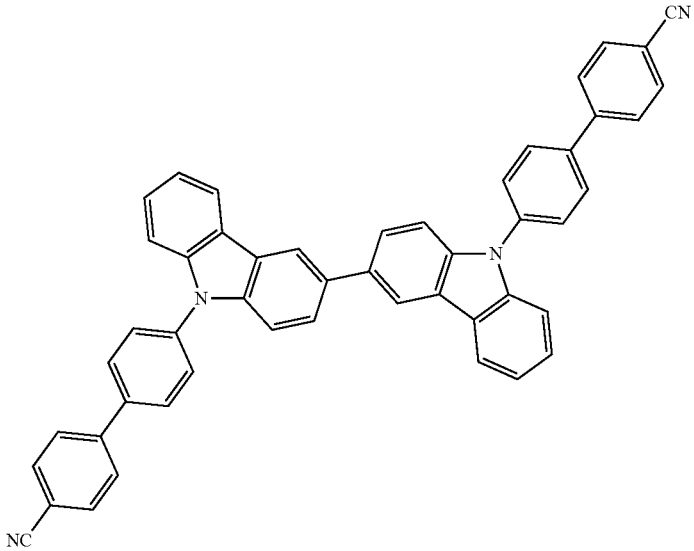
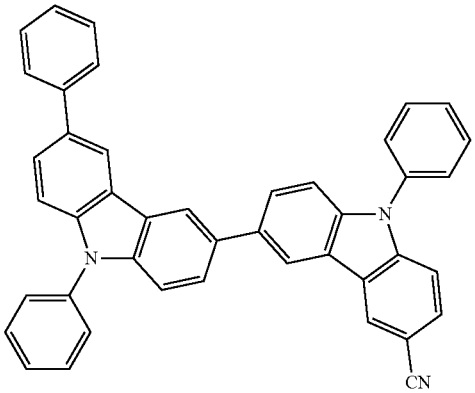
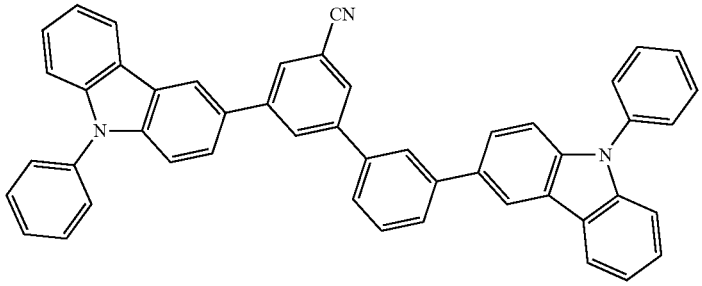
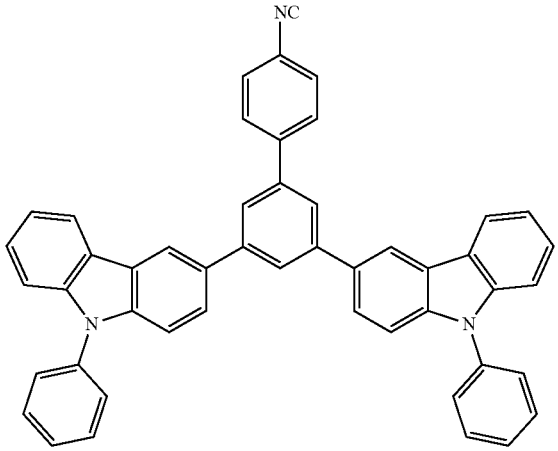
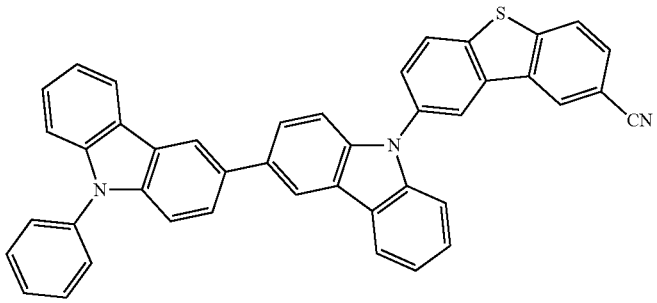

-continued
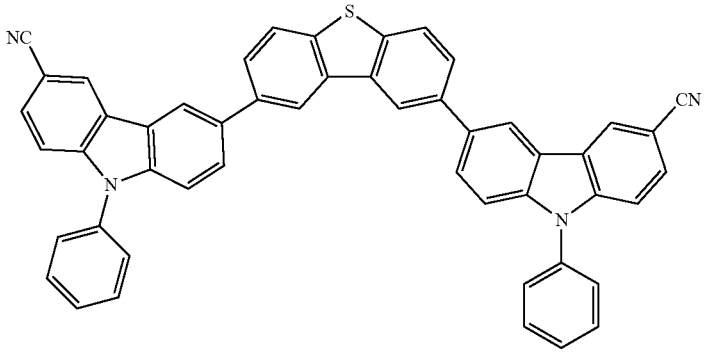
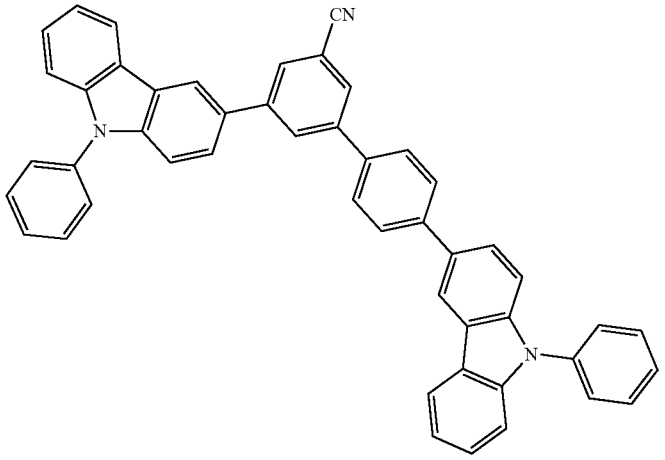
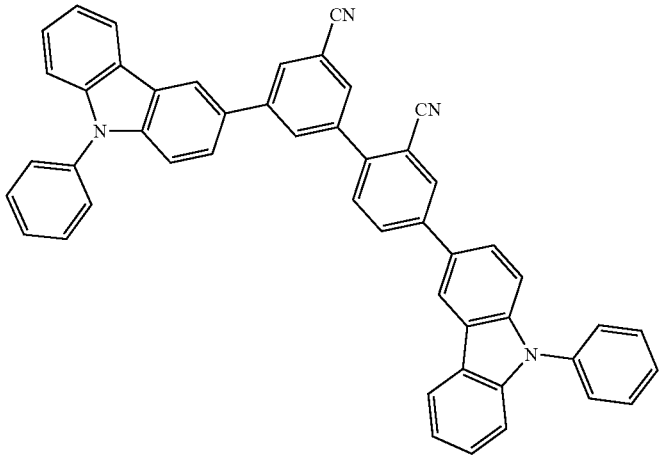

-continued
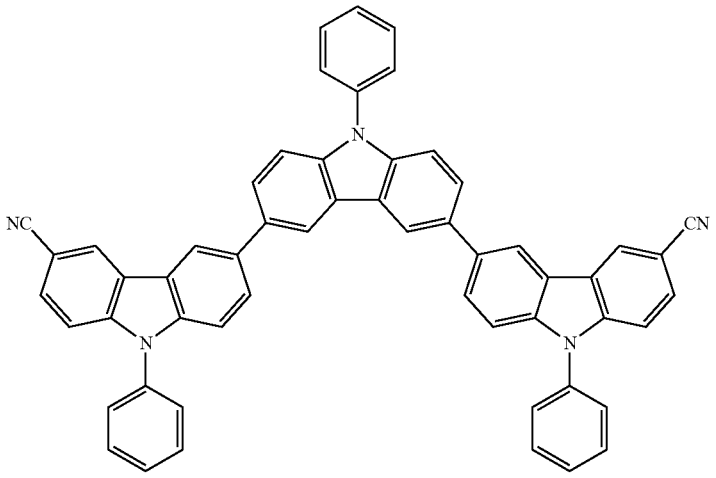
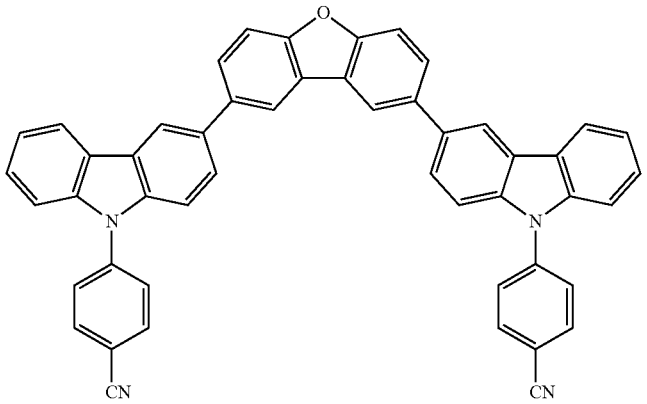
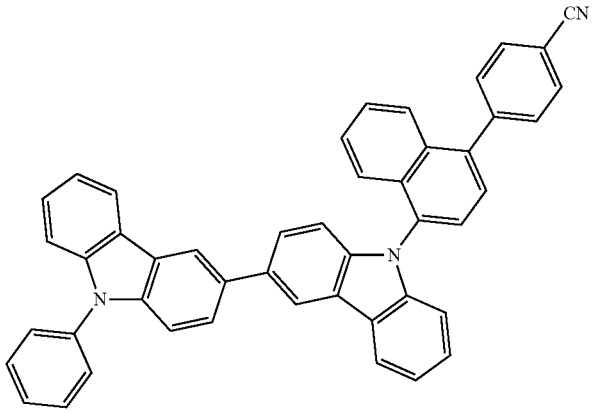
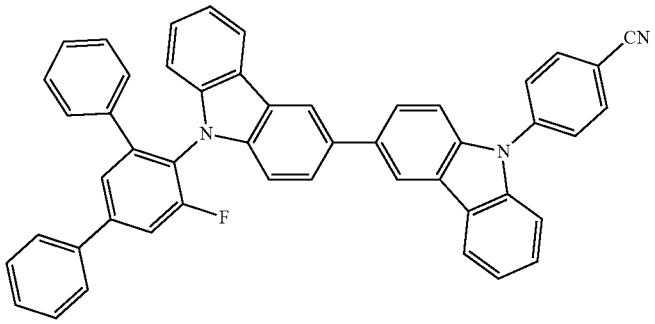

-continued
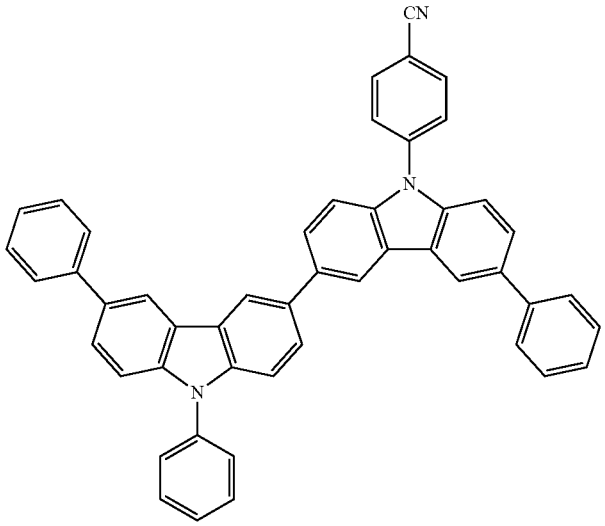
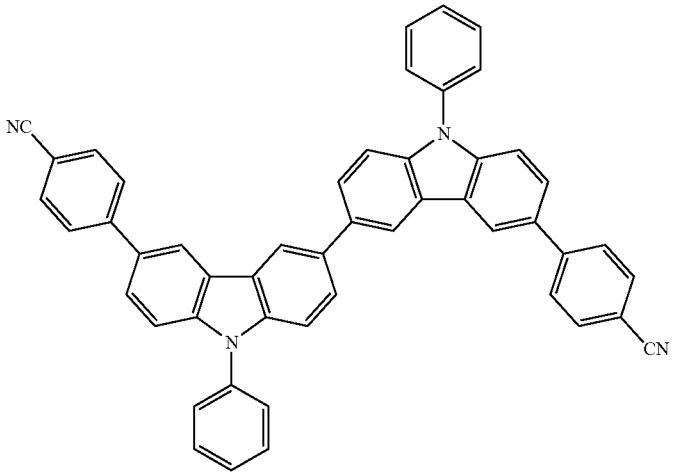
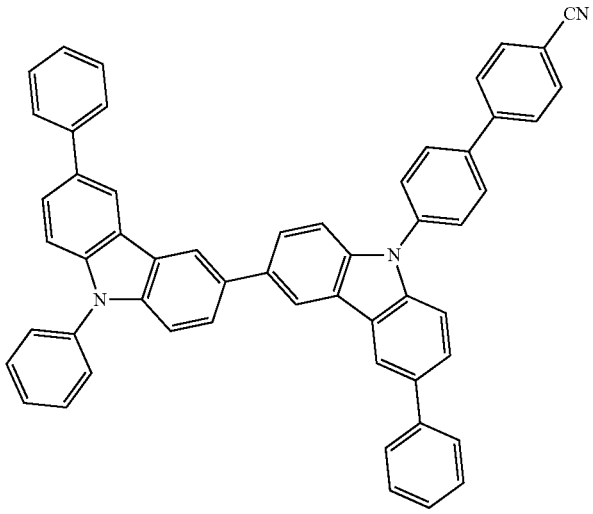
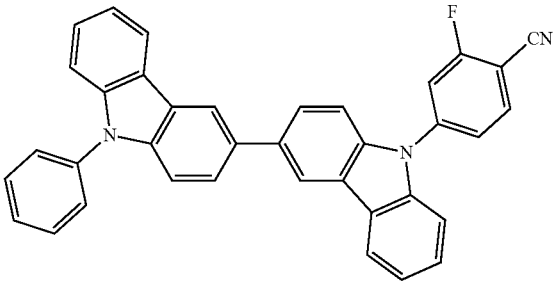

-continued
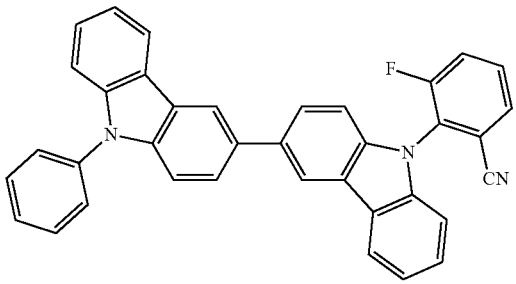
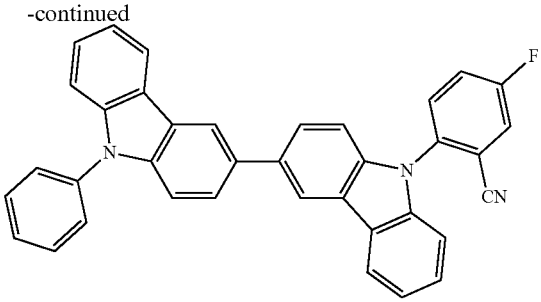
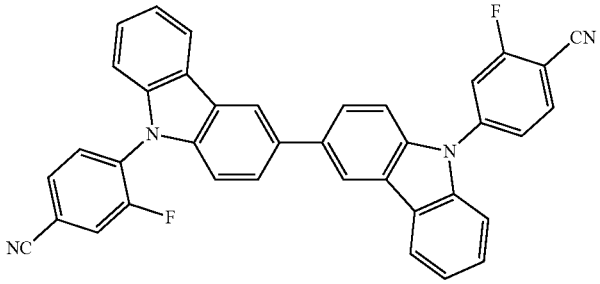
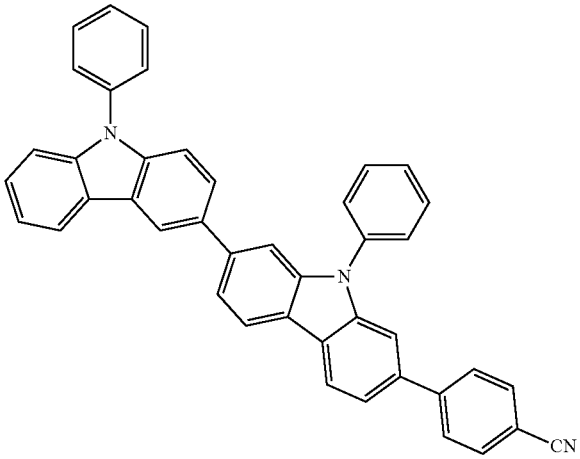
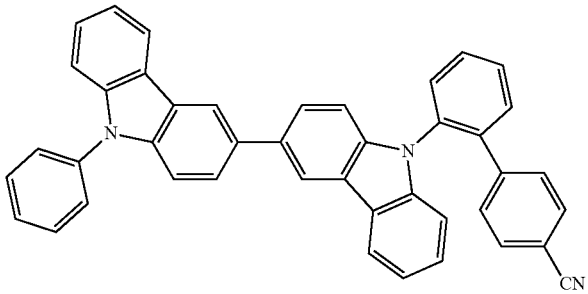
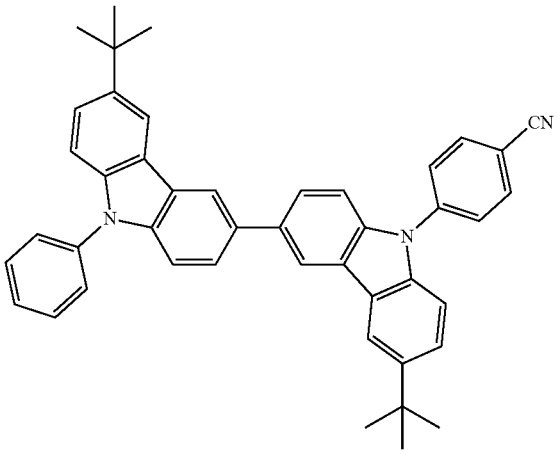
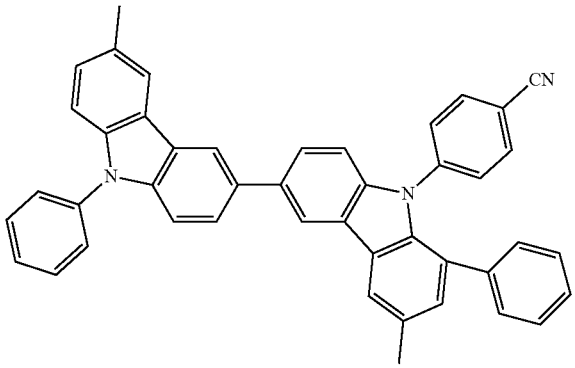

-continued
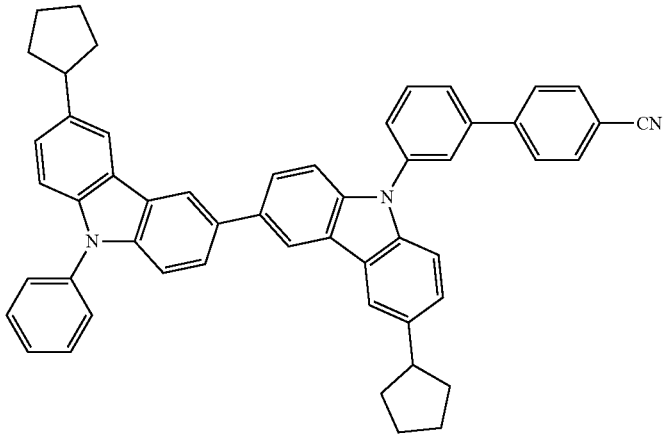
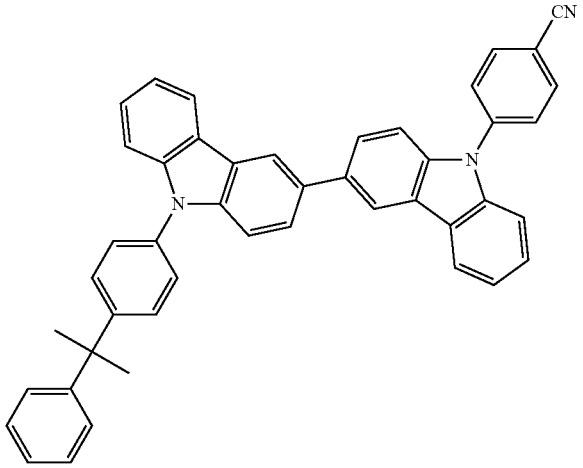
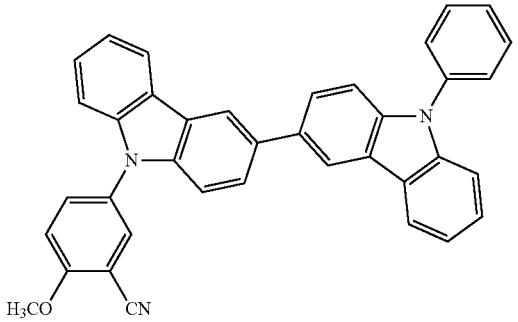
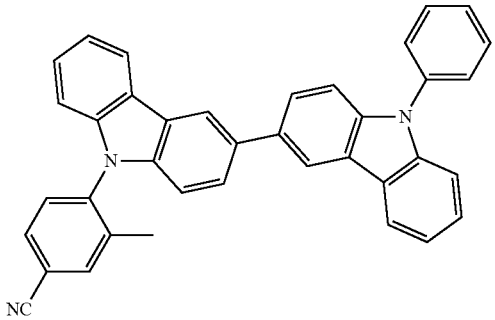
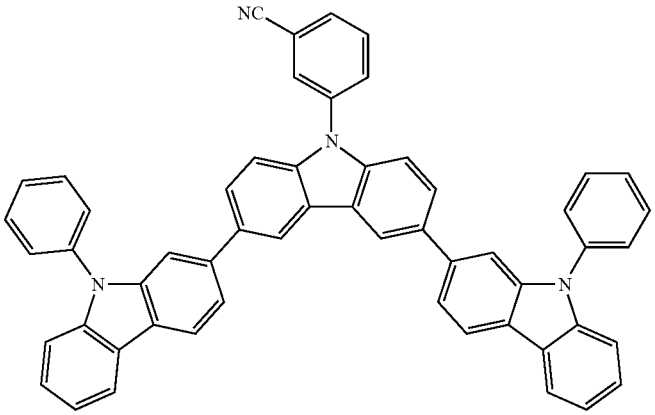

-continued
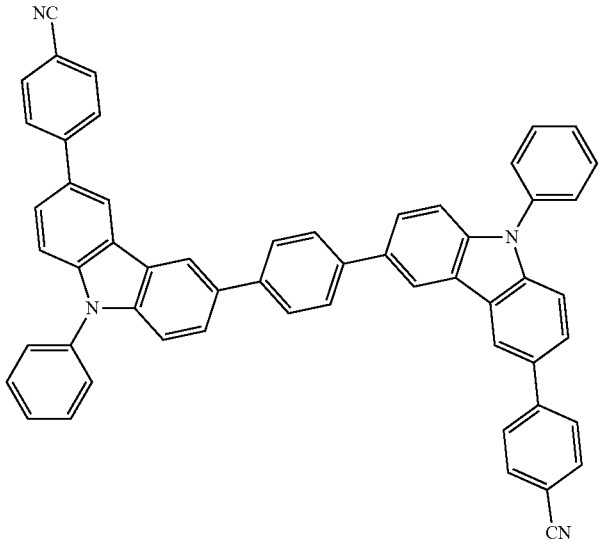
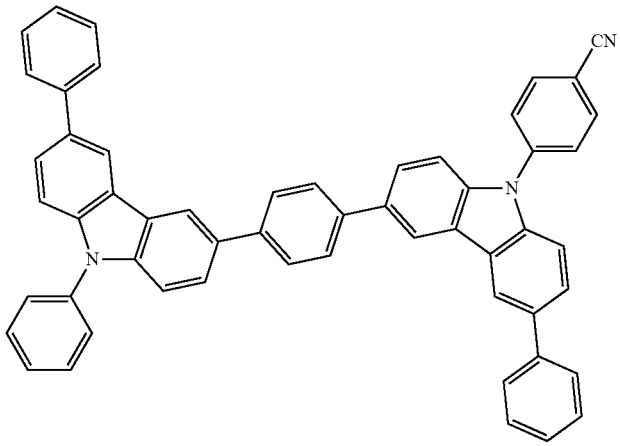
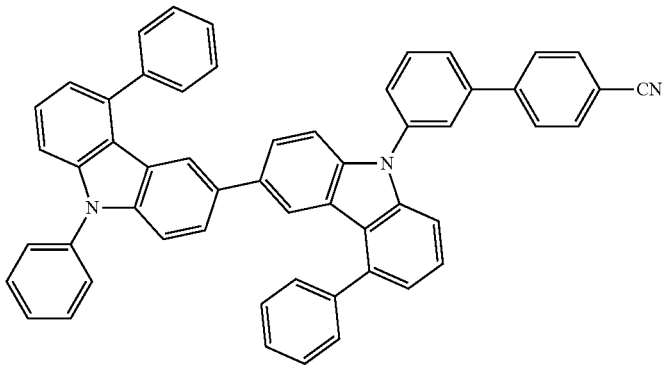
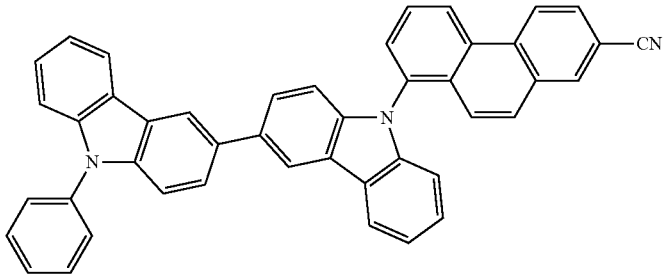

-continued

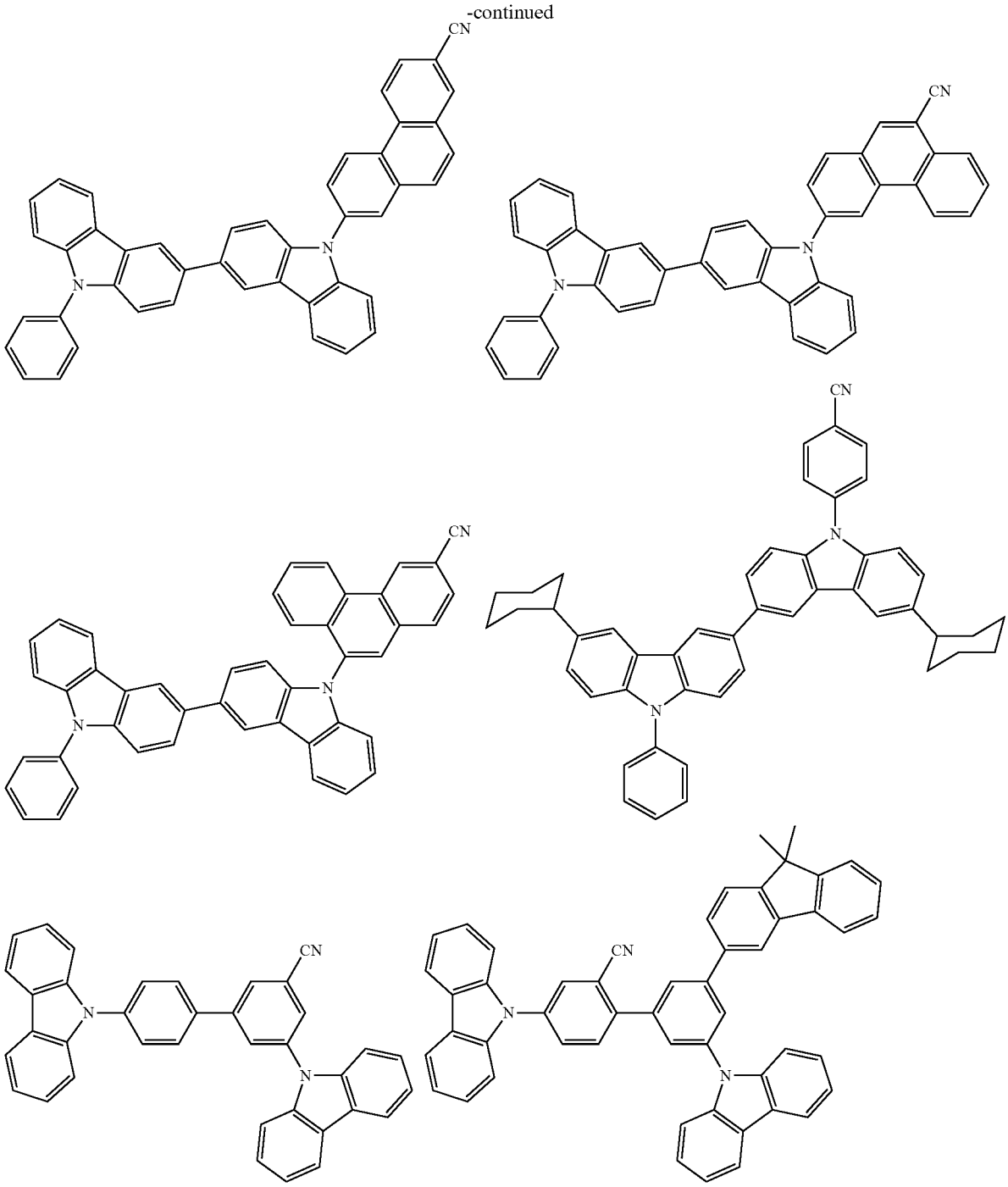

In the exemplary embodiment, the first host material is preferably represented by at least one of the following formulae (1-2) and (2-2). Moreover, in the exemplary embodiment, the second host material is preferably represented by the following formula (3-2).

$$A\text{-}L^{10}\text{-}Az\text{-}(\text{-}W_{CN})_p \quad (1\text{-}2)$$

$$A\text{-}L^{10}\text{-}Az\text{-}(\text{-}CN)_q \quad (2\text{-}2)$$

$$A\text{-}L^{10}\text{-}Ar^1\text{-}(\text{-}CN)_r \quad (3\text{-}2)$$

In the formulae (1-2), (2-2) and (3-2), Az, $W_{CN}$, $Ar^1$, p, q and r are the same as Az, $W_{CN}$, $Ar^1$, p, q and r described above.

In the formulae (1-2), (2-2) and (3-2), $L^{10}$ represents a divalent aromatic hydrocarbon group having 6 to 60 ring carbon atoms, or a divalent heterocyclic group having 5 to 60 ring atoms. $L^{10}$ may have a substituent. The divalent aromatic hydrocarbon group having 6 to 60 ring carbon atoms for $L^{10}$ is exemplified by an aromatic hydrocarbon group having 6 to 60 ring carbon atoms represented by A described later of which valence is changed to 2. The divalent aromatic heterocyclic group having 5 to 60 ring carbon atoms for $L^{10}$ is exemplified by an aromatic heterocyclic group having 5 to 60 ring carbon atoms represented by A described later of which valence is changed to 2.

In the formulae (1-2), (2-2) and (3-2), A each independently represents an aromatic hydrocarbon group having 6 to 60 ring carbon atoms (preferably, having 6 to 30 ring carbon atoms), or a heterocyclic group having 5 to 60 ring atoms (preferably, having 5 to 30 ring atoms). A may have a substituent. Examples of the aromatic hydrocarbon group having 6 to 60 ring carbon atoms for A in the formulae (1-2), (2-2) and (3-2) are the same as those of the aromatic hydrocarbon group for $W_{CN}$ in the formula (1). Examples of the heterocyclic group having 5 to 60 ring atoms for A in the formulae (1-2), (2-2) and (3-2) are the same as those of the aromatic heterocyclic group for $W_{CN}$ in the formula (1). A in the formulae (1-2), (2-2) and (3-2) is preferably a group derived vrom benzene, naphthalene, phenanthrene, fluorene, triphenylene, dibenzofuran and carbazole and may have a substituent.

In the formulae (1-2), (2-2) and (3-2), A is preferably represented by the following formula (10).

(10)

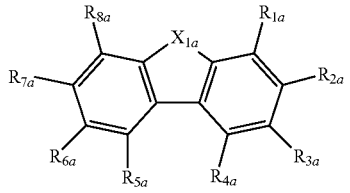

In the formula (10), $R_{1a}$ to $R_{8a}$ each independently represent a hydrogen atom or a substituent. At least one pair of adjacent substituents of $R_{1a}$ to $R_{8a}$ are bonded to each other to form a cyclic structure represented yb the following formula (11).

(11)

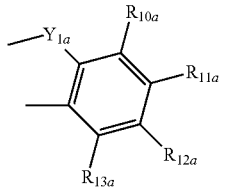

In the formula (11), $R_{10a}$ to $R_{13a}$ each independently represent a hydrogen atom or a substituent.

$X_{1a}$ in the formula (10) and $Y_{1a}$ in the formula (11) each independently represent an oxygen atom, a sulfur atom, —$NR_{21}$— or —$CR_{22}R_{23}$—. $R_{21}$, $R_{22}$ and $R_{23}$ each independently represent a hydrogen atom or a substituent.

It should be noted that, in the formulae (10) and (11), one of $R_{1a}$ to $R_{8a}$, $R_{10a}$ to $R_{13a}$ and $R_{21}$ to $R_{23}$ is bonded to $L^{10}$.

In the formulae (1-2), (2-2) and (3-2), A is preferably represented by one of the following formulae (12) to (17).

(12)

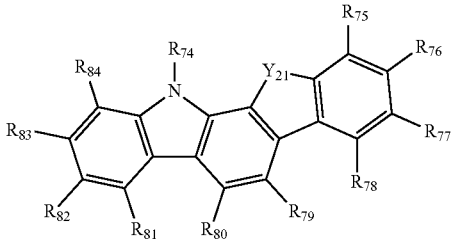

(13)

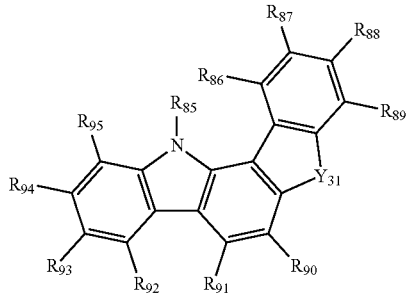

(14)

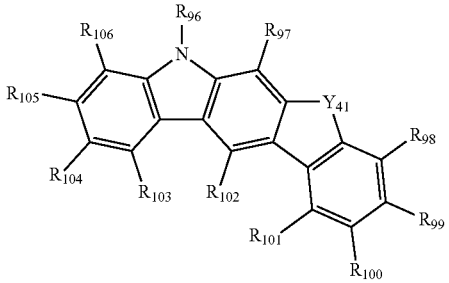

(15)

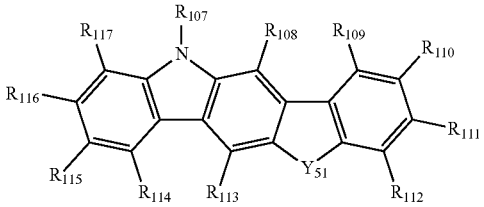

(16)

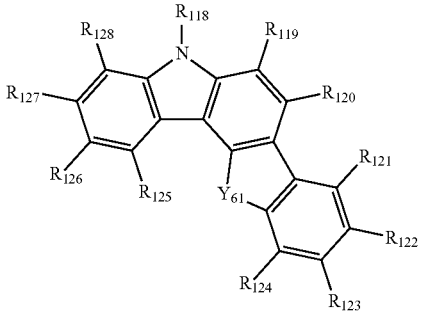

-continued (17)

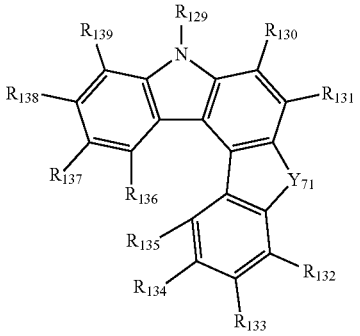

In the formulae (12) to (17), $R_{74}$ to $R_{139}$ each independently represent a hydrogen atom or a substituent.

In the formulae (12) to (17), $Y_{21}$, $Y_{31}$, $Y_{41}$, $Y_{51}$, $Y_{61}$ and $Y_{71}$ in the formulae (12) to (17) each independently represent an oxygen atom, a sulfur atom, —$NR_{31}$— or —$CR_{32}R_{33}$—. $R_{31}$, $R_{32}$ and $R_{33}$ each independently represent a hydrogen atom or a substituent.

In the formula (12), one of $R_{74}$ to $R_{84}$ and $R_{31}$ to $R_{33}$ is bonded to $L^{10}$. In the formula (13), one of $R_{85}$ to $R_{95}$ and $R_{31}$ to $R_{33}$ is bonded to $L^{10}$. In the formula (14), one of $R_{96}$ to $R_{106}$ and $R_{31}$ to $R_{33}$ is bonded to $L^{10}$. In the formula (15), one of $R_{107}$ to $R_{117}$ and $R_{31}$ to $R_{33}$ is bonded to $L^{10}$. In the formula (16), one of $R_{118}$ to $R_{128}$ and $R_{31}$ to $R_{33}$ is bonded to $L^{10}$. In the formula (17), one of $R_{129}$ to $R_{139}$ and $R_{31}$ to $R_{33}$ is bonded to $L^{10}$.

In the formulae (1-2), (2-2) and (3-2), A is preferably represented by the following formula (20).

(20)

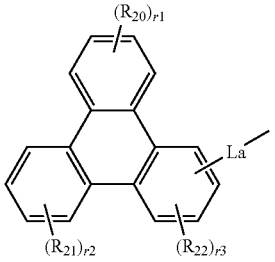

In the formula (20), $R_{20}$, $R_{21}$ and $R_{22}$ each independently represent a hydrogen atom or a substituent. $R_{20}$, $R_{21}$ and $R_{22}$ is bonded to carbon atoms in a cyclic structure forming a triphenylene ring represented by the formula (20). Adjacent substituents in $R_{20}$, $R_{21}$ and $R_{22}$ may form a ring.

In the formula (20), r1 and r2 is 4, and r3 is 3.

In the formula (20), La is a divalent aromatic hydrocarbon group having 6 to 60 ring carbon atoms or a divalent heterocyclic group having 5 to 60 ring atoms. La may have a substituent. La is bonded to carbon atoms in a cyclic structure forming a triphenylene ring represented by the formula (20).

The substituents in the formulae (1-2), (2-2), (3-2), (12) to (17) and (20) represents the same as the aforementioned substituents.

Specific examples of the first host material in the exemplary embodiment are described below, but the compound of the exemplary embodiment is not limited thereto.

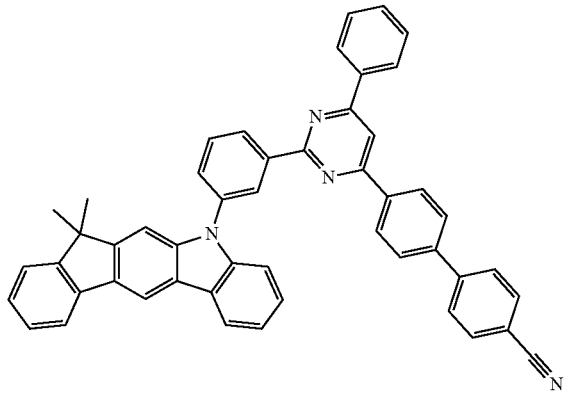

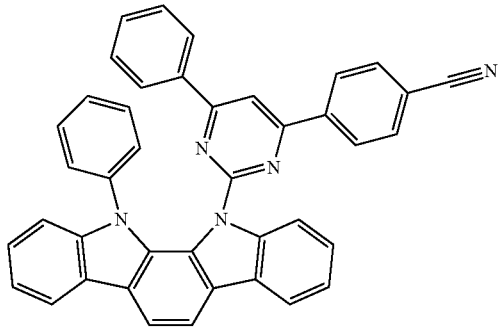

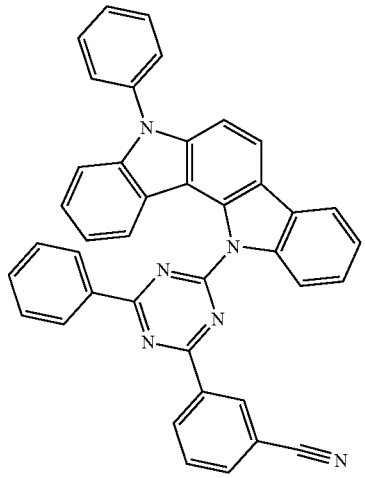

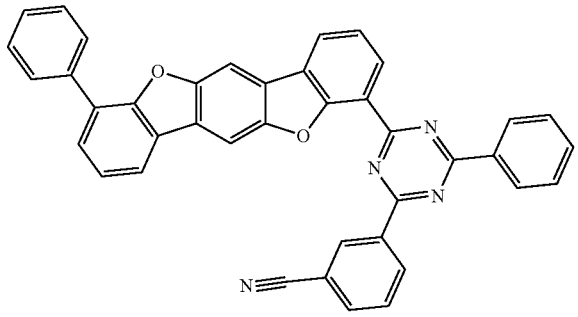

-continued
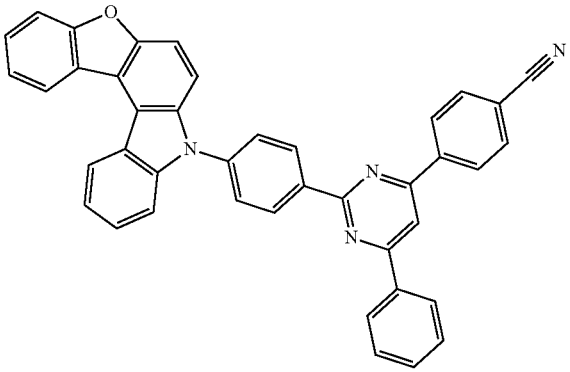
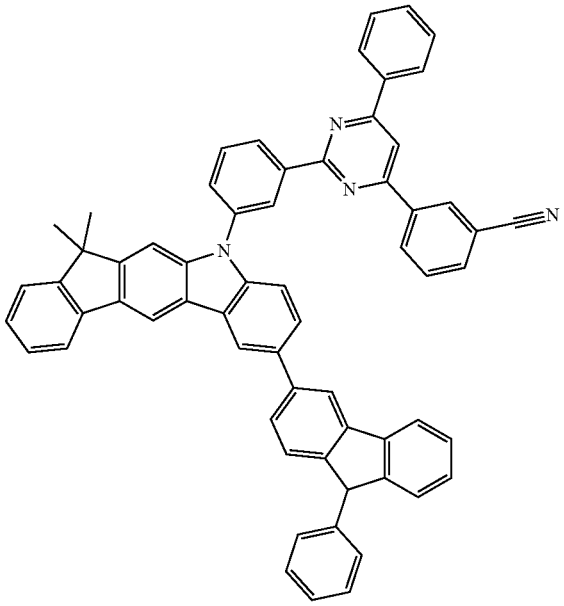
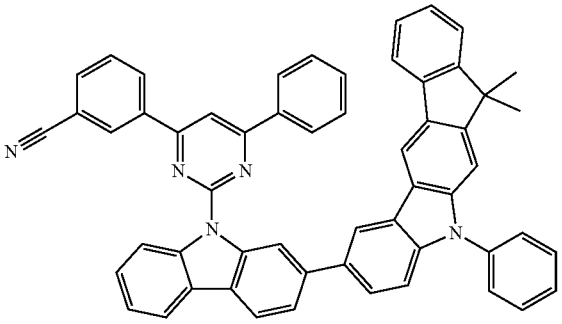
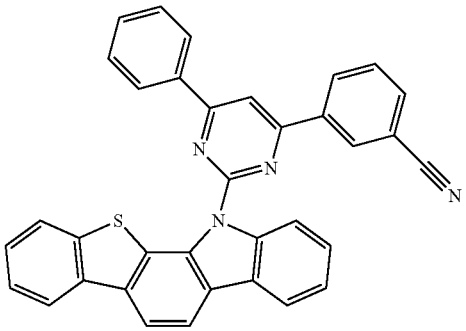
-continued
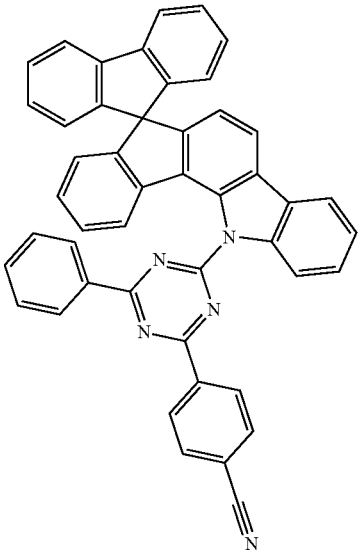
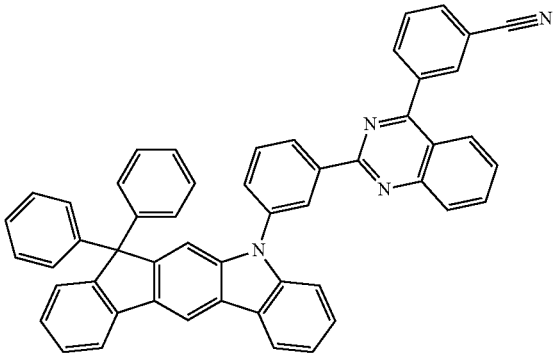
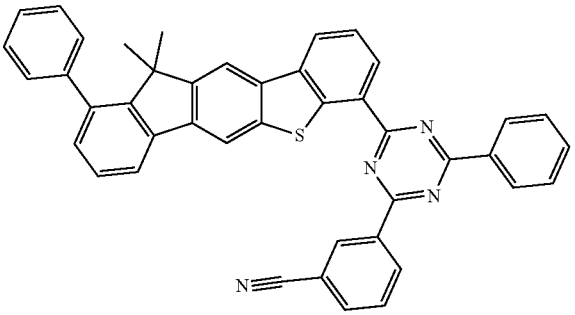
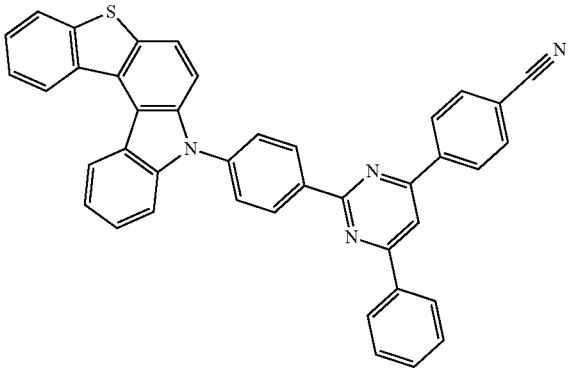
Subsequently, specific examples of the second host material in the exemplary embodiment are described below, but the compound of the exemplary embodiment is not limited thereto.

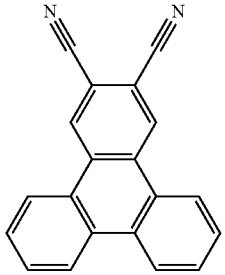
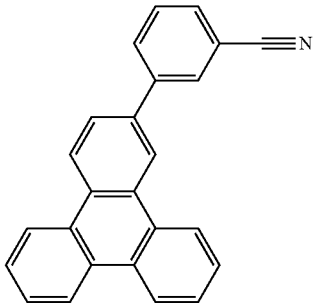
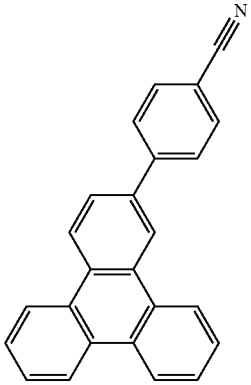
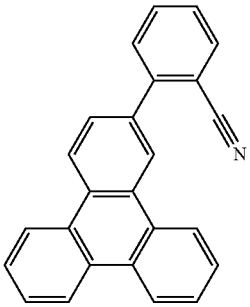
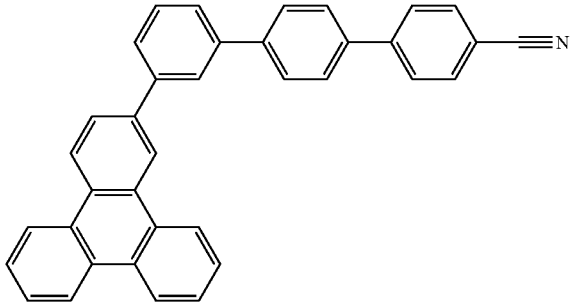
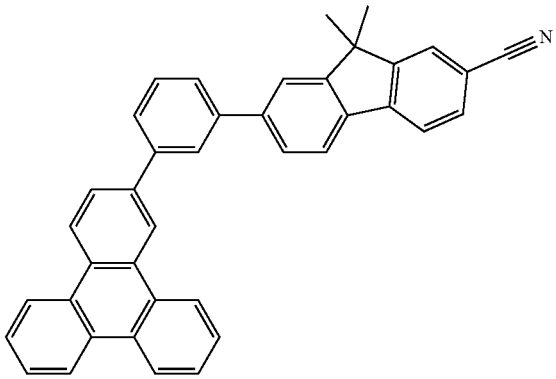
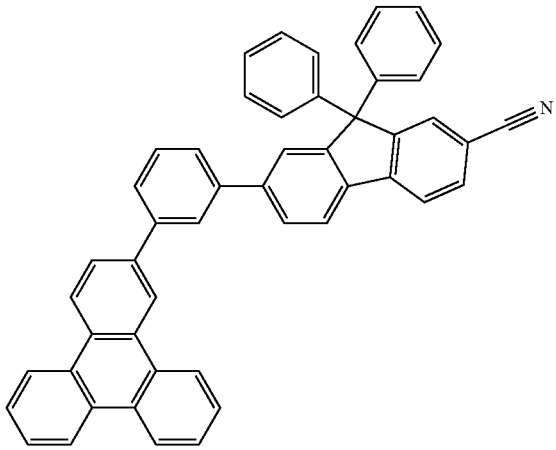
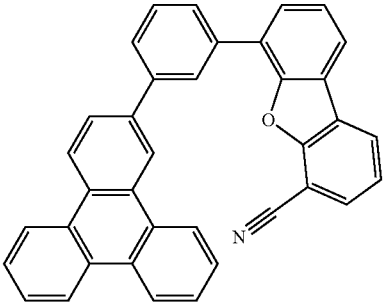
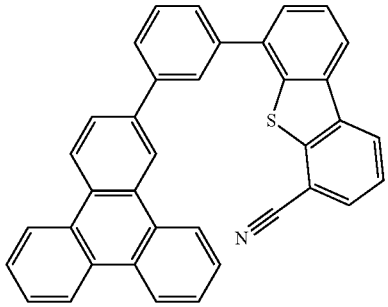
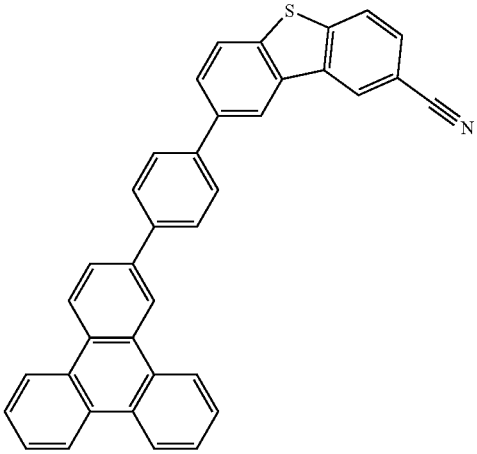

-continued
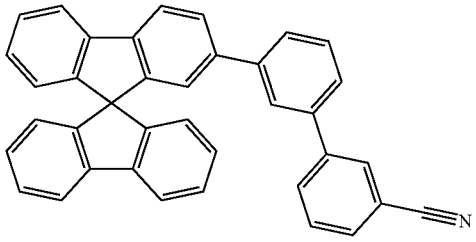
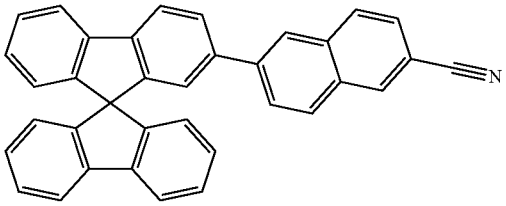
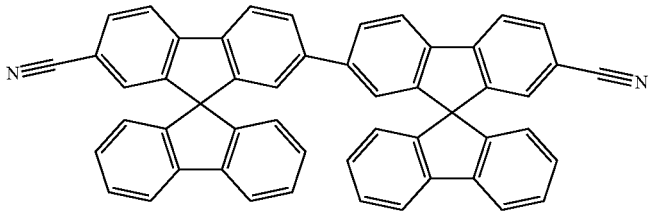
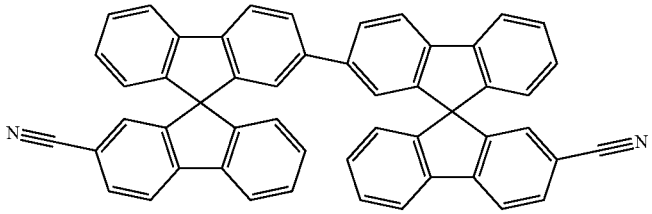
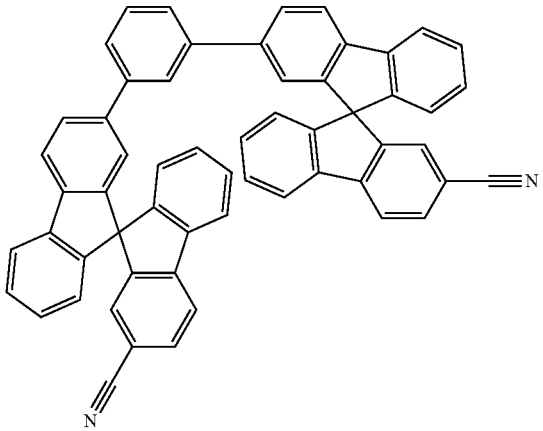
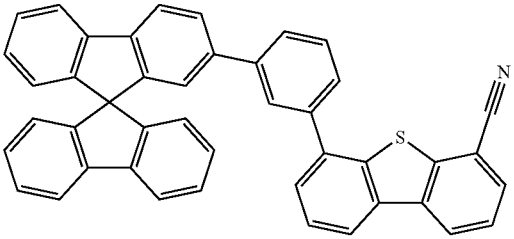
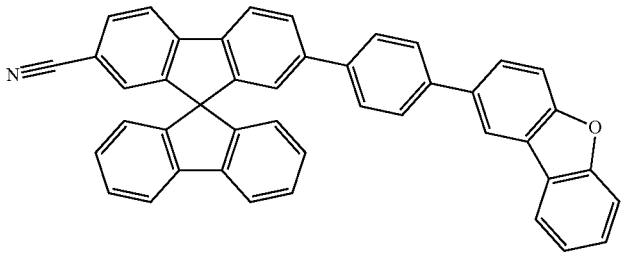
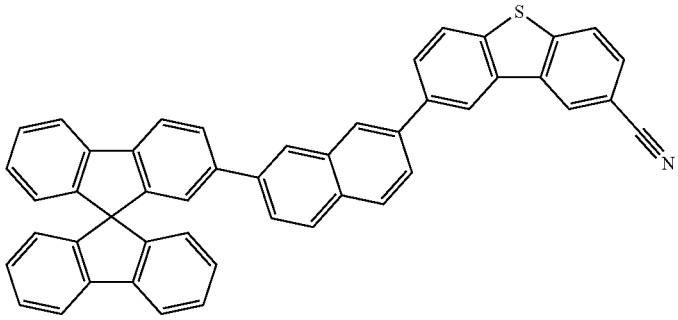
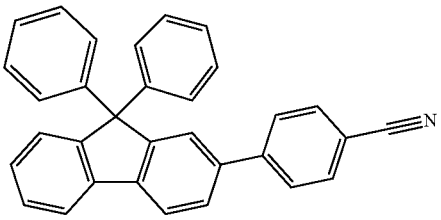

-continued
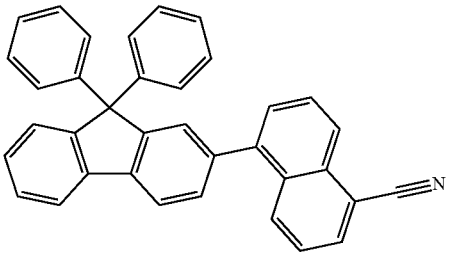
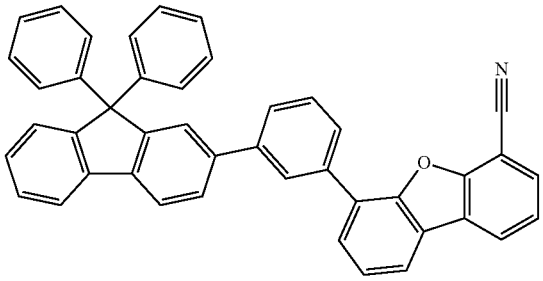
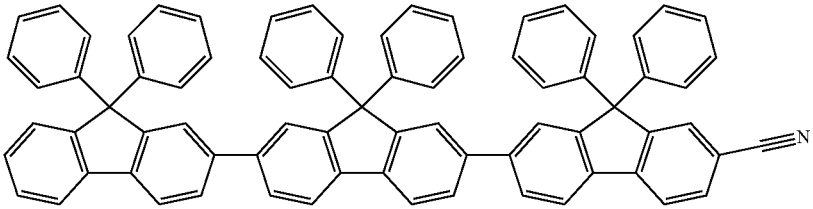
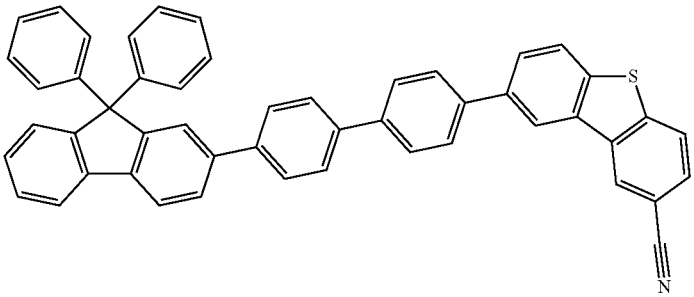
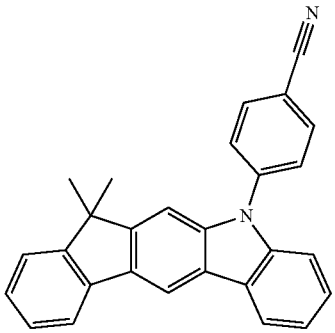
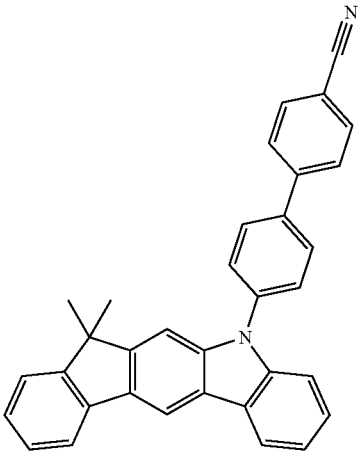
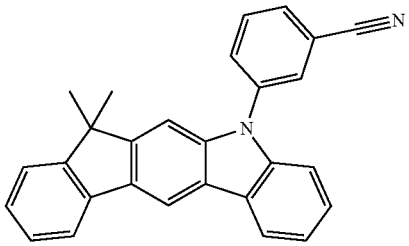
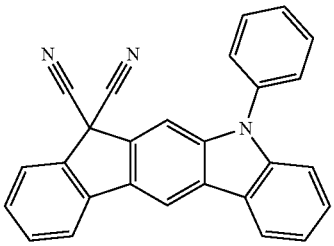
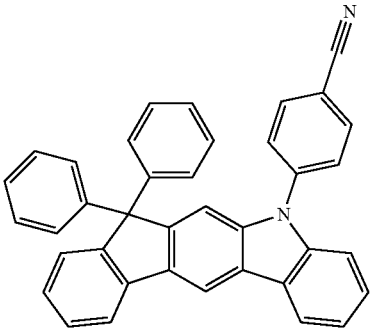
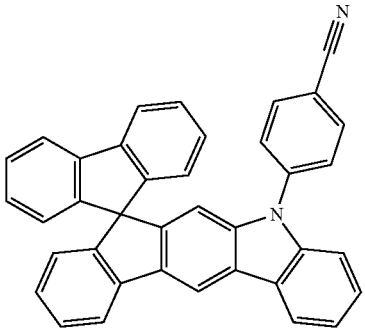
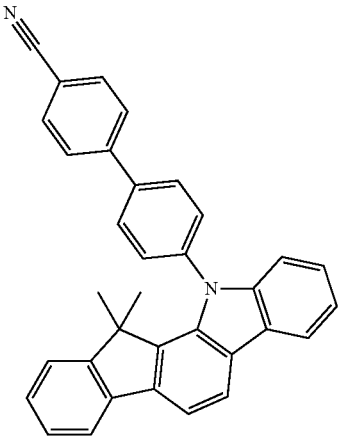

-continued
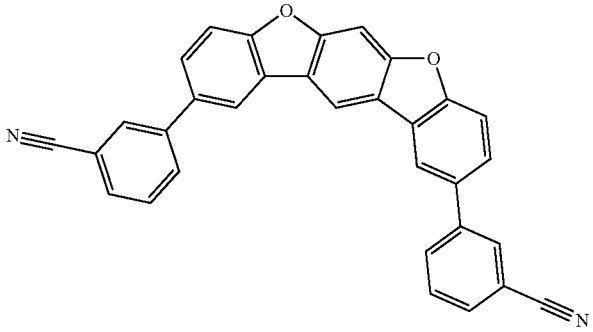
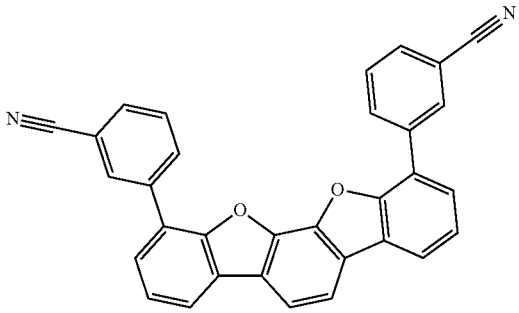
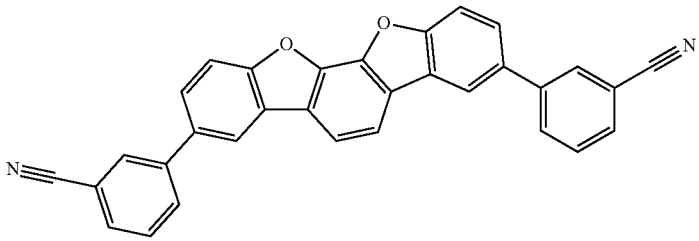
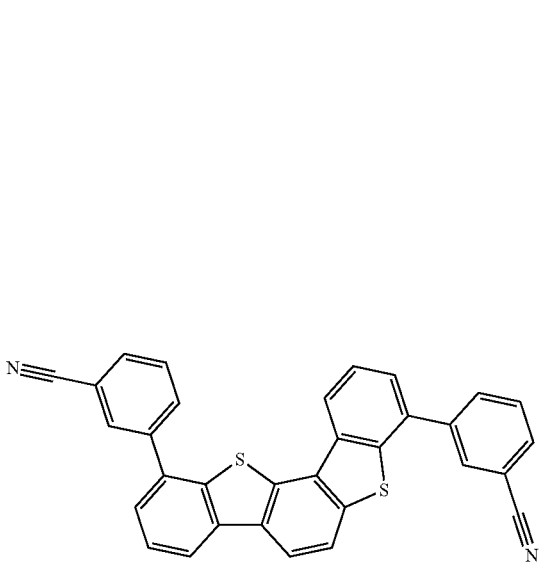
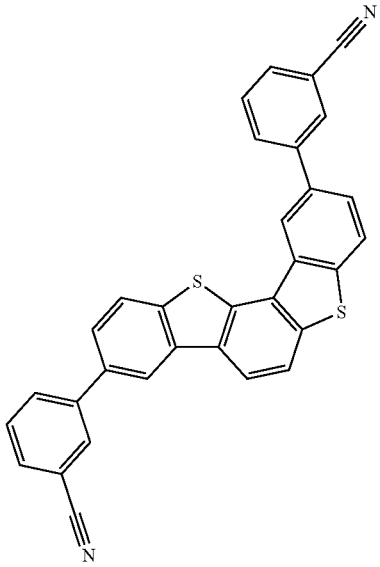
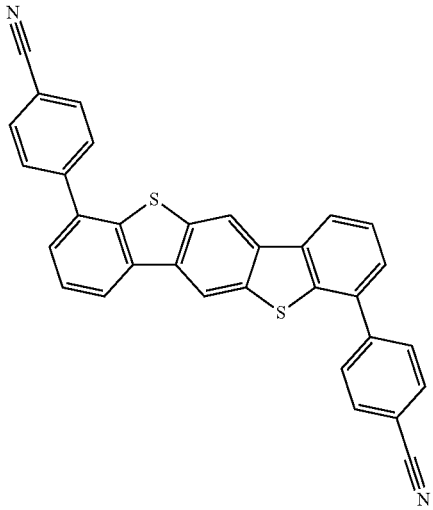
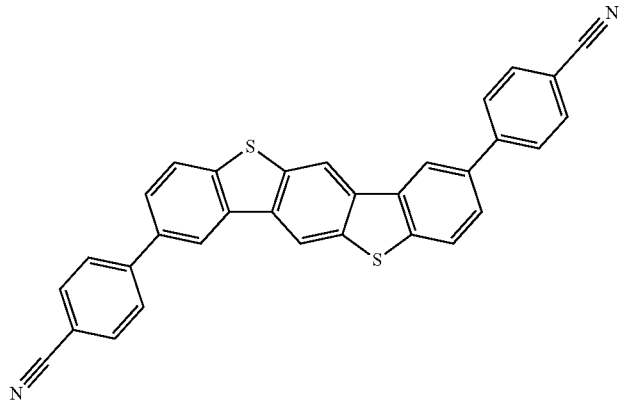

-continued
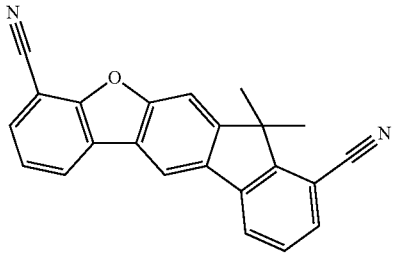
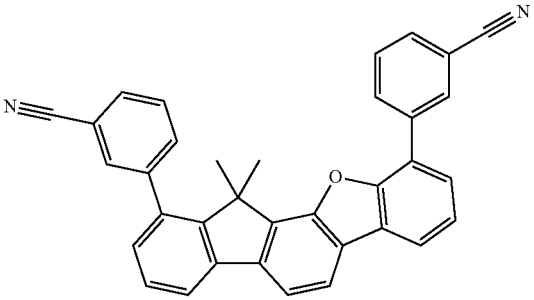
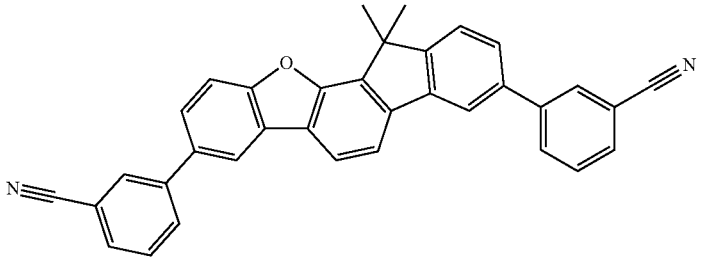
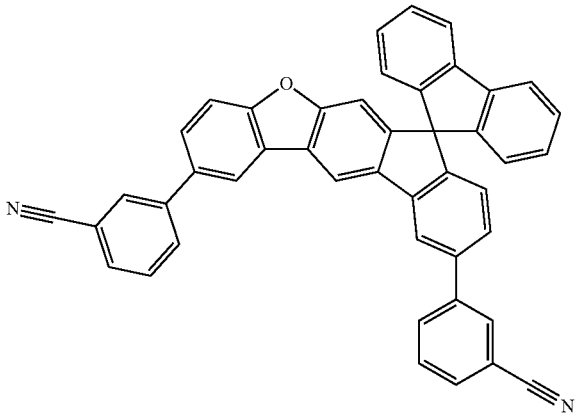
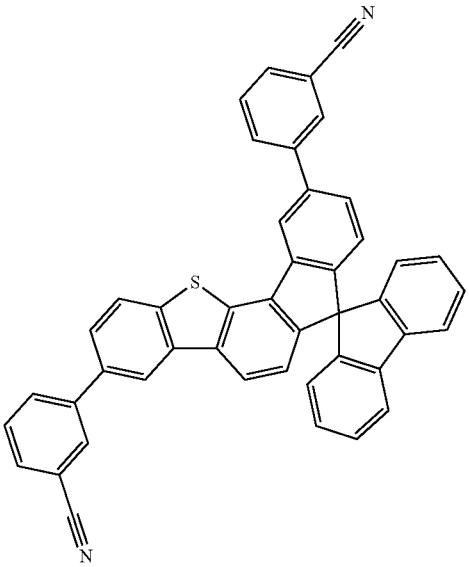
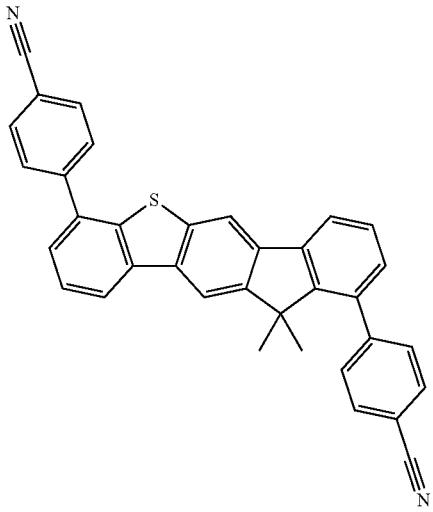
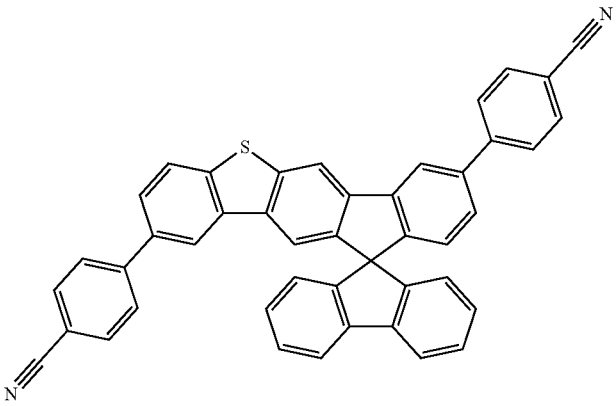

-continued
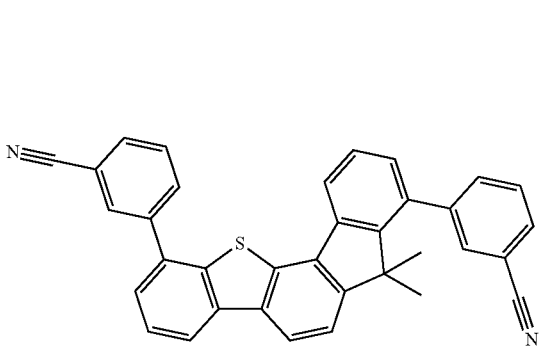
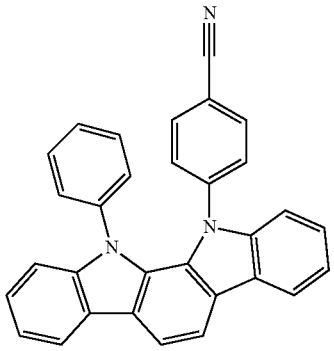
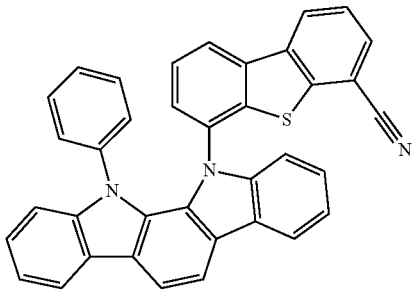
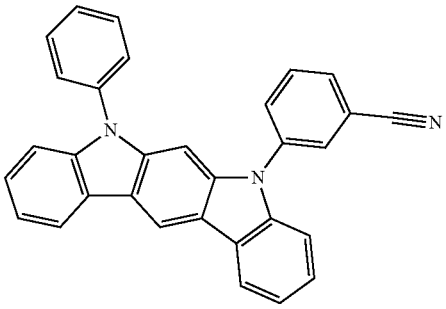
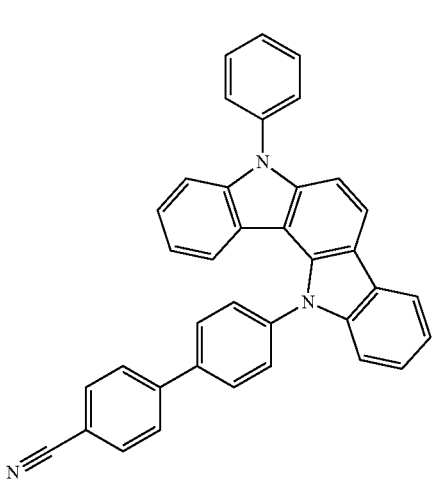
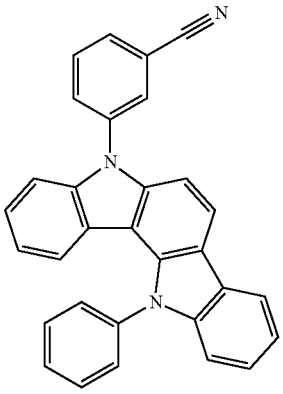
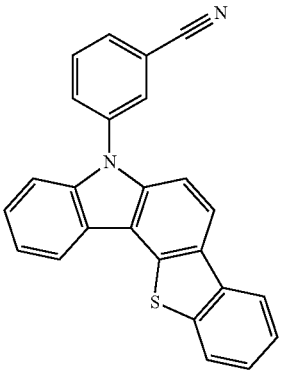
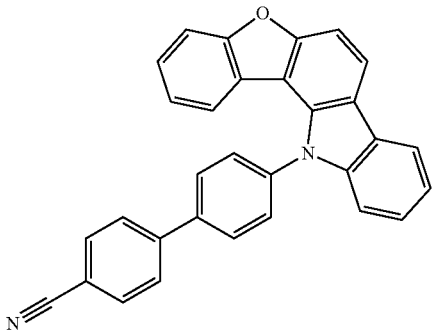
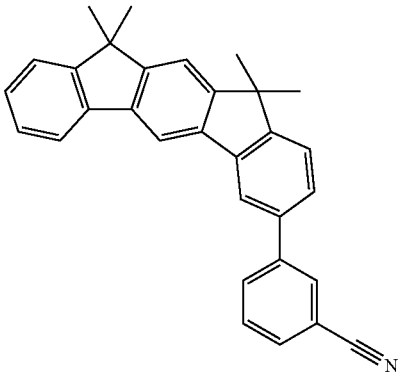
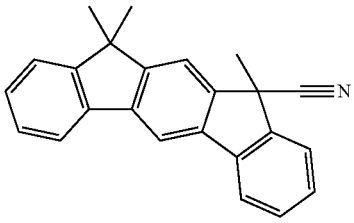

-continued

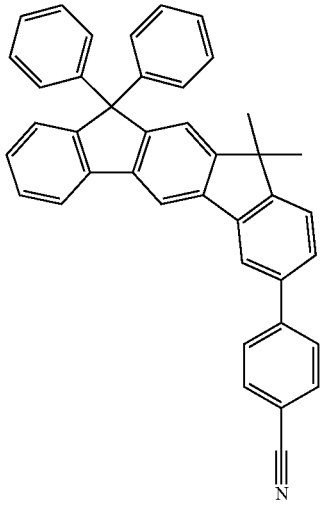

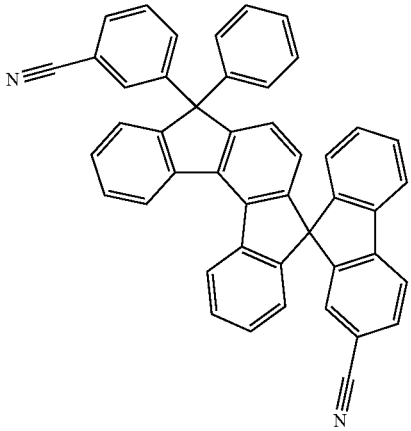

Luminescent Material

Examples of a luminescent material contained in the emitting layer are a fluorescent material and a phosphorescent material, among which the phosphorescent material is preferable.

The fluorescent material used as the dopant material (hereinafter, referred to as a fluorescent dopant material) is selected from a fluoranthene derivative, pyrene derivative, arylacetylene derivative, fluorene derivative, boron complex, perylene derivative, oxadiazole derivative, anthracene derivative and chrysene derivative. The fluoranthene derivative, pyrene derivative and boron complex are preferable.

The dopant material of the organic EL device according to the exemplary embodiment is preferably the phosphorescent material emittable in a triplet state. The phosphorescent material used as the dopant material (hereinafter, referred to as a phosphorescent dopant material) preferably contains a metal complex. The metal complex preferably contains: a metal atom selected from iridium (Ir), platinum (Pt), osmium (Os), gold (Au), rhenium (Re) and ruthenium (Ru); and a ligand. Particularly, an ortho-metalated complex in which the ligand and the metal atom form an ortho-metal bond is preferable. As the phosphorescent dopant material, an ortho-metalated complex containing a metal selected from the group consisting of iridium (Ir), osmium (Os) and platinum (Pt) is preferable since a phosphorescent quantum yield is high and an external quantum efficiency of an emitting device is improvable. In terms of the luminous efficiency, a metal complex including the ligand selected from phenyl quinoline, phenyl isoquinoline, phenyl pyridine, phenyl pyrimidine, phenyl pyrazine and phenyl imidazole is preferable.

A content of the dopant material in the emitting layer is not particularly limited. Although the content thereof can be selected according to the need, for instance, the content thereof is preferably in a range of 0.1 mass % to 70 mass %, more preferably of 1 mass % to 30 mass %. When the content of the dopant material is 0.1 mass % or more, a sufficient emission is obtained. When the content of the dopant material is 70 mass % or less, concentration quenching is avoidable.

It should be noted that a host material combined with a fluorescent dopant material is herein referred to as a fluorescent host material while a host material combined with a phosphorescent dopant material is herein referred to as a phosphorescent host material. The fluorescent host material and the phosphorescent host material are not differentiated only from molecular structures thereof. In other words, the phosphorescent host material herein means a material for forming a phosphorescent-emitting layer containing a phosphorescent dopant material, and does not mean to be inapplicable to a material for forming a fluorescent-emitting layer. The same applies to a fluorescent host material.

Examples of the phosphorescent dopant material are shown below.

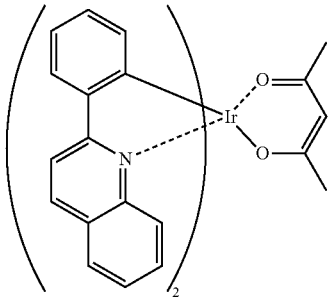

PQIr

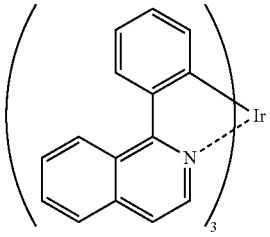

-continued
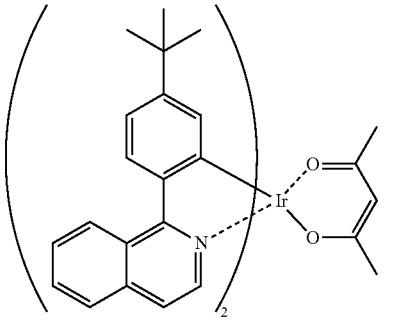
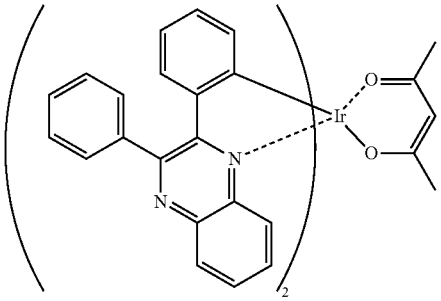
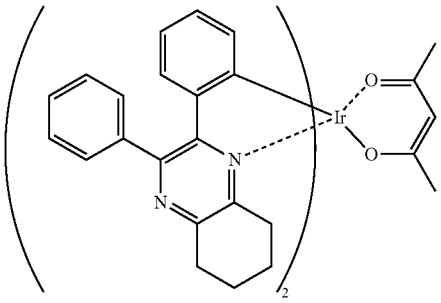
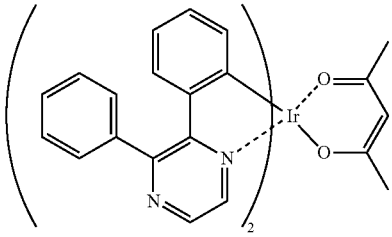
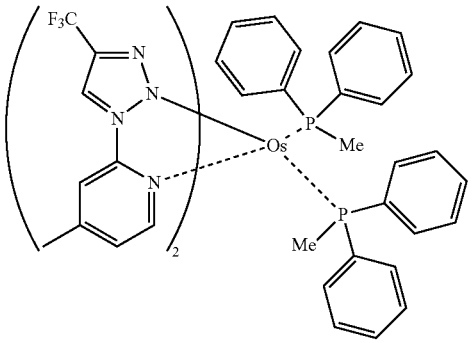
-continued
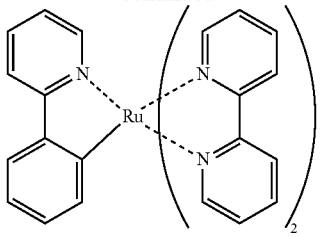
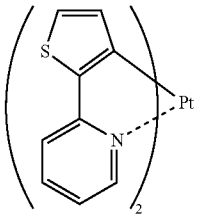
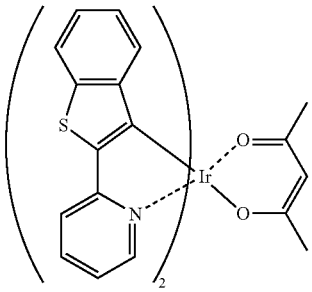
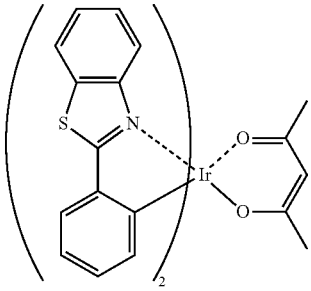
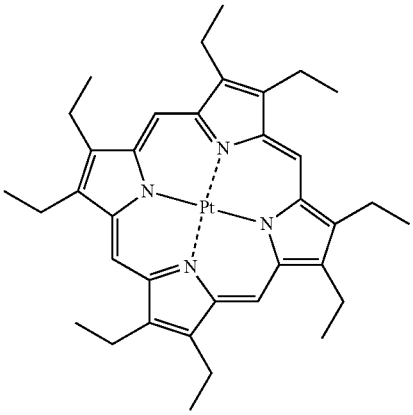
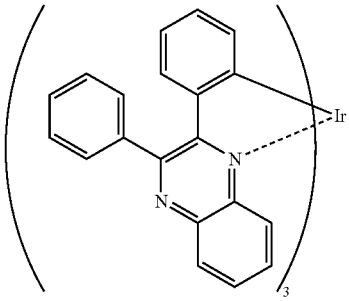

-continued
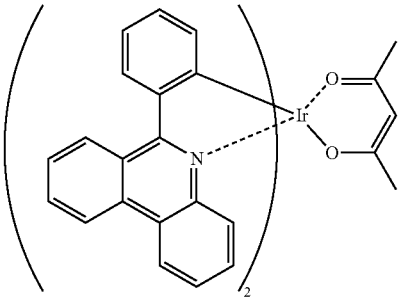
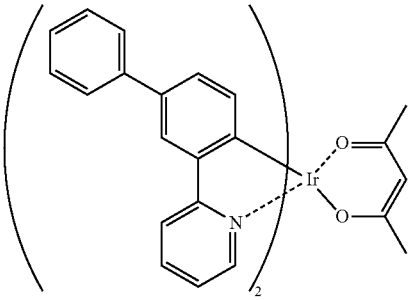
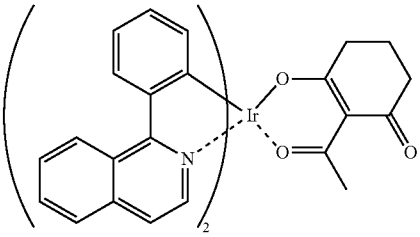
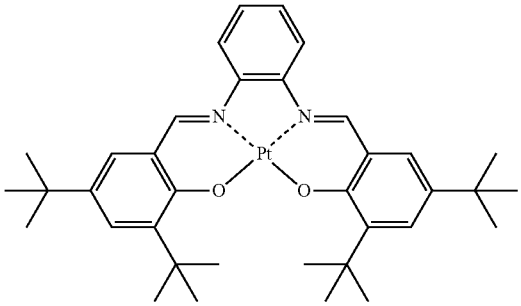
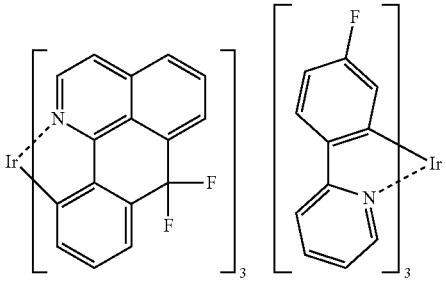
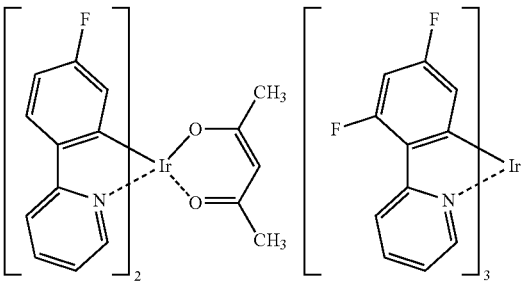
-continued
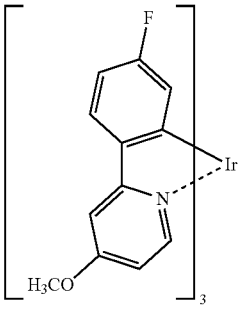
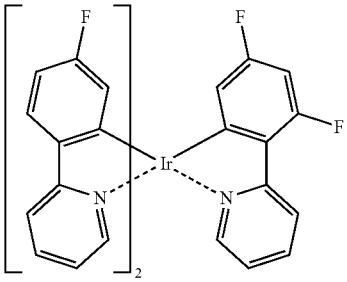
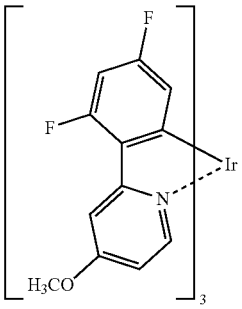
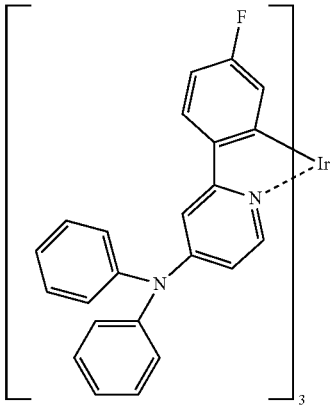
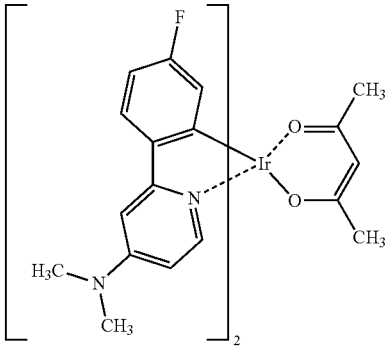

-continued
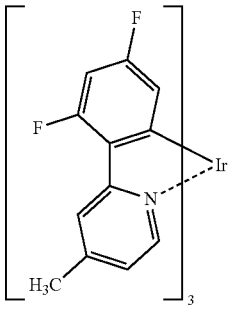
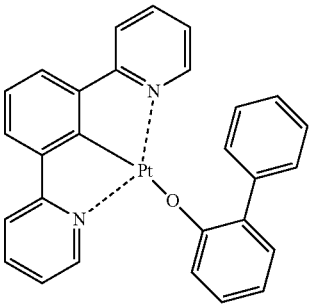
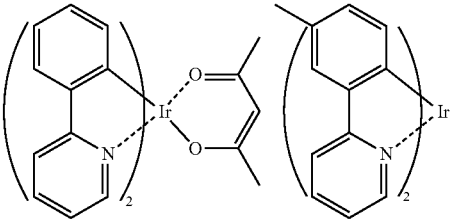
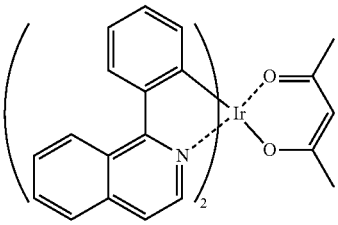
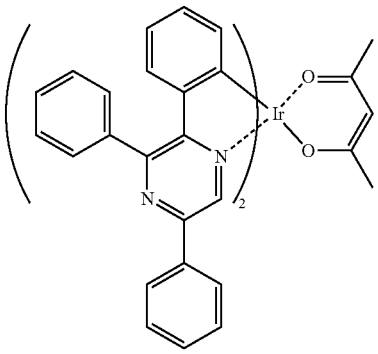
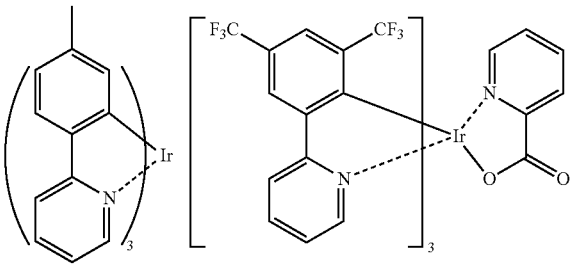
-continued
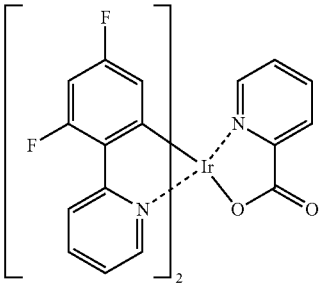
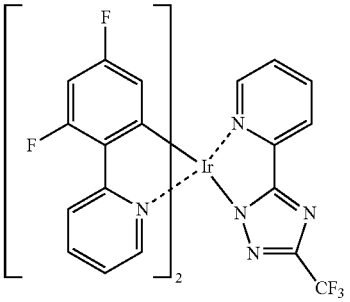
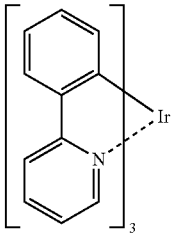
Ir(ppy)$_3$
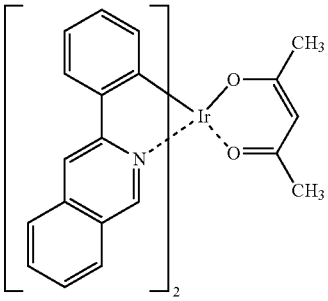
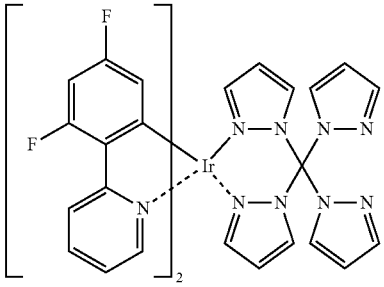
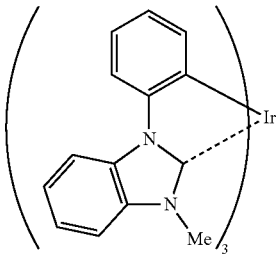
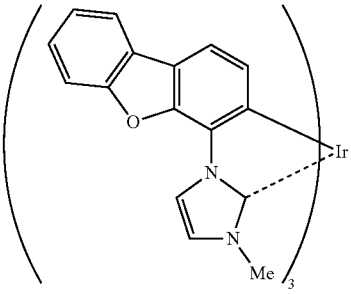

-continued
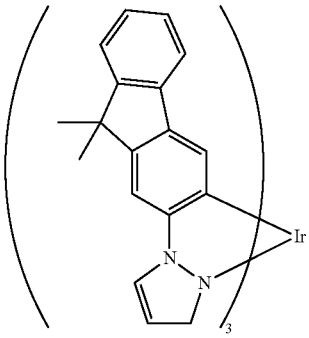
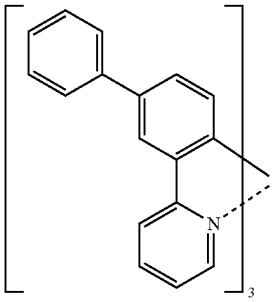
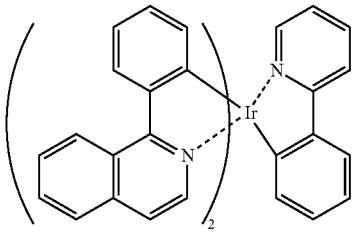
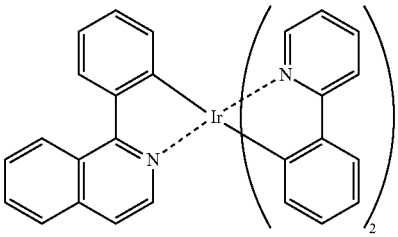
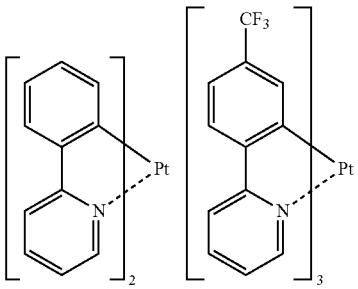
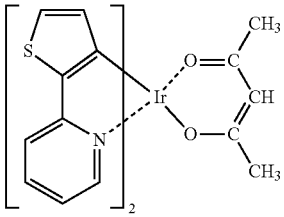
-continued
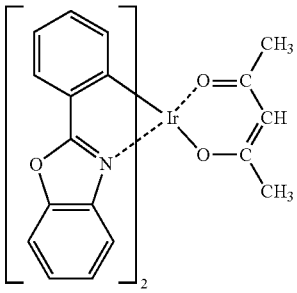
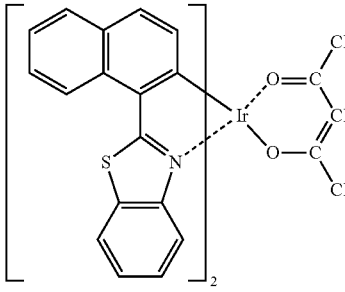
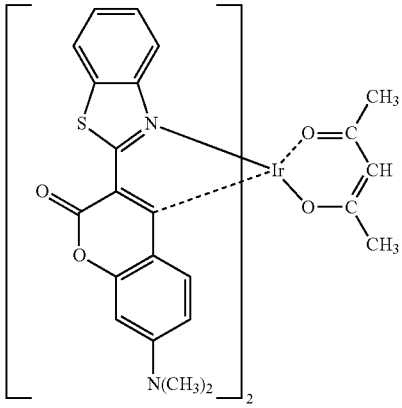
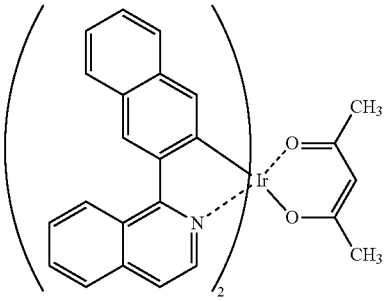
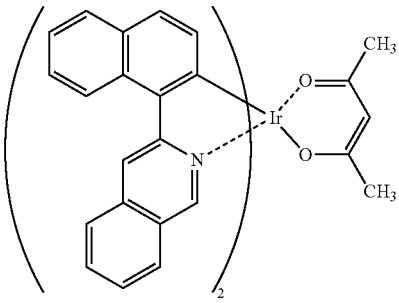

-continued

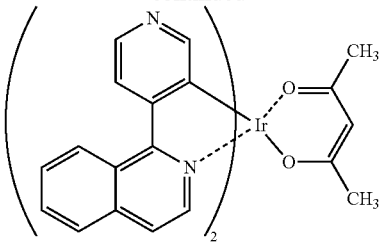

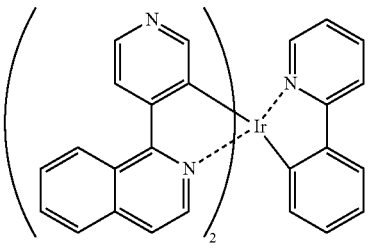

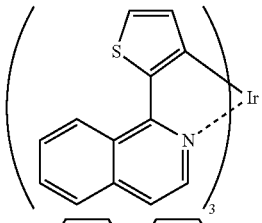

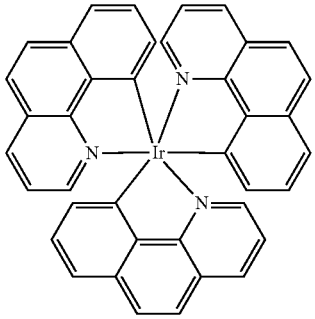

$Ir(bzq)_3$

One kind of the phosphorescent dopant material may be singularly used, or two or more kinds thereof may be used in combination.

An emission wavelength of the phosphorescent dopant material contained in the emitting layer is not particularly limited, but at least one of the phosphorescent dopant material contained in the emitting layer preferably has a peak of the emission wavelength in a range of 490 nm to 700 nm, more preferably in a range of 490 nm to 650 nm. Preferable emission colors of the emitting layer are, for instance, red, yellow and green. Using the first and second host materials and doping the phosphorescent dopant material having such an emission wavelength to form the emitting layer, the organic EL device can exhibit a high efficiency and a long lifetime.

The phosphorescent host material is a compound having a function to enable the phosphorescent dopant material to emit efficiently by efficiently trapping triplet energy of the phosphorescent dopant material in the emitting layer. The organic EL device according to the exemplary embodiment may select a compound other than the compounds of the first and second host materials as the phosphorescent host material according to the object of the invention.

The first and second host materials and the other compound may be used together in the same emitting layer. When a plurality of emitting layers are present, the first and second host materials may be used as a phosphorescent host material in one of the emitting layers while the compound other than the first and second host materials may be used as a phosphorescent host material in another one of the emitting layers. The first and second host materials may be used in the organic layer other than the emitting layer(s).

Specific examples of a preferable compound for the phosphorescent host material except for the compound for the first and second host materials include a carbazole derivative, triazoles derivative, oxazole derivative, oxadiazole derivative, imidazoles derivative, polyarylalkane derivative, pyrazoline derivative, pyrazolone derivative, phenylenediamine derivative, arylamine derivative, amino-substituted chalcone derivative, styryl anthracene derivative, fluorenone derivative, hydrazone derivative, stilbene derivative, silazane derivative, aromatic tertiary amine compound, styrylamine compound, aromatic dimethylidene compound, porphyrin compound, anthraquinodimethane derivative, anthrone derivative, diphenylquinone derivative, thiopyrandioxide derivative, carbodiimide derivative, fluorenylidenemethan derivative, distyryl pyrazine derivative, hyterocyclic tetracarboxylic acid anhydride such as naphthaleneperylene, phthalocyanine derivative, various metal complex polysilane compounds typified by a metal complex of 8-quinolinol derivative, and a metal complex having metal phthalocyanine, benzoxazole or benzothiazole as the ligand, poly(N-vinylcarbazole) derivative, aniline copolymer, conductive high molecular weight oligomers such as thiophene oligomer and polythiophene, polymer compounds such as polythiophene derivative, polyphenylene derivative, polyphenylene vinylene derivative and polyfluorene derivative. One kind of the phosphorescent host material other than the first and second host materials may be singularly used, or two or more kinds thereof may be used in combination. Specifically, the following compounds are shown.

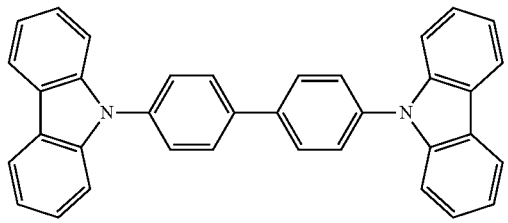

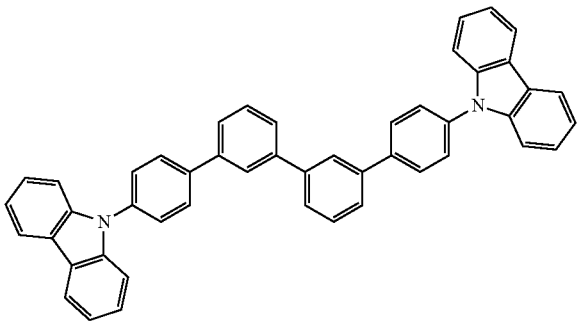

-continued

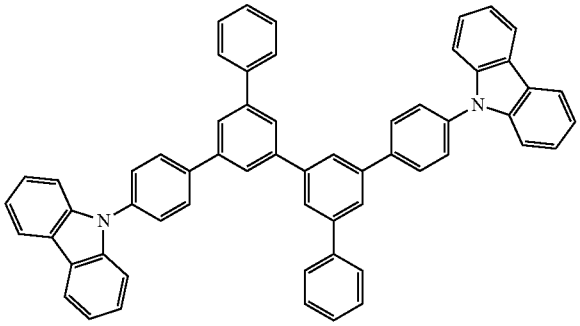

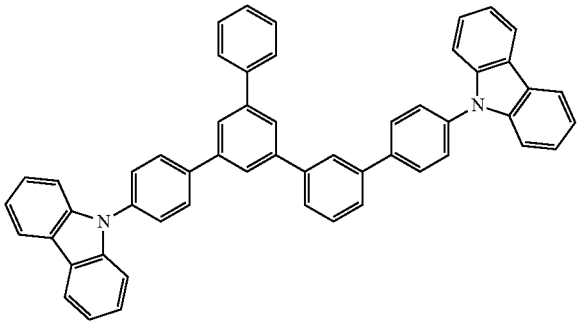

Hole Injecting•Transporting Layer

The hole injecting•transporting layer helps injection of holes to the emitting layer and transports the holes to an emitting region. The hole injecting•transporting layer exhibits a large hole mobility and a small ionization energy.

The hole injecting transporting layer may be provided by a hole injecting layer or a hole transporting layer, or alternatively, may be provided by a laminate of a hole injecting layer and a hole transporting layer.

A material for forming the hole injecting layer and the hole transporting layer is preferably a material for transporting the holes to the emitting layer at a lower electric field intensity. For instance, an aromatic amine compound is preferably used. A material for the hole injecting layer is preferably a porphyrin compound, an aromatic tertiary amine compound or a styryl amine compound, particularly preferably the aromatic tertiary amine compound such as hexacyanohexaazatriphenylene (HAT).

A material for forming the hole injecting•transporting layer is preferably a material for transporting the holes to the emitting layer at a lower electric field intensity. For instance, an aromatic amine compound represented by the following formula (A1) is preferably used.

(A1)

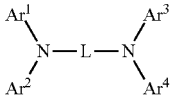

In the formula (A1), $Ar^1$ to $Ar^4$ each independently represent an aromatic hydrocarbon group having 6 to 50 ring carbon atoms, an aromatic heterocyclic group having 2 to 40 ring carbon atoms, a group provided by bonding the aromatic hydrocarbon group and the aromatic heterocyclic group, or a group provided by bonding the aromatic hydrocarbon group and the aromatic heterocyclic group.

Note that the aromatic hydrocarbon group and the aromatic heterocyclic group described herein may have a substituent.

In the formula (A1), L is a linking group and represents a divalent aromatic hydrocarbon group having 6 to 50 ring carbon atoms, a divalent aromatic heterocyclic group having 5 to 50 ring carbon atoms, and a divalent group provided by bonding at least two of the aromatic heterocyclic groups or the aromatic heterocyclic group through a single bond, an ether bond, a thioether bond, an alkylene group having 1 to 20 carbon atoms, an alkenylene group having 2 to 20 carbon atoms, or an amino group.

It should be noted that the divalent aromatic hydrocarbon group and the divalent aromatic heterocyclic group described herein may have a substituent.

Examples of the compound represented by the formula (A1) are shown below. However, the compound represented by the formula (A1) is not limited thereto.

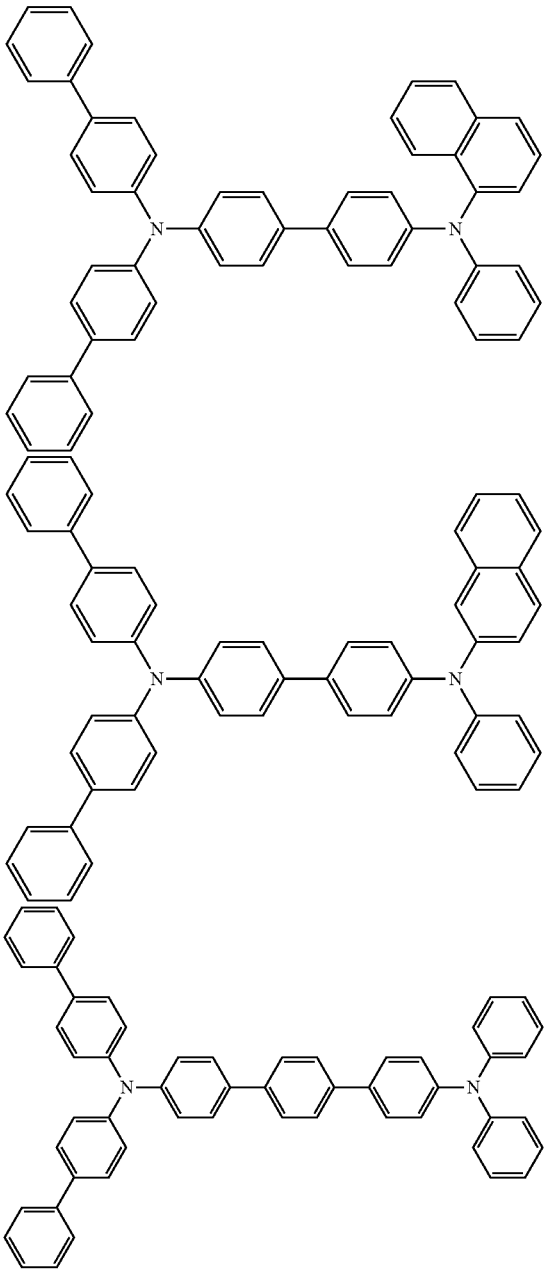

-continued
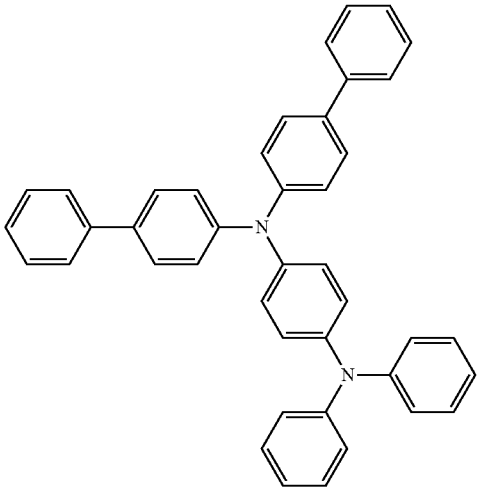
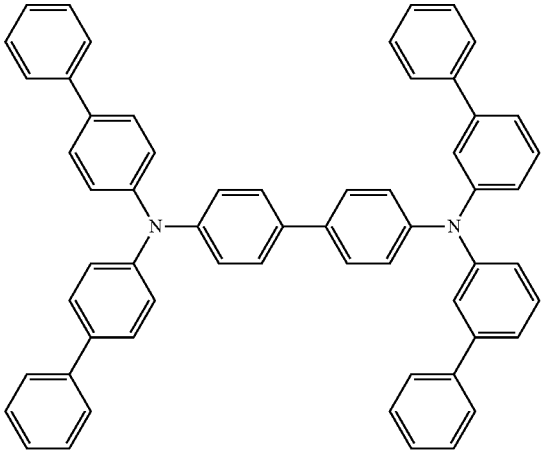
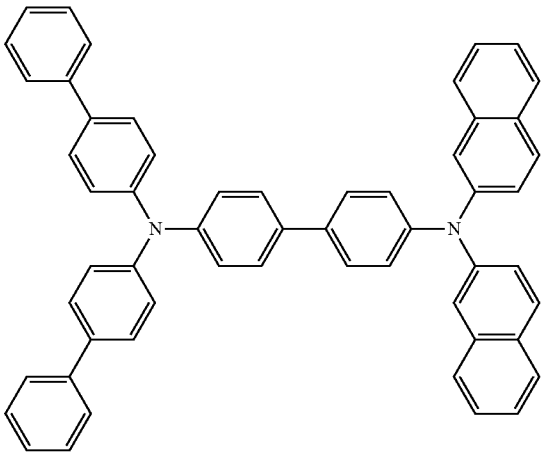
-continued
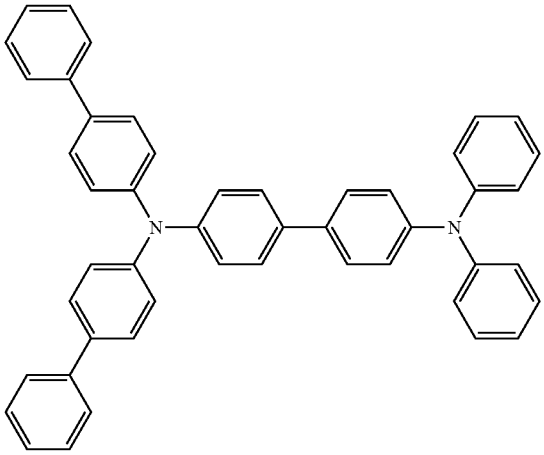
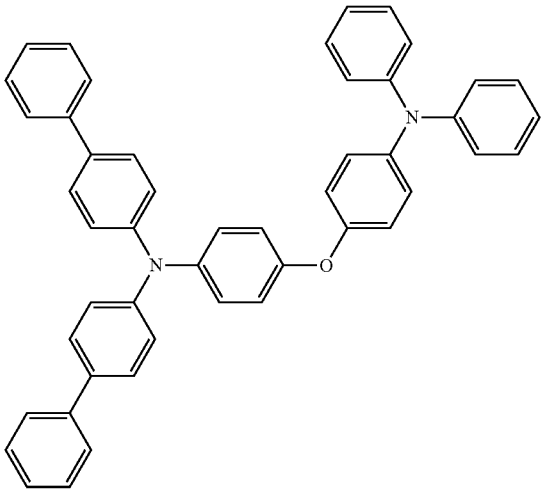
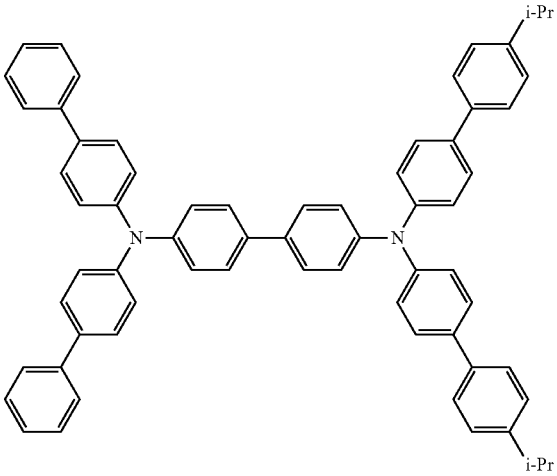

-continued
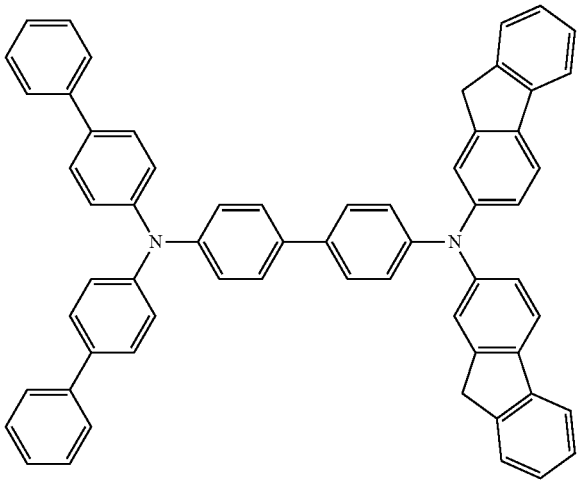
-continued
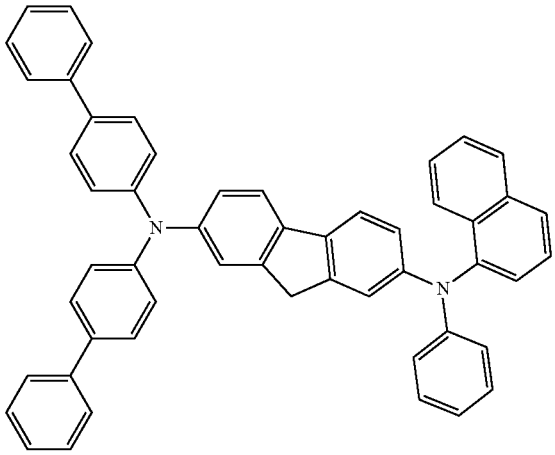
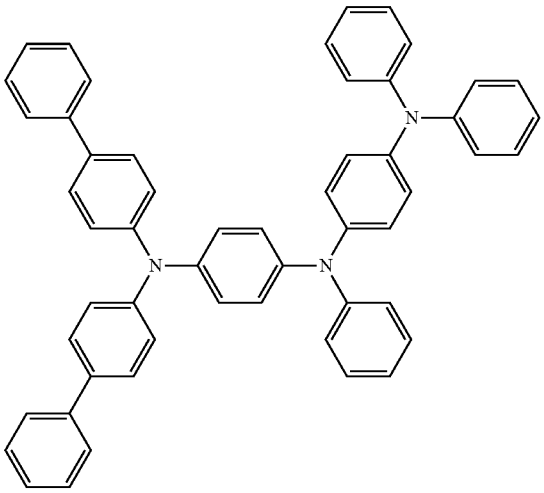
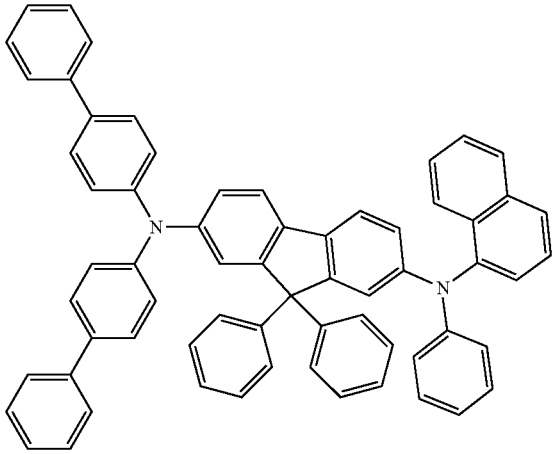
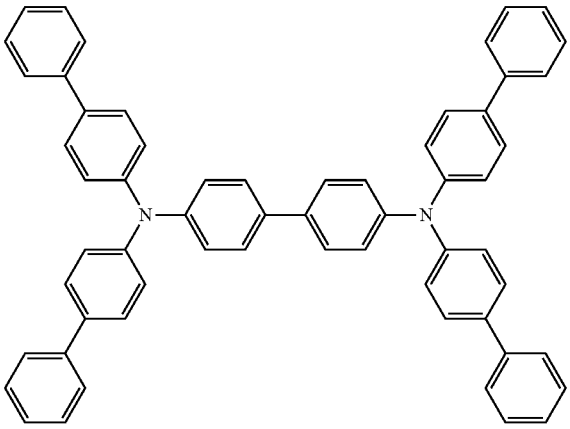
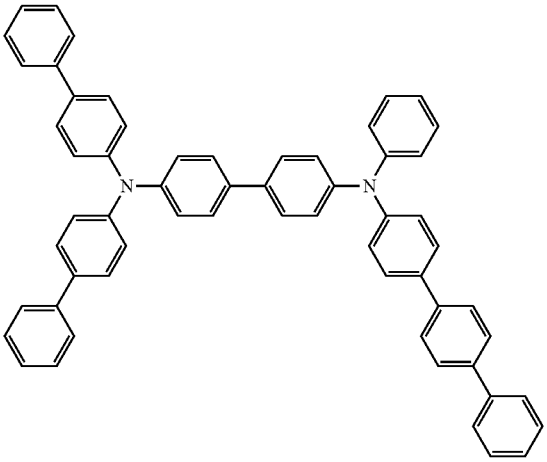

-continued
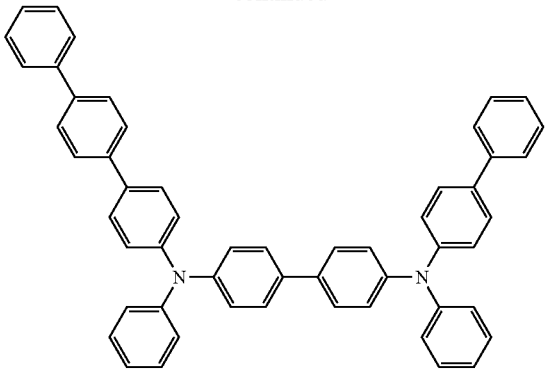
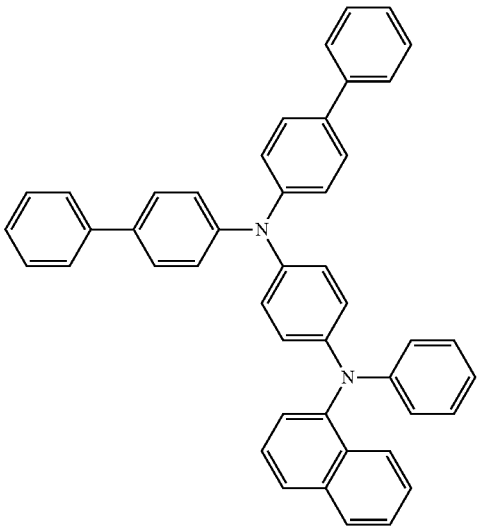
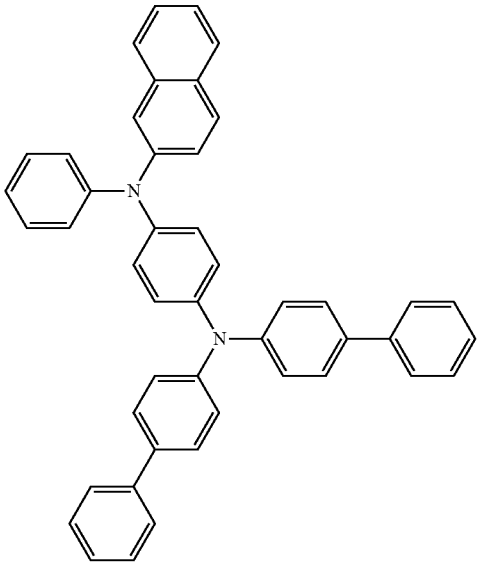
-continued
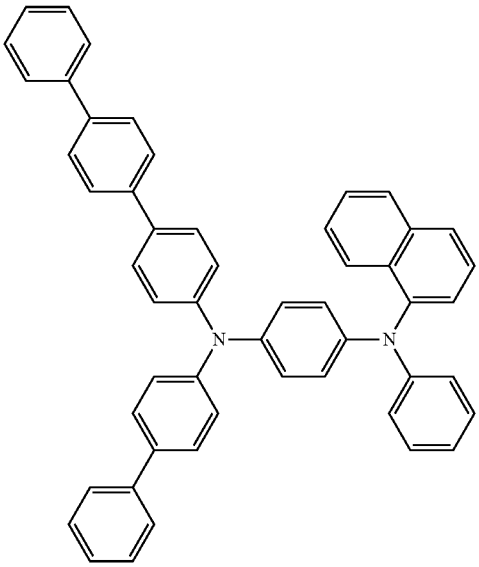
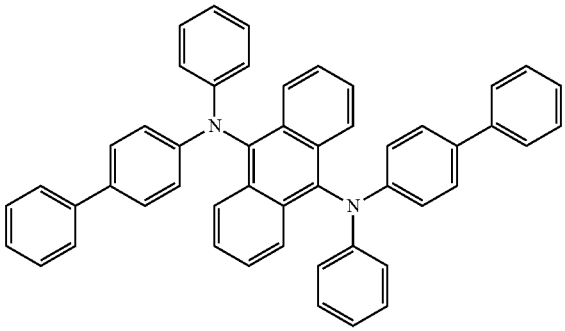
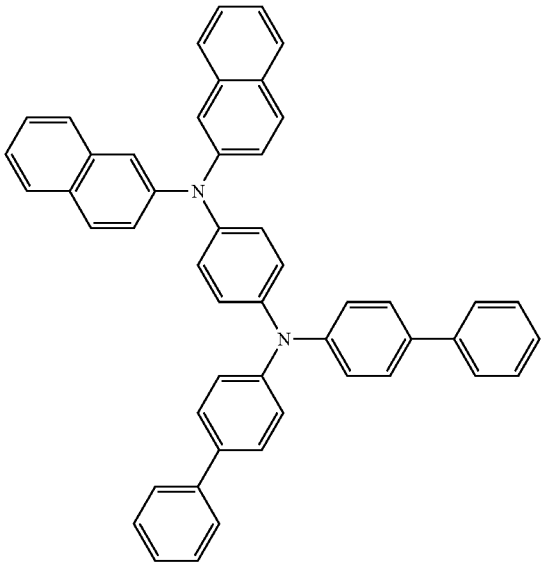

-continued
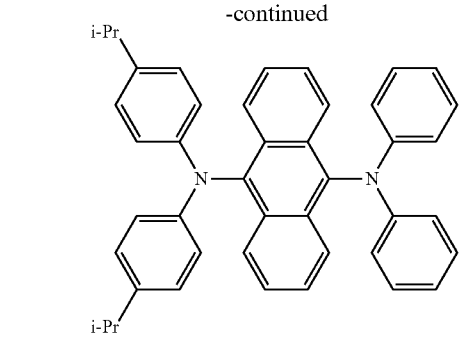
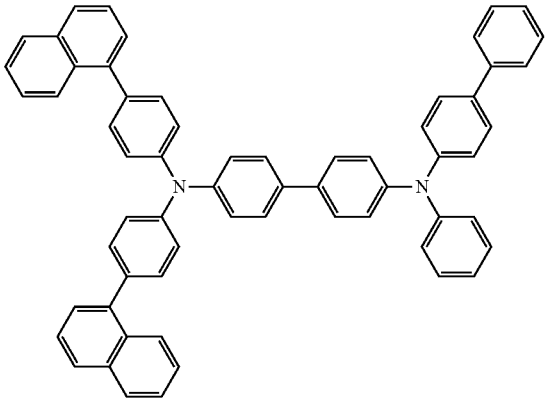
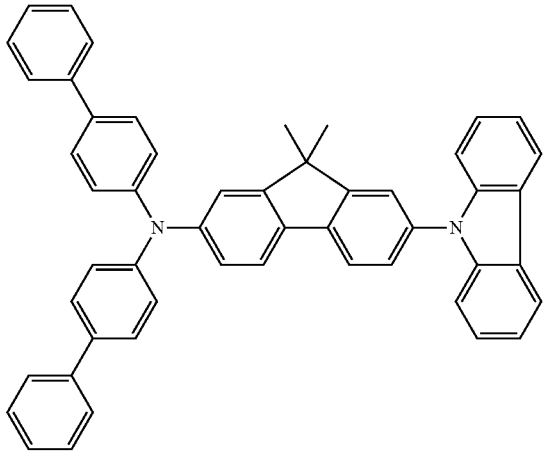
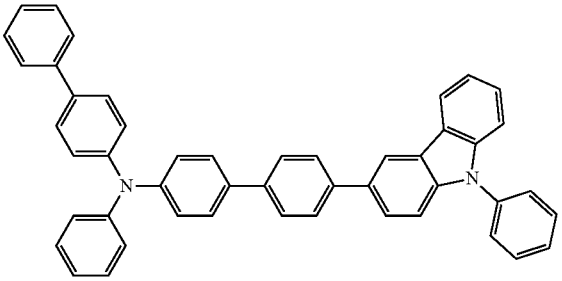
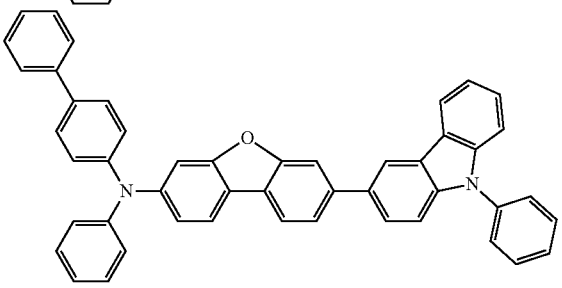
-continued
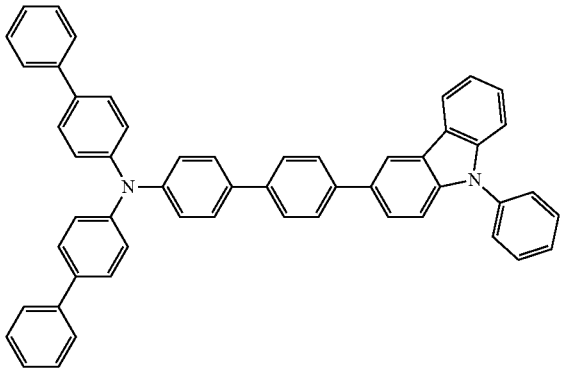
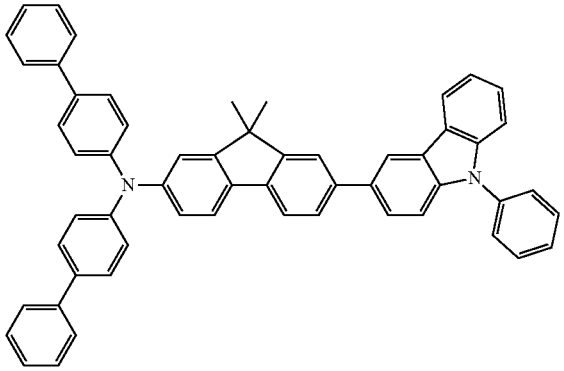
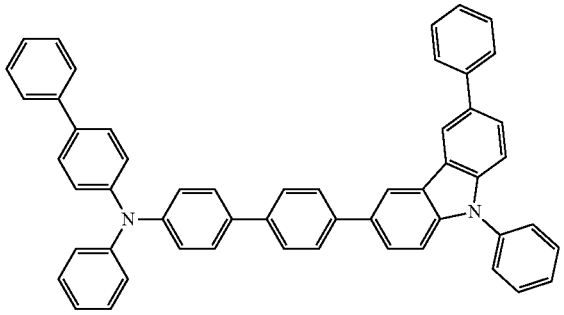
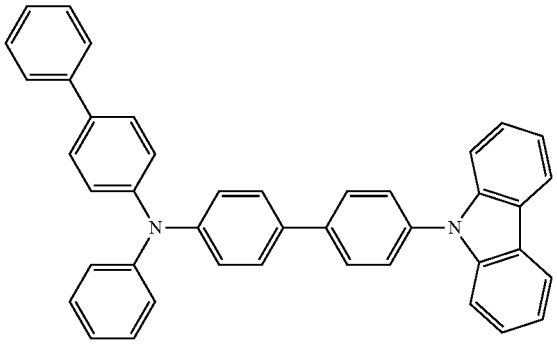

-continued

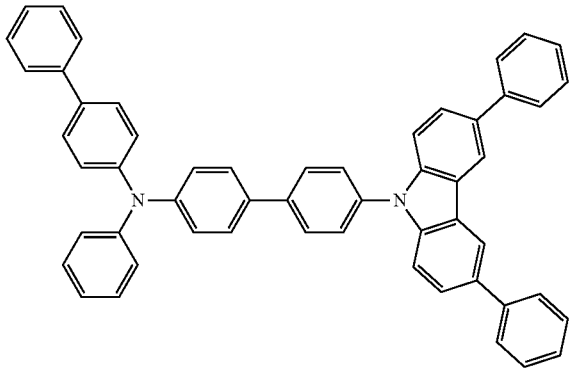

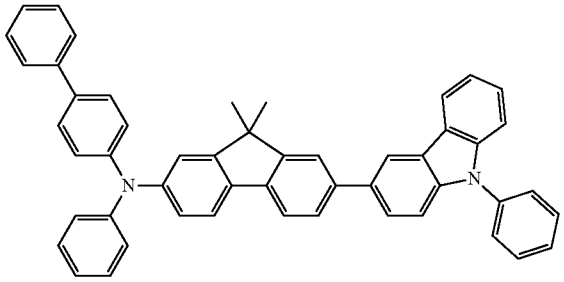

Aromatic amine represented by the following formula (A2) can also be preferably used for forming the hole injecting/transporting layer.

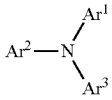

(A2)

In the above formula (A2), $Ar^1$ to $Ar^a$ each represent the same as $Ar^1$ to $Ar^4$ of the above formula (A1). Examples of the compound represented by the formula (A2) are shown below. However, the compound represented by the formula (A2) is not limited thereto.

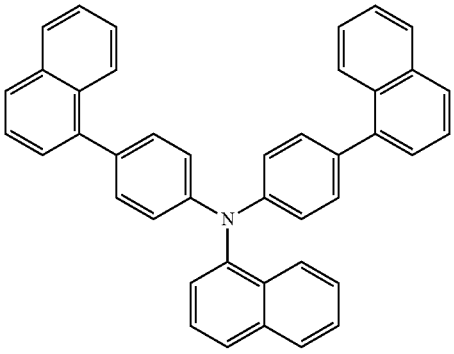

-continued

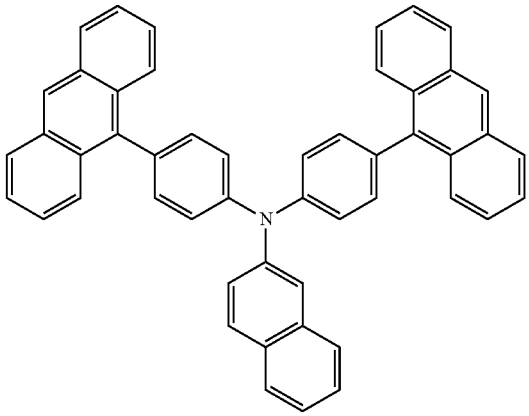

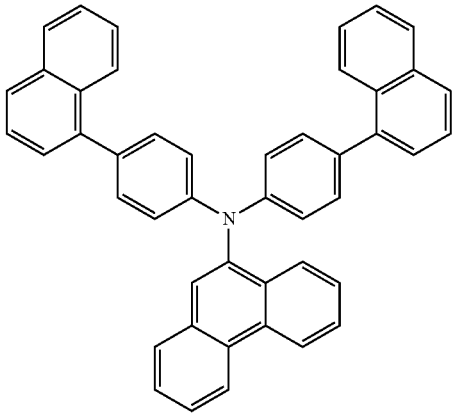

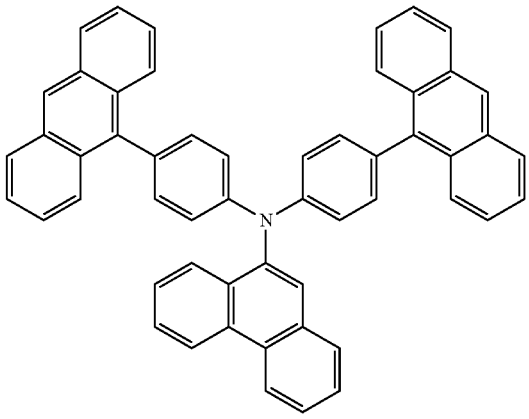

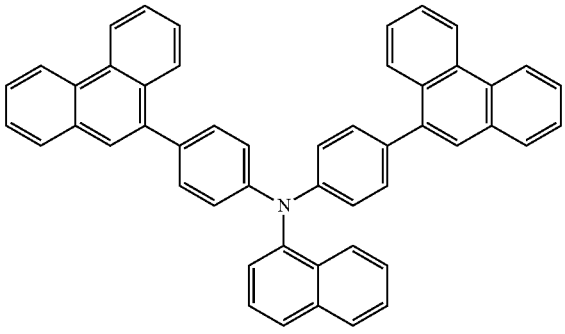

-continued
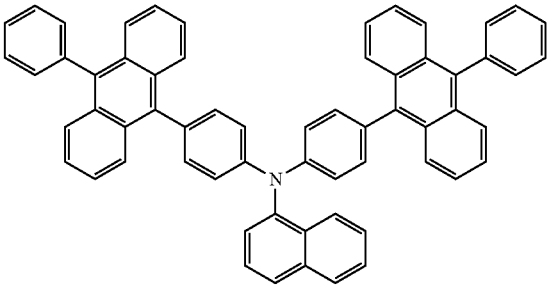
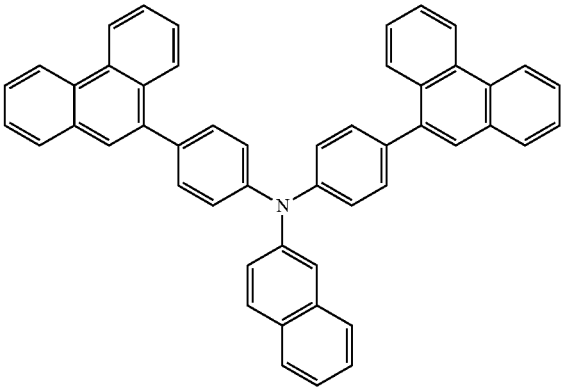
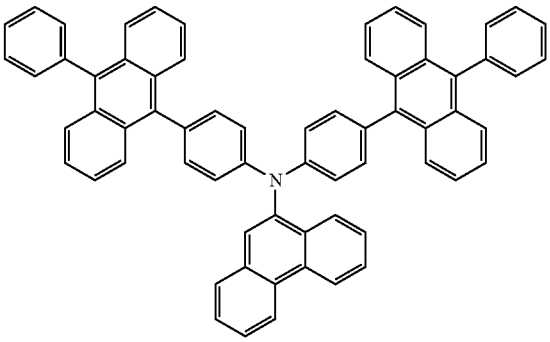
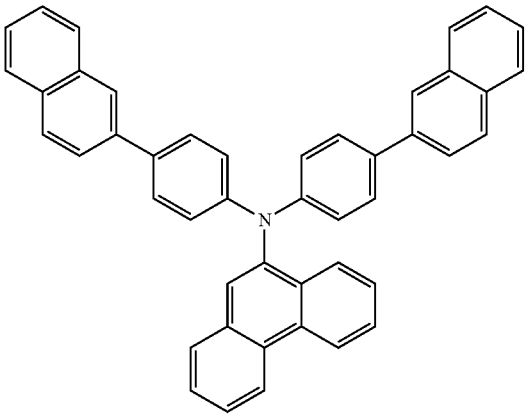
-continued
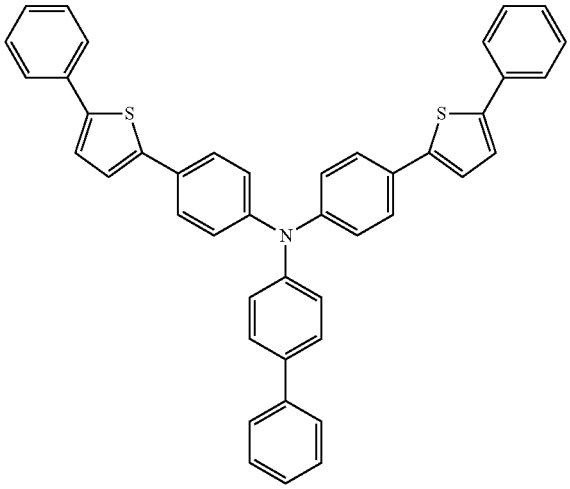
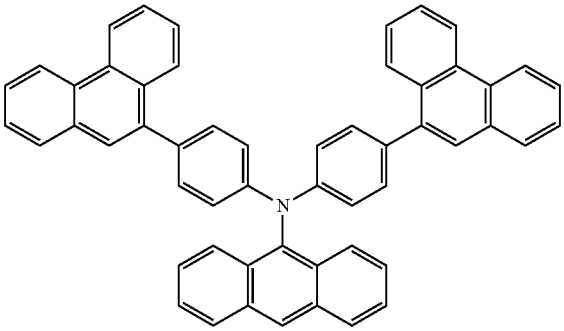
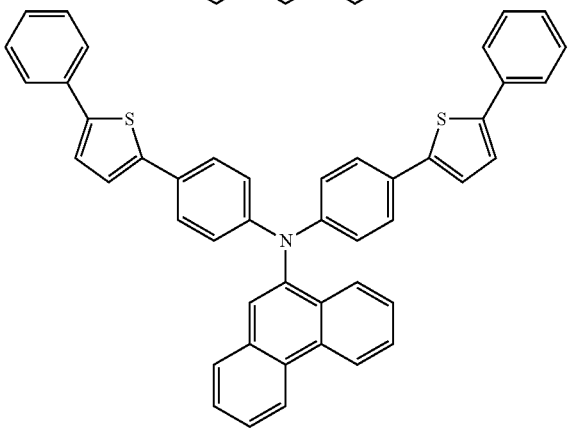
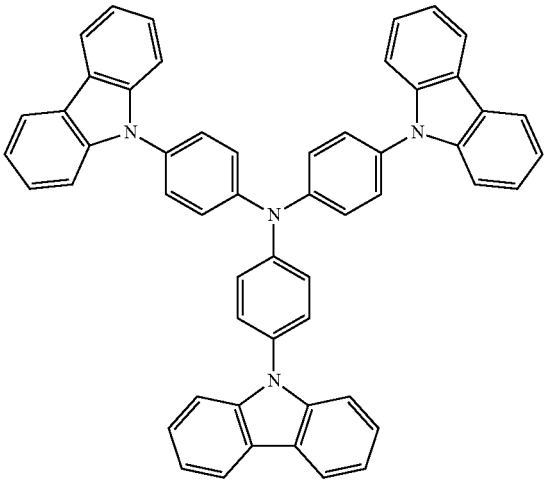

-continued

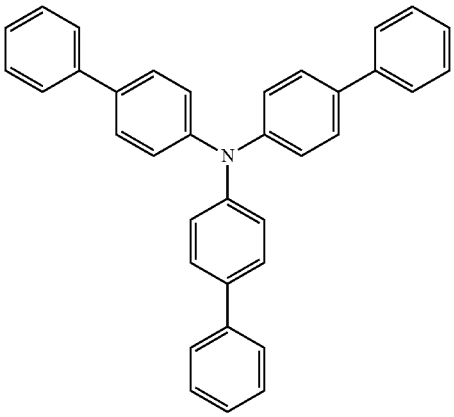

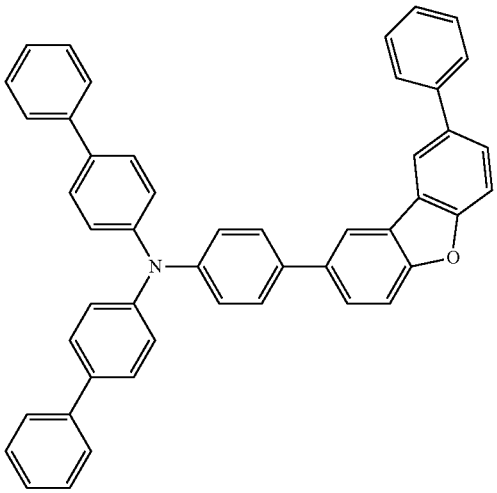

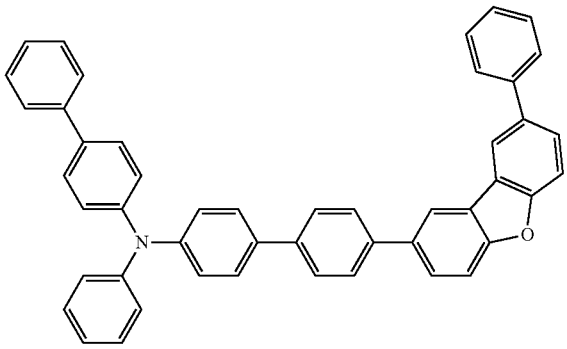

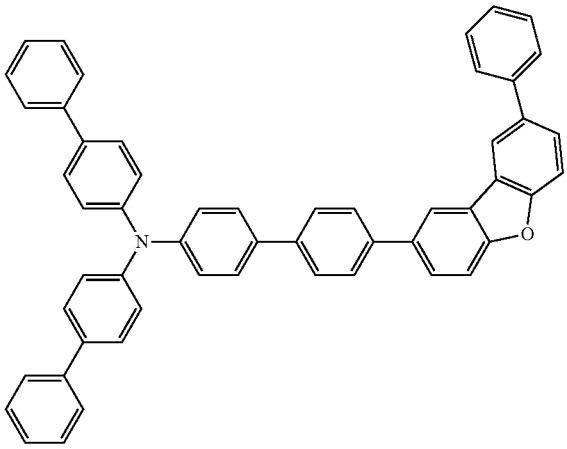

The hole transporting layer of the organic EL device according to the exemplary embodiment may have a double-layer structure of a first hole transporting layer (near the anode) and a second hole transporting layer (near the cathode).

Although a film thickness of the hole transporting layer is not particularly limited, the film thickness is preferably 10 nm to 200 nm.

In the organic EL device according to the exemplary embodiment, a layer containing an acceptor material may be bonded to a side near the anode of the hole transporting layer or the first hole transporting layer. With this arrangement, reduction in the drive voltage and manufacturing costs is expected.

The acceptor material is preferably a compound represented by the following formula (K).

(K)

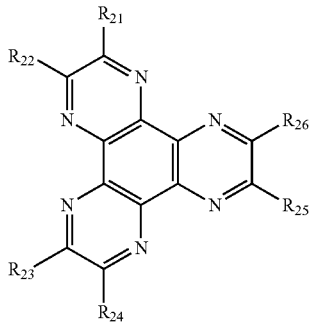

In the formula (K), $R_{21}$ to $R_{26}$ may be mutually the same or different and each independently represent a cyano group, —$CONH_2$, a carboxyl group or —$COOR_{27}$ in which $R_{27}$ represents an alkyl group having 1 to 20 carbon atoms or a cycloalkyl group having 3 to 20 carbon atoms. Among a pair of $R_{21}$ and $R_{22}$, a pair of $R_{23}$ and $R_{24}$ and a pair of $R_{25}$ and $R_{26}$, one or more of the pairs may be combined to form a group represented by —CO—O—CO—

Examples of $R_{27}$ include a methyl group, ethyl group, n-propyl group, isopropyl group, n-butyl group, isobutyl group, t-butyl group, cyclopentyl group and cyclohexyl group.

Although a film thickness of the acceptor material is not particularly limited, the film thickness is preferably 5 nm to 20 nm.

Electron Injecting•Transporting Layer

The electron injection/transport layer helps injection of the electron to the luminescent layer and has a high electron mobility. The electron injecting layer is provided for adjusting energy level, by which, for instance, sudden changes of the energy level can be reduced. The electron injection/transport layer includes at least one of the electron injecting layer and the electron transporting layer.

The organic EL device according to this exemplary embodiment preferably includes the electron injecting layer between the emitting layer and the cathode, and the electron injecting layer preferably contains a nitrogen-containing cyclic derivative as a main component. The electron injecting layer may serve as the electron transporting layer.

Noted that "as a main component" means that the nitrogen-containing cyclic derivative is contained in the electron injecting layer at a content of 50 mass % or more.

The electron transporting material for forming the electron injecting layer is preferably exemplified by an aromatic heterocyclic compound having in the molecule at least one heteroatom (e.g., nitrogen, oxygen, sulfur and phosphorus). Particularly, a nitrogen-containing cyclic derivative is preferable. The nitrogen-containing cyclic derivative is preferably an aromatic cyclic compound having a nitrogen-containing six-membered or five-membered ring skeleton.

The nitrogen-containing cyclic derivative is preferably exemplified by a nitrogen-containing cyclic metal chelate complex represented by the following formula (B1).

(B1)

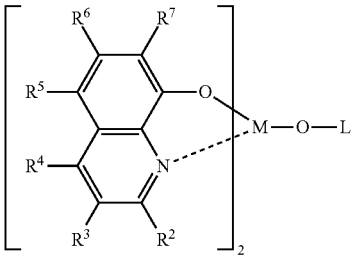

In the formula (B1), $R^2$ to $R^7$ each independently represent a hydrogen atom, a halogen atom, an oxy group, an amino group, a hydrocarbon group having 1 to 40 carbon atoms, an alkoxyl group, an aryloxy group, an alkxoycarbonyl group, or an aromatic heterocyclic group, all of which may have a substituent.

Examples of the halogen atom are fluorine, chlorine, bromine and iodine. In addition, examples of the substituted or unsubstituted amino group include an alkylamino group, an arylamino group, and an aralkylamino group.

The alkoxycarbonyl group is represented by —COOY'. Examples of Y' are the same as the examples of the alkyl group. The alkylamino group and the aralkylamino group are represented by —$NQ^1Q^2$. Examples for each of $Q^1$ and $Q^2$ are the same as the examples described in relation to the alkyl group and the aralkyl group (i.e., a group obtained by substituting a hydrogen atom of an alkyl group with an aryl group), and preferable examples for each of $Q^1$ and $Q^2$ are also the same as those described in relation to the alkyl group and the aralkyl group. One of $Q^1$ and $Q^2$ may be a hydrogen atom. Note that the aralkyl group is a group obtained by substituting the hydrogen atom of the alkyl group with the aryl group.

The arylamino group is represented by —$NAr^1Ar^2$. Examples for each of $Ar^1$ and $Ar^2$ are the same as the examples described in relation to the non-fused aromatic hydrocarbon group. One of $Ar^1$ and $Ar^2$ may be a hydrogen atom.

M in the formula (B1) represents aluminum (Al), gallium (Ga) or indium (In), among which In is preferable.

L in the formula (B1) represents a group represented by a formula (B2) or (B3) below.

(B2)

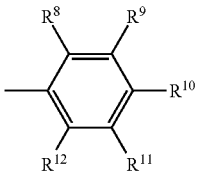

-continued (B3)

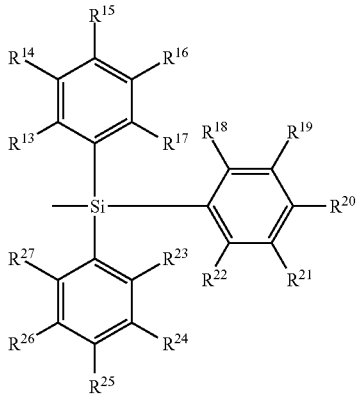

In the formula (B2), $R^8$ to $R^{12}$ each independently represent a hydrogen atom or a hydrocarbon group having 1 to 40 carbon atoms. Adjacent groups may form a cyclic structure. The hydrocarbon group may have a substituent.

In the formula (B3), $R^{13}$ to $R^{27}$ each independently represent a hydrogen atom or a hydrocarbon group having 1 to 40 carbon atoms. Adjacent groups may form a cyclic structure. The hydrocarbon group may have a substituent.

Examples of the hydrocarbon group having 1 to 40 carbon atoms represented by each of $R^8$ to $R^{12}$ and $R^{13}$ to $R^{27}$ in the formulae (B2) and (B3) are the same as those of $R^2$ to $R^7$ in the formula (B1).

Examples of a divalent group formed when adjacent groups of $R^8$ to $R^{12}$ in the formula (B2) and adjacent groups of $R^{13}$ to $R^{27}$ in the formula (B3) form a cyclic structure are a tetramethylene group, pentamethylene group, hexamethylene group, diphenylmethane-2,2'-diyl group, diphenylethane-3,3'-diyl group and diphenylpropane-4,4'-diyl group.

The electron transporting layer preferably contains at least one of nitrogen-containing heterocyclic derivatives respectively represented by the following formulae (B4) to (B6).

(B4)

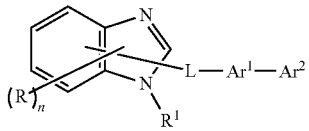

(B5)

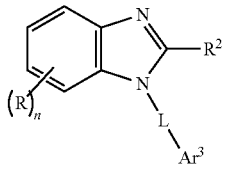

(B6)

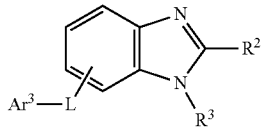

In the formulae (B4) to (B6), R represents a hydrogen atom, aromatic hydrocarbon group having 6 to 60 ring carbon atoms, pyridyl group, quinolyl group, alkyl group having 1 to 20 carbon atoms, or alkoxy group having 1 to 20 carbon atoms. n is an integer in a range of 0 to 4.

In the formulae (B4) to (B6), $R^1$ represents an aromatic hydrocarbon group having 6 to 60 ring carbon atoms, pyridyl group, quinolyl group, alkyl group having 1 to 20 carbon atoms, or alkoxy group having 1 to 20 carbon atoms.

In the formulae (B4) to (B6), $R^2$ and $R^3$ each independently represent a hydrogen atom, aromatic hydrocarbon group having 6 to 60 ring carbon atoms, pyridyl group, quinolyl group, alkyl group having 1 to 20 carbon atoms, or alkoxy group having 1 to 20 carbon atoms.

In the formulae (B4) to (B6), L represents an aromatic hydrocarbon group having 6 to 60 ring carbon atoms, pyridinylene group, quinolinylene group or fluorenylene group.

In the formulae (B4) to (B6), $Ar^1$ represents an aromatic hydrocarbon group having 6 to 60 ring carbon atoms, pyridinylene group or quinolinylene group.

In the formulae (B4) to (B6), $Ar^2$ represents an aromatic hydrocarbon group having 6 to 60 ring carbon atoms, pyridyl group, quinolyl group, alkyl group having 1 to 20 carbon atoms, or alkoxy group having 1 to 20 carbon atoms.

In the formulae (B4) to (B6), $Ar^3$ represents an aromatic hydrocarbon group having 6 to 60 ring carbon atoms, pyridyl group, quinolyl group, alkyl group having 1 to 20 carbon atoms, alkoxy group having 1 to 20 carbon atoms, or a group represented by —$Ar^1$—$Ar^2$ (in which $Ar^1$ and $Ar^2$ are the same as those described above).

The aromatic hydrocarbon group, pyridyl group, quinolyl group, alkyl group, alkoxy group, pyridinylene group, quinolinylene group and fluorenylene group which are described in relation to R, $R^1$, $R^2$, $R^3$, L, $Ar^1$, $Ar^2$ and $Ar^3$ in the formulae (B4) to (B6) may have a substituent.

As an electron transporting compound for the electron injecting layer or the electron transporting layer, 8-hydroxyquinoline or a metal complex of its derivative, an oxadiazole derivative and a nitrogen-containing heterocyclic derivative are preferable. An example of the 8-hydroxyquinoline or the metal complex of its derivative is a metal chelate oxinoid compound containing a chelate of oxine (typically 8-quinolinol or 8-hydroxyquinoline). For instance, tris(8-quinolinol) aluminum can be used. Examples of the oxadiazole derivative are as follows.

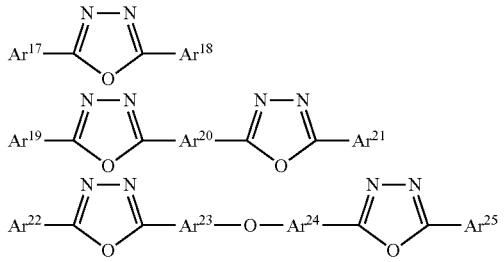

In each of the formulae of the oxadiazole derivatives, $Ar^{17}$, $Ar^{18}$, $Ar^{19}$, $Ar^{21}$, $Ar^{22}$ and $Ar^{25}$ represent an aromatic hydrocarbon group having 6 to 40 ring carbon atoms.

Note that the aromatic hydrocarbon group described herein may have a substituent. $Ar^{17}$, $Ar^{19}$ and $Ar^{22}$ are respectively the same as or different from $Ar^{18}$, $Ar^{21}$ and $Ar^{25}$.

Examples of the aromatic hydrocarbon group described herein are a phenyl group, naphthyl group, biphenyl group, anthranil group, perylenyl group and pyrenyl group. Examples of the substituent therefor are an alkyl group having 1 to 10 carbon atoms, alkoxy group having 1 to 10 carbon atoms and cyano group.

In each of the formulae of the oxadiazole derivatives, $Ar^{20}$, $Ar^{23}$ and $Ar^{24}$ are a divalent aromatic hydrocarbon group having 6 to 40 ring carbon atoms.

It should be noted that the aromatic hydrocarbon group described herein may have a substituent.

$Ar^{23}$ and $Ar^{24}$ are mutually the same or different.

Examples of the divalent aromatic hydrocarbon group described herein are a phenylene group, naphthylene group, biphenylene group, anthranylene group, perylenylene group and pyrenylene group. Examples of the substituent therefor are an alkyl group having 1 to 10 carbon atoms, alkoxy group having 1 to 10 carbon atoms and cyano group.

Such an electron transport compound is preferably an electron transport compound that can be favorably formed into a thin film(s). Examples of the electron transport compound are as follows.

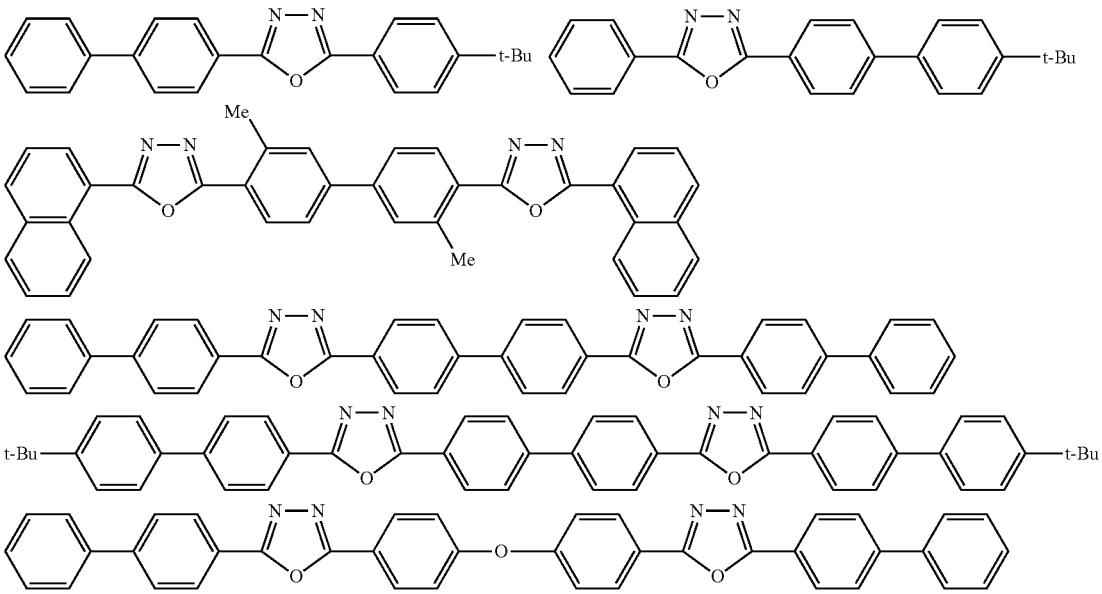

An example of the nitrogen-containing heterocyclic derivative as the electron transporting compound is a nitrogen-containing compound that is not a metal complex, the derivative being formed of an organic compound represented by one of the following formulae. Examples of the nitrogen-containing compound are a nitrogen-containing compound having five-membered ring or six-membered ring with a skeleton represented by the following formula (B7) and a nitrogen-containing compound having a structure represented by the following formula (B8).

(B7)

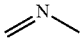

(B8)

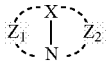

In the formula (B8), X represents a carbon atom or a nitrogen atom. $Z_1$ and $Z_2$ each independently represent an atom group from which a nitrogen-containing heterocycle can be formed.

More preferably, the nitrogen-containing heterocyclic derivative is an organic compound having a nitrogen-containing aromatic polycyclic group having a five-membered ring or six-membered ring. Further, in the organic compound having the nitrogen-containing aromatic polycyclic group having plural nitrogen atoms, a nitrogen-containing aromatic polycyclic organic compound having a skeleton formed by a combination of the skeletons respectively represented by the formulae (B7) and (B8), or by a combination of the skeletons respectively represented by the formula (B7) and the following formula (B9) is preferable.

(B9)

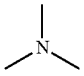

A nitrogen-containing group of the nitrogen-containing aromatic polycyclic organic compound is selected from nitrogen-containing heterocyclic groups respectively represented by the following formulae.

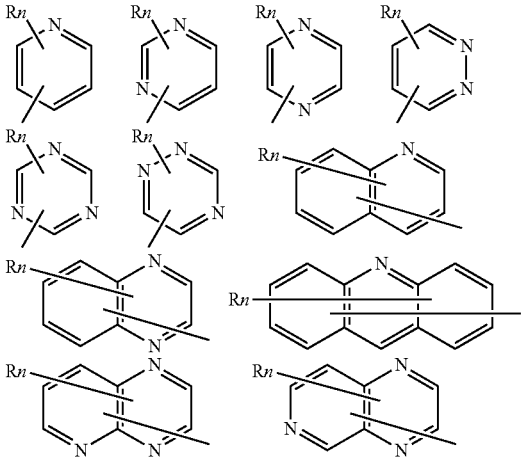

-continued

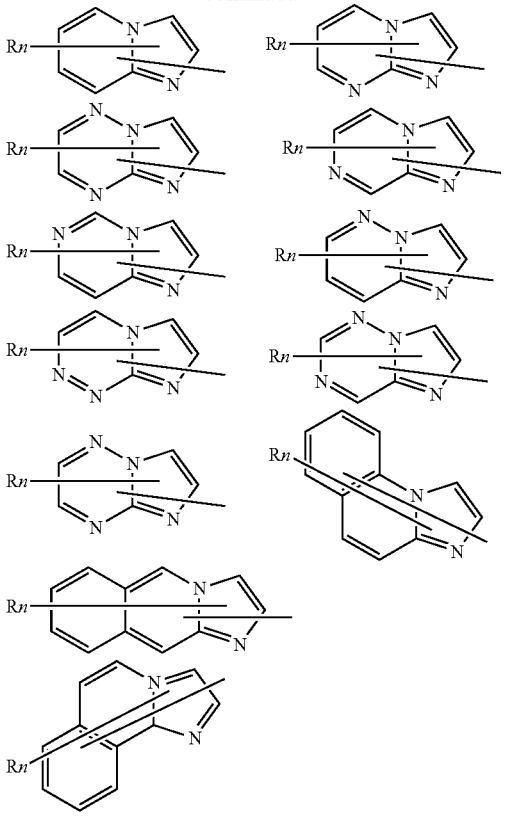

In each of the formulae of the nitrogen-containing heterocyclic groups, R represents an aromatic hydrocarbon group having 6 to 40 ring carbon atoms, aromatic heterocyclic group having 2 to 40 ring carbon atoms, alkyl group having 1 to 20 carbon atoms, or alkoxy group having 1 to 20 carbon atoms.

In each of the formulae of the nitrogen-containing heterocyclic groups, n is an integer of 0 to 5. When n is 2 or more, a plurality of R may be mutually the same or different.

A preferable specific compound is a nitrogen-containing heterocyclic derivative represented by the following formula (B 10).

$$HAr\text{-}L^1\text{-}Ar^1\text{—}Ar^2 \quad (B10)$$

In the above formula (B10), HAr is a nitrogen-containing heterocyclic group having 1 to 40 ring carbon atoms.

In the formula (B10), $L^1$ represents a single bond, an aromatic hydrocarbon group having 6 to 40 ring carbon atoms, or an aromatic heterocyclic group having 2 to 40 ring carbon atoms.

In the formula (B 10), $Ar^1$ is a divalent aromatic hydrocarbon group having 6 to 40 ring carbon atoms.

In the formula (B10), $Ar^2$ is an aromatic hydrocarbon group having 6 to 40 ring carbon atoms or aromatic heterocyclic group having 2 to 40 ring carbon atoms.

The nitrogen-containing heterocyclic group, aromatic hydrocarbon group and aromatic heterocyclic group described in relation to HAr, $L^1$, $Ar^1$ and $Ar^2$ in the formula (B 10) may have a substituent.

HAr in the formula (B 10) is exemplarily selected from the following group.

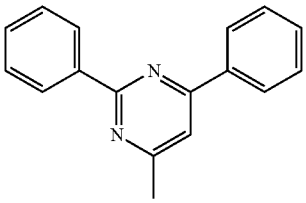
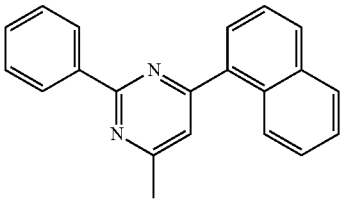
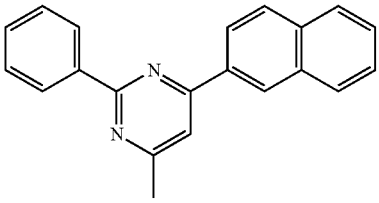
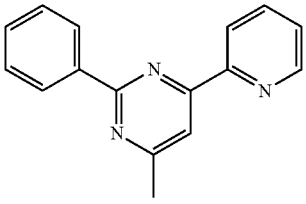
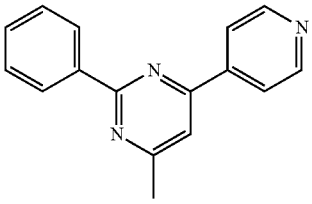
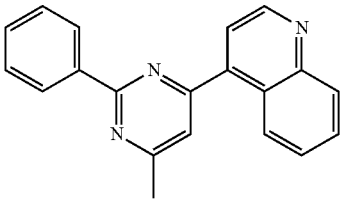
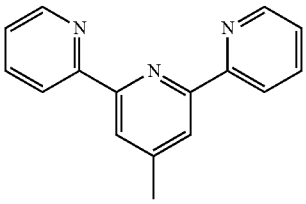
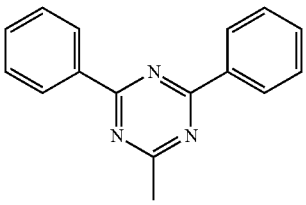
-continued
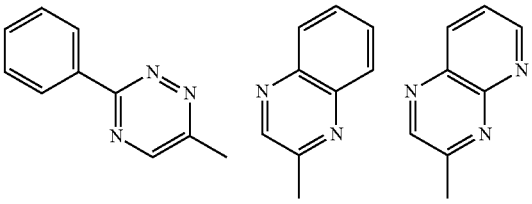
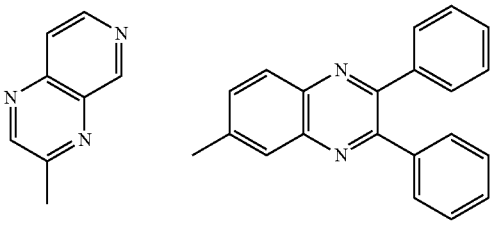
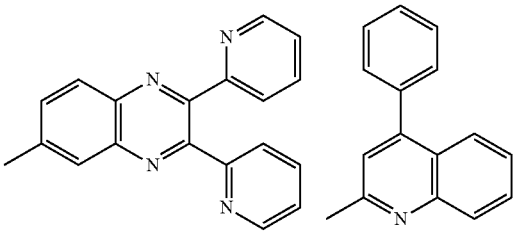
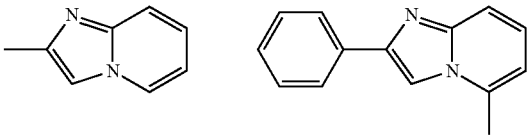
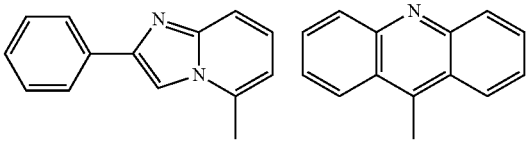
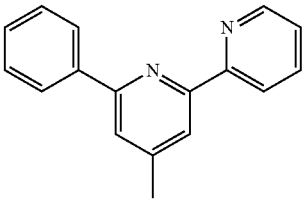
$L^1$ in the formula (B10) is exemplarily selected from the following group.
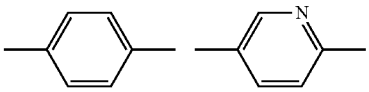
$Ar^1$ in the formula (B 10) is exemplarily selected from the following arylanthranil group.

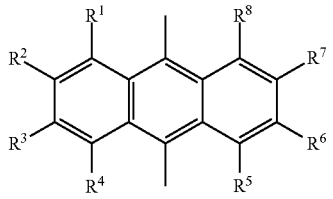

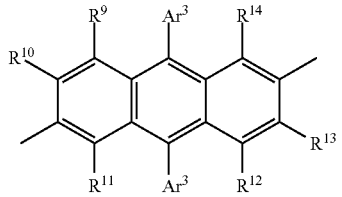

In the formula (A1), $R^1$ to $R^{14}$ each independently represent a hydrogen atom, a halogen atom, an alkyl group having 1 to 20 carbon atoms, an alkoxy group having 1 to 20 carbon atoms, an aryloxy group having 6 to 40 ring carbon atoms, an aromatic hydrocarbon group having 6 to 40 ring carbon atoms, or an aromatic heterocyclic group having 2 to 40 ring carbon atoms.

In the formula of the arylanthranil group, $Ar^3$ is an aromatic hydrocarbon group having 6 to 40 ring carbon atoms or aromatic heterocyclic group having 2 to 40 ring carbon atoms.

The aromatic hydrocarbon group and aromatic heterocyclic group described in relation to $R^1$ to $R^{14}$ and $Ar^3$ in the formula of the arylanthranil may have a substituent.

All of $R^1$ to $R^8$ of a nitrogen-containing heterocyclic derivative may be hydrogen atoms.

In the formula of the arylanthranil group, $Ar^2$ is exemplarily selected from the following group.

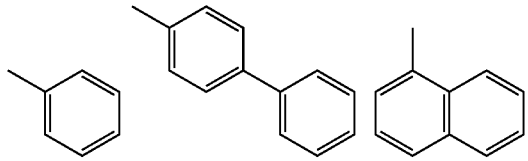

-continued

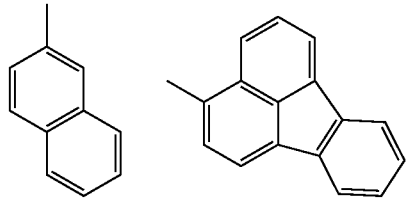

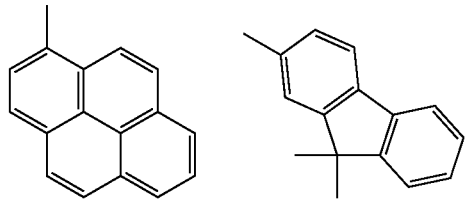

Other than the above, the following compound represented by the following formula (B11) (see JP-A-9-3448) can be favorably used for the nitrogen-containing aromatic polycyclic organic compound as the electron transporting compound.

(B11)

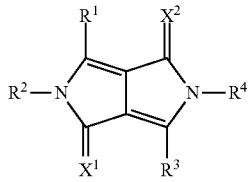

In the formula (B11) of the nitrogen-containing aromatic polycyclic organic compound, $R^1$ to $R^4$ each independently represent a hydrogen atom, aliphatic group, alicyclic group, carbocyclic aromatic cyclic group or heterocyclic group. Note that the aliphatic group, alicyclic group, carbocyclic aromatic cyclic group and heterocyclic group may have a substituent.

In the formula (B 11) of the nitrogen-containing aromatic polycyclic organic compound, $X^1$ and $X^2$ each independently represent an oxygen atom, sulfur atom or dicyanomethylene group.

The following compound represented by the following formula (B12) (see JP-A-2000-173774) can also be favorably used for the electron transporting compound.

(B12)

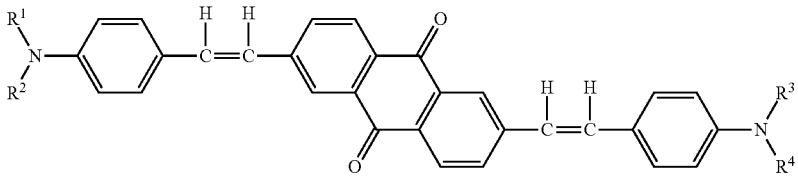

In the formula (B12), $R^1$, $R^2$, $R^3$ and $R^4$, which may be mutually the same or different, each represent an aromatic hydrocarbon group or fused aromatic hydrocarbon group represented by the following formula (B12-1).

(B12-1)

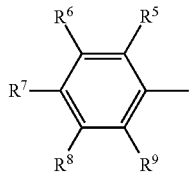

In the formula (B 12-1), $R^5$, $R^6$, $R^7$, $R^8$ and $R^9$, which may be mutually the same or different, each represent a hydrogen atom, a saturated or unsaturated alkoxyl group, alkyl group, amino group or alkylamino group. At least one of $R^5$, $R^6$, $R^7$, $R^8$ and $R^9$ represents a saturated or unsaturated alkoxyl group, alkyl group, amino group or alkylamino group.

A polymer compound containing the nitrogen-containing heterocyclic group or a nitrogen-containing heterocyclic derivative may be used for the electron transporting compound.

Although a film thickness of the electron injecting layer or the electron transporting layer is not specifically limited, the film thickness is preferably in a range of 1 nm to 100 nm.

The electron injecting layer preferably contains an inorganic compound such as an insulator or a semiconductor in addition to the nitrogen-containing cyclic derivative. Such an insulator or a semiconductor, when contained in the electron injecting layer, can effectively prevent a current leak, thereby enhancing electron capability of the electron injecting layer.

For such an insulator, at least one metal compound selected from a group of alkali metal chalcogenide, alkaline-earth metal chalcogenide, halogenide of alkali metal, and halogenide of alkaline-earth metal may preferably be utilized. A configuration in which the electron injecting layer is formed by these alkali metal chalcogenide and the like is advantageous in that the electron injecting property is further improved. Specifically, preferable examples of the alkali metal chalcogenide are lithium oxide ($Li_2O$), potassium oxide ($K_2O$), sodium sulfide ($Na_2S$), sodium selenide ($Na_2Se$) and sodium oxide ($Na_2O$). Preferable examples of the alkaline-earth metal chalcogenide are calcium oxide (CaO), barium oxide (BaO), strontium oxide (SrO), beryllium oxide (BeO), barium sulfide (BaS) and calcium selenide (CaSe). Preferable examples of the halogenide of the alkali metal are lithium fluoride (LiF), sodium fluoride (NaF), potassium fluoride (KF), lithium chloride (LiCl), potassium chloride (KCl) and sodium chloride (NaCl). Preferable examples of the halogenide of the alkaline-earth metal are fluorides such as calcium fluoride ($CaF_2$), barium fluoride ($BaF_2$), strontium fluoride ($SrF_2$), magnesium fluoride ($MgF_2$) and beryllium fluoride ($BeF_2$), and halogenides other than the fluorides.

Examples of the semiconductor are one of or a combination of two or more of an oxide, a nitride or an oxidized nitride containing at least one element selected from barium (Ba), calcium (Ca), strontium (Sr), ytterbium (Yb), aluminum (Al), gallium (Ga), indium (In), lithium (Li), sodium (Na), cadmium (Cd), magnesium (Mg), silicon (Si), tantalum (Ta), antimony (Sb) and zinc (Zn). An inorganic compound for forming the electron injecting layer is preferably a microcrystalline or amorphous insulative thin-film. When the electron injecting layer is formed of such an insulative thin-film, more uniform thin-film can be formed, thereby reducing pixel defects such as a dark spot. Examples of such an inorganic compound are the above-described alkali metal chalcogenide, alkaline-earth metal chalcogenide, halogenide of the alkali metal and halogenide of the alkaline-earth metal.

When the electron injecting layer contains such an insulator or a semiconductor, a film thickness thereof is preferably in a range of approximately 0.1 nm to 15 nm. The electron injecting layer according to the exemplary embodiment may preferably contain the above-described reductive dopant.

Electron-Donating Dopant and Organic Metal Complex

In the organic EL device according to this exemplary embodiment, at least one of an electron-donating dopant and an organic metal complex is preferably contained in an interfacial region between the cathode and the organic thin-film layer.

With this arrangement, the organic EL device can emit light with enhanced luminance intensity and have a longer lifetime.

The electron-donating dopant may be at least one selected from an alkali metal, an alkali metal compound, an alkaline-earth metal, an alkaline-earth metal compound, a rare-earth metal, a rare-earth metal compound and the like.

The organic metal complex may be at least one selected from an organic metal complex including an alkali metal, an organic metal complex including an alkaline-earth metal, an organic metal complex including a rare-earth metal and the like.

Examples of the alkali metal are lithium (Li) (work function: 2.93 eV), sodium (Na) (work function: 2.36 eV), potassium (K) (work function: 2.28 eV), rubidium (Rb) (work function: 2.16 eV) and cesium (Cs) (work function: 1.95 eV), which particularly preferably has a work function of 2.9 eV or less. Among the above, the reductive dopant is preferably K, Rb or Cs, more preferably Rb or Cs, the most preferably Cs.

Examples of the alkaline-earth metal are calcium (Ca) (work function: 2.9 eV), strontium (Sr) (work function: 2.0 to 2.5 eV), and barium (Ba) (work function: 2.52 eV), among which a substance having a work function of 2.9 eV or less is particularly preferable.

Examples of the rare-earth metal are scandium (Sc), yttrium (Y), cerium (Ce), terbium (Tb), and ytterbium (Yb), among which a substance having a work function of 2.9 eV or less is particularly preferable.

Since the above preferred metals have particularly high reducibility, addition of a relatively small amount of the metals to an electron injecting zone can enhance luminance intensity and lifetime of the organic EL device.

Examples of the alkali metal compound are an alkali oxide such as lithium oxide ($Li_2O$), cesium oxide ($Cs_2O$) and potassium oxide ($K_2O$), and an alkali halogenide such as sodium fluoride (NaF), cesium fluoride (CsF) and potassium fluoride (KF), among which lithium fluoride (LiF), lithium oxide ($Li_2O$) and sodium fluoride (NaF) are preferable.

Examples of the alkaline-earth metal compound are barium oxide (BaO), strontium oxide (SrO), calcium oxide (CaO) and a mixture thereof, i.e., barium strontium oxide ($Ba_xSr_{1-x}O$) ($0<x<1$), barium calcium oxide ($Ba_xCa_{1-x}O$) ($0<x<1$), among which BaO, SrO and CaO are preferable.

Examples of the rare earth metal compound are ytterbium fluoride ($YbF_3$), scandium fluoride ($ScF_3$), scandium oxide ($ScO_3$), yttrium oxide ($Y_2O_3$), cerium oxide ($Ce_2O_3$), gadolinium fluoride ($GdF_3$) and terbium fluoride ($TbF_3$), among which $YbF_3$, $ScF_3$, and $TbF_3$ are preferable.

The organic metal complex is not specifically limited as long as containing at least one metal ion of an alkali metal ion, an alkaline-earth metal ion and a rare earth metal ion. A ligand for each of the complexes is preferably quinolinol, benzoquinolinol, acridinol, phenanthridinol, hydroxyphenyl oxazole, hydroxyphenyl thiazole, hydroxydiaryl oxadiazole, hydroxydiaryl thiadiazole, hydroxyphenyl pyridine, hydroxyphenyl benzoimidazole, hydroxybenzo triazole, hydroxy fluborane, bipyridyl, phenanthroline, phthalocyanine, porphyrin, cyclopentadiene, â-diketones, azomethines, or a derivative thereof, but the ligand is not limited thereto.

The electron-donating dopant and the organic metal complex are added to preferably form a layer or an island pattern in the interfacial region. The layer of the electron-donating dopant or the island pattern of the organic metal complex is preferably formed by evaporating at least one of the electron-donating dopant and the organic metal complex by resistance heating evaporation while an emitting material for forming the interfacial region or an organic substance as an electron-injecting material are simultaneously evaporated, so that at least one of the electron-donating dopant and an organic metal complex reduction-causing dopant is dispersed in the organic substance. Dispersion concentration at which the electron-donating dopant is dispersed in the organic substance is a mole ratio (the organic substance to the electron-donating dopant or the organic metal complex) of 100:1 to 1:100, preferably 5:1 to 1:5.

When at least one of the electron-donating dopant and the organic metal complex forms a layer, the emitting material or the electron injecting material for forming the organic layer of the interfacial region is initially layered, and then, at least one of the electron-donating dopant and the organic metal complex is singularly evaporated thereon by resistance heating evaporation to preferably form a 0.1 nm- to 15 nm-thick layer.

When at least one of the electron-donating dopant and the organic metal complex forms an island pattern, the emitting material or the electron injecting material for forming the organic layer of the interfacial region is initially layered, and then, at least one of the electron-donating dopant is singularly evaporated thereon by resistance heating evaporation to preferably form a 0.05 nm- to 1 nm-thick island pattern.

A ratio of the main component to at least one of the electron-donating dopant and the organic metal complex in the organic EL device according to the exemplary embodiment is preferably a mole ratio (the main component to the electron-donating dopant or the organic metal complex) of 5:1 to 1:5, more preferably 2:1 to 1:2.

n/p Doping

In the aforementioned hole transporting layer and electron transporting layer, carrier injectability is adjustable by doping (n) of the donor material or doping (p) of the acceptor material as described in the specification of JP Patent No. 3695714.

n-doping is representatively exemplified by a method of doping a metal such as Li or Cs to an electron transporting material. p-doping is representatively exemplified by a method of doping an acceptor material such as $F_4TCNQ$(2,3,5,6-Tetrafluoro-7,7,8,8-tetracyanoquinodimethane) to a hole transporting material.

In the organic EL device according to the exemplary embodiment, in addition to the above exemplary compounds, any compound used in the typical organic EL device is usable as a compound for the organic thin-film layer other than the emitting layer (i.e., the hole injecting layer, hole transporting layer, electron transporting layer, electron injecting layer and blocking layer).

Formation Method of Each Layer of Organic EL Device

A method of forming each of the layers in the organic EL device according to the exemplary embodiment is not particularly limited. A conventionally known method such as vacuum deposition method, sputtering method, ink jet method or spin coating method may be employed for forming the layers. The organic thin-film layer containing the compound used in the organic EL device according to this exemplary embodiment can be formed by a conventional coating method such as vacuum deposition method, molecular beam epitaxy (MBE) method or a coating method with a solution by a dipping method, spin coating method, casting method, bar coating method, ink jet method or roll coating method.

Film Thickness of Each Layer of Organic EL Device

A film thickness of the emitting layer is preferably in a range of 5 nm to 50 nm, more preferably in a range of 7 nm to 50 nm and most preferably in a range of 10 nm to 50 nm. By forming the emitting layer at the film thickness of 5 nm or more, the emitting layer is easily formable and chromaticity is easily adjustable. By forming the emitting layer at the film thickness of 50 nm or less, increase in the drive voltage is suppressible.

A film thickness of the organic thin-film layer other than the emitting layer is not particularly limited, but is preferably in a typical range of several nm to 1 μm. When the film thickness is provided in the above range, defects such as pin holes caused by an excessively thinned film can be avoided while increase in the drive voltage caused by an excessively thickened film can be suppressed to prevent deterioration of the efficiency.

Second Exemplary Embodiment

Next, a second exemplary embodiment is described below.

In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable.

An organic EL device according to the second exemplary embodiment is a so-called tandem-type device including a charge generating layer and at least two emitting units. In addition to charges injected from a pair of electrodes, charges supplied from the charge generating layer are injected into the emitting units. Accordingly, by providing the charge generating layer, luminous efficiency (current efficiency) relative to injected current is improved.

Figure 3:
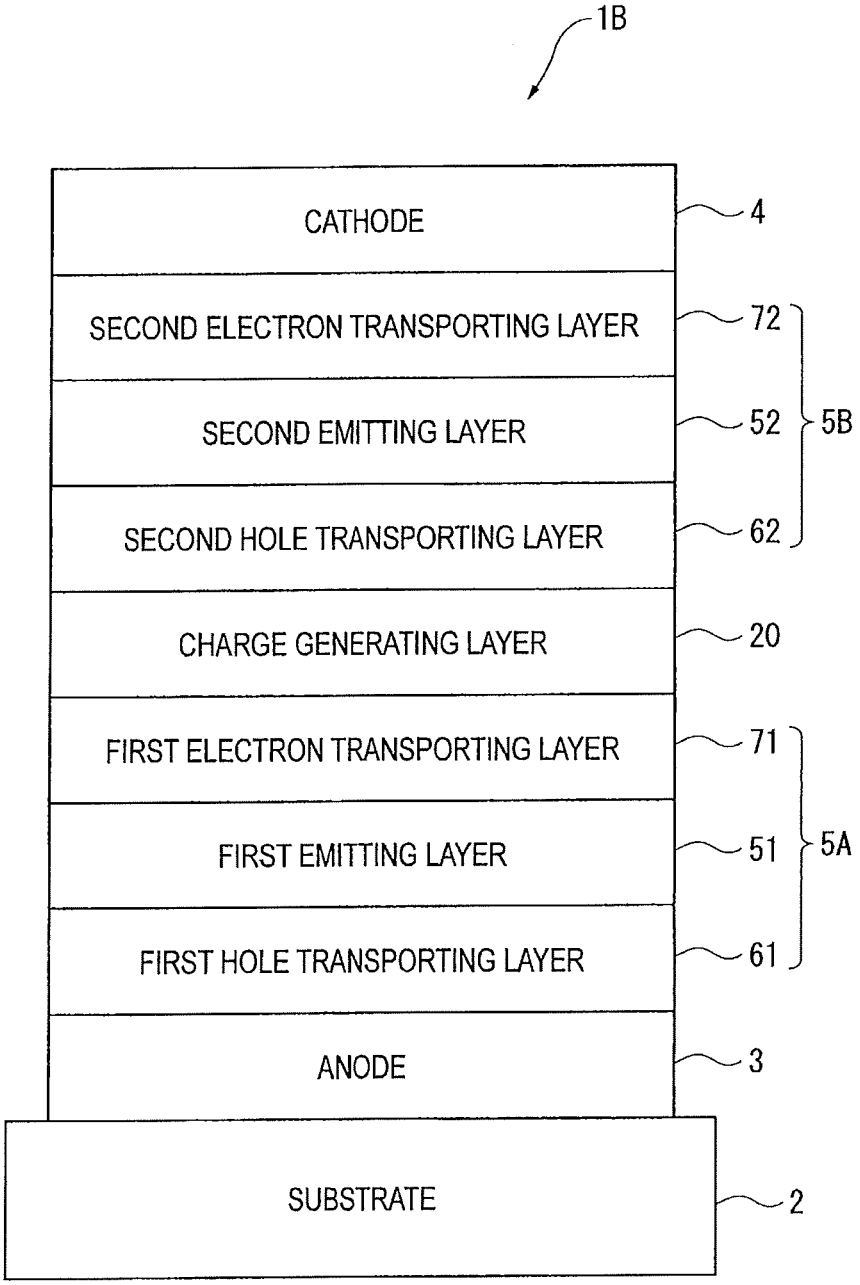
FIG. 3 schematically shows an exemplary arrangement of an organic EL device according to a second exemplary embodiment.

As shown in FIG. 3, an organic EL device 1B according to the second exemplary embodiment is provided by laminating an anode 3, a first emitting unit 5A, a charge generating layer 20, a second emitting unit 5B and a cathode 4 on a substrate 2 in this sequence.

The first emitting unit 5A is provided by laminating a first hole transporting layer 61, first emitting layer 51 and a first electron transporting layer 71 from the anode 3 in this sequence.

The second emitting unit 5B is provided by laminating a second hole transporting layer 62, second emitting layer 52 and second electron transporting layer 72 from the charge generating layer 20 in this sequence.

At least one of the first emitting layer 51 and the second emitting layer 52 is an emitting layer containing the first host material, second host material and luminescent material as described above. In the exemplary embodiment, the second emitting layer 52 contains the first host material, second host material and the yellow-emitting phosphorescent dopant material (luminescent material) as described above. The first emitting layer contains the blue-emitting fluorescent dopant material and the fluorescent host material.

The charge generating layer 20 generates charges when an electric field is applied to the organic EL device 1B and injects electrons to the first electron transporting layer 71 while injecting holes to the second hole transporting layer 62.

As a material for the charge generating layer 20, a known material such as a material described in U.S. Pat. No. 7,358,661 is usable. Specific examples of the material include oxides, nitrides, iodides and borides of metals such as In, Sn, Zn, Ti, Zr, Hf, V, Mo, Cu, Ga, Sr, La and Ru. In order that the first emitting layer 51 easily accepts the electrons from the charge generation layer 20, it is suitable to dope a donor, a representative example of which is an alkali metal, in the vicinity of an interface of the charge generation layer in the first electron transporting layer 71. As the donor, at least one of a donor metal, donor metal compound and donor metal complex can be selected. Specific examples of the compounds used for the donor metal, donor metal compound and donor metal complex include compounds disclosed in Patent Application Number PCT/JP2010/003434.

The second hole transporting layer 62 and the second electron transporting layer 72 are the same as the hole transporting layer and the electron transporting layer according to the first exemplary embodiment.

Since the organic EL device 1B is a so-called tandem-type device, the drive voltage can be reduced and durability can also be improved.

Modifications of Embodiment(s)

It should be noted that the invention is not limited to the above exemplary embodiment but may include any modification and improvement as long as such modification and improvement are compatible with the invention.

The organic EL device according to the exemplary embodiment may include a hole transporting layer, emitting layer, space layer, blocking layer and the like. The layers may contain the same compounds as the above compounds for the first host material and the second host material.

For instance, the organic EL device may further include an electron blocking layer provided to the emitting layer near the anode and a hole blocking layer provided to the emitting layer near the cathode. With this arrangement, the electrons and the holes can be trapped in the emitting layer, thereby enhancing probability of exciton generation in the emitting layer.

The emitting layer is not limited to a single layer, but may be provided by laminating a plurality of emitting layers. When the organic EL device has the plurality of emitting layers, it is only required that at least one of the emitting layers contains the first and second host materials.

Moreover, when the organic EL device includes the plurality of emitting layers, the plurality of emitting layers may be adjacent to each other, or may be laminated on each other via a layer other than the emitting layers (e.g., a charge generating layer).

The organic EL device according to the exemplary embodiment may be a fluorescent monochromatic emission device or a phosphorescent monochromatic emission device, or alternatively, may be a white-emitting hybrid device of the fluorescent and phosphorescent monochromatic emission devices. The organic EL device according to the exemplary embodiment may be in a simple structure having a single emitting unit or may be in a tandem structure including a plurality of emitting units. Among the above, a phosphorescent monochromatic emission device is preferable. Herein, the "emitting unit" means the minimum unit that includes an organic layer having one or more layers, in which one of the layers is an emitting layer to emit light by recombination of injected holes and electrons.

(1) Anode/Emitting Unit/Cathode

The aforementioned emitting unit may be provided by laminating a plurality of phosphorescent-emitting layers and fluorescent-emitting layers. In this arrangement, a space layer may be provided between the emitting layers in order to prevent excitons generated in the phosphorescent-emitting layers from diffusing into the fluorescent-emitting layers. Representative examples of a layer arrangement of the emitting unit are given below:

(a1) hole transporting layer/emitting layer (/electron transporting layer);

(b1) hole transporting layer/first phosphorescent-emitting layer/second phosphorescent-emitting layer (/electron transporting layer);

(c1) hole transporting layer/phosphorescent-emitting layer/space layer/fluorescent-emitting layer (/electron transporting layer);

(d1) hole transporting layer/first phosphorescent-emitting layer/second phosphorescent-emitting layer/space layer/fluorescent-emitting layer (/electron transporting layer);

(e1) hole transporting layer/first phosphorescent-emitting layer/space layer/second phosphorescent-emitting layer/space layer/fluorescent-emitting layer (/electron transporting layer);

(f1) hole transporting layer/phosphorescent-emitting layer/space layer/first fluorescent-emitting layer/second fluorescent-emitting layer (/electron transporting layer);

(g1) hole transporting layer/electron blocking layer/emitting layer (/electron transporting layer);

(h1) hole transporting layer/emitting layer/hole blocking layer (/electron transporting layer); and (i1) hole transporting layer/fluorescent-emitting layer/triplet blocking layer (/electron transporting layer).

Each of the phosphorescent-emitting layers or the fluorescent-emitting layers can exhibit different emission colors. Specifically, the above laminated emitting layers (d1) is in the layer arrangement of the hole transporting layer/first phosphorescent-emitting layer (red emission)/second phosphorescent-emitting layer (green emission)/space layer/fluorescent-emitting layer (blue emission)/electron transporting layer.

An electron blocking layer may be provided as needed between each of the emitting layers and the hole transporting layer or the space layer. Moreover, a hole blocking layer may be provided as needed between each of the emitting layers and the electron transporting layer. Provision of the electron blocking layer or the hole blocking layer enables electrons or holes to be trapped in the emitting layers, thereby enhancing probability of charge recombination in the emitting layers to improve luminous efficiency.

A representative device arrangement of the tandem-type organic EL device is shown below.

(2) Anode/First Emitting Unit/Intermediate Layer/Second Emitting Unit/Cathode

Herein, the first emitting unit and the second emitting unit can be independently the same as the aforementioned emitting units.

The intermediate layer is generally referred to as an intermediate electrode, intermediate conductive layer, charge generating layer, electron drawing layer, connection layer or intermediate insulative layer. The intermediate layer can be made of known materials that supply electrons to the first emitting unit and holes to the second emitting unit.

Space Layer

For instance, when a fluorescent-emitting layer is laminated to a phosphorescent-emitting layer, the space layer is provided between the fluorescent-emitting layer and the phosphorescent-emitting layer in order to prevent excitons generated in the phosphorescent-emitting layer from diffusing into the fluorescent-emitting layer or to adjust carrier balance. Moreover, the space layer may be provided between a plurality of phosphorescent-emitting layers.

Since the space layer is provided between the emitting layers, the space layer is preferably formed of a material having both of electron transporting capability and hole transporting capability. Moreover, triplet energy of the space layer is preferably 2.6 eV or more in order to prevent diffusion of triplet energy into an adjacent phosphorescent-emitting layer. The material used for the space layer is the same as the aforementioned material used for the hole transporting layer.

Blocking Layer

The organic EL device according to the exemplary embodiment preferably includes a blocking layer such as an electron blocking layer, hole blocking layer or triplet blocking layer at a part adjacent to the emitting layer. Herein, the electron blocking layer prevents electrons from leaking from the emitting layer into the hole transporting layer while the hole blocking layer prevents holes from leaking from the emitting layer into the electron transporting layer.

The triplet blocking layer has a function of preventing triplet excitons generated in the emitting layer from diffusing into neighboring layers to trap the triplet excitons within the emitting layer, thereby suppressing energy deactivation of the triplet excitons on molecules other than the emitting dopant in the electron transporting layer.

When the triplet blocking layer is provided in a phosphorescent device, supposing that triplet energy of a phosphorescent dopant in the emitting layer is denoted as $E^T_d$ and triplet energy of a compound used as the triplet blocking layer is denoted as $E^T_{TB}$, in an energy relationship of $E^T_d < E^T_{TB}$, triplet excitons of the phosphorescent dopant are trapped (cannot be transferred to another molecule) due to the energy relationship to leave no alternative route for energy deactivation other than emission on the dopant, so that highly efficient emission can be expected. However, when an energy gap ($\Delta E^T = E^T_{TB} - E^T_d$) is small even though the relationship of $E^t_d < E^T_{TB}$ is satisfied, under actual environments for driving a device (i.e., at around the room temperature), it is considered that triplet excitons can be transferred to another molecule irrespective of the energy gap $\Delta E^T$ by absorbing ambient heat energy. Particularly, since the excitons of the phosphorescent device have a longer lifetime than those of a fluorescent device, influence by heat absorption during transfer of the excitons is more likely to emerge on the phosphorescent device relative to the fluorescent device. The larger energy gap $\Delta E^T$ relative to the heat energy at the room temperature is preferable, more preferably 0.1 eV or more, particularly preferable at 0.2 eV or more.

An electron mobility of a material for forming the triplet blocking layer is desirably $10^{-6}$ $cm^2/Vs$ or more in an electric field intensity of 0.04 MV/cm to 0.5 MV/cm. As a measuring method of the electron mobility of the organic material, some methods such as Time of Flight method are known. Herein, the electron mobility is determined by the impedance spectroscopy.

An electron mobility of a material for forming the electron injecting layer is desirably $10^{-6}$ $cm^2/Vs$ or more in the electric field intensity of 0.04 MV/cm to 0.5 MV/cm. This arrangement promotes electron injection from the cathode to the electron transporting layer, thereby promoting the electron injection to the neighboring blocking layer and emitting layer, so that the device can be driven at a low voltage.

EXAMPLES

Next, the present invention will be described in further detail by exemplifying Example(s) and Comparative(s). However, the present invention is not limited by the description of Example(s).

Synthesis of Compounds

Synthesis Example 1-1

Synthesis of Compound H1-1

Synthesis Example 1-1-1

Synthesis of Intermediate Body 1-1

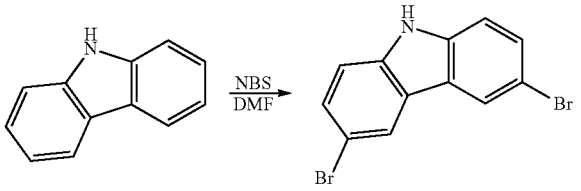

Intermediate body 1-1

Under argon, to a 1000-mL eggplant flask, carbazole (56 g, 334 mmol) and N,N-dimethylformamide (250 mL) were added and cooled to −7 degrees C. in an ice water bath (in which sodium chloride was added). To the mixture, a solution (200 mL) of N-bromosuccinimide (119 g, 668 mmol) in N,N-dimethylformamide was dropped and stirred for four hours at −7 degrees C.

The reaction solution was added with pure water to be heated to the room temperature. Subsequently, a precipitated solid was collected by filtration. The obtained solid was repeatedly recrystallized in toluene, so that an intermediate body 1-1 (71 g, a yield rate of 65%) was obtained. As a result of FD-MS (Field Desoprtion Mass Spectrometry) analysis, the reactant was identified as the intermediate body 1-1.

Synthesis Example 1-1-2

Synthesis of Intermediate Body 1-2

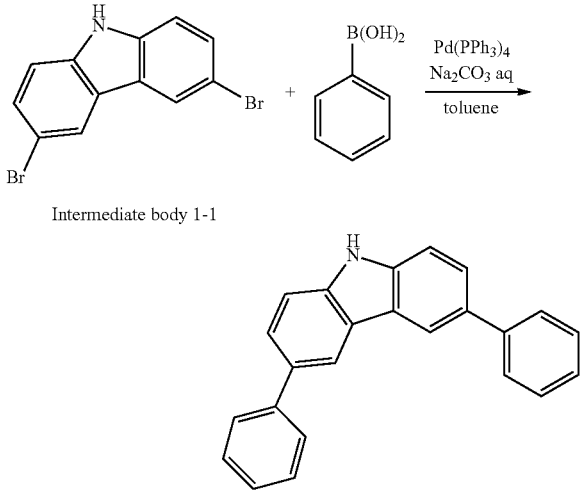

Under argon, to a 2000-mL eggplant flask, the intermediate body 1-1 (33 g, 102 mmol), phenylboronic acid (27 g, 221 mmol), tetrakis(triphenylphosphine)palladium (7.0 g, 6.1 mmol), 1,2-dimethoxyethane (600 mL) and 2M sodium carbonate solution (200 mL) were sequentially added and heated to reflux for eight hours.

After the reaction solution was cooled down to the room temperature, an organic phase was separated and an organic solvent was distilled away under reduced pressure. The obtained residue was refined by silica-gel column chromatography, whereby an intermediate body 1-2 (19 g, a yield rate of 58%) was obtained. As a result of FD-MS (Field Desoprtion Mass Spectrometry) analysis, the reactant was identified as the intermediate body 1-2.

Synthesis Example 1-1-3

Synthesis of Intermediate Body 1-3

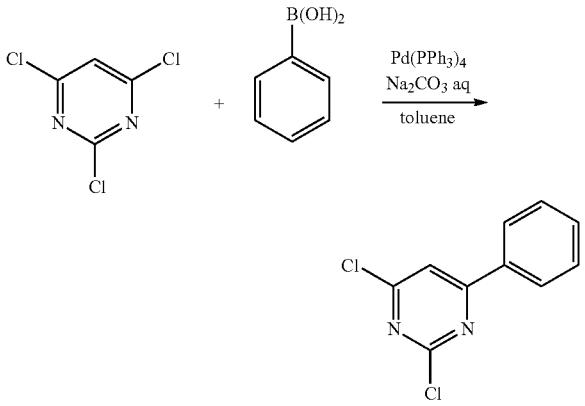

An intermediate body 1-3 was synthesized by the same method as the intermediate body 1-2 except that 2,4,6-trichloropyrimidine was used in place of the intermediate body 1-1. As a result of FD-MS (Field Desoprtion Mass Spectrometry) analysis, the reactant was identified as the intermediate body 1-3.

Synthesis Example 1-1-4

Synthesis of Intermediate Body 1-4

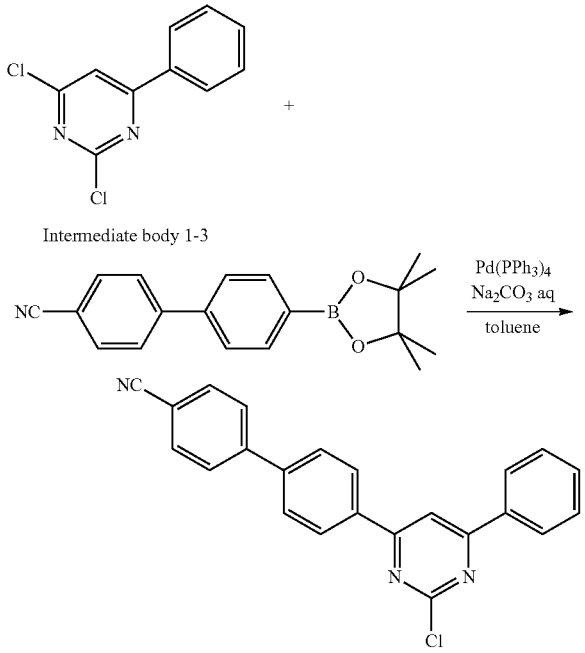

An intermediate body 1-4 was synthesized by the same method as the intermediate body 1-2 except that the intermediate body 1-3 was used in place of the intermediate body 1-1 and that 4'-(4,4,5,5-tetramethyl-1,3,2-dioxaborane-2-yl) biphenyl-4-carbonitrile was used in place of phenylboronic acid. As a result of FD-MS (Field Desoprtion Mass Spectrometry) analysis, the reactant was identified as the intermediate body 1-4.

Synthesis Example 1-1-5

Synthesis of Compound H1-1

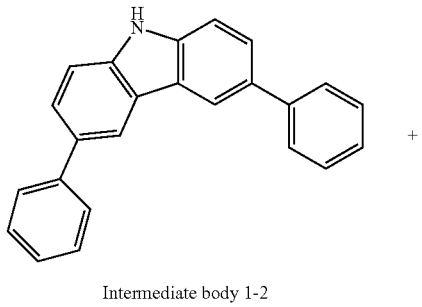

-continued

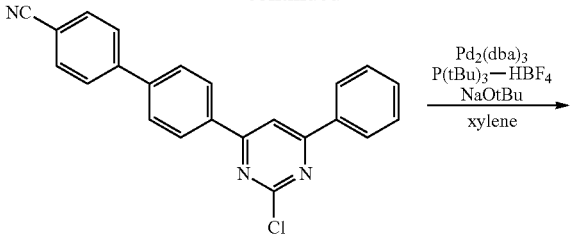

Intermediate body 1-4

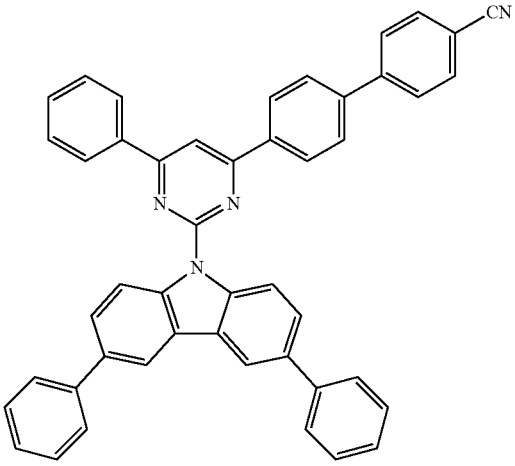

Compound H1-1

Under argon, the intermediate body 1-2 (2.3 g, 7.2 mmol), the intermediate body 1-4 (3.2 g, 8.6 mmol), tris(dibenzylideneacetone)dipalladium (0.26 g, 0.29 mmol), tri-t-butylphosphonium tetrafluoroborate (0.21 g, 0.72 mmol), sodium t-butoxide (1.4 g, 14 mmol), and anhydrous xylene (40 mL) were sequentially added, and heated to reflux for eight hours.

After the reaction solution was cooled down to the room temperature, an organic phase was separated and an organic solvent was distilled away under reduced pressure. The obtained residue was refined by silica-gel column chromatography, whereby 3.6 g of a yellowish white solid (H1-1) was obtained.

A result of FD-MS (Field Desoprtion Mass Spectrometry) of the obtained compound and a maximum fluorescent wavelength thereof in a toluene solution FL(PhMe, λex=325 nm; λmax) are shown below:

FDMS, calcd for C47H30N4=650, found m/z=650 (M+)

FL(PhMe, λex=325 nm); λmax, 471 nm

Synthesis Example 1-2

Synthesis of Compound H1-2

Synthesis Example 1-2-1

Synthesis of Intermediate Body 1-5

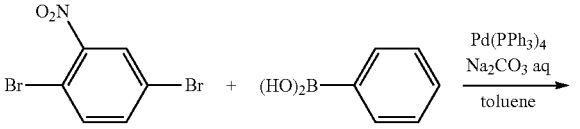

-continued

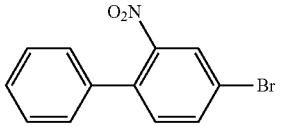

Intermediate body 1-5

Under argon, 2-nitro-1,4-dibromobenzene (11.2 g, 40 mmol), phenylboronic acid (4.9 g, 40 mmol), tetrakis(triphenylphosphine)palladium (1.39 g, 1.2 mmol), toluene (120 mL) and an aqueous solution of 2M sodium carbonate (60 mL) were sequentially added and heated to reflux for eight hours.

After the reaction solution was cooled down to the room temperature, an organic phase was separated and an organic solvent was distilled away under reduced pressure. The obtained residue was refined by silica-gel column chromatography, so that an intermediate body 5 (6.6 g, a yield of 59%) was obtained. As a result of FD-MS (Field Desoprtion Mass Spectrometry) analysis, the reactant was identified as the intermediate body 1-5.

Synthesis Example 1-2-2

Synthesis of Intermediate Body 1-6

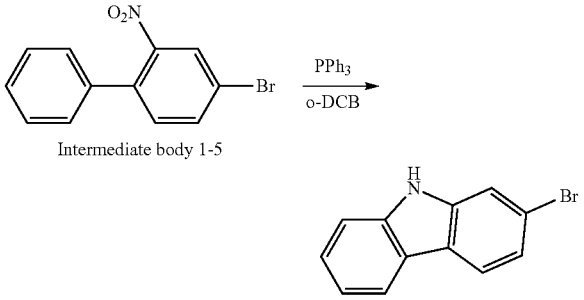

Intermediate body 1-5

Intermediate body 1-6

Under argon, the intermediate body 1-5 (6.6 g, 23.7 mmol), triphenylphosphine (15.6 g, 59.3 mmol), and o-dichlorobenzene (24 mL) were sequentially added and heated to reflux at 180 degrees C. for eight hours.

After cooled down to the room temperature, the reaction solution was refined by silica-gel column chromatography, whereby an intermediate body 6 (4 g, a yield of 68%) was obtained. As a result of FD-MS (Field Desoprtion Mass Spectrometry) analysis, the reactant was identified as the intermediate body 1-6.

Synthesis Example 1-2-3

Synthesis of Intermediate Body 1-7

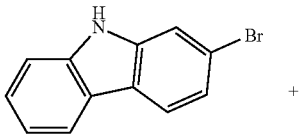

Intermediate body 1-6

-continued

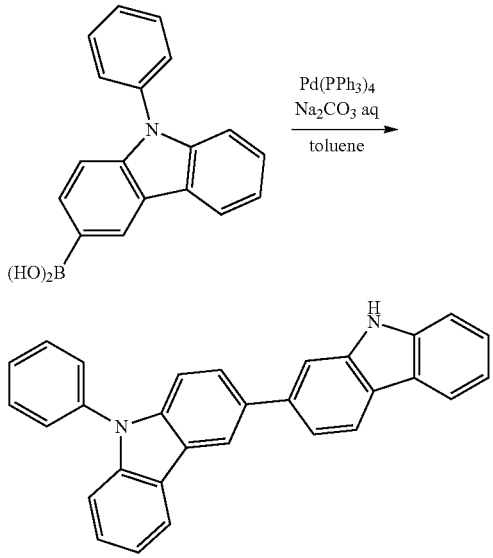

Intermediate body 1-7

An intermediate body 1-7 was synthesized by the same method as the intermediate body 1-5 except that the intermediate body 1-6 was used in place of 2-nitro-1,4-dibromobenzene and that 9-phenyl-9H-carbazole-3-ylboronic acid was used in place of phenylboronic acid. As a result of FD-MS (Field Desoprtion Mass Spectrometry) analysis, the reactant was identified as the intermediate body 1-7.

Synthesis Example 1-2-4

Synthesis of Compound H1-2

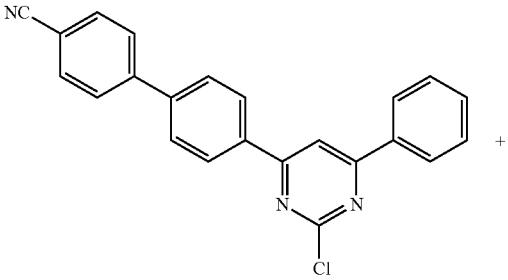

Intermediate body 1-4

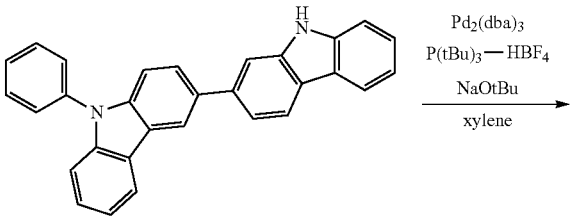

Intermediate body 1-7

-continued

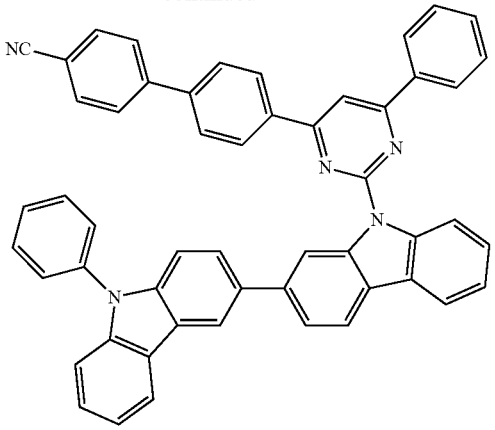

Compound H1-2

The compound H1-2 was synthesized by the same method as the compound H-1 except that the intermediate body 1-7 was used in place of intermediate body 1-2.

A result of FD-MS (Field Desoprtion Mass Spectrometry) of the obtained compound and a maximum fluorescent wavelength thereof in a toluene solution FL(PhMe, λex=325 nm; λmax) are shown below:

FDMS, calcd for C53H33N5=739, found m/z=739 (M+)

FL(PhMe, λex=325 nm); λmax, 475 nm

Synthesis Example 1-3

Synthesis of Compound H1-3

Synthesis Example 1-3-1

Synthesis of Intermediate Body 1-8

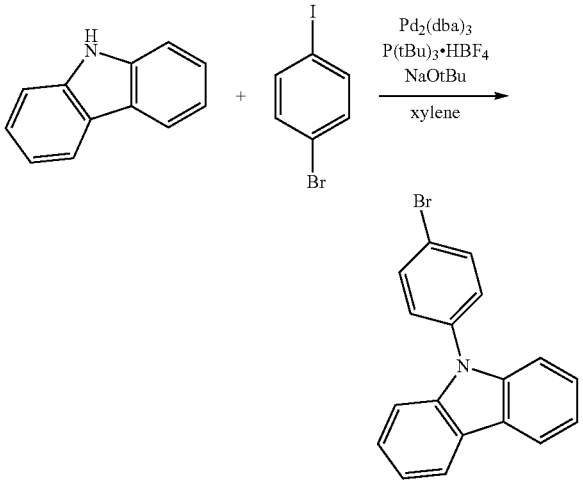

Intermediate body 1-8

An intermediate body 1-8 was synthesized by the same method as the compound H1-1 except that carbazole was used in place of intermediate body 1-2 and 1-bromo-4-iodobenzene was used in place of intermediate body 1-4. As a result of FD-MS (Field Desoprtion Mass Spectrometry) analysis, the reactant was identified as the intermediate body 1-8.

Synthesis Example 1-3-2

Synthesis of Intermediate Body 1-9

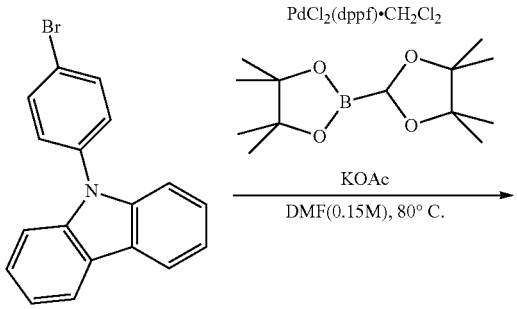

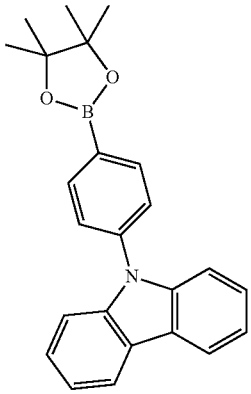

Intermediate body 1-9

Under argon, the intermediate body 1-8 (8.4 g, 25 mmol), bis(pinacolato)diboron (8.3 g, 33 mmol), [1,1'-bis(diphenylphosphino)ferrocene]palladium(II) dichloride dichloromethane adduct (0.62 g, 0.75 mmol), potassium acetate (7.4 g, 75 mmol) and N,N-dimethylformamide (170 mL) were sequentially added, and heated to reflux for eight hours.

After the reaction solution was cooled down to the room temperature, an organic phase was separated and an organic solvent was distilled away under reduced pressure. The obtained residue was refined by silica-gel column chromatography, whereby an intermediate body 1-9 (5.5 g, a yield of 60%) was obtained. As a result of FD-MS (Field Desoprtion Mass Spectrometry) analysis, the reactant was identified as the intermediate body 1-9.

Synthesis Example 1-3

Synthesis of Compound H1-3

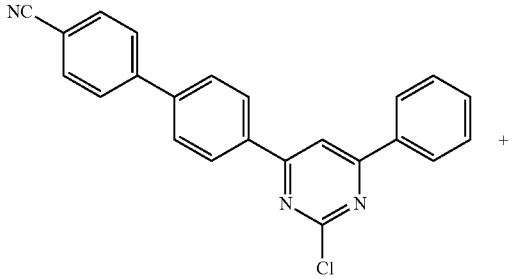

Intermediate body 1-4

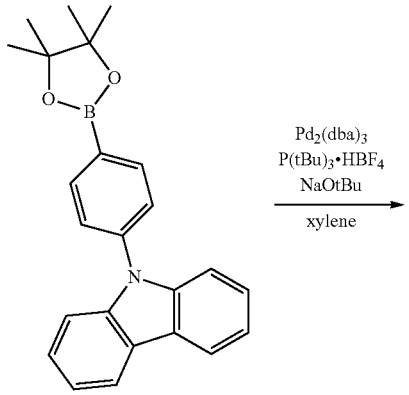

Intermediate body 1-9

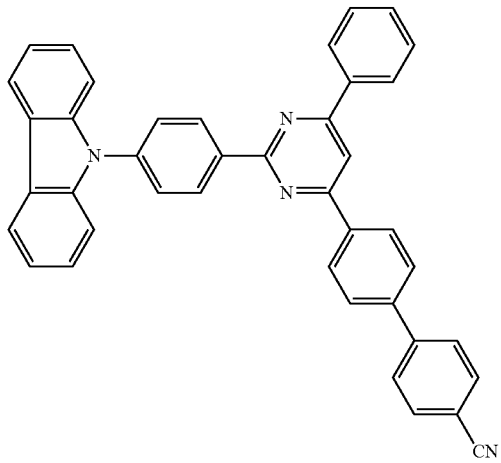

Compound H1-3

The compound H1-2 was synthesized by the same method as the compound H1-1 except that the intermediate body 1-9 was used in place of intermediate body 1-2.

A result of FD-MS (Field Desoprtion Mass Spectrometry) of the obtained compound and a maximum fluorescent wavelength thereof in a toluene solution FL(PhMe, λex=300 nm; λmax) are shown below:

FDMS, calcd for C41H16N4=574, found m/z=574 (M+)

FL(PhMe, λex=300 nm); λmax, 416 nm

Synthesis Example 2-1

Synthesis of Compound H2-1

Synthesis Example 2-1-1

Synthesis of Intermediate Body 2-1

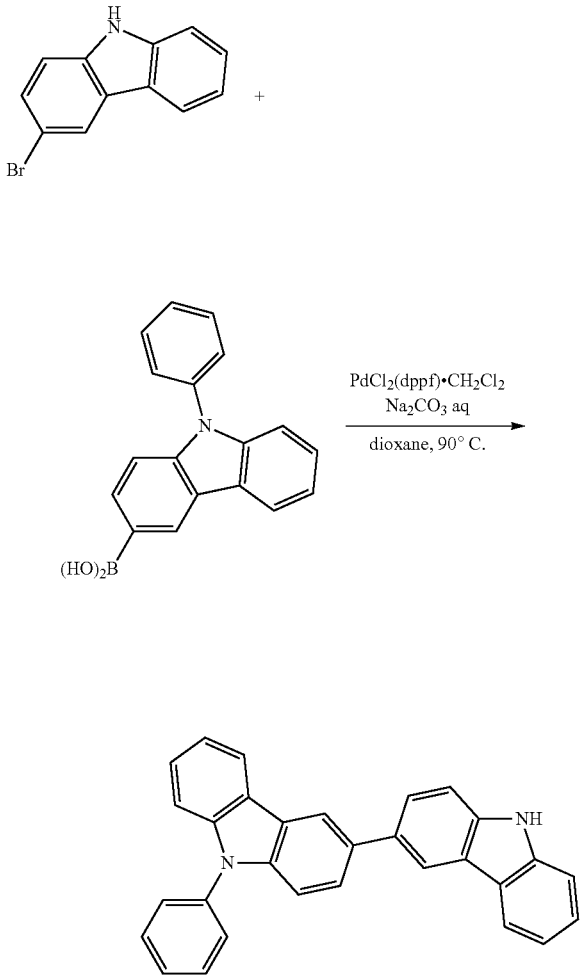

Intermediate body 2-1

Under argon, to a 2000-mL eggplant flask, 3-bromocarbazole (43 g, 174 mmol), 9-phenylcarbazole-3-ylboronic acid (50 g, 174 mmol), [1,1'-bix(diphenylphosphino)ferrocene]palladium(II) dichloride dichloromethane adduct (1.4 g, 1.7 mmol), dioxane (610 mL) and 2M sodium carbonate solution (260 mL) were sequentially added and heated to reflux for eight hours.

After the reaction solution was cooled down to the room temperature, an organic phase was separated and an organic solvent was distilled away under reduced pressure. The obtained residue was refined by silica-gel column chromatography, so that an intermediate body 4 (43 g, a yield of 60%) was obtained. As a result of FD-MS (Field Desoprtion Mass Spectrometry) analysis, the reactant was identified as the intermediate body 2-1.

Synthesis Example 2-1-2

Synthesis of Compound H2-1

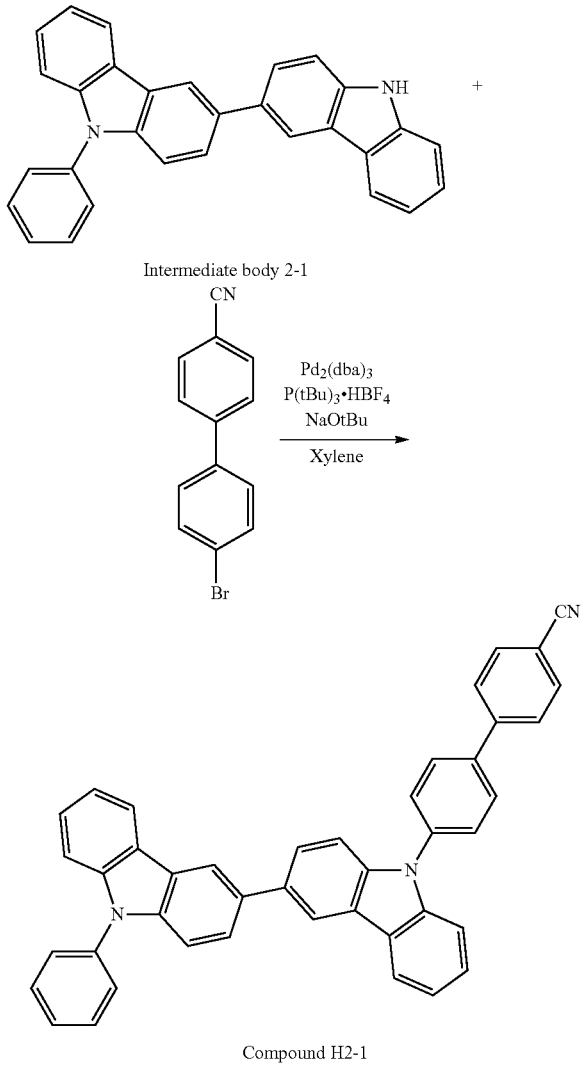

Intermediate body 2-1

Compound H2-1

Under argon, to a 300-mL eggplant flask, the intermediate body 2-1 (5.14 g, 12.6 mmol), 4'-bromobiphenyl-4-carbonitrile (3.90 g, 15.1 mmol), tris(dibenzylideneacetone)dipalladium (0.462 g, 0.505 mmol), tri-t-butylphosphonium tetrafluoroborate (0.470 g, 1.62 mmol), sodium t-butoxide (2.42 g, 25.2 mmol), and anhydrous xylene (25 mL) were sequentially added and heated to reflux for eight hours.

After the reaction solution was cooled down to the room temperature, an organic phase was separated and an organic solvent was distilled away under reduced pressure. The obtained residue was refined by silica-gel column chromatography, whereby 4.5 g of a white solid (H2-1) was obtained.

A result of FD-MS (Field Desoprtion Mass Spectrometry) of the obtained compound, a maximum ultraviolet absorption wavelength thereof in a toluene solution UV(PhMe; λmax) and a maximum fluorescent wavelength thereof in a toluene solution FL(PhMe, λex=310 nm; λmax) are shown below:

FDMS, calcd for C43H27N3=585, found m/z=585 (M+)

UV(PhMe); λmax, 340 nm

FL(PhMe, λex=310 nm); λmax, 424 nm

Synthesis Example 2-2

Synthesis of Compound H2-2

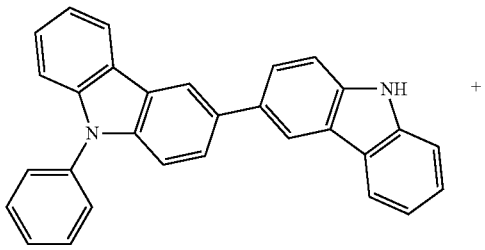

Intermediate body 2-1

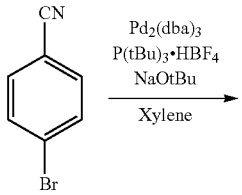

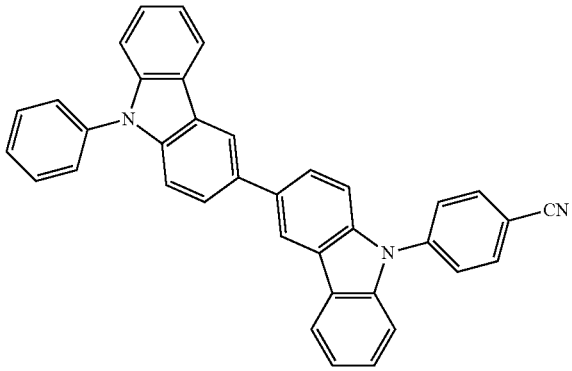

Compound H2-2

The compound H2-2 was synthesized by the same method as the compound H2-1 except that 4-bromobenzonitrile was used in place of 4'-bromobiphenyl-4-carbonitrile.

A result of FD-MS (Field Desoprtion Mass Spectrometry) of the obtained compound, a maximum ultraviolet absorption wavelength thereof in a toluene solution UV(PhMe; λmax) and a maximum fluorescent wavelength thereof in a toluene solution FL(PhMe, λex=300 nm; λmax) are shown below:

FDMS, calcd for C37H23N3=509, found m/z=509 (M+)

UV(PhMe); λmax, 339 nm

FL(PhMe, λex=300 nm); λmax, 404 nm

Manufacture and Evaluation on Luminescent Performance of Organic EL Device

Example 1

Manufacture of Organic EL Device

A glass substrate (size: 25 mm×75 mm×1.1 mm thick) having an ITO transparent electrode (manufactured by GEOMATEC Co., Ltd.) was ultrasonic-cleaned in isopropyl alcohol for five minutes, and then UV/ozone-cleaned for 30 minutes. A film thickness of ITO transparent electrode was 77 nm.

After the glass substrate having the transparent electrode line was cleaned, the glass substrate was mounted on a substrate holder of a vacuum deposition apparatus. The following electron accepting (acceptor) compound (C-1) was evaporated to form a 5-nm thick film of the compound C-1 on a surface of the glass substrate where the transparent electrode line was provided so as to cover the transparent electrode.

On the film of the compound C-1, the following aromatic amine derivative (compound X-1) was evaporated as a first hole transporting material to form a 65-nm thick first hole transporting layer.

After film formation of the first hole transporting layer, the following aromatic amine derivative (compound X-2) was evaporated as a second hole transporting material to form a 10-nm thick second hole transporting layer.

Further, on the second hole transporting layer, the following compound H1-1, the following compound H2-1 as the second host material and the following compound $Ir(bzq)_3$ were co-evaporated to form a 25-nm thick emitting layer. In the emitting layer, concentrations of the compound $Ir(bzq)_3$, the host material H1-1 and the host material H2-1 were respectively 10.0 mass %, 45.0 mass % and 45.0 mass %. This co-evaporated film serves as the emitting layer.

After the film formation of the emitting layer, a 35-nm thick film of the following compound (ET) was formed. The film of the compound ET serves as the electron transporting layer.

Next, a 1-nm thick film of LiF was formed as an electron-injecting electrode (cathode) at a film-forming speed of 0.1 Å/min. A metal Al was evaporated on the LiF film to form an 80-nm thick metal cathode.

Thus, an organic EL device of Example 1 was manufactured.

Compounds used in Examples and Comparatives will be shown below.

C-1

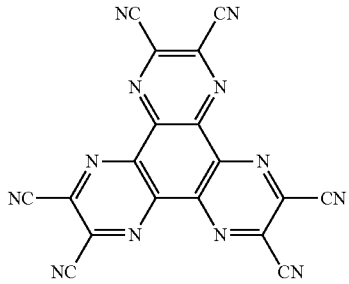

-continued
X-1
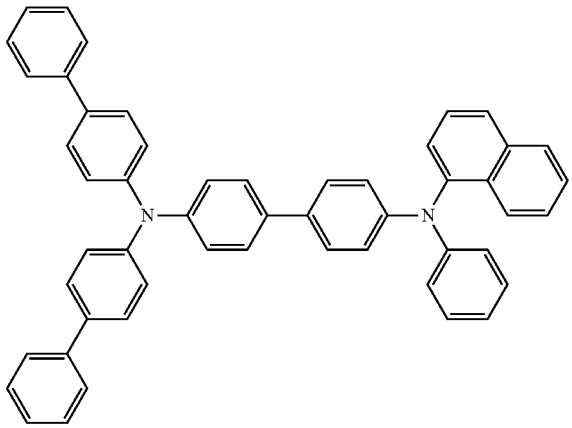
X-2
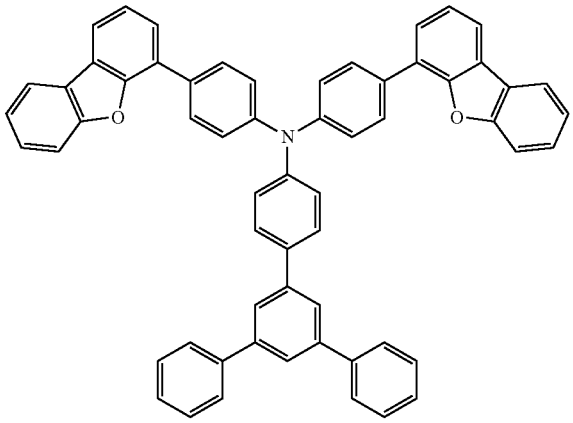
X-3
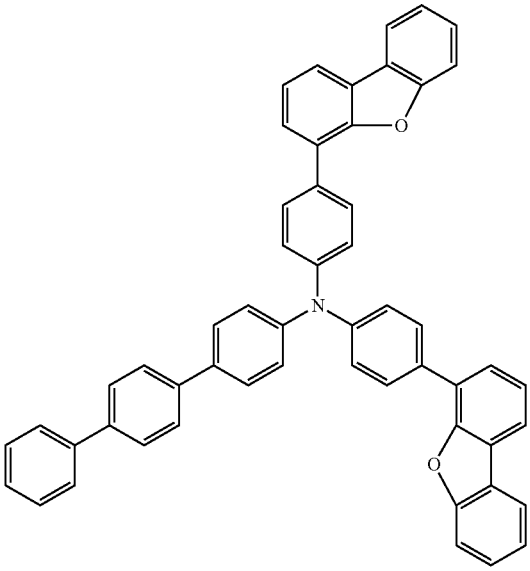
-continued
ET
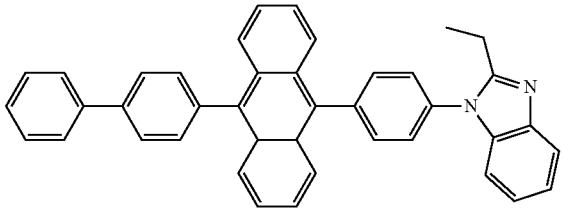
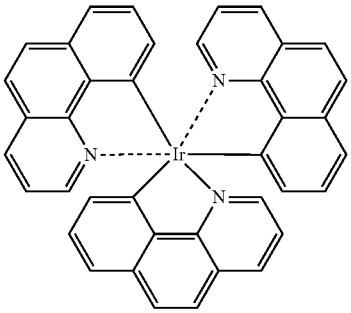
$Ir(bzq)_3$
H1-1
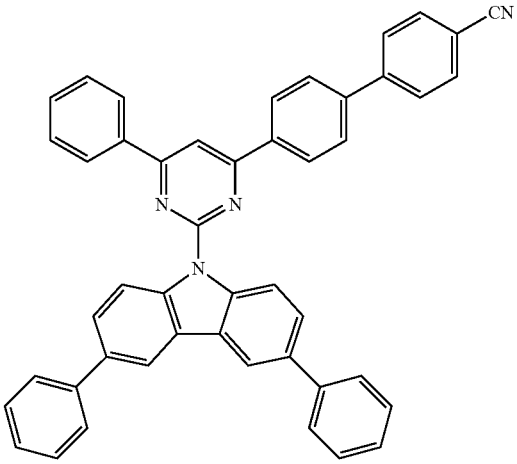
H1-2
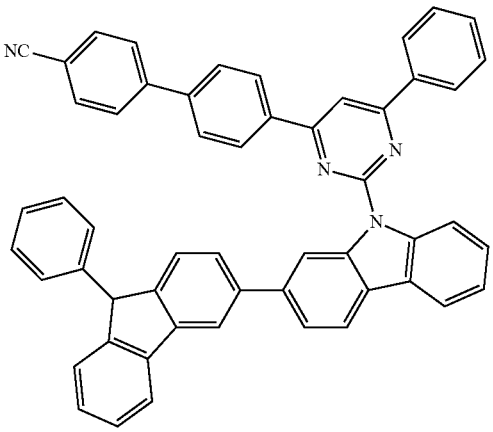

-continued

H1-3

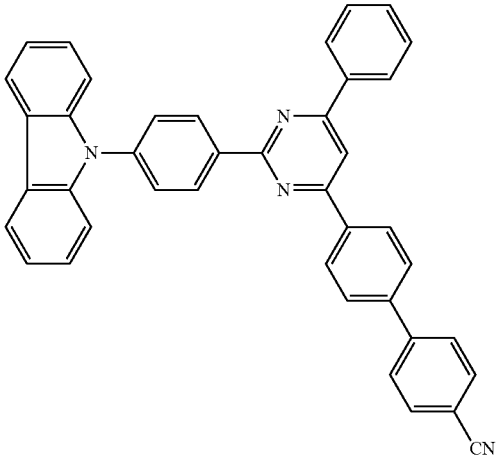

H2-1

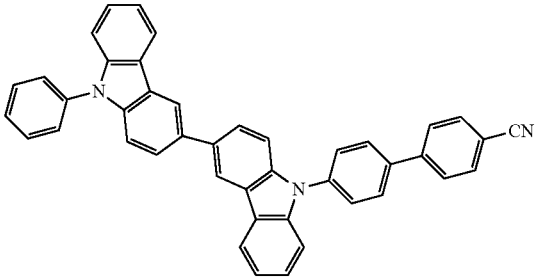

H2-2

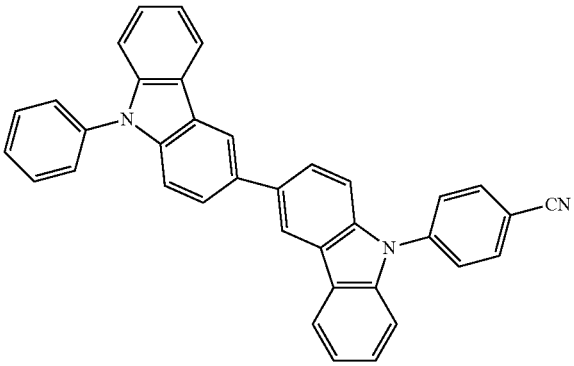

-continued

F1

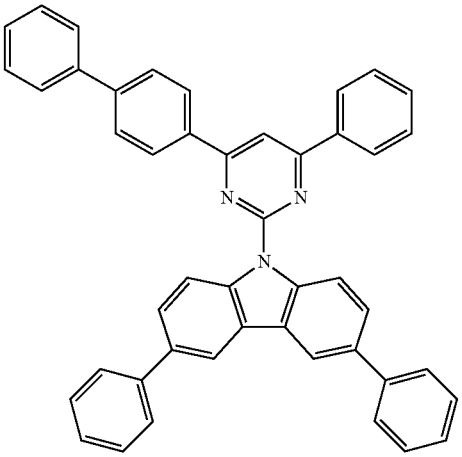

F2

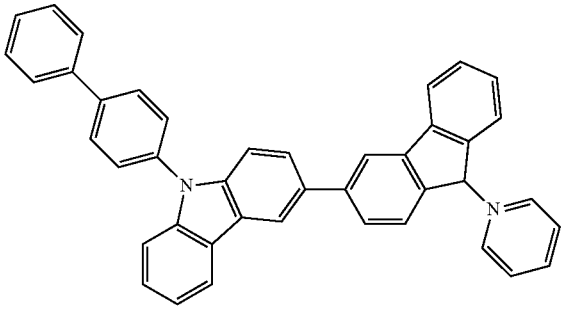

An arrangement of the organic EL devices manufactured in Examples and Comparatives are shown in Table 1. The numerals without a unit in parentheses in Table 1 indicate a thickness of each layer (unit: nm). The numerals with % indicate a mass % concentration of the compound.

TABLE I

| | Arrangement of Organic EL device |
|---|---|
| Example 1 | ITO(77)/C-1(5)/X-1(65)/X-2(10)/H1-1:H2-1:Ir(bzq)$_3$(25, 45%:45%:10%)/ET(35)/LiF(1)/Al(80) |
| Example 2 | ITO(77)/C-1(5)/X-1(65)/X-2(10)/H1-2:H2-1:Ir(bzq)$_3$(25, 45%:45%:10%)/ET(35)/LiF(1)/Al(80) |
| Example 3 | ITO(77)/C-1(5)/X-1(65)/X-3(10)/H1-3:H2-2:Ir(bzq)$_3$(25, 45%:45%:10%)/ET(35)/LiF(1)/Al(80) |
| Comp. 1 | ITO(77)/C-1(5)/X-1(65)/X-3(10)/F1:Ir(bzq)$_3$(25, 10%)/ET(35)/LiF(1)/Al(80) |
| Comp. 2 | ITO(77)/C-1(5)/X-1(65)/X-3(10)/F2:Ir(bzq)$_3$(25, 10%)/ET(35)/LiF(1)/Al(80) |
| Comp. 3 | ITO(77)/C-1(5)/X-1(65)/X-3(10)/F1:F2:Ir(bzq)$_3$(25, 45%:45%:10%)/ET(35)/LiF(1)/Al(80) |
| Ref. 1 | ITO(77)/C-1(5)/X-1(65)/X-3(10)/H1-2:Ir(bzq)$_3$(25, 10%)/ET(35)/LiF(1)/Al(80) |
| Ref. 2 | ITO(77)/C-1(5)/X-1(65)/X-2(10)/F1:H1-1:Ir(bzq)$_3$(25, 45%:45%:10%)/ET(35)/LiF(1)/Al(80) |
| Ref. 3 | ITO(77)/C-1(5)/X-1(65)/X-2(10)/F2:H1-2:Ir(bzq)$_3$(25, 45%:45%:10%)/ET(35)/LiF(1)/Al(80) |

Examples 2 to 3, Comparatives 1 to 3 and References 1 to 3

Organic EL devices of Examples 2 to 3, Comparatives 1 to 3 and References 1 to 3 were manufactured in the same manner as in the Example 1 except for using the arrangement of the organic EL device shown in Table 1.

Evaluation of Organic EL Device

The prepared organic EL devices were evaluated in terms of a drive voltage, an external quantum efficiency EQE and a lifetime $LT_{95}$. The results are shown in Table 2.

Drive Voltage

Electrical current was applied between ITO and Al such that a current density was 10 mA/cm$^2$, where voltage (unit: V) was measured.

External Quantum Efficiency EQE

Voltage was applied on each of the organic EL devices at the room temperature such that a current density was 10 mA/cm$^2$, where EL emission spectrum was measured by a spectroradiometer (CS-1000 manufactured by Konica Minolta Holdings, Inc.). The external quantum efficiency EQE (unit: %) was calculated based on the obtained spectral-radiance spectra, assuming that the spectra was provided under a Lambertian radiation.

Lifetime

A 95%-lifetime at the current density of 50 mA/cm$^2$ was obtained. The 95%-lifetime means an elapsed time until a luminance intensity is reduced to 95% of an initial luminance intensity when each of the organic devices is driven at a constant current. The 95%-lifetime is occasionally referred to as LT95.

TABLE 2

| | Host material of Emitting layer | Voltage (V) 10 (mA/cm$^2$) | EQE (%) 10 (mA/cm$^2$) | LT95 (hrs) 50 (mA/cm$^2$) |
|---|---|---|---|---|
| Example 1 | H1-1:H2-1 | 3.4 | 17.9 | 80 |
| Example 2 | H1-2:H2-1 | 3.4 | 16.6 | 130 |
| Example 3 | H1-3:H2-2 | 3.1 | 14.3 | 80 |
| Comp. 1 | Fl | 3.4 | 16.8 | 5 |
| Comp. 2 | F2 | 4.1 | 6.8 | 1 |
| Comp. 3 | F1:F2 | 3.4 | 17.8 | 20 |
| Ref. 1 | H1-2 | 3.2 | 14.8 | 70 |
| Ref. 2 | F1:H1-2 | 3.4 | 18.1 | 10 |
| Ref. 3 | F2:H1-1 | 3.2 | 17.8 | 40 |

As understood from Table 2, the organic EL devices of Examples 1 to 3 were equal to each other in terms of the luminous efficiency (external quantum efficiency EQE) and had a prolonged lifetime, as compared with the organic EL devices of Comparatives 1 to 3.

This is considered to be because the organic EL devices of Examples 1 to 3 contained a combination of the first host material (the compounds H1-1, H1-2, H1-3) having the partial structure represented by the formula (1) and the second host material (the compounds H2-1, H2-2) having the partial structure represented by the formula (3) as the host material (co-host) of the emitting layer.

On other hand, the organic EL devices of Comparatives 1 to 3 contained the compound F1 having no partial structure represented by the formula (1) and the compound F2 having no partial structure represented by the formula (3). The organic EL device of Comparative 1 singularly used the compound F1 and the organic EL device of Comparative 2 singularly used the compound F2. Both of the organic EL devices had an extremely short lifetime.

Further, even when the compounds F1 and F2 were used in combination as the host material in the emitting layer as shown in Comparative 3, the lifetime of the device was found to be short. The compound F1 and the compound H-1 as the first host material of Example 1 were similar to each other in skeleton except for the presence of a cyano group. The compound F2 and the compound H2-1 as the second host material of Example 1 were similar to each other in skeleton except for the presence of a cyano group. However, as described above, since the first host material and the second host material had specific partial structures, the lifetime of the organic EL device of Example 1 exhibited 80 hours, which was four times longer than the lifetime (20 hours) of the organic EL device of Comparative 3 using a combination of the compounds having no specific partial structure.

Reference 1 singularly used the compound H1-2 of the first host material of Example 2 as the host material. The lifetime of the organic EL device of Example 2 was about twice longer than the lifetime of the organic EL device of Reference 1.

Reference 2 shows the emitting layer in which the compound H1-2 used as the first host material of Example 2 and the compound F1 used in Comparative 1. The lifetime of the organic EL device of Reference 2 was twice longer than the lifetime of the organic EL device of Comparative 1. However, the lifetime of the organic EL device of Reference 2 was shorter than the lifetime of the organic EL device of Example 2.

Reference 3 shows the emitting layer in which the compound H1-1 used as the first host material of Example 1 and the compound F2 used in Comparative 2. The lifetime of the organic EL device of Reference 3 was twice longer than the lifetime of the organic EL device of Comparative 3. However, the lifetime of the organic EL device of Reference 3 was half of the lifetime of the organic EL device of Example 1.

When two host materials of the emitting layer respectively had the partial structure represented by the formula (1) and the partial structure represented by the formula (3) as shown in Examples 1 to 3, it was found that an advantage of prolonging the lifetime became remarkable.

In comparison between Examples 1 and 2, when the skeleton of the first host material was changed from the carbazole skeleton as in the compound H1-1 to the biscarbazole skeleton as in the compound H1-2, it was found that the lifetime was further prolonged.

Examples 4 to 6

In Examples 4 to 6, the following compounds were used in addition to the above compounds.

PG-1
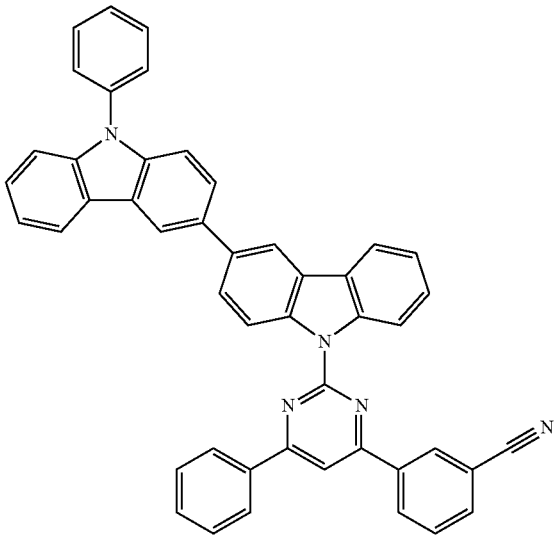
PG-2
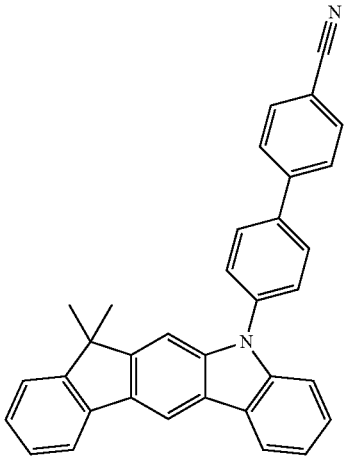
PG-3
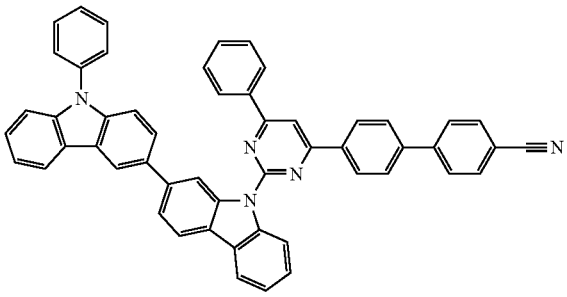
-continued
PG-4
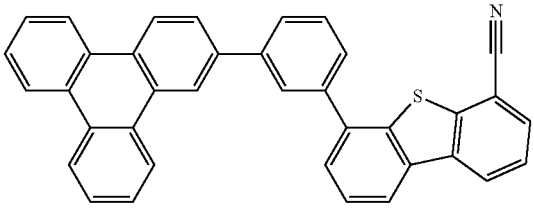
PG-5
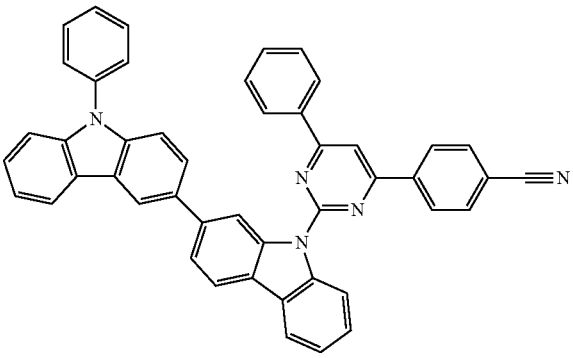
PG-6
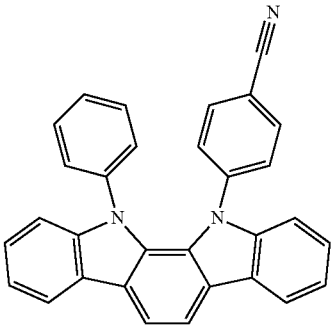
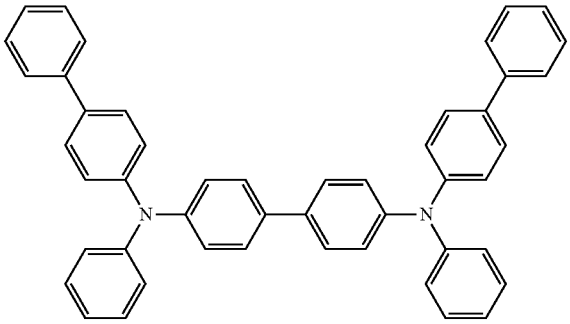
HT -continued
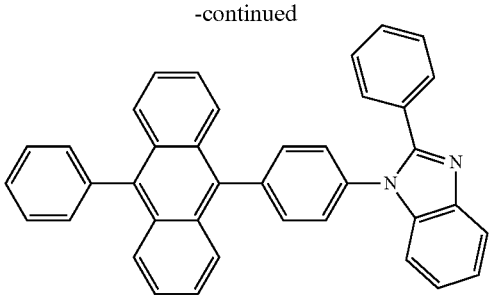
ET2
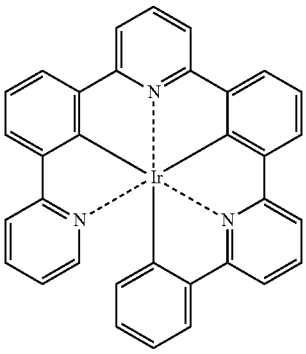
$Ir(ppy)_3$
-continued
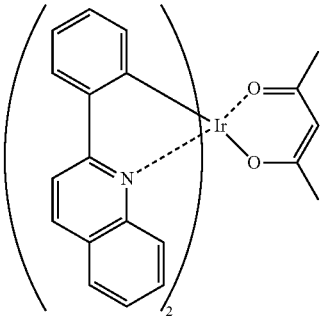
$PQ_2Ir(acac)$
Synthesis of Compounds
Synthesis Example 3-1
Synthesis of Compound PG-1
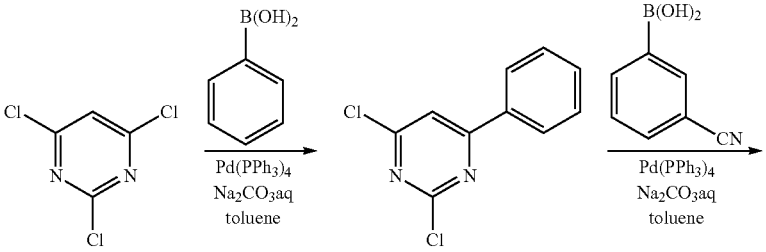
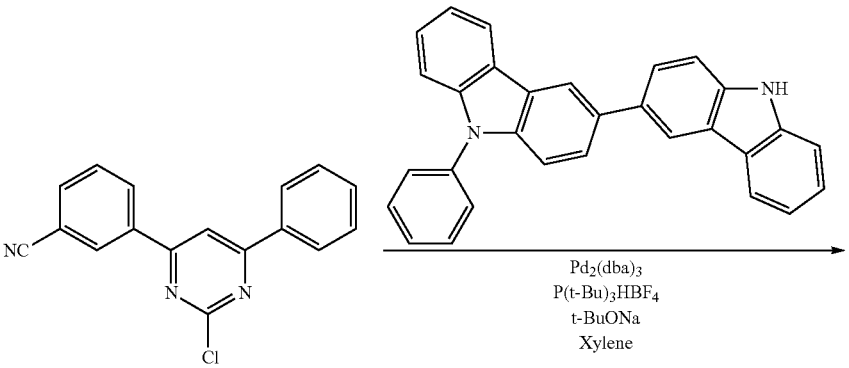

-continued

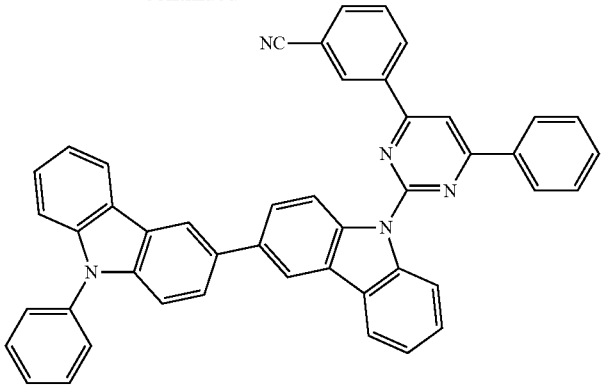

PG-1

(3-1-1) Synthesis of 2,4-dichloro-6-phenylpyrimidine

Under argon, 2,4,6-trichloropyrimidine (7.28 g, 40 mmol), phenylboronic acid (4.9 g, 40 mmol), tetrakis(triphenylphosphine)palladium (1.39 g, 1.2 mmol), toluene (120 mL) and an aqueous solution of 2M sodium carbonate (60 mL) were sequentially added and heated to reflux for eight hours.

After the reaction solution was cooled down to the room temperature, an organic phase was separated and an organic solvent was distilled away under reduced pressure. The obtained residue was refined by silica-gel column chromatography, so that 2,4-dichloro-6-phenylpyrimidine (5.4 g) was obtained.

(3-1-2) Synthesis of 2-chloro-4-(3-cyanophenyl)-6-phenylpyrimidine 2-chloro-4-(3-cyanophenyl)-6-phenylpyrimidine was synthesized by the same method as in syntheses of 2,4-dichloro-6-phenylpyrimidine in the above (3-1-1), except that 2,4-dichloro-6-phenylpyrimidine was used in place of 2,4,6-trichloropyrimidine and that 3-cyanophenylboronic acid was used in place of phenylboronic acid.

(3-1-3) Synthesis of PG-1

Under argon, 2-chloro-4-(3-cyanophenyl)-6-phenylpyrimidine (2.91 g, 10 mmol), 3-(9-phenylcarbazole-3-yl)carbazole (4.9 g, 12 mmol) synthesized by a known method, tris(dibenzylideneacetone)dipalladium (0.183 g, 0.20 mmol), tri-t-butylphosphonium tetrafluoroborate (0.15 g, 0.52 mmol), sodium t-butoxide (1.9 g, 20 mmol), and anhydrous xylene (50 mL) were sequentially added and heated to reflux for eight hours.

After the reaction solution was cooled down to the room temperature, an organic phase was separated and an organic solvent was distilled away under reduced pressure. The obtained residue was refined by silica-gel column chromatography, whereby 3.3 g of a compound PG-1 was obtained. As a result of mass spectrum (FD-MS) analysis, the obtained compound was the target compound PG-1 at m/e=663 to 663.24 of a molecular weight.

Synthesis Example 3-2

Synthesis of Compound PG-2

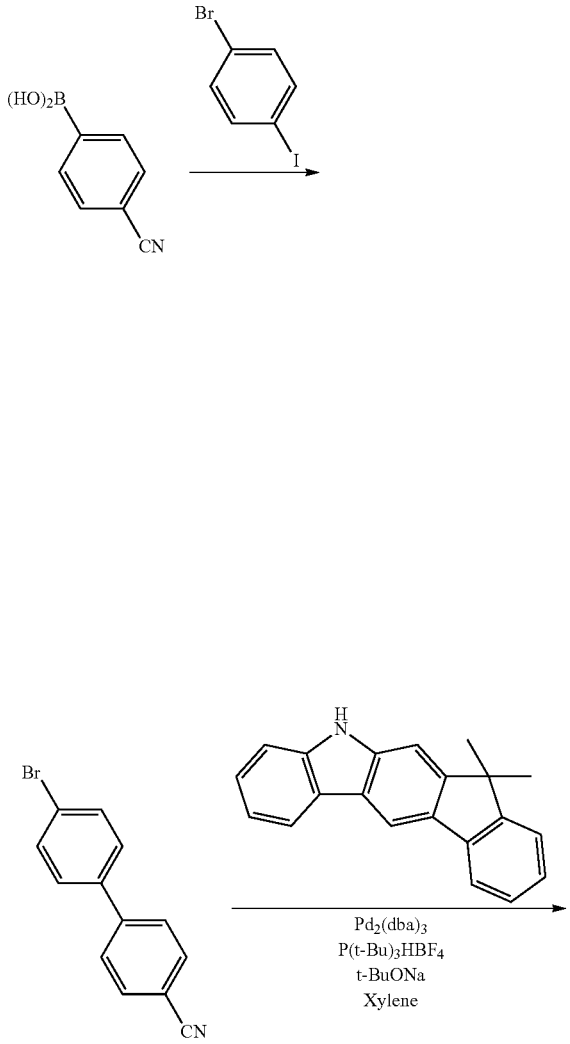

-continued

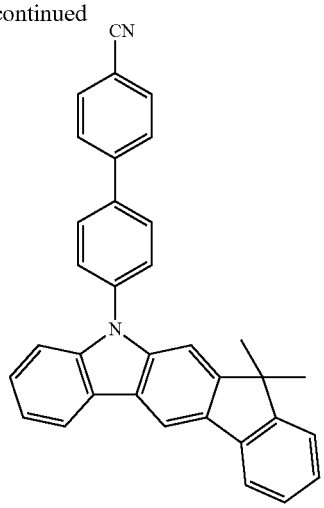

PG-2

(3-2-1) Synthesis of 4-bromo'-cyanobiphenyl 4-bromo-4'-cyanobiphenyl was synthesized by the same method as in syntheses of 2,4-dichloro-6-phenylpyrimidine in the above (3-1-1), except that 4-bromoiodobenzene was used in place of 2,4,6-trichloropyrimidine and that 4-cyanophenylboronic acid was used in place of phenylboronic acid.

(3-2-2) Synthesis of PG-2

The compound PG-2 was synthesized by the same method as the compound PG-1 in the above (3-1-3) except that 7,7-dimethyl-7H-indeno[2,1-b]carbazole synthesized by a known method was used in place of 3-(9-phenylcarbazole-3-yl)carbazole and 4-bromo-4'-cyanobiphenyl was used in place of 2-chloro-4-(3-cyanophenyl)-6-phenylpyrimidine. As a result of mass spectrum (FD-MS) analysis, the obtained compound was the target compound PG-2 at m/e=460 to 460.19 of a molecular weight.

Synthesis Example 3-3

Synthesis of Compound PG-4

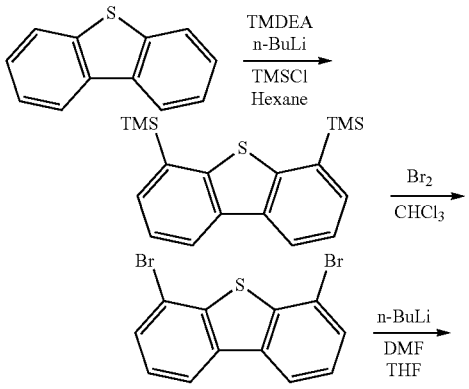

-continued

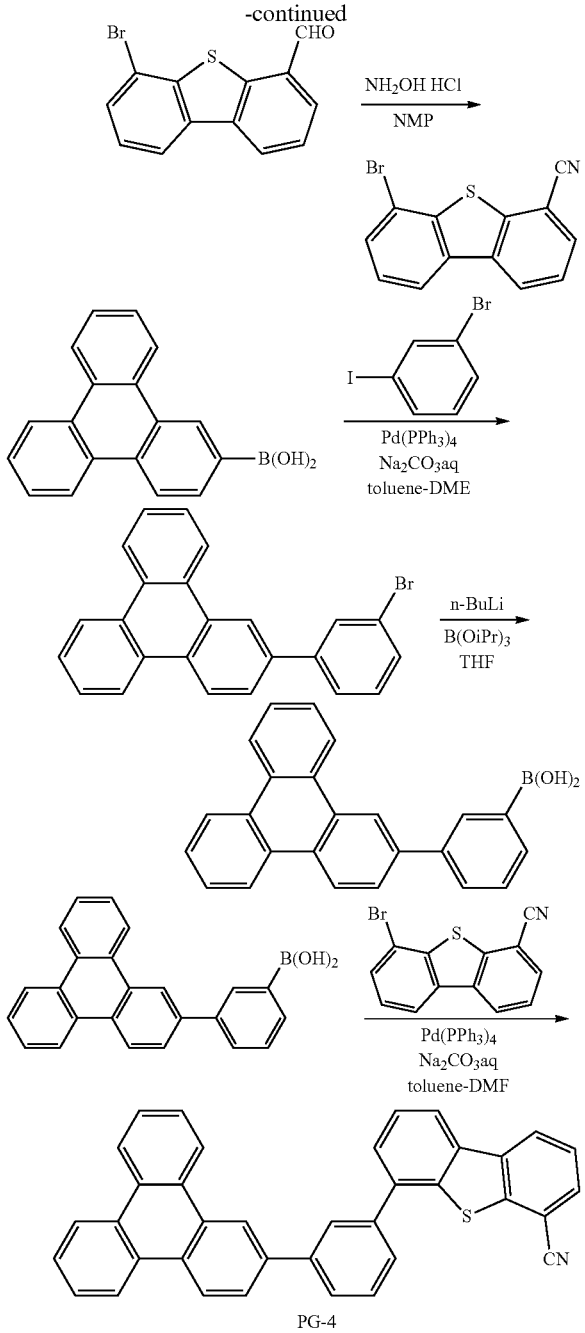

PG-4

(3-3-1) Synthesis of 4,6-bis(trimethylsilyl)dibenzothiophene

Under an argon atmosphere, tetramethylethylenediamine (1.76 kg) and hexane (7.67 L) were prepared, to which a solution (9.51 L) of 1.6M n-butyllithium in hexane was dropped with stirring at 0 degree C. After stirring for 30 minutes at the room temperature, hexane (11.5 L) was added and, then, dibenzothiophene (930 g) was added. The temperature of the reaction solution was raised to 60 degrees C. and the reaction solution was stirred for two hours. The reaction solution was cooled to −78 degrees C., to which chlorotrimethylsilane (1.65 kg) was dropped. After stirred for 30 minutes at −78 degrees C., the reaction solution was kept stirred for five hours while the temperature of the reaction solution being raised to the room temperature. A 5%-aqueous solution of hydrochloric acid (15 L) was added to the reaction solution to quench the reaction. After an aqueous phase was removed, an organic phase was washed with water, dried with magnesium sulfate and distilled away under reduced pressure. The obtained residue was refined by silica-gel column chromatography, so that 4,6-bis(trimethylsilyl)dibenzothiophene (547 g) was obtained.

(3-3-2) Synthesis of 4,6-dibromodibenzothiophene 4,6-bis(trimethylsilyl)dibenzothiophene (540 g) and chloroform (3.4 L) were prepared, to which a solution (1.4 L) of bromine (551 g) in chloroform was added with stirring at −15 degree C. After stirred for 1 hour at −15 degrees C., the reaction solution was kept stirred while the temperature of the reaction solution being raised to the room temperature. The reaction was quenched with a 5%-aqueous solution of sodium hydroxide (1.4 L). After an aqueous phase was removed, an organic phase was washed with water and dried with magnesium sulfate and distilled away under reduced pressure. After washed with methanol, the obtained solid was repeatedly recrystallized in toluene to provide 4,6-dibromodibenzothiophene (180 g).

(3-3-3) Synthesis of 6-dibromodibenzofuran-4-carboxyaldehyde

Under an argon atmosphere, 4,6-dibromodibenzothiophene (180 g) and dehydrated THF (3.6 L) were prepared, to which a solution (432 mL) of 1.6M n-butyllithium in hexane was dropped with stirring at −78 degree C. After stirring the reaction solution for one hour at the room temperature, N,N-dimethlformamide (115 g) was added to the reaction solution. After stirring the reaction solution for 30 minutes at −78 degrees C., the temperature of the reaction solution was raised to −40 degrees C. and a 5% aqueous solution of hydrochloric acid was added to the reaction solution to quench the reaction. After an aqueous phase was removed, an organic phase was washed with water, dried with magnesium sulfate and distilled away under reduced pressure. The obtained residue was refined by silica-gel column chromatography, so that 6-bromodibenzofuran-4-carboxyaldehyde (65 g) was obtained.

(3-3-4) Synthesis of 6-cyano-4-bromodibenzothiophene

Under an argon atmosphere, 6-bromodibenzofuran-4-carboxyaldehyde (65 g), hydroxylamine hydrochloride (20.2 g) and NMP (N-methylpyrrolidone) (850 mL) were prepared and heated at 150 degrees for 27 hours with stirring. The reaction solution was cooled to the room temperature and added with ice water to precipitate crystals. The precipitated crystals were filtrated. The obtained solid was refined by silica-gel column chromatography, so that 6-cyano-4-bromodibenzothiophene (34 g) was obtained.

(3-3-5) Synthesis of 2-(3-bromophenyl)triphenylene

Under an argon atmosphere, triphenylene-2-boronic acid (32.6 g), 3-bromoiodobenzene (28.1 g), tetrakistriphenylphosphinepalladium(0) (2.31 g), toluene (200 mL), DME (dimethylether) (200 mL) and an aqueous solution of 2M sodium carbonate (200 mL) were put in a flask and heated to reflux for 24 hours. After the reaction solution was cooled down to the room temperature, the reaction solution was extracted with toluene. After an aqueous phase was removed, an organic layer was washed with saturated saline. After the organic phase was drided with magnesium sulfate and concentrated, the obtained residue was refined by silica-gel column chromatography, so that 2-(3-bromophenyl) triphenylene (27.5 g) was obtained.

(3-3-6) Synthesis of 3-(2-triphenylenyl)phenylboronic acid

Under an argon atmosphere, 2-(3-bromophenyl)triphenylene (19.1 g) and tetrahydrofuran (dehydrated) (500 mL) were added to a flask and cooled to −78 degrees C. n-BuLi (1.60M in hexane) (34 mL) was added to the flask. The reaction solution was stirred for two hours while the temperature of the reaction solution being raised to 0 degree C. Next, the reaction solution was again cooled down to −78 degrees C., added with $B(OMe)_3$ (28.2 g) and stirred for 10 minutes at −78 degrees C. Subsequently, the reaction solution was stirred for five hours while the temperature of the reaction solution being gradually raised to the room temperature.

After the reaction was finished, the reaction solution was added with an aqueous solution of 1N HCl (200 mL) and stirred for one hour at the room temperature. Subsequently, the reaction solution was transferred into a separating funnel and extracted with ethyl acetate.

After the solution was drided with magnesium sulfate, concentrated and washed with hexane, 3-(2-triphenylenyl) phenylboronic acid (10.4 g) was obtained.

(3-3-7) Synthesis of PG-4

Under an argon atmosphere, 6-cyano-4-bromodibenzothiophene (2.88 g), 3-(2-triphenylenyl)phenylboronic acid (3.83 g), tetrakis(triphenylphosphine)palladium(0) (0.231 g), 1,2-dimethoxyethane (20 mL), toluene (20 mL) and an aqueous solution of 2M sodium carbonate (20 mL) were prepared and refluxed for eight hours. After the reaction solution was cooled down to the room temperature, a precipitated solid was filtrated. After washed with water and methanol, the obtained solid was again recrystallized in toluene to provide the compound PG-1 (4.10 g). As a result of mass spectrum (FD-MS) analysis, the obtained compound was the target compound PG-4 at m/e=511 to 511.14 of a molecular weight.

Synthesis Example 3-4

Synthesis of Compound PG-5

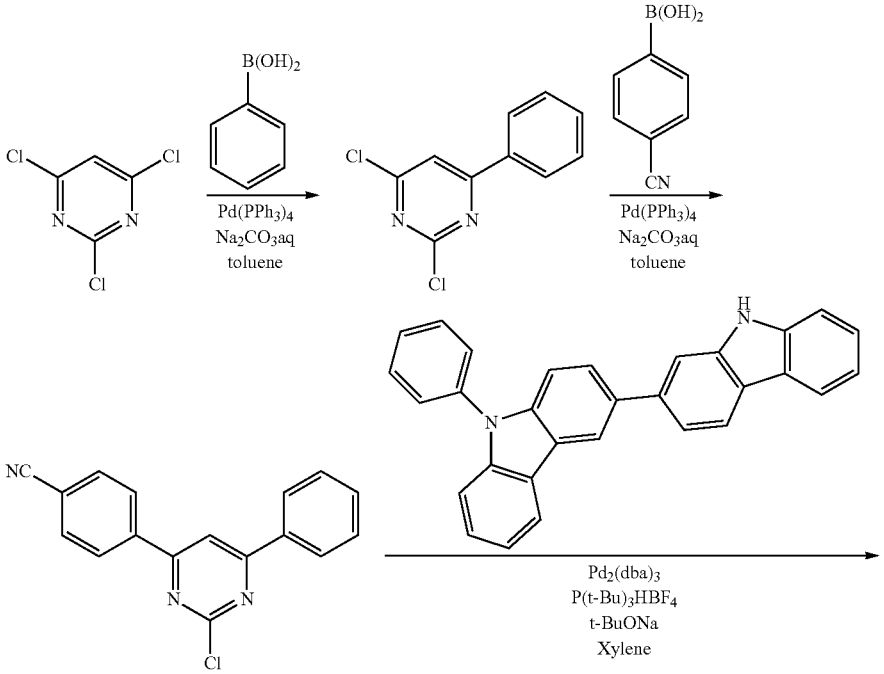

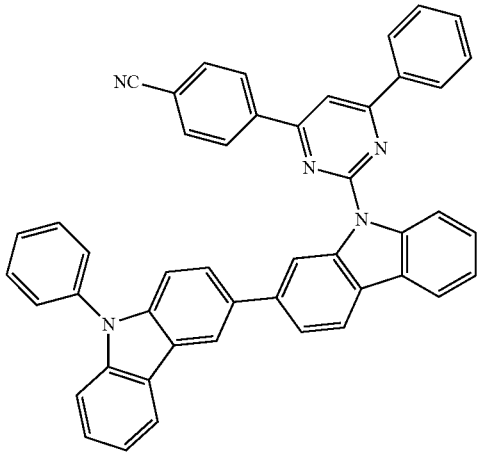

PG-5

(3-4-1) Synthesis of 2-chloro-4-(4-cyanophenyl)-6-phenylpyrimidine 2-chloro-4-(3-cyanophenyl)-6-phenylpyrimidine was synthesized by the same method as in syntheses of 2,4-dichloro-6-phenylpyrimidine in the above (4-1-1), except that 2,4-dichloro-6-phenylpyrimidine was used in place of 2,4,6-trichloropyrimidine and that 3-cyanophenylboronic acid was used in place of phenylboronic acid.

(3-4-2) Synthesis of PG-5

The compound PG-5 was synthesized by the same method as the compound PG-1 in the above (3-1-3) except that 2-(9-phenylcarbazol-3-yl)carbazole synthesized by a known method was used in place of 3-(9-phenylcarbazole-3-yl) carbazole and 2-chloro-4-(4-cyanophenyl)-6-phenylpyrimidine was used in place of 2-chloro-4-(3-cyanophenyl)-6-phenylpyrimidine. As a result of mass spectrum (FD-MS) analysis, the obtained compound was the target compound PG-5 at m/e=663 to 663.24 of a molecular weight.

Synthesis Example 3-5

Synthesis of Compound PG-6

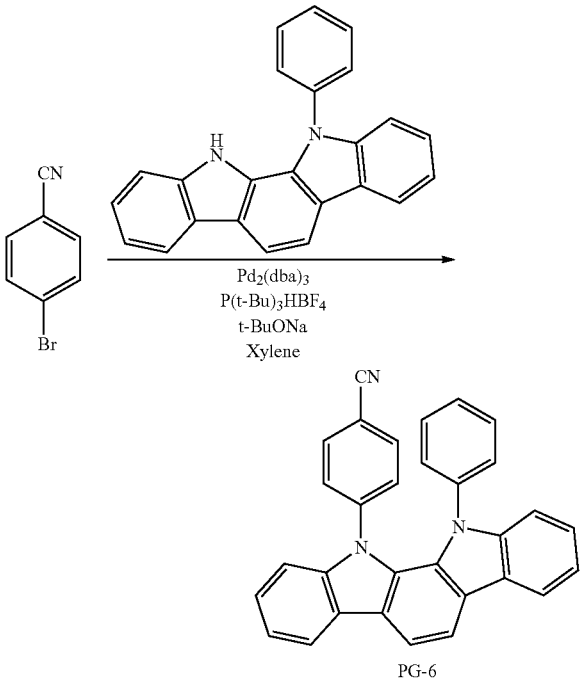

The compound PG-6 was synthesized by the same method as the compound PG-1 in the above (3-1-3) except that 11-phenyl-11H,12H-indolo[2,3-a]carbazole synthesized by a known method was used in place of 3-(9-phenylcarbazole-3-yl)carbazole and 4-bromobenzonitrile was used in place of 2-chloro-4-(3-cyanophenyl)-6-phenylpyrimidine. As a result of mass spectrum (FD-MS) analysis, the obtained compound was the target compound PG-6 at m/e=433 to 433.16 of a molecular weight.

Manufacture of Organic EL Device in Example 4

A glass substrate (size: 25 mm×75 mm×1.1 mm thick) having an ITO transparent electrode (manufactured by GEOMATEC Co., Ltd.) was ultrasonic-cleaned in isopropyl alcohol for five minutes, and then UV/ozone-cleaned for 30 minutes. A film thickness of ITO transparent electrode was 70 nm.

After the glass substrate having the transparent electrode line was cleaned, the glass substrate was mounted on a substrate holder of a vacuum deposition apparatus. The compound C-1 was evaporated to form a 5-nm thick film of the compound C-1 on a surface of the glass substrate where the transparent electrode line was provided so as to cover the transparent electrode.

On the film of the compound C-1, the compound HT was evaporated to form a 40-nm thick film of the compound HT. The film of the compound HT serves as the hole transporting layer.

Further, on the film of the compound HT, the compound PG-1 (first host material), the compound PG-2 (second host material) and the compound $Ir(ppy)_3$ (phosphorescent dopant material) were co-evaporated to form a 35-nm thick emitting layer. In the emitting layer, concentrations of the compound $Ir(ppy)_3$, the compound PG-1 and the compound PG-2 were respectively 10.0 mass %, 45.0 mass % and 45.0 mass %. This co-evaporated film serves as the emitting layer.

Following the film formation of the emitting layer, the compound ET2 was evaporated to form a 30-nm thick film of the compound ET2. The film of the compound ET2 serves as the electron transporting layer.

Next, a 1-nm thick film of LiF was formed as an electron-injecting electrode (cathode) at a film-forming speed of 0.1 Å/min. A metal Al was evaporated on the LiF film to form an 80-nm thick metal cathode.

Thus, an organic EL device of Example 4 was manufactured.

Manufacture of Organic EL Device in Example 5

An organic EL device in Example 5 was manufactured in the same manner as the organic EL device in Example 4 except that the film thickness of the ITO transparent electrode was changed to 100 nm, the thickness of the co-evaporated film of the emitting layer was changed to 25 nm, the compound PG-3 was used as the first host material contained in the emitting layer, the compound PG-4 was used as the second host material, $Ir(bzq)_3$ was used as the phosphorescent dopant material, the concentrations of the compounds $Ir(bzq)_3$, PG-3 and PG-4 in the emitting layer were set at 5.0 mass %, 47.5 mass % and 47.5 mass %, and the film thickness of the compound ET2 as the electron transporting layer was changed to 35 nm.

Manufacture of Organic EL Device in Example 6

An organic EL device in Example 6 was manufactured in the same manner as the organic EL device in Example 4 except that the film thickness of the ITO transparent electrode was changed to 130 nm, the thickness of the co-evaporated film of the emitting layer was changed to 40 nm, the compound PG-5 was used as the first host material contained in the emitting layer, the compound PG-6 was used as the second host material, $PQIr(acac)_2$ was used as the phosphorescent dopant material, the concentrations of the compounds $PQIr(acac)_2$, PG-5 and PG-6 in the emitting layer were set at 3.0 mass %, 87.0 mass % and 10.0 mass %, and the film thickness of the compound ET2 as the electron transporting layer was changed to 40 nm.

Evaluation of Organic EL Devices in Examples 4 to 6

The prepared organic EL devices were evaluated in terms of a drive voltage, an external quantum efficiency EQE and a lifetime LT80. The results are shown in Table 3.

Drive Voltage

Electrical current was applied between ITO and Al such that a current density was 10 mA/cm$^2$, where voltage (unit: V) was measured.

External Quantum Efficiency EQE

Voltage was applied on each of the organic EL devices at the room temperature such that a current density was 10 mA/cm$^2$, where EL emission spectrum was measured by a spectroradiometer (CS-1000 manufactured by Konica Minolta Holdings, Inc.). The external quantum efficiency EQE (unit: %) was calculated based on the obtained spectral-radiance spectra, assuming that the spectra was provided under a Lambertian radiation.

Lifetime LT80

A 80%-lifetime at a current density of 50 mA/cm$^2$ was obtained. The 80%-lifetime means an elapsed time until a luminance intensity is reduced to 80% of an initial luminance intensity when each of the organic devices is driven at a constant current. The 80%-lifetime is occasionally referred to as LT80.

TABLE 3

| | Host material of Emitting layer | Votage (V) 10(mA/cm$^2$) | EQE (%) 10(mA/cm$^2$) | LT80 (hrs) 50(mA/cm$^2$) |
|---|---|---|---|---|
| Example 4 | PG-1:PG-2 | 3.5 | 18.3 | 380 |
| Example 5 | PG-3:PG-4 | 3.8 | 16.5 | 820 |
| Example 6 | PG-5:PG-6 | 4.2 | 17.2 | 1,320 |

Lifetimes of the organic el devices in Examples 4 to 6 were also prolonged.

What is claimed is:

1. An organic electroluminescence device comprising:

an anode;

a cathode opposed to the anode; and an emitting layer provided between the anode and the cathode, wherein the emitting layer comprises a first host material, a second host material and a luminescent material, the first host material [comprises a partial structure represented by at least one of the following formulae (1) and (2)] *is represented by formula (4),*

*(4)*

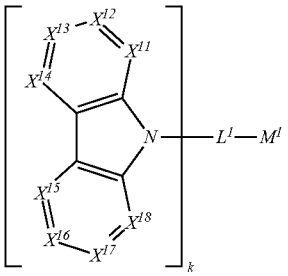

*wherein:*

$M^1$ *represents a group represented by one of formulae (1) and (2),*

$L^1$ *represents a single bond, a substituted or unsubstituted polyvalent aromatic hydrocarbon group having 6 to 30 ring carbon atoms, a substituted or unsubstituted polyvalent aromatic heterocyclic group having 5 to 30 ring atoms, a cycloalkylene group having 5 to 30 ring carbon atoms, or a group provided by linking the polyvalent aromatic hydrocarbon group, the polyvalent aromatic heterocyclic group and the cycloalkylene group,*

*k is 1 or 2,*

$X^{11}$ *to* $X^{18}$ *each independently represent a nitrogen atom or* $CR^b$, $R^b$ *each independently represents a hydrogen atom, a halogen atom, a cyano group, a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted alkoxy group having 1 to 30 carbon atoms, a substituted or unsubstituted aralkyl group having 6 to 30 ring carbon atoms, or a substituted or unsubstituted aryloxy group having 6 to 30 ring carbon atoms, and*

*a part of one of adjacent two* $R^b$ *in* $X^{11}$ *to* $X^{18}$ *is optionally bonded to a part of the other* $R^b$ *to form a cyclic structure*, and the second host material [comprises a partial structure represented by the following formula (3)] *is represented by formula (3-1)* and does not comprise a partial structure represented by [the] formula (1) or [the] formula (2), $$Ar^3—Ar^1—(CN)_r \quad (3\text{-}1)$$

$$\text{-Az-}(W_{CN})_p \quad (1)$$

$$\text{-Az-}(CN)_q \quad (2)$$

$$[—Ar^1—(CN)_r \quad (3)]$$

where: in the formula (1),

Az represents a substituted or unsubstituted aromatic heterocyclic group comprising a nitrogen-containing six-membered ring, $W_{CN}$ is an aromatic hydrocarbon group substituted by at least one cyano group (CN) or an aromatic heterocyclic group substituted by at least one cyano group (CN), p is an integer of 1 or more, and $W_{CN}$ optionally comprises a substituent other than the cyano group and, when a plurality of $W_{CN}$ are present, the plurality of $W_{CN}$ are mutually the same or different;

In the formula (2),

Az represents the same as Az of the formula (1), and q is an integer of 1 or more; [and]

$Ar^3$ *in the formula (3-1) represents a substituted or unsubstituted aromatic hydrocarbon group having 6 to 30 ring carbon atoms, or a substituted or unsubstituted aromatic heterocyclic group having 5 to 30 ring atoms; and* in the formula [(3)] *(3-1)*, $Ar^1$ is a substituted or unsubstituted aromatic hydrocarbon group or a substituted or unsubstituted aromatic heterocyclic group, but is not an aromatic heterocyclic group comprising a nitrogen-containing six-membered ring, and r is an integer of 1 or more.

[2. The organic electroluminescence device according to claim 1, wherein the first host material is represented by at least one of the formulae (1-1) and (2-1), and the second host material is represented by the following formula (3-1), $$Ar^2\text{-Az-}(W_{CN})_p \quad (1\text{-}1)$$

$$Ar^2\text{-Az-}(CN)_q \quad (2\text{-}1)$$

$$Ar^3—Ar^1—(CN)_r \quad (3\text{-}1)$$

where:

$Ar^2$ and $Ar^3$ each independently represent a substituted or unsubstituted aromatic hydrocarbon group having 6 to 30 ring carbon atoms, or a substituted or unsubstituted aromatic heterocyclic group having 5 to 30 ring atoms, Az, $W_{CN}$ and p in the formula (1-1) are the same as Az, $W_{CN}$ and p in the formula (1), Az and q in the formula (2-1) are the same as Az and q in the formula (2), and $Ar^1$ and r in the formula (3-1) are the same as $Ar^1$ and r in the formula (3).]

[3. The organic electroluminescence device according to claim 1, wherein the first host material is represented by the following formula (4), (4)

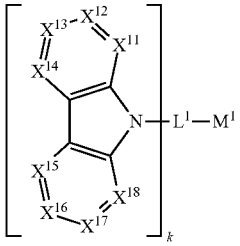

where:

$M^1$ represents a group represented by one of the formulae (1) and (2), $L^1$ represents a single bond, a substituted or unsubstituted polyvalent aromatic hydrocarbon group having 6 to 30 ring carbon atoms, a substituted or unsubstituted polyvalent aromatic heterocyclic group having 5 to 30 ring atoms, a cycloalkylene group having 5 to 30 ring carbon atoms, or a group provided by linking the polyvalent aromatic hydrocarbon group, the polyvalent aromatic heterocyclic group and the cycloalkylene group, k is 1 or 2, $X^{11}$ to $X^{18}$ each independently represent a nitrogen atom or $CR^b$, $R^b$ each independently represents a hydrogen atom, a halogen atom, a cyano group, a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted alkoxy group having 1 to 30 carbon atoms, a substituted or unsubstituted aralkyl group having 6 to 30 ring carbon atoms, and a substituted or unsubstituted aryloxy group having 6 to 30 ring carbon atoms, and a part of one of adjacent two $R^b$ in $X^{11}$ to $X^{18}$ is optionally bonded to a part of the other $R^b$ to form a cyclic structure.]

4. The organic electroluminescence device according to claim 1, wherein the second host material is represented by [the following] formula (5), (5)

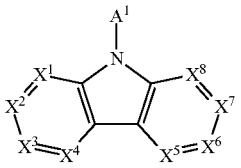

where: $A^1$ represents a group represented by the formula (3), $$-Ar^1-(CN)_r \quad (3)$$

*$Ar^1$ and r in the formula (3) are the same as $Ar^1$ and r in the formula (3-1),*

$X^1$ to $X^8$ each independently represent N (nitrogen atom) or $CR^a$, $R^a$ each independently represents a hydrogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted silyl group, a halogen atom, or a cyano group, when a plurality of $R^a$ are present, the plurality of $R^a$ are the same or different, and when at least adjacent two of $X^1$ to $X^4$ and $X^5$ to $X^8$ are $CR^a$, a part of $R^a$ in the adjacent $CR^a$ is optionally bonded to a part of the other $R^a$ to form a cyclic structure.

5. The organic electroluminescence device according to claim [3] *1*, wherein the first host material is represented by at least one of the following formulae (4-3) and (4-4), (4-3)

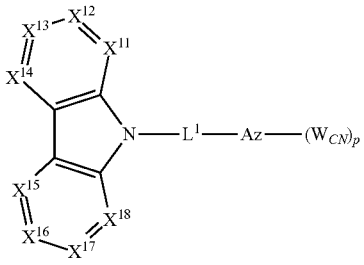

(4-4)

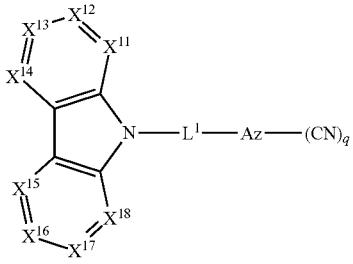

where: $L^1$ and $X^{11}$ to $X^{18}$ are the same as $L^1$ and $X^{11}$ to $X^{18}$ in the formula (4), Az, $W_{CN}$ and p in the formula (4-3) are the same as Az, $W_{CN}$ and p in the formula (1), and Az and q in the formula (4-4) are the same as Az and q in the formula (1).

6. The organic electroluminescence device according to claim 4, wherein the first host material is represented by at least one of the following formulae (4-3) and (4-4), (4-3)

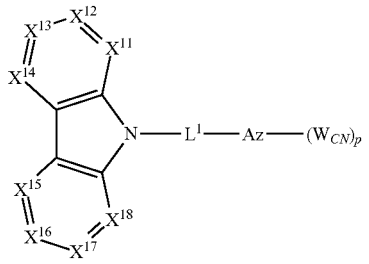

(4-4)

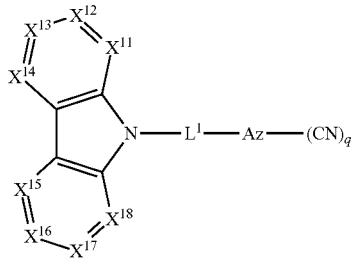

where: $L^1$ represents a single bond, a substituted or unsubstituted polyvalent aromatic hydrocarbon group having 6 to 30 ring carbon atoms, a substituted or unsubstituted polyvalent aromatic heterocyclic group having 5 to 30 ring atoms, a cycloalkylene group having 5 to 30 ring carbon atoms, or a group provided by linking the polyvalent aromatic hydrocarbon group, the polyvalent aromatic heterocyclic group and the cycloalkylene group, $X^{11}$ to $X^{18}$ each independently represent a nitrogen atom or $CR^b$, $R^b$ each independently represents a hydrogen atom, a halogen atom, a cyano group, a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted alkoxy group having 1 to 30 carbon atoms, a substituted or unsubstituted aralkyl group having 6 to 30 ring carbon atoms, [and] *or* a substituted or unsubstituted aryloxy group having 6 to 30 ring carbon atoms, and a part of one of adjacent two $R^b$ in $X^{11}$ to $X^{18}$ is optionally bonded to a part of the other $R^b$ to form a cyclic structure, Az, $W_{CN}$ and p in the formula (4-3) are the same as Az, $W_{CN}$ and p in the formula (1), and Az and q in the formula (4-4) are the same as Az and q in the formula (1).

7. The organic electroluminescence device according to claim 1, wherein the second host material is represented by [the following] formula (5-1), (5-1)

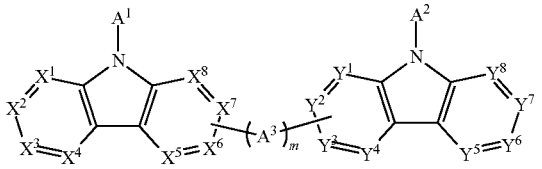

where: $A^1$ represents the group [having the partial structure] represented by the formula (3), $$-Ar^1-(CN)_r \quad (3)$$

*$Ar^1$ and r in the formula (3) are the same as $Ar^1$ and r in the formula (3-1),*

$A^2$ each independently represents the group [having the partial structure] represented by the formula (3), a substituted or unsubstituted aromatic hydrocarbon group having 6 to 30 ring carbon atoms, or a substituted or unsubstituted aromatic heterocyclic group having 5 to 30 ring atoms, $A^3$ represents a substituted or unsubstituted divalent aromatic hydrocarbon group having 6 to 30 ring carbon atoms, a substituted or unsubstituted divalent aromatic heterocyclic group having 5 to 30 ring atoms, a substituted or unsubstituted cycloalkylene group having 5 to 30 ring carbon atoms, or a group provided by linking the divalent aromatic hydrocarbon group, the divalent aromatic heterocyclic group and the cycloalkylene group, m is an integer of 0 to 3, $X^1$ to $X^4$ and $Y^5$ to $Y^8$ each independently represent N (nitrogen atom) or $CR^a$, $X^5$ to $X^8$ and $Y^1$ to $Y^4$ each independently represent N (nitrogen atom), $CR^a$ or a carbon atom to be bonded to $A^3$, $R^a$ in $X^1$ to $X^8$ and $Y^1$ to $Y^8$ each independently represents a hydrogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted silyl group, a halogen atom, or a cyano group, when a plurality of $R^a$ are present, the plurality of $R^a$ are the same or different, and when at least adjacent two of $X^1$ to $X^8$ and $Y^1$ to $Y^8$ are $CR^a$, a part of $R^a$ in the adjacent $CR^a$ is optionally bonded to a part of the other $R^a$ to form a cyclic structure.

[8. The organic electroluminescence device according to claim 3, wherein the second host material is represented by the following formula (5-1), (5-1)

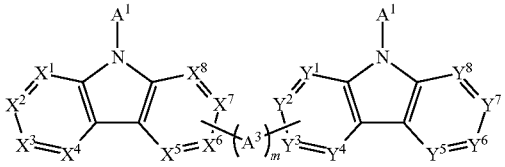

where:

$A^1$ represents the group having the partial structure represented by the formula (3), $A^2$ each independently represents the group having the partial structure represented by the formula (3), a substituted or unsubstituted aromatic hydrocarbon group having 6 to 30 ring carbon atoms, or a substituted or unsubstituted aromatic heterocyclic group having 5 to 30 ring atoms, $A^3$ represents a substituted or unsubstituted divalent aromatic hydrocarbon group having 6 to 30 ring carbon atoms, a substituted or unsubstituted divalent aromatic heterocyclic group having 5 to 30 ring atoms, a substituted or unsubstituted cycloalkylene group having 5 to 30 ring carbon atoms, or a group provided by linking the divalent aromatic hydrocarbon group, the divalent aromatic heterocyclic group and the cycloalkylene group, m is an integer of 0 to 3, $X^1$ to $X^4$ and $Y^5$ to $Y^8$ each independently represent N (nitrogen atom) or $CR^a$, $X^5$ to $X^8$ and $Y^1$ to $Y^4$ each independently represent N (nitrogen atom), $CR^a$ or a carbon atom to be bonded to $A^3$, $R^a$ in $X^1$ to $X^8$ and $Y^1$ to $Y^8$ each independently represents a hydrogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted silyl group, a halogen atom, or a cyano group, when a plurality of $R^a$ are present, the plurality of $R^a$ are the same or different, and when at least adjacent two of $X^1$ to $X^8$ and $Y^1$ to $Y^8$ are $CR^a$, a part of $R^a$ in the adjacent $CR^a$ is optionally bonded to a part of the other $R^a$ to form a cyclic structure.]

9. The organic electroluminescence device according to claim 5, wherein the second host material is represented by [the following] formula (5-1), (5-1)

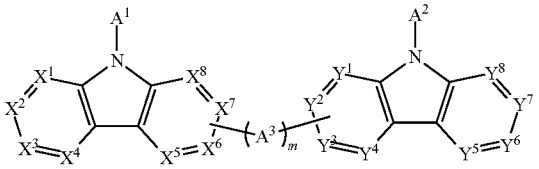

where: $A^1$ represents the group [having the partial structure] represented by the formula (3), $$-Ar^1-(CN)_r \quad (3)$$

*$Ar^1$ and r in the formula (3) are the same as $Ar^1$ and r in the formula (3-1),*

$A^2$ each independently represents the group [having the partial structure] represented by the formula (3), a substituted or unsubstituted aromatic hydrocarbon group having 6 to 30 ring carbon atoms, or a substituted or unsubstituted aromatic heterocyclic group having 5 to 30 ring atoms, $A^3$ represents a substituted or unsubstituted divalent aromatic hydrocarbon group having 6 to 30 ring carbon atoms, a substituted or unsubstituted divalent aromatic heterocyclic group having 5 to 30 ring atoms, a substituted or unsubstituted cycloalkylene group having 5 to 30 ring carbon atoms, or a group provided by linking the divalent aromatic hydrocarbon group, the divalent aromatic heterocyclic group and the cycloalkylene group, m is an integer of 0 to 3, $X^1$ to $X^4$ and $Y^5$ to $Y^8$ each independently represent N (nitrogen atom) or $CR^a$, $X^5$ to $X^8$ and $Y^1$ to $Y^4$ each independently represent N (nitrogen atom), $CR^a$ or a carbon atom to be bonded to $A^3$, $R^a$ in $X^1$ to $X^8$ and $Y^1$ to $Y^8$ each independently represents a hydrogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted silyl group, a halogen atom, or a cyano group, when a plurality of $R^a$ are present, the plurality of $R^a$ are the same or different, and when at least adjacent two of $X^1$ to $X^8$ and $Y^1$ to $Y^8$ are $CR^a$, a part of $R^a$ in the adjacent $CR^a$ is optionally bonded to a part of the other $R^a$ to form a cyclic structure.

10. The organic electroluminescence device according to claim [3] *1*, wherein the first host material is represented by the following formula (4-5), (4-5)

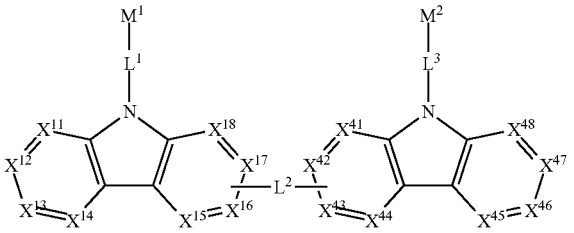

where: $L^1$ represents the same as $L^1$ in the formula (4), $X^{11}$ to $X^{14}$ and $X^{45}$ to $X^{48}$ each independently represent a nitrogen atom or $CR^b$, $X^{15}$ to $X^{18}$ and $X^{41}$ to $X^{44}$ each independently represent a nitrogen atom, $CR^b$ or a carbon atom to be bonded to $L^2$, $R^b$ of $CR^b$ in $X^{11}$ to $X^{18}$ and $X^{41}$ to $X^{48}$ is the same as $R^b$ of $CR^b$ in $X^{11}$ to $X^{18}$ in the formula (4), $L^2$ and $L^3$ each independently represent a single bond, a substituted or unsubstituted divalent aromatic hydrocarbon group having 6 to 30 ring carbon atoms, a substituted or unsubstituted divalent aromatic heterocyclic group having 5 to 30 ring atoms, a cycloalkylene group having 5 to 30 ring carbon atoms, or a group provided by linking the divalent aromatic hydrocarbon group, the divalent aromatic heterocyclic group and the cycloalkylene group, a part of one of at least adjacent two $R^b$ in $X^{11}$ to $X^{18}$ and $X^{41}$ to $X^{48}$ is optionally bonded to a part of the other $R^b$ to form a cyclic structure, $M^1$ represents a group represented by one of the formulae (1) and (2), $M^2$ represents a substituted or unsubstituted aromatic hydrocarbon group having 6 to 30 ring carbon atoms, a substituted or unsubstituted aromatic heterocyclic group having 5 to 30 ring atoms, or a group represented by one of the formulae (1) and (2), and $M^1$ and $M^2$ are the same or different.

11. The organic electroluminescence device according to claim 7, wherein the first host material is represented by the following formula (4-5), (4-5)

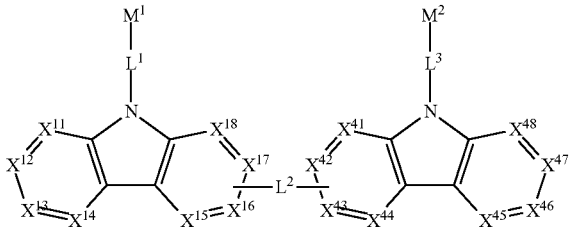

where: $L^1$ represents a single bond, a substituted or unsubstituted polyvalent aromatic hydrocarbon group having 6 to 30 ring carbon atoms, a substituted or unsubstituted polyvalent aromatic heterocyclic group having 5 to 30 ring atoms, a cycloalkylene group having 5 to 30 ring carbon atoms, or a group provided by linking the polyvalent aromatic hydrocarbon group, the polyvalent aromatic heterocyclic group and the cycloalkylene group, $X^{11}$ to $X^{14}$ and $X^{45}$ to $X^{48}$ each independently represent a nitrogen atom or $CR^b$, $X^{15}$ to $X^{18}$ and $X^{41}$ to $X^{44}$ each independently represent a nitrogen atom, $CR^b$ or a carbon atom to be bonded to $L^2$, $R^b$ of $CR^b$ in $X^{11}$ to $X^{18}$ and $X^{41}$ to $X^{48}$ each independently represents a hydrogen atom, a halogen atom, a cyano group, a substituted or unsubstituted aromatic hydrocarbon group having 6 to 30 ring carbon atoms, a substituted or unsubstituted heterocyclic group having 5 to 30 ring atoms, a substituted or unsubstituted alkyl group having 1 to 30 carbon atoms, a substituted or unsubstituted alkenyl group having 2 to 30 carbon atoms, a substituted or unsubstituted alkynyl group having 2 to 30 carbon atoms, a substituted or unsubstituted alkylsilyl group having 3 to 30 carbon atoms, a substituted or unsubstituted arylsilyl group having 6 to 30 ring carbon atoms, a substituted or unsubstituted alkoxy group having 1 to 30 carbon atoms, a substituted or unsubstituted aralkyl group having 6 to 30 ring carbon atoms, [and] *or* a substituted or unsubstituted aryloxy group having 6 to 30 ring carbon atoms, $L^2$ and $L^3$ each independently represent a single bond, a substituted or unsubstituted divalent aromatic hydrocarbon group having 6 to 30 ring carbon atoms, a substituted or unsubstituted divalent aromatic heterocyclic group having 5 to 30 ring atoms, a cycloalkylene group having 5 to 30 ring carbon atoms, or a group provided by linking the divalent aromatic hydrocarbon group, the divalent aromatic heterocyclic group and the cycloalkylene group, a part of one of at least adjacent two $R^b$ in $X^{11}$ to $X^{18}$ and $X^{41}$ to $X^{48}$ is optionally bonded to a part of the other $R^b$ to form a cyclic structure, $M^1$ represents a group represented by one of the formulae (1) and (2), $M^2$ represents a substituted or unsubstituted aromatic hydrocarbon group having 6 to 30 ring carbon atoms, a substituted or unsubstituted aromatic heterocyclic group having 5 to 30 ring atoms, or a group represented by one of the formulae (1) and (2), and $M^1$ and $M^2$ are the same or different.

12. The organic electroluminescence device according to claim 1, wherein Az is a divalent to pentavalent group of a ring represented by the following formula (4-6), (4-6)

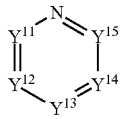

where: $Y^{11}$ to $Y^{15}$ each independently represent a nitrogen atom (N) or $CR^c$, $R^c$ of $CR^c$ each independently represents a hydrogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted silyl group, or a halogen atom, when adjacent two of $Y^{11}$ to $Y^{15}$ are $CR^c$, a part of $R^c$ of the adjacent $CR^c$ is optionally bonded to a part of the other $R^c$ to form a cyclic structure, *and* when a plurality of $R^c$ are present, the plurality of $R^c$ are mutually the same or different.

[13. The organic electroluminescence device according to claim 3, wherein Az is a divalent to pentavalent group of a ring represented by the following formula (4-6), (4-6)

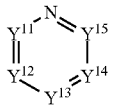

where:

$Y^{11}$ to $Y^{15}$ each independently represent a nitrogen atom (N) or $CR^c$, $R^c$ of $CR^c$ each independently represents a hydrogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted silyl group, or a halogen atom, when adjacent two of $Y^{11}$ to $Y^{15}$ are $CR^c$, a part of $R^c$ of the adjacent $CR^c$ is optionally bonded to a part of the other $R^c$ to form a cyclic structure, and when a plurality of $R^c$ are present, the plurality of $R^c$ are mutually the same or different.]

14. The organic electroluminescence device according to claim 5, wherein Az *is* a divalent to pentavalent group of a ring represented by the following formula (4-6), (4-6)

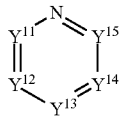

where: $Y^{11}$ to $Y^{15}$ each independently represent a nitrogen atom (N) or $CR^c$, $R^c$ of $CR^c$ each independently represents a hydrogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted silyl group, or a halogen atom, when adjacent two of $Y^{11}$ to $Y^{15}$ are $CR^c$, a part of $R^c$ of the adjacent $CR^c$ is optionally bonded to a part of the other $R^c$ to form a cyclic structure, and when a plurality of $R^c$ are present, the plurality of $R^c$ are mutually the same or different.

15. The organic electroluminescence device according to claim 10, wherein Az *is* a divalent to pentavalent group of a ring represented by the following formula (4-6), (4-6)

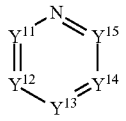

where: $Y^{11}$ to $Y^{15}$ each independently represent a nitrogen atom (N) or $CR^c$, $R^c$ of $CR^c$ each independently represents a hydrogen atom, a substituted or unsubstituted aromatic hydrocarbon group having 6 to 30 ring carbon atoms, a substituted or unsubstituted aromatic heterocyclic group having 5 to 30 ring atoms, a substituted or unsubstituted alkyl group having 1 to 30 carbon atoms, a substituted or unsubstituted silyl group, or a halogen atom, when adjacent two of $Y^{11}$ to $Y^{15}$ are $CR^c$, a part of $R^c$ of the adjacent $CR^c$ is optionally bonded to a part of the other $R^c$ to form a cyclic structure, and when a plurality of $R^c$ are present, the plurality of $R^c$ are mutually the same or different.

16. The organic electroluminescence device according to claim 10, wherein the first host material represented by the formula (4-5) is represented by one of the following formulae (4-5-1), (4-5-2) and (4-5-3), (4-5-1)

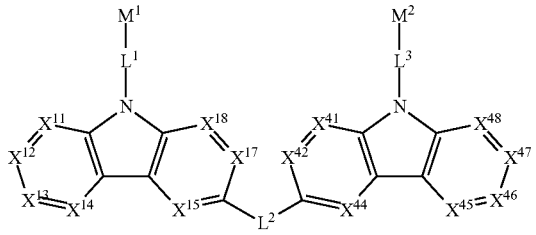

-continued (4-5-2)

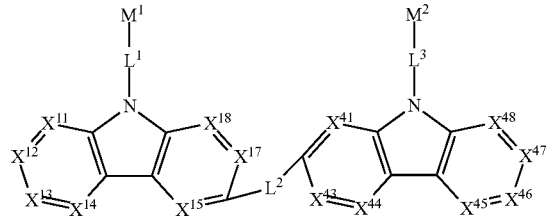

(4-5-3)

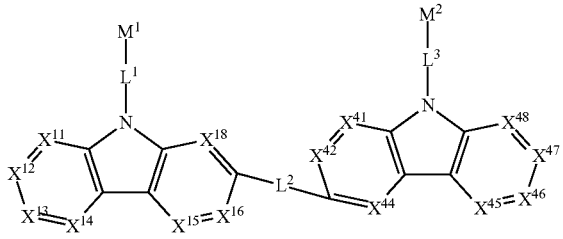

where: $M^1$, $M^2$, $L^1$, $L^2$, $L^3$, $X^{11}$ to $X^{18}$, and $X^{41}$ to $X^{48}$ represent the same as $M^1$, $M^2$, $L^1$, $L^2$, $L^3$, $X^{11}$ to $X^{18}$, and $X^{41}$ to $X^{48}$ in the formula (4-5).

17. The organic electroluminescence device according to claim 7, wherein the second host material represented by the formula (5-1) is [preferably] represented by one of the following formulae (5-1-1), (5-1-2) and (5-1-3), (5-1-1)

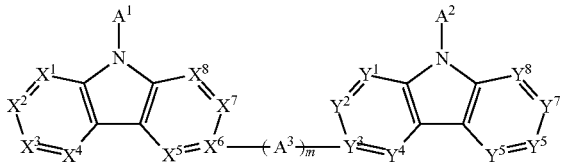

(5-1-2)

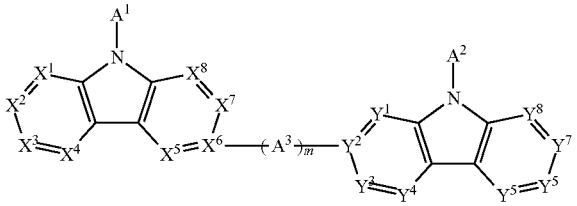

(5-1-3)

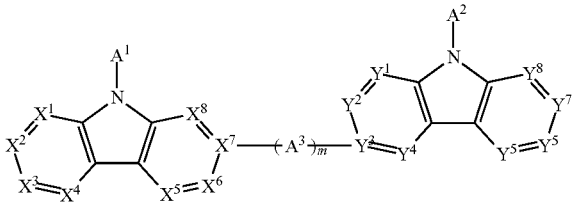

where: in the formula (5-1-1), $A^1$, $A^2$, $A^3$, $X^1$ to $X^5$, $X^7$, $X^8$, $Y^1$, $Y^2$, $Y^4$ to $Y^8$ and m represent the same as $A^1$, $A^2$, $A^3$, $X^1$ to $X^5$, $X^7$, $X^8$, $Y^1$, $Y^2$, $Y^4$ to $Y^8$ and m in the formula (5-1), and $X^6$ and $Y^3$ are carbon atoms, in the formula (5-1-2), $A^1, A^2, A^3, X^1$ to $X^5, X^7, X^8, Y^1, Y^3$ to $Y^8$ and m represent the same as $A^1, A^2, A^3, X^1$ to $X^5, X^7, X^8, Y^1, Y^3$ to $Y^8$ and m in the formula (5-1), and $X^6$ and $Y^2$ are carbon atoms, and in the formula (5-1-3), $A^1, A^2, A^3, X^1$ to $X^6, X^8, Y^1, Y^2, Y^4$ to $Y^8$ and m represent the same as $A^1, A^2, A^3, X^1$ to $X^6, X^8, Y^1, Y^2, Y^4$ to $Y^8$ and m in the formula (5-1), and $X^7$ and $Y^3$ are carbon atoms.

18. The organic electroluminescence device according to claim 1, wherein at least one [of the partial structures represented by the formula (3)] *partial structure —$Ar^1$—$(CN)_r$ within the formula (3-1)* of the second host material is a cyano-substituted phenyl group, a cyano-substituted naphthyl group, a cyano-substituted phenanthryl group, a cyano-substituted dibenzofuranyl group, a cyano-substituted biphenylyl group, a cyano-substituted terphenylyl group, or a cyano-substituted triphenylenyl group.

19. The organic electroluminescence device according to claim 1, wherein the luminescent material comprises a phosphorescent material that is an ortho-metalated complex of a metal atom selected from iridium (Ir), osmium (Os) and platinum (Pt).

20. The organic electroluminescence device according to claim 19, wherein a wavelength of an emission peak of the phosphorescent material is 490 nm to 700 nm.

*21. A compound represented by formula (3-2):*

$$A\text{-}L^{10}\text{-}Ar^1(\text{-}CN)_r \qquad (3\text{-}2)$$

*wherein*

*$L^{10}$ represents a divalent group derived from a group selected from the group consisting of a phenyl group, naphthyl group, phenanthryl group, biphenyl group, terphenyl group, quaterphenyl group, fluoranthenyl group, triphenylenyl group, phenanthrenyl group, fluorenyl group, spirofluorenyl group, 9,9-diphenylfluorenyl group, 9,9'-spirobi[9H-fluorene]-2-yl group, 9,9-dimethylfluorenyl group, benzo[c]phenanthrenyl group, benzo[a]triphenylenyl group, naphtho[1,2-c]phenanthrenyl group, naphtho[1,2-a]triphenylenyl group, dibenzo[a,c]triphenylenyl group, benzo[b]fluoranthenyl group, a quinoline ring, isoquinoline ring, quinoxaline ring, phenanthridine ring, phenanthroline ring, pyridine ring, pyrazine ring, pyrimidine ring, pyridazine ring, triazine ring, acridine ring, piperidine ring, morpholine ring, piperazine ring, a pyrrole ring, isoindole ring, benzofuran ring, isobenzofuran ring, dibenzothiophen ring, indole ring, pyrrolidine ring, dioxane ring, carbazole ring, furan ring, thiophen ring, oxazole ring, oxadiazole ring, benzoxazole ring, thiazole ring, thiadiazole ring, benzothiazole ring, triazole ring, imidazole ring, benzimidazole ring, pyrane ring, dibenzofuran ring, and benzo[c]dibenzofuran ring;*

*$Ar^1$ represents a group selected from the group consisting of a phenyl group, naphthyl group, phenanthryl group, biphenyl group, terphenyl group, quaterphenyl group, fluoranthenyl group, triphenylenyl group, phenanthrenyl group, fluorenyl group, spirofluorenyl group, 9,9-diphenylfluorenyl group, 9,9'-spirobi[9H-fluorene]-2-yl group, 9,9-dimethylfluorenyl group, benzo[c]phenanthrenyl group, benzo[a]triphenylenyl group, naphtho[1,2-c]phenanthrenyl group, naphtho[1,2-a]triphenylenyl group, dibenzo[a,c]triphenylenyl group, benzo[b]fluoranthenyl group, a quinoline ring, isoquinoline ring, quinoxaline ring, phenanthridine ring, phenanthroline ring, a pyrrole ring, isoindole ring, benzofuran ring, isobenzofuran ring, dibenzothiophen ring, indole ring, pyrrolidine ring, dioxane ring, carbazole ring, furan ring, thiophen ring, oxazole ring, oxadiazole ring, benzoxazole ring, thiazole ring, thiadiazole ring, benzothiazole ring, triazole ring, imidazole ring, benzimidazole ring, pyrane ring, dibenzofuran ring, and benzo[c]dibenzofuran ring;*

*r is an integer of 1 or more;*

*A is a group represented by formula (10):*

*(10)*

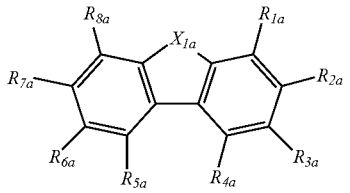

*$R_{1a}$ to $R_{8a}$ each independently represent a hydrogen atom or a substituent;*

*at least one pair of adjacent substituents of $R_{1a}$ to $R_{8a}$ are bonded to each other to form a cyclic structure of formula (11):*

*(11)*

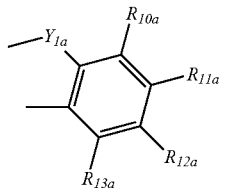

*$R_{10a}$ to $R_{13a}$ each independently represent a hydrogen atom or a substituent;*

*$X_{1a}$ and $Y_{1a}$ each independently represent an oxygen atom, a sulfur atom, —$NR_{21}$—, or —$CR_{22}R_{23}$—;*

*$R_{21}$, $R_{22}$, and $R_{23}$ each independently represent a hydrogen atom or a substituent; and*

*a group selected from the group consisting of $R_{1a}$ to $R_{8a}$, $R_{10a}$ to $R_{13a}$, and $R_{21}$ to $R_{23}$ is bonded to $L^{10}$.*

*22. The compound of claim 21, wherein A is represented by any of formulae (12) to (17):*

*(12)*

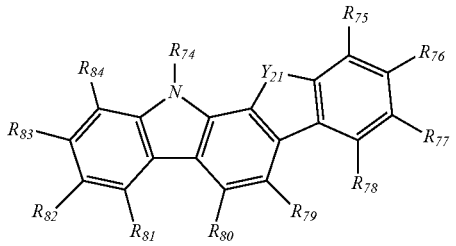

-continued (13)

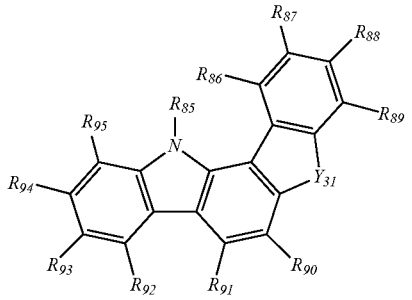

(14)

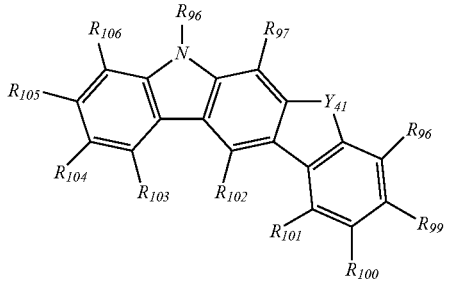

(15)

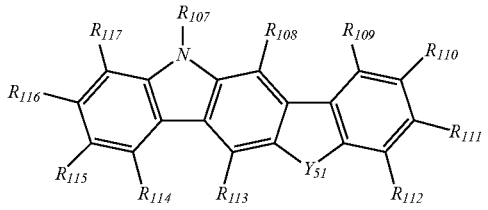

(16)

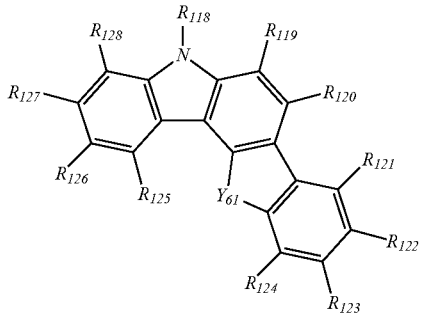

(17)

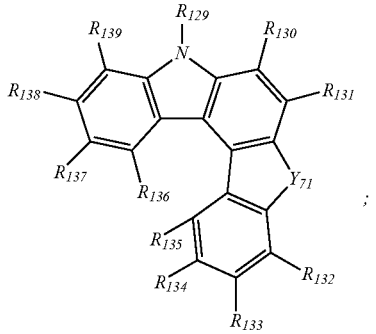

;

$R_{74}$ to $R_{139}$ each independently represent a hydrogen atom or a substituent;

$Y_{21}$, $Y_{31}$, $Y_{41}$, $Y_{51}$, $Y_{61}$, and $Y_{71}$ each independently represent an oxygen atom, a sulfur atom, —$NR_{31}$—, or —$CR_{32}R_{33}$—;

$R_{31}$, $R_{32}$, and $R_{33}$ each independently represent a hydrogen atom or a substituent;

if A is represented by formula (12), then a group selected from the group consisting of $R_{74}$ to $R_{84}$ and $R_{31}$ to $R_{33}$ is bonded to $L^{10}$;

if A is represented by formula (13), then a group selected from the group consisting of $R_{85}$ to $R_{95}$ and $R_{31}$ to $R_{33}$ is bonded to $L^{10}$;

if A is represented by formula (14), then a group selected from the group consisting of $R_{96}$ to $R_{106}$ and $R_{31}$ to $R_{33}$ is bonded to $L^{10}$;

if A is represented by formula (15), then a group selected from the group consisting of $R_{107}$ to $R_{117}$ and $R_{31}$ to $R_{33}$ is bonded to $L^{10}$;

if A is represented by formula (16), then a group selected from the group consisting of $R_{118}$ to $R_{128}$ and $R_{31}$ to $R_{33}$ is bonded to $L^{10}$; and if A is represented by formula (17), then a group selected from the group consisting of $R_{129}$ to $R_{139}$ and $R_{31}$ to $R_{33}$ is bonded to $L^{10}$.

23. The compound of claim 21, wherein $Ar^1$ represents a group selected from the group consisting of a phenyl group, naphthyl group, phenanthryl group, biphenyl group, terphenyl group, quaterphenyl group, fluoranthenyl group, triphenylenyl group, phenanthrenyl group, fluorenyl group, spirofluorenyl group, 9,9-diphenylfluorenyl group, 9,9'-spirobi[9H-fluorene]-2-yl group, 9,9-dimethylfluorenyl group, benzo[c]phenanthrenyl group, benzo[a]triphenylenyl group, naphtho[1,2-c]phenanthrenyl group, naphtho[1,2-a]triphenylenyl group, dibenzo[a,c]triphenylenyl group, and benzo[b]fluoranthenyl group.

24. The compound of claim 21, wherein $Ar^1$ represents a group selected from the group consisting of a quinoline ring, isoquinoline ring, quinoxaline ring, phenanthridine ring, phenanthroline ring, a pyrrole ring, isoindole ring, benzofuran ring, isobenzofuran ring, dibenzothiophen ring, indole ring, pyrrolidine ring, dioxane ring, carbazole ring, furan ring, thiophen ring, oxazole ring, oxadiazole ring, benzoxazole ring, thiazole ring, thiadiazole ring, benzothiazole ring, triazole ring, imidazole ring, benzimidazole ring, pyrane ring, dibenzofuran ring, and benzo[c]dibenzofuran ring.

25. The compound of claim 21, wherein $L^{10}$ represents a divalent group derived from a group selected from the group consisting of a phenyl group, naphthyl group, phenanthryl group, biphenyl group, terphenyl group, quaterphenyl group, fluoranthenyl group, triphenylenyl group, phenanthrenyl group, fluorenyl group, spirofluorenyl group, 9,9-diphenylfluorenyl group, 9,9'-spirobi[9H-fluorene]-2-yl group, 9,9-dimethylfluorenyl group, benzo[c]phenanthrenyl group, benzo[a]triphenylenyl group, naphtho[1,2-c]phenanthrenyl group, naphtho[1,2-a]triphenylenyl group, dibenzo[a,c]triphenylenyl group, and benzo[b]fluoranthenyl group.

26. The compound of claim 21, wherein $L^{10}$ represents a divalent group derived from a group selected from the group consisting of a quinoline ring, isoquinoline ring, quinoxaline ring, phenanthridine ring, phenanthroline ring, pyridine ring, pyrazine ring, pyrimidine ring, pyridazine ring, triazine ring, acridine ring, piperidine ring, morpholine ring, piperazine ring, a pyrrole ring, isoindole ring, benzofuran ring, isobenzofuran ring, dibenzothiophen ring, indole ring, pyrrolidine ring, dioxane ring, carbazole ring, furan ring, thiophen ring, oxazole ring, oxadiazole ring, benzoxazole ring, thiazole ring, thiadiazole ring, benzothiazole ring, triazole ring, imidazole ring, benzimidazole ring, pyrane ring, dibenzofuran ring, and benzo[c]dibenzofuran ring.

*27. The compound of claim 21, wherein $L^{10}$ represents a divalent group derived from a group selected from the group consisting of a phenyl group, naphthyl group, phenanthryl group, biphenyl group, terphenyl group, quaterphenyl group, fluoranthenyl group, triphenylenyl group, phenanthrenyl group, fluorenyl group, spirofluorenyl group, benzofuran ring, dibenzothiophen ring, carbazole ring, furan ring, thiophen ring, dibenzofuran ring, and benzo[c]dibenzofuran ring; and*

*$Ar^1$ represents a group selected from the group consisting of a phenyl group, naphthyl group, phenanthryl group, biphenyl group, terphenyl group, quaterphenyl group, fluoranthenyl group, triphenylenyl group, phenanthrenyl group, fluorenyl group, spirofluorenyl group, benzofuran ring, dibenzothiophen ring, carbazole ring, furan ring, thiophen ring, dibenzofuran ring, benzo[c]dibenzofuran ring and a group formed from derivatives thereof.*

*28. An organic electroluminescence device, comprising:*

*a cathode,*

*an anode, and*

*at least one organic thin film layer between the cathode and the anode,*

*wherein the at least one organic thin film layer comprises a light emitting layer, and*

*wherein the at least one organic thin film layer comprises a layer that comprises the compound of claim 21.*

* * * * *